United States Patent [19]

Place

[11] Patent Number: 4,589,088
[45] Date of Patent: May 13, 1986

[54] REMOTE DATA GATHERING PANEL

[75] Inventor: William C. Place, Acton, Mass.

[73] Assignee: Honeywell Inc., Minneapolis, Minn.

[21] Appl. No.: 538,445

[22] Filed: Oct. 3, 1983

Related U.S. Application Data

[62] Division of Ser. No. 232,793, Feb. 9, 1981, Pat. No. 4,423,408.

[51] Int. Cl.$^4$ .................................................. G06F 13/00
[52] U.S. Cl. ..................................................... 364/900
[58] Field of Search ... 364/200 MS File, 900 MS File; 365/94, 226; 340/347 M

[56] References Cited

U.S. PATENT DOCUMENTS 4,093,998 6/1978 Miller .................................. 364/900
4,151,611 4/1979 Sugawara et al. ............... 364/900 X Primary Examiner—Thomas M. Heckler
Attorney, Agent, or Firm—Trevor B. Joike

[57] ABSTRACT

A data gathering panel is disclosed for converting analog values into digital values having input terminals for connection to analog sensors, a memory for storing a base value and a range value associated with the sensor, a base circuit connected to the memory for applying the base value to the analog value, and an analog-to-digital converter using the analog value, the base value and the range value for converting the analog value into a digital value. The data gathering panel may also permit connection to a plurality of input sensors having different characteristics by providing a memory for storing the different characteristics of the input sensors to be used by a processor in processing the information derived from the sensors. This memory may be a programmable read-only memory and the data gathering panel may have a facility thereon for allowing the altering of information stored in the programmable read-only memory.

5 Claims, 14 Drawing Figures

REMOTE DATA GATHERING PANEL

This application is a divisional application of Ser. No. 232,793 filed on Feb. 9, 1981, now U.S. Pat. No. 4,423,408.

BACKGROUND OF THE INVENTION

The subject invention relates to a data gathering panel for use in communication systems wherein the data gathering panel is located remotely from other remote stations one of which may include a central processing unit and, more particularly, to a data gathering panel which can accommodate a wide variety of analog and digital sensors, which provides an analog-to-digital converter capable of converting analog values from a wide variety of analog sensors to standard digital values, and which provides a programmable read-only memory for storing information which is useful by the processor in processing information wherein the programmable read-only memory can be configured and/or reconfigured from a station remote from the data gathering panel.

In an effort to reduce the complexity and attendant unreliability and installation costs of systems for controlling a building's air conditioning plant, energy consuming equipment, and the like, communication systems were developed wherein a central station communicated with a plurality of remote stations over a communication channel so that various points around a building could be sensed and various control units could be controlled. A typical remote station consisted of an interface circuit having a remote state address so that all remote stations were connected over a single pair of wires to the central station. Communication over this pair of wires was established between the central station and the remote stations so that the central station read the status points of the remote stations and commanded the control apparatus associated with the remote station. Therefore, the interface apparatus at the remote station simply served as a vehicle for collecting data to be reported to a central station and for responding to control messages sent by the central station to operate the various control apparatus associated with the remote station.

The evolution of such building automation and fire and security systems in recent times is beginning to influence system architecture. For example, there is a tendency for increasing the size of such building control systems to accommodate the ever increasing size of office buildings which are being constructed and to handle the increased number of sensing, control, fire and security points in new and existings buildings. The increased size and complexity of the system architecture and the increasing variety of tasks to be performed by the hardware has placed an enormous burden on the central processing units of such systems. Moreover, it may be necessary or desirable in some systems to eliminate the central processing unit altogether and to spread the control functions normally performed by a central station among a plurality of stations located throughout the communication system. These factors, among others, require that the system be capable of processing information at locations other than a central station. Thus, the remote stations (or data gathering panels) located throughout the communication system are beginning to be provided with computerized data processing capability made feasible by the microprocessor.

Since it is the data gathering panel which must now perform a portion of the data processing involved in the system as a whole, these data gathering panels must interface with the sensing and control points in such building automation and fire and security systems. The data gathering panel must acquire data from sensors connected thereto and must process the data acquired from these sensors to effect certain control decisions with respect to the control apparatus also connected to the data gathering panel. It would be beneficial if such data gathering panels were universal in nature such that they could be connected to any type of analog sensor or digital sensor without providing special connecting interface hardware between the sensor and the data gathering panel. If the data gathering panel is to be connected to sensors having widely varying characteristics, and if the data gathering panel is to process the data received from the sensors to effect control of the loads connected thereto, the data gathering panel must be able to convert the analog input signals from analog sensors having different characteristics into digital values for processing by the processing apparatus. If the use of separate hardware for each type of sensor is to be avoided, it is necessary to provide memory associated with the processing apparatus located in the data gathering panel for storing the programs and data files associated with the sensors and control apparatus, and it is desirable, therefore, to be able to change this memory from a remote location.

SUMMARY OF THE INVENTION

Thus, the invention relates to a data gathering panel for the conversion of analog values into digital values wherein the panel includes input terminals for connecting analog sensors to the panel, a memory for storing a base value and a range value for each of the analog sensors connected to the panel, a base circuit connected to the memory for applying the base value to the analog value, and an analog-to-digital converter connected to the input terminals, to the base circuit and to the memory for converting the analog value into a digital value, the analog-to-digital converter determining the digital value by utilizing the analog value, the base value and the range value.

The data gathering panel may also be adapted to be connected to a plurality of input sensors having different characteristics and thus include input terminals for connection to the plurality of input sensors, a memory for storing the characteristics of the input sensors so that the data gathering panel can be connected to the input sensors having different characteristics, and a processor connected to the input terminals and to the memory for processing the input signals derived from the input sensors according to the characteristics for the input sensors stored in the memory.

Moreover, the data gathering panel can be reprogrammed from a remote location by including a programmable read-only memory for storing information to be used by the data gathering panel for controlling processing, an energy source in the data gathering panel for altering upon command the information stored in the programmable read-only memory, and a controller responsive to remote transmissions from a remote station over a communication channel for interconnecting the energy source and the programmable read-only memory for altering the information stored in the programmable read-only memory.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
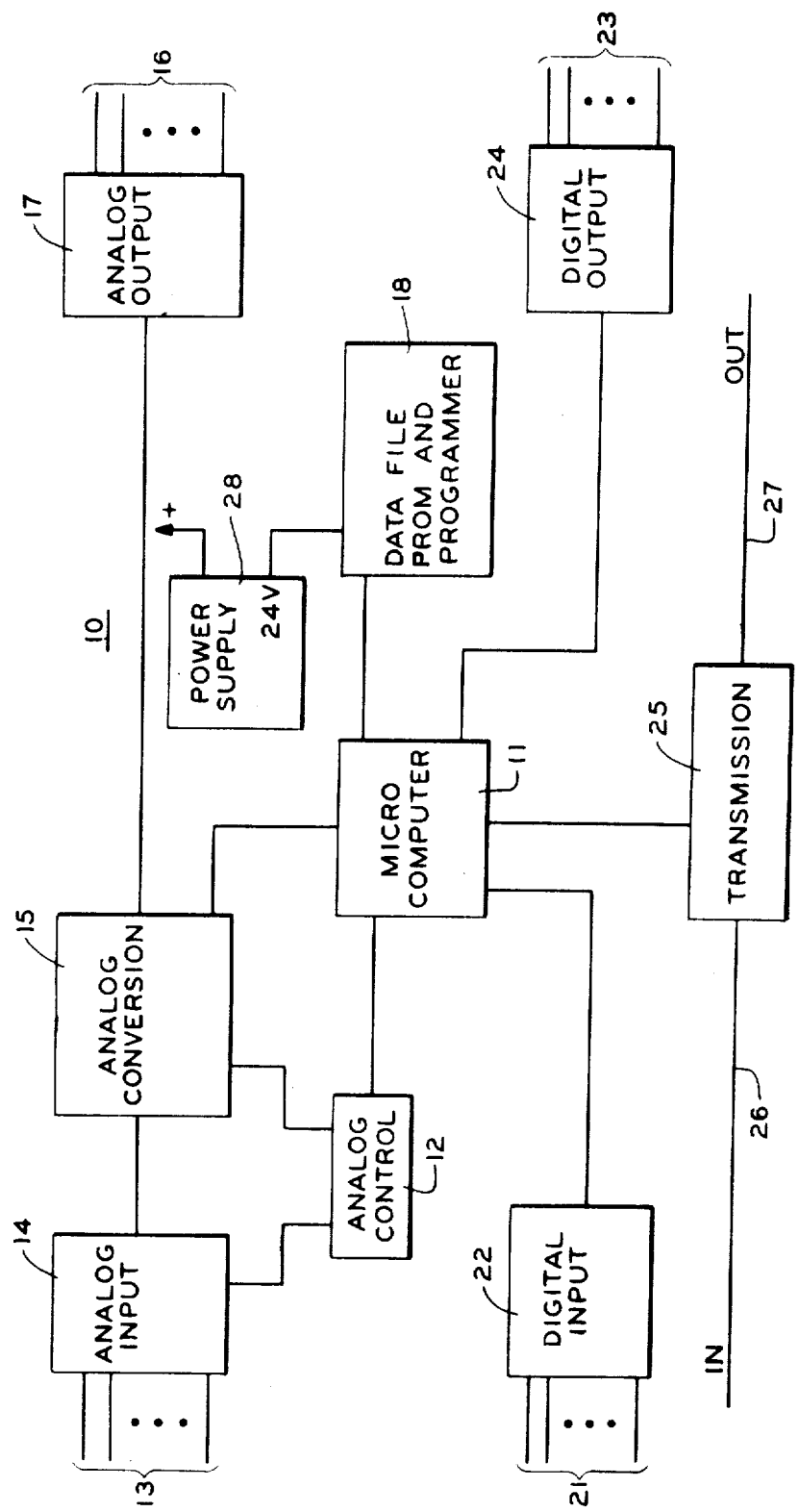
FIG. 1 shows a block diagram of the data gathering panel according to the present invention.

The block form of the data gathering panel is shown in FIG. 1. All of the circuits comprising the blocks shown in FIG. 1 may be placed on a single printed circuit board for easier installation and utility. The heart of the system shown in FIG. 1 is microcomputer 11 which through analog control circuit 12 controls the connection of analog inputs 13 through analog input circuit 14 to the input of an analog conversion network 15. Analog conversion network 15 converts the analog input signals supplied through analog input 14 into digital signals for connection to microcomputer 11. Microcomputer 11 also controls analog outputs 16 through analog conversion circuit 15 and analog output circuit 17. Analog outputs 16 may be connected to such apparatus as control point adjustment apparatus for adjusting the control point of a control system, relays or other equipment which is to be controlled by the data gathering panel.

Since the data gathering panel shown in FIG. 1 is intended to receive the input from any type of analog input sensor, data file PROM and programmer 18 is connected to microcomputer 11 and stores therein the data files necessary for characterizing each type of analog input sensor to which inputs 13 may be connected. Thus, at the time of installation of the data gathering panel shown in FIG. 1 into a building automation system, the input sensors to be connected to the inputs 13 are selected and characterizing information for each sensor is stored in memory 18 to be later used by microcomputer 11 for converting the analog input signal derived from the analog input sensor to a digital representation to be used by the microcomputer 11 in its communication with other stations connected to the communication bus and in determining whether or not a control point needs adjustment or is in alarm. For example, the types of analog sensors which may be connected to the data gathering panel shown in FIG. 1 include 1–100 millivolt voltage sensors, 4–20 milliamp current sensors, 0–5 milliamp current sensors, 3280–4000, ohms or 80–120 ohms resistance temperature devices, or 0–10 volts voltage sensors.

The analog conversion circuitry acts on one analog input at a time. Because the conversion circuitry chosen for implementing the present invention provides a digital 0 output for an analog input of less than 5 volts and will saturate for an analog input substantially greater than 10 volts, certain scaling and base values must be applied to the input depending on the type of analog sensor connected thereto. In the example given above, an input from a 0–100 millivolt voltage sensor is first multiplied or scaled by a factor of 10 to produce a 0–1 volt signal. Next, a 5.5 volt base value signal is added thereto so that the analog range for this type of sensor is between 5.5 and 6.5 volts. All current sensors when connected to one of the inputs 13 shown in FIG. 1 are also connected through a corresponding 121 ohm resistor (not shown) which converts, in the case of the 4–20 milliamp sensor, the current input into a 0.484–2.42 volt signal. Then, a base voltage is applied thereto of 5.016 volts to produce an analog voltage range of 5.5–7.436 volts for this sensor. As another example, the 0–5 milliamp current sensor is first applied through two 121 ohm parallel resistors and then is multiplied or scaled similarly to the 4–20 milliamp sensor.

If a two slope conversion of an analog input signal were followed, the process would begin by allowing an integrator to charge from a reference voltage VR for a fixed amount of time TI. After this integration time, the integrator is next allowed to discharge for a time TM, dependent upon its original charge, to the reference voltage VR. Next, since the reference voltage VR is known, since the digital representation of integration time TI is known and since the measured time TM has been digitally measured, the analog voltage VI can be calculated as a digital value according to the following equation:

$$\frac{VI}{VR} = \frac{TM}{TI} . \tag{1}$$

Figure 4:
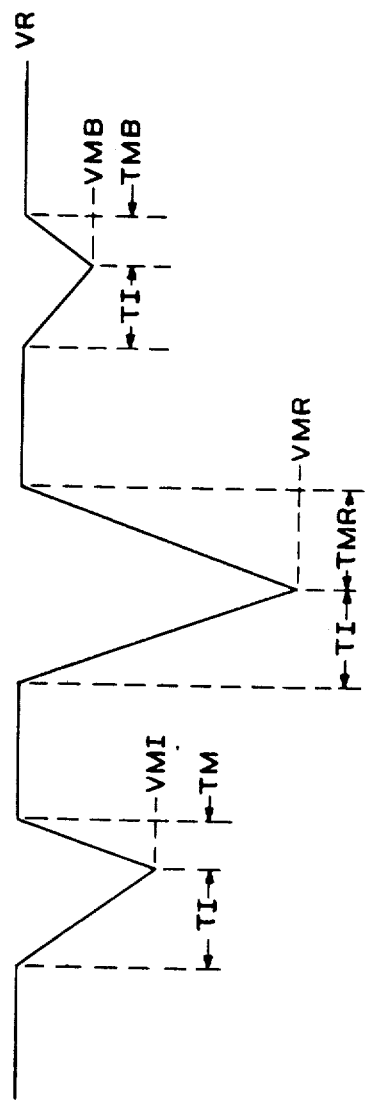

However, the digital representation of the analog value derived from this equation is not meaningful because it has not been related to the base value which was applied to the analog voltage during the conversion process and is not related to the voltage range for this analog signal. Therefore, a more meaningful conversion is a conversion which takes into account the base and range values. FIG. 4 shows a timing diagram for a hex slope conversion which uses not only the analog input voltage, but also the base and range values.

In FIG. 4, the integrator begins at the reference voltage VR and is allowed to charge for a reference amount of time TI. The voltage of the integrator at this point is representative of the measured analog input voltage, VMI. Next, the integrator is discharged over a variable measured amount of time TM until it reaches the reference voltage VR. Next, the range value, which is defined as the upper limit of the voltage range or span which can be supplied by the analog signal input sensor (6.5 volts in the example of the 0–100 millivolt sensor), is applied to the conversion circuitry and the integrator is again charged for the fixed amount of time TI. The voltage of the integrator after this amount of time is representative of the measured range value VMR. Next, the integrator is allowed to discharge for a measured amount of time TMR to discharge the integrator to the reference voltage level VR. Finally, the base voltage which is the lower limit of the span which may be experienced from the sensor (5.5 volts in the example of the 0–100 millivolt sensor) is applied to the integrator and the integrator is again charged for the reference amount of time TI. Next, the integrator is allowed to discharge for a measured amount of time TMB to the voltage reference level VR. As should be clear, the only unknown of these quantities is the analog input voltage VMI.

The following equation shows how these variables may be used in deriving a digital representation of the analog input signal:

$$PV = \frac{TMI - TMB}{TMR - TMB} = \frac{VMI\left(\frac{TI}{VR}\right) - VMB\left(\frac{TI}{VR}\right)}{VMR\left(\frac{TI}{VR}\right) - VMB\left(\frac{TI}{VR}\right)} = \quad (2)$$

$$\frac{VMI - VMB}{VMR - VMB}$$

In equation (2), the only unknown is the term VMI, the term VMB being representative of the base voltage, VMR being representative of the range voltage, TMI, TMB and TMR being the measured times in digital representation of the input discharge time, the base discharge time and the range discharge time respectively. Thus, the voltage VMI can be calculated readily.

It is to be noted that it is only necessary to derive a proportional value PV which is based upon the various measured times in digital representation and which can be said to relate the voltage within the span, that is the input voltage minus the base voltage, to the span itself, that is the difference between the range voltage and the base voltage. This proportional value is a digital representation of the input voltage as related to both the range value and the base value and it is specifically related to the type of analog input sensor from which the raw analog voltage signal was derived. The middle term of equation (2) merely shows that the integration time TI and the reference voltage VR cancel out and need not be used in the calculation process.

The digital value PV is a 16 bit raw value which, because the processor processes digital signals having a maximum of 12 bits, because of the wide variety of sensors which can be connected to the data gathering panel and because 12 bits have been chosen for resolution, the PV value must be converted to a final value. For this purpose, a standard range of 95–4095 has been chosen so that the following equation is useful for this conversion:

$$FV = (PV \times 4000) MOD 4096 + 95 \quad (3)$$

It is to be noted that the proportional value PV must by definition be less than 1. Therefore, equation (3) multiplies the proportional value by 4000 and then divides that result by 4096 and adds the remainder of that operation to the digital equivalent of 95. The result is a final value FV which is a digital representation within a standard range of an analog value received from an analog input sensor connected to one of the inputs 13 and related to the base and range for that specific sensor. The base and range values are stored in data file 18 along with any other necessary characterization data. Each set of data is stored in a memory location designated for a specific sensor. There will be as many sets of data stored in memory 18 as there are sensors connected to inputs 13.

The apparatus of FIG. 1 is also capable of successively approximating the analog value received over one of the inputs 13. In this mode of operation, a digital-to-analog converter can be used wherein the digital inputs to the digital-to-analog converter are continually adjusted until the analog input value is nulled out. At this point, the digital input value to the D/A converter is then representative of the analog value. However, in actual practice, this mode of operation is used as a threshold sensing arrangement. In this arrangement, the analog input value is compared to several digital threshold values to determine the limits within which the analog value falls. This type of operation is particularly useful in determining the nature of an alarm in a fire and security application.

A third mode of operation, suggested above, is the resistance-to-period, R/P, operation. When this type of operation is intended, a sensor and a R/P converter are connected to an input of inputs 13. The R/P routine has 6 ranges of calibration that are digitized. The ranges each result in a value of 4000 states from 95 to 4095 to make a b 12 bit value. A counter will count the time between 20 pulses to accumulate an R/P count. The R/P count is then operated upon in a manner similar to equation (3) for determining the digital value representative of the R/P count.

Note that no terminal interconnect hardware changes are required to convert inputs from any of the inputs attached to 13.

The data gathering panel shown in FIG. 1 may receive inputs from a plurality of digital sensors, runtime or totalizer sensors connected to inputs 21. Digital sensors may be simple on/off devices such as air flow switches, security door switches, fire or smoke sensors, or the like. Totalizer inputs count pulses. Each time a totalizing contact opens and closes a count is registered. Such an input can be used, for example, in conjunction with runtime inputs to total the elapsed time an input is closed in two second increments. Such an input can be used, for example, for measuring fluid flow. The inputs 21 are connected through digital input circuit 22 to microcomputer 11 which also controls a plurality of digital outputs 23 through digital output circuit 24. Digital outputs 23 may be connected to loads such as relays for controlling the various functions in a building automation system. Finally, microcomputer 11 is connected to transmission circuit 25 which controls the receiving and transmitting of information over a communication channel which includes input line 26 and output line 27 for communication with other remote stations and a central processor if used.

The data gathering panel shown in FIG. 1 is capable of being reconfigured from a remote location. If it is desired, for example, to change the manner of processing the analog and digital inputs supplied to data gathering panel 10 over inputs 13 and 21, the data file and program contained in memory 18 can be changed from a remote location. As another example, it may be desirable to change sensors or their locations which would require a similar change in memory 18. Instead of having to disconnect memory 18 from data gathering panel 10 and substituting a new memory therefor or using a programmer for reprogramming old memory 18, those portions of the old routine which are no longer desirable can be erased from memory 18 and the new desired program and data file can be burned into memory 18 under control from a remote location. In order to facilitate the remote reconfiguration of memory 18, power supply 28 which supplies tne power necessary to drive the various blocks shown in FIG. 1 is also provided with a 24 volt output connected to memory 18. Under control of microcomputer 11, therefore, memory 18 can use the 24 volt source for erasing the old information which is no longer desired and burning into memory 18 the new information which can be supplied and controlled from the remote location.

Figure 2:
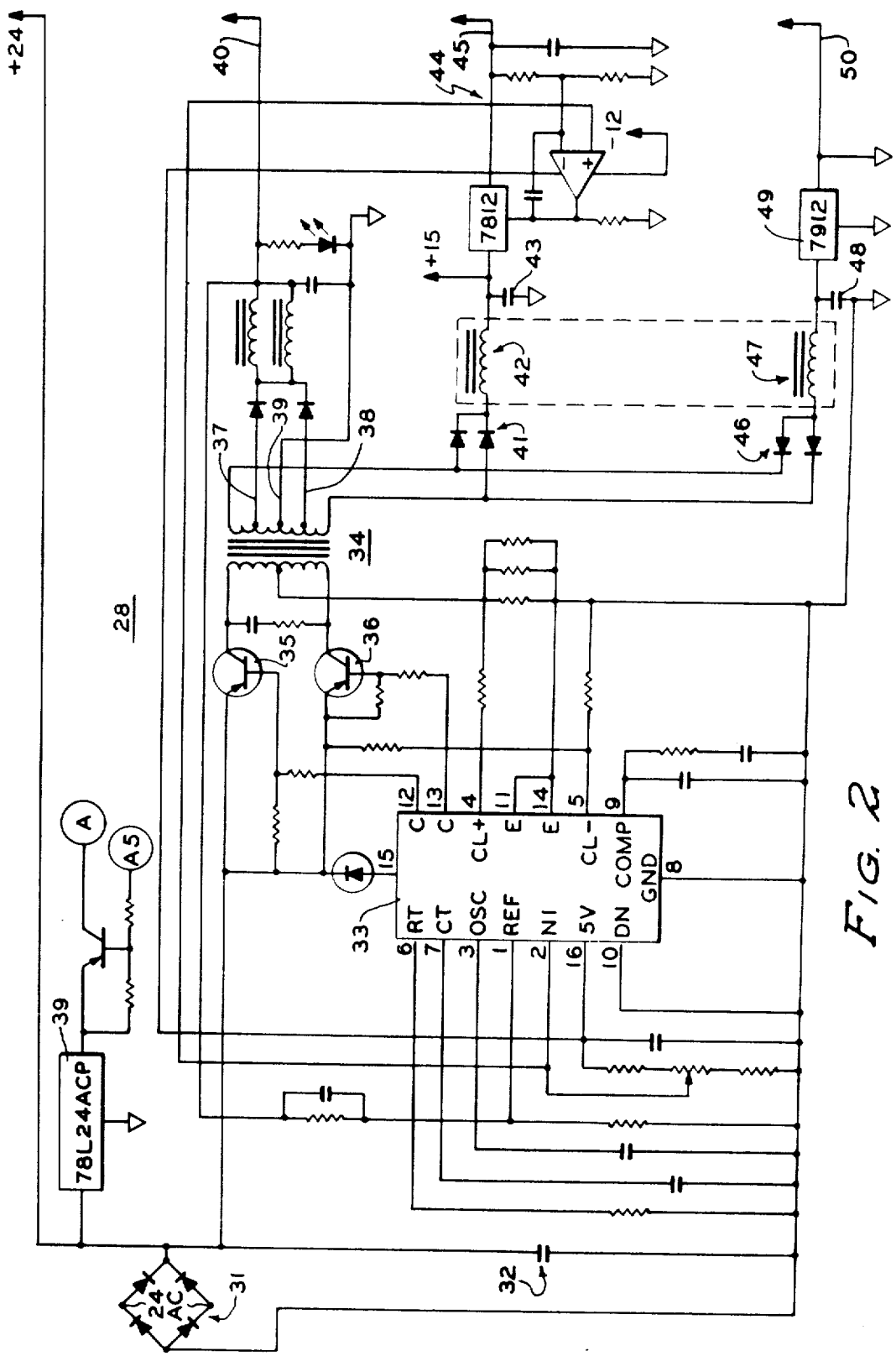
FIG. 2 shows the power supply which is used for providing the power to the various circuits shown in the drawings.

FIG. 2 shows power supply 28 in more detail. A 24 volt alternating current source is full wave rectified by bridge 31 and smoothed by capacitor 32 for supplying unfiltered 24 volt DC to the rest of power supply 28. The heart of power supply 28 is pulse width modulation chip 33 the pins of which are shown as connected. The output from pulse width modulator 33 is used for controlling the primary of transformer 34 through transistors 35 and 36. Taps 37 and 38 together with ground tap 39 are rectified and supplied through choke coils for supplying output 40 thereof. For example, these taps may be chosen so that output 40 provides a 5 volt output for use by the data gathering panel. One extreme end of the secondary of transformer 34 is rectified in a forward direction by diodes 41, smoothed by choke coil 42 and capacitor 43, and regulated by regulator 44 for supplying output 45 which may, for example, be a positive 12 volt output. Likewise, the other extreme end of the secondary of transformer 34 is rectified in a reverse direction by diodes 46, smoothed by choke coil 47 and capacitor 48, regulated by regulator 49 and supplied to output 50 which may be a negative 12 volt line, for example. The unfiltered direct current 24 volt signal is also regulated at 39 for supplying terminal A with a regulated 24 volt d.c. signal. Terminal A is connected to PROM 112 (FIG. 3F) of memory 18 for use in reconfiguring the data file and programs stored therein.

Figure 3A:
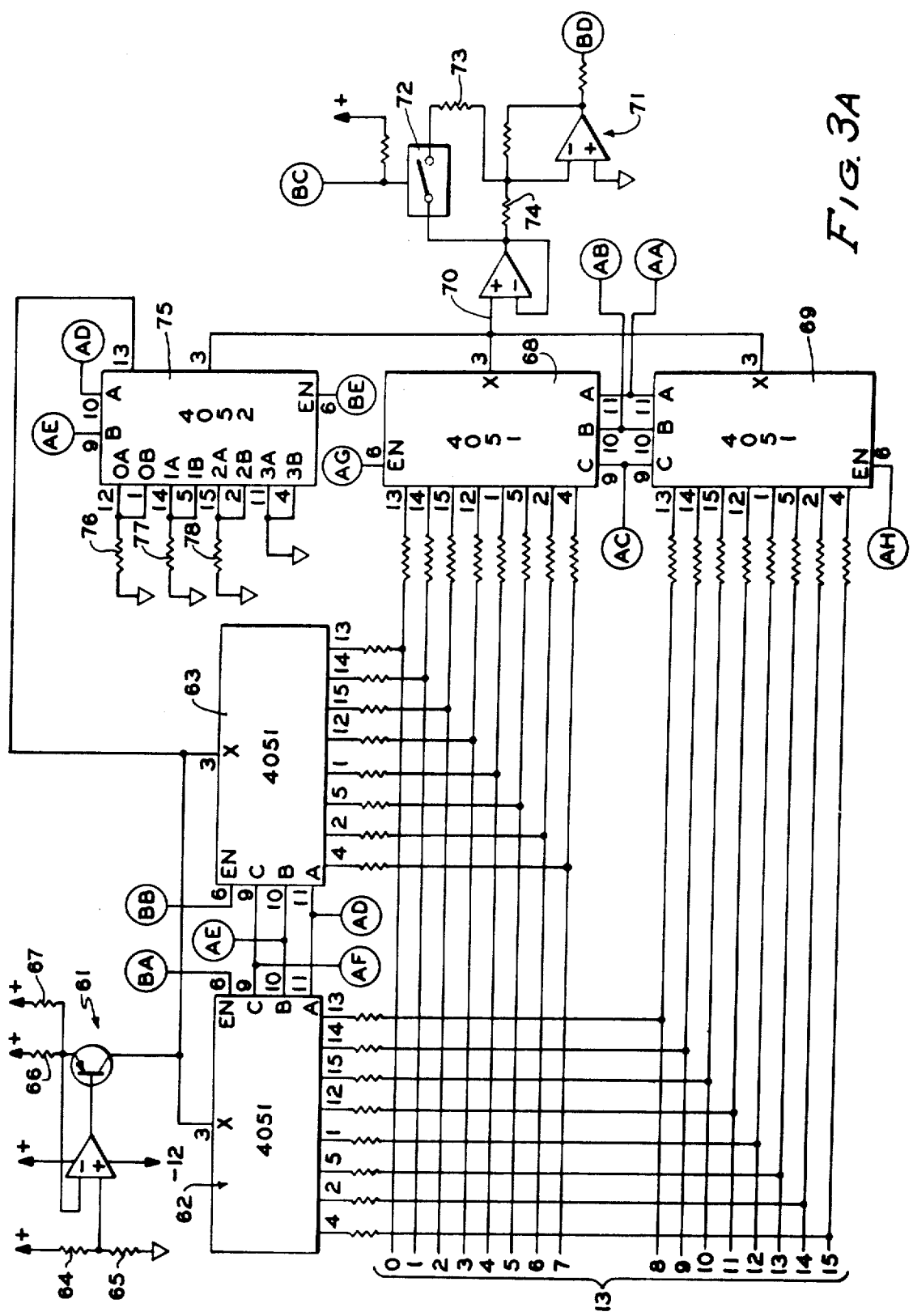
FIGS. 3A–3K show the details of the data gathering panel shown in block form in FIG. 1; and, FIG. 4 is a timing diagram of the signals used for hex slope converting an analog value into a digital value.

FIGS. 3A-3K show the details of the blocks shown in FIG. 1. The circled terminals show the interconnections between the blocks shown in FIG. 1 and the straight line terminals show the inputs and outputs to the various portions of the control circuitry of the data gathering panel. As shown in FIG. 3A, inputs 13 may, for example, total 16 in number and can receive current from constant current source 61 through multiplexers 62 and 63 depending upon the type of sensor. Current source 61 is used when passive sensors, such as resistance temperature devices, are used. If resistance-to-period, source voltage or source current sensors are provided, then constant current source 61 is not used. The current supplied by constant current source 61 is determined by resistors 64, 65 and 66. Resistor 67 may be provided as an option for supplying two different current levels.

Multiplexers 68 and 69 select which input sensor is to be connected to output line 70. Output line 70 is then connected through inverting buffer 71 to output terminal BD. This inverting buffer is a high input impedance voltage follower cascaded with an inverter. The inverter will scale the input signal depending upon whether the selected sensor supplies are input signal which is less than 1 volt. Thus, if the input signal on output 70 is to be less than 1 volt, switch 72 is closed to parallel resistor 73 with resistor 74 for multiplying the signal on output 70 by 10 to raise the signal to at least 1 volt. If the signal at output 70 is to be above 1 volt, switch 72 remains open and resistor 73 is omitted from the circuit. Thus, the signal at terminal BD is transformed into a low impedance scaled replica of the input signal.

Figure 3B:
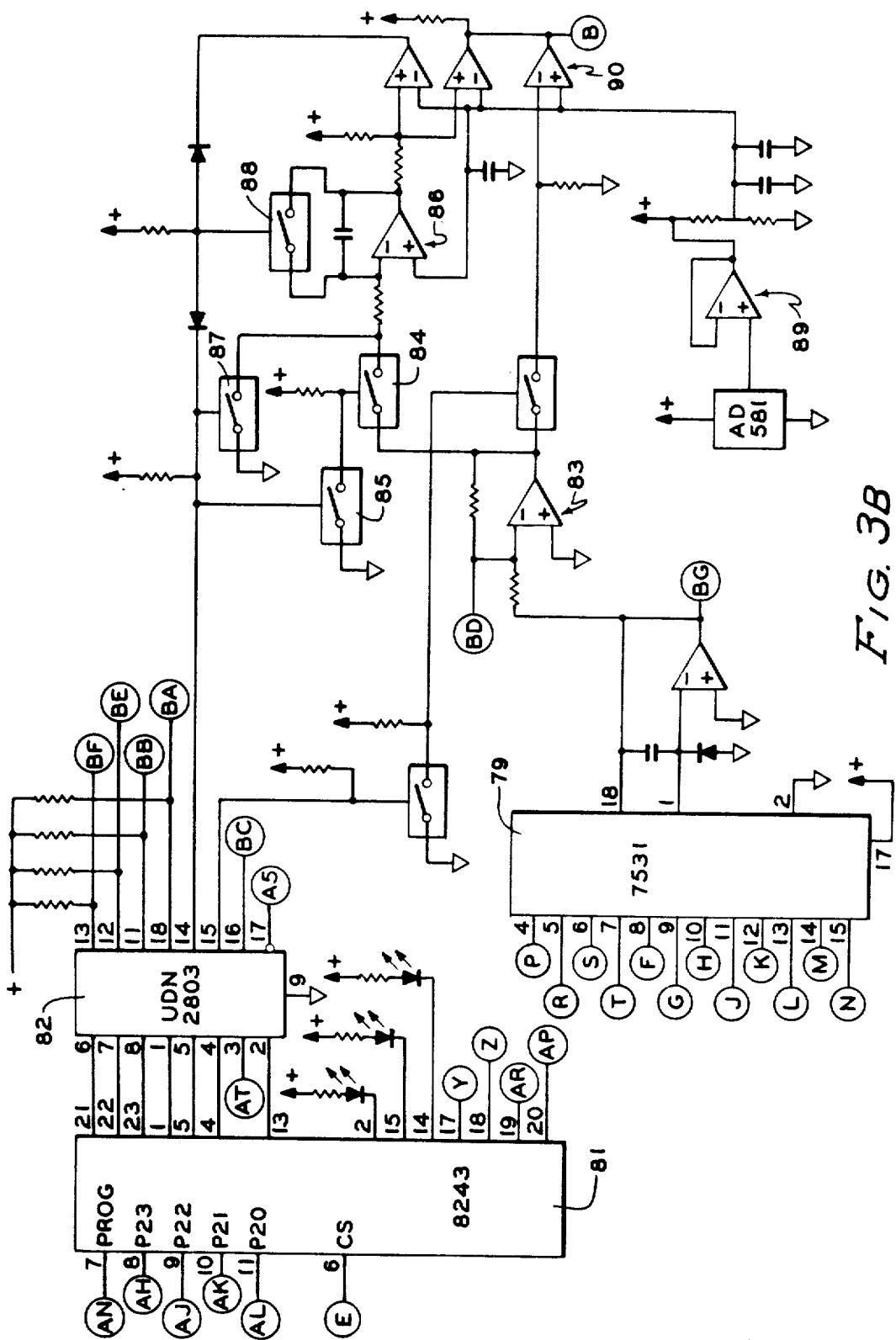

Moreover, as discussed above, if the sensor selected by multiplexers 68 and 69 supplies a signal which is less than 5.5 volts, a constant voltage must be added to the analog value to raise it to a value which is useful by the converter. If the sensor type which is being measured is a resistance sensor, then multiplexer 75 shown in FIG. 3A is used to steer current from constant current source 61 through resistor 76, 77 or 78 and to apply the resulting voltage to output 70. One resistor is selected for a base value and a second for a range value for each resistive sensor measurement. The digital-to-analog converter 79 shown in FIG. 3B is used to add a fixed voltage to the input, range and base voltages to insure that all values at BD are greater than 5.5 volts.

If the sensor is a current or a voltage sensor, then digital-to-analog converter 79 is used to provide base and range values of voltage at BD. The base voltage is added to the analog value as scaled to raise the voltage at BD to 5.5 volts minimum. This signal at BD is then processed by the conversion circuitry for charging an integrator over a preset amount of time and discharging it to a preset level. The amount of time it takes to discharge the integrator to the preset level is then measured and is used as an indication of the analog value of the analog input signal at terminal BD.

Next, the base signal alone is applied by either multiplexer 75 or D/A converter 79 to the integrator and the process is repeated to derive a digital representation of the amount of time it takes to discharge the integrator from a level indicative of the base value to the reference voltage. Finally, the range or upper limit of the signal which may be expected from the type of sensor which is being connected to the integrator is applied to the integrator by either multiplexer 75 or D/A converter 79 and the process is again repeated deriving a digital representation of the amount of time required to discharge the integrator from a level representative of the range value to the reference voltage.

The control of the analog-to-digital conversion process is performed by port expander 81 and voltage driver 82. Port expander 81 has essentially four inputs at pins 8-11 which are time shared. These four inputs select the outputs over which command signals are given. They are also used to accomplish a plurality of commands. For example, they may transfer the output from port expander 81 to the microcomputer, they may control the transfer from the microcomputer to the output of the port expander, or they may transfer information from the microcomputer to the output of the port expander and change only one bit thereof by an AND operation or by an OR operation.

During the conversion process, the microcomputer using port expander 81 and voltage driver 82 will control switch 72 for scaling the analog value of the analog signal from the sensor which is connected through mux 68-69. The analog value is then amplified at 83 and connected through input switch 84, under control of control switch 85, to the input of integrator 86. At the same time that input switch 84 is closed, ground switch 87 and discharge switch 88 are opened. Thus, the input to the integrator received from amplifier 83 is charged for a fixed amount of time. The timer within the microcomputer is used to generate this delay. After this delay, the control line from pin 14 of driver 82 is switched high causing switch 85 to close, switch 84 to open and switch 87 to close. The timer within the 8155 RAM 113 shown in FIG. 3F then counts the time to discharge the integrator to the reference voltage level. This time is then a digital representation. Once the reference voltage level has been reached, switch 88 is closed to finally discharge the capacitor of integrator 86 so that the capacitor will always begin charging at a predetermined point. The reference voltage is supplied by circuit 89 shown in FIG. 3B. The output from the comparator section 90 of the integrator shown in FIG. 3B is connected over terminal B to an input of the microcomputer.

Next, under control of the microcomputer, the base value is supplied by D/A converter 79 in the case of a voltage or current input or by multiplexer 75 in the case of a resistance input and integrated, and finally the range value is supplied by either D/A converter 79 or multiplexer 75 and is integrated. Then the hex slope conversion process is performed as described above.

Finally enable terminals BA and BB of FIG. 3A for input multiplexers 62 and 63 are derived from voltage driver 82 shown in FIG. 3B.

Figure 3C:
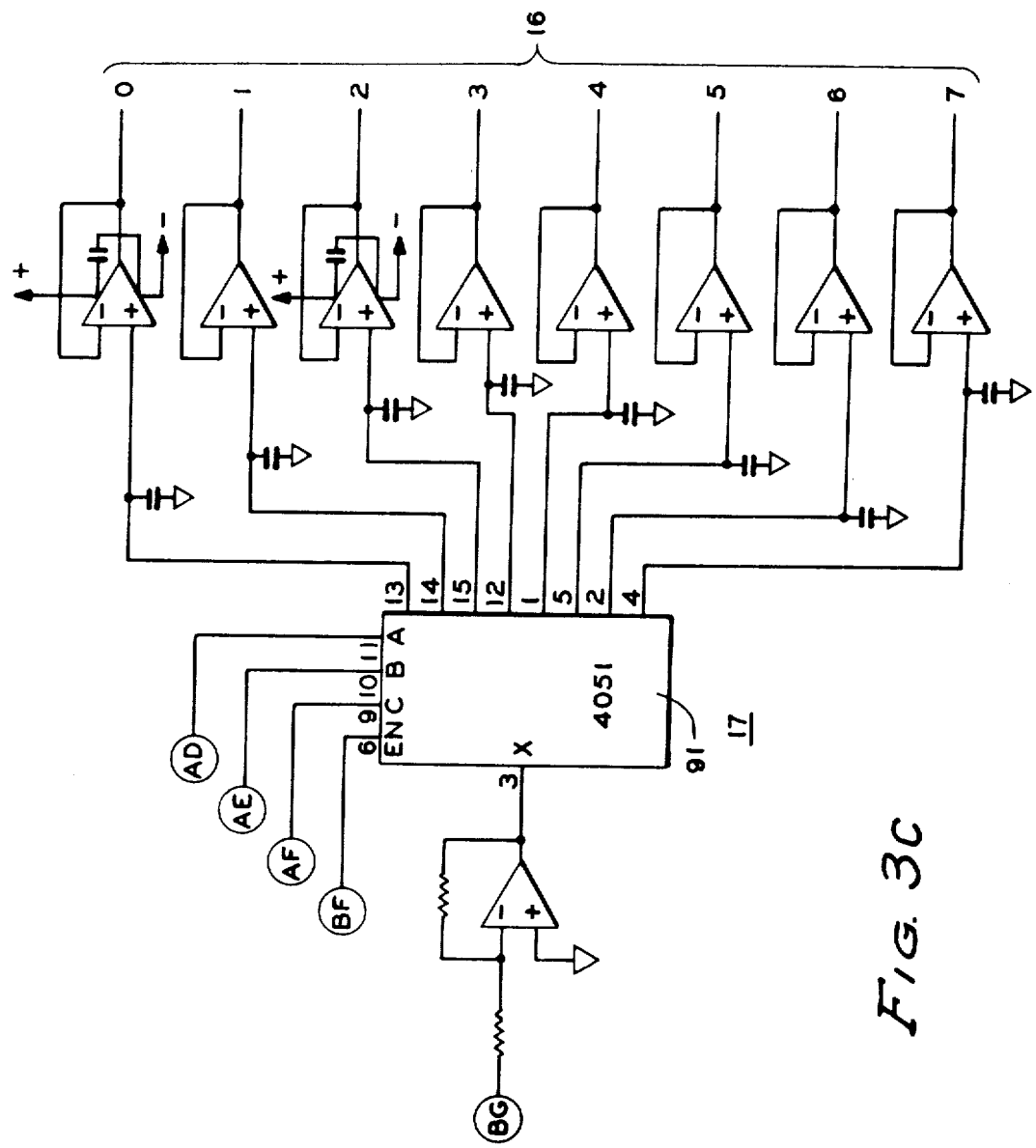

FIG. 3C shows the analog output 17 and output lines 16. As can be seen, up to 8 analog outputs, for example, may be provided and are controlled through multiplexer 91 by the microcomputer 11 and analog control logic 12. As can be seen from FIG. 3C, the analog outputs are sample and hold voltage follower outputs that are individually programmable for offset and range. Specifically, the digital-to-analog converter 79 of FIG. 3B is connected through terminal BG to the input of multiplexer 91. This digital-to-analog converter can be used then to program the offset and range for each analog output 16. The processor continually cycles through each analog output to refresh the charged capacitor. The voltage follower and multiplexer 91 arrangement provides super high impedance paths in the off state keeping the voltage ripple of the voltage follower output to a minimum.

Figure 3D:
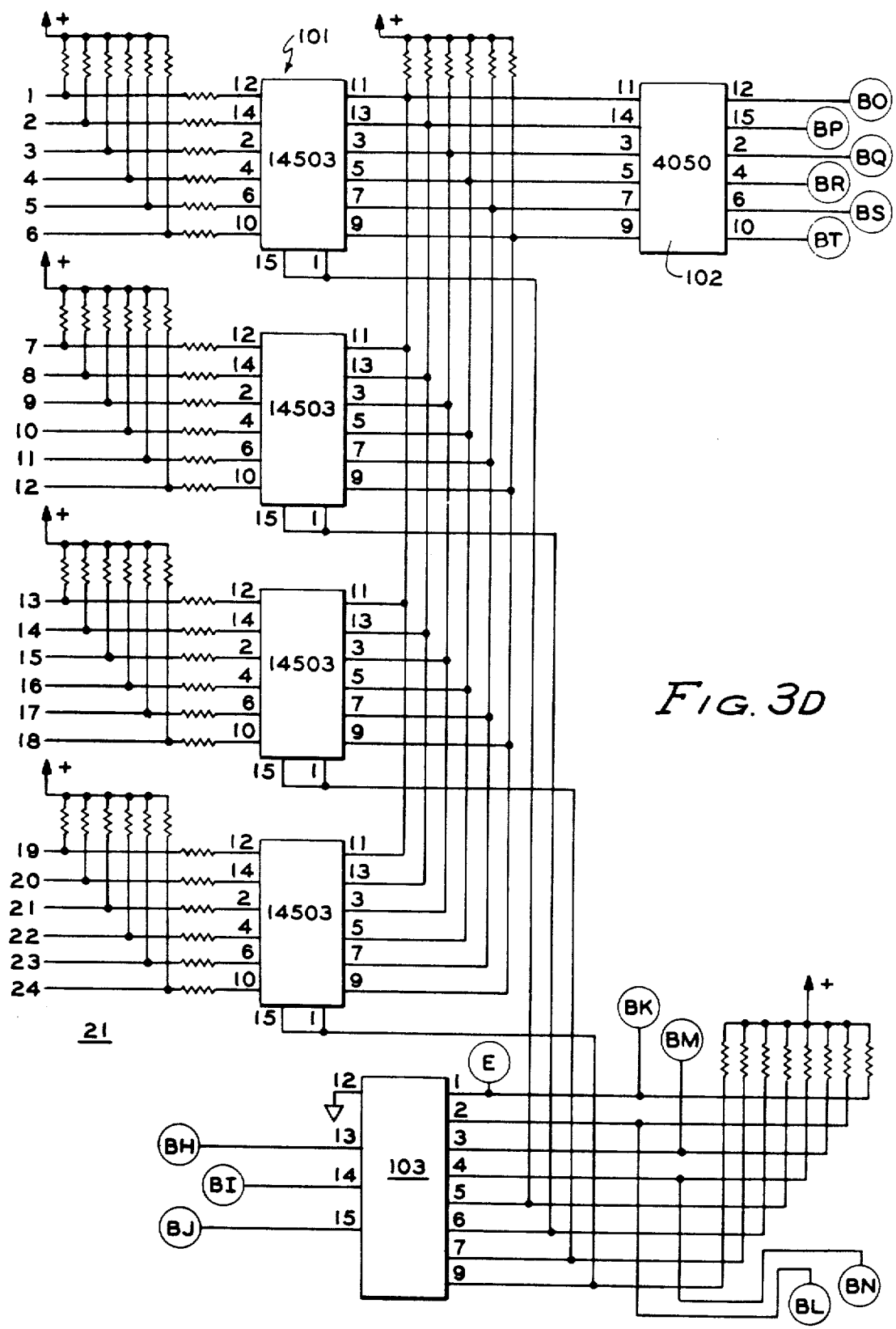

Digital inputs 21 are shown in FIG. 3D and may total, for example, 24. These input lines are connected to pull-up resistors as shown and are also connected through series limiting resistors to the inputs of four buffer circuits 101. Each digital input may be programmed as normally open or normally closed by an appropriate data file entry into memory 18. Digital inputs are read each time a poll is received. Demands, repeats, etc., do not affect the buffer status of digital inputs. The outputs of these buffers are likewise connected through pull-up resistors to the inputs of level converter 102 the outputs of which are connected directly to the microcomputer. The control of the buffers 101 is under control of decoder 103 which decodes three outputs from the microcomputer to control its various output lines for selectively enabling buffers 101 as well as RAM 113, a universal asynchronous receiver transmitter 114 and digital output port expanders 106, 109 all of which are to be discussed hereinafter.

Figure 3E:
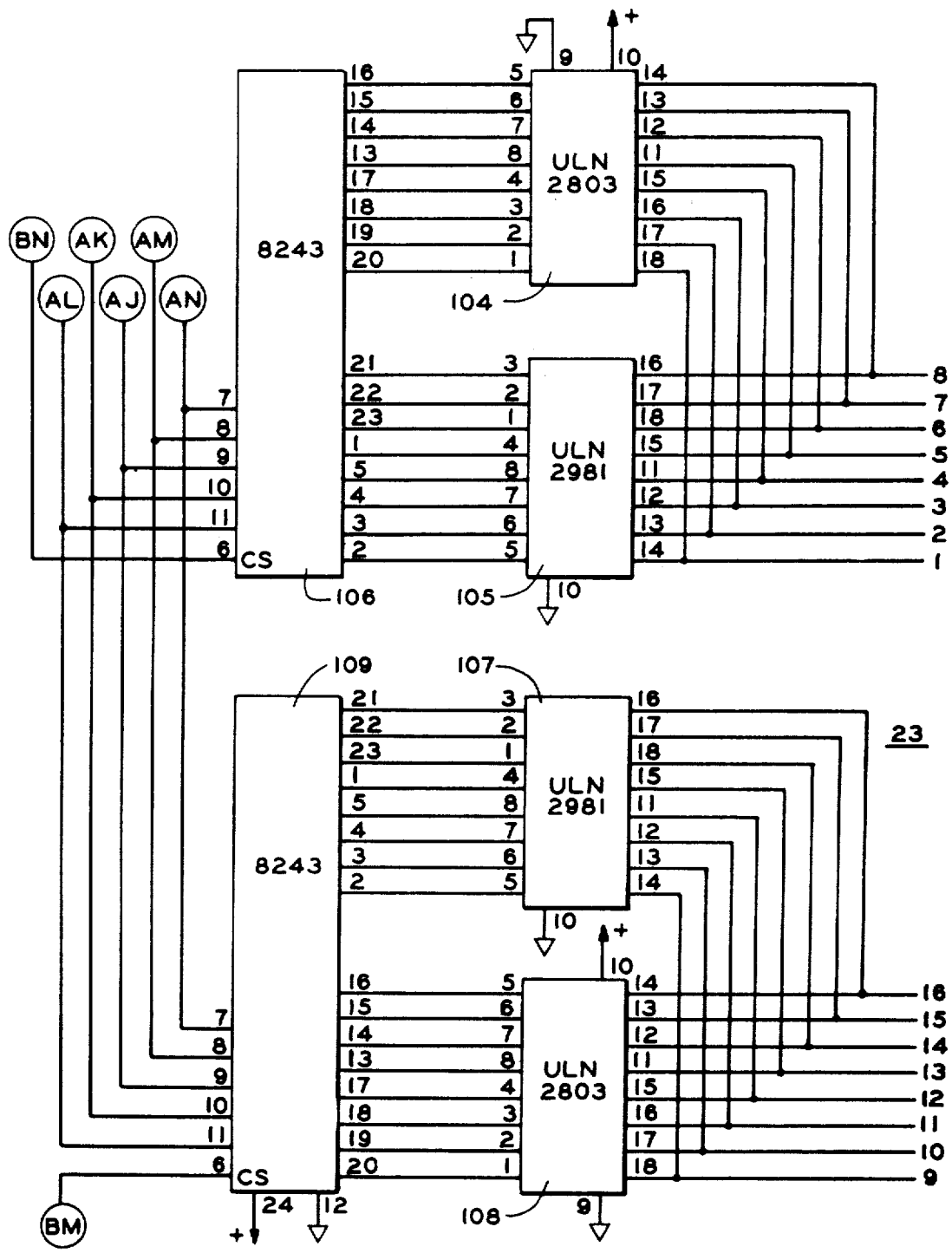

The first eight digital output lines of digital outputs 23 as shown in FIG. 3E are connected as outputs from voltage drivers 104 and 105 from the outputs of port expander 106 under control of the microcomputer. The last eight output lines are connected as outputs from voltage drivers 107 and 108 from the outputs of port expander 109 under control of the microcomputer. Each output can be configured individually to drive high to a predetermined voltage, low to a reference voltage such as ground, turn off or pulse high or low. Various pulse periods may also be chosen.

Figure 3F:
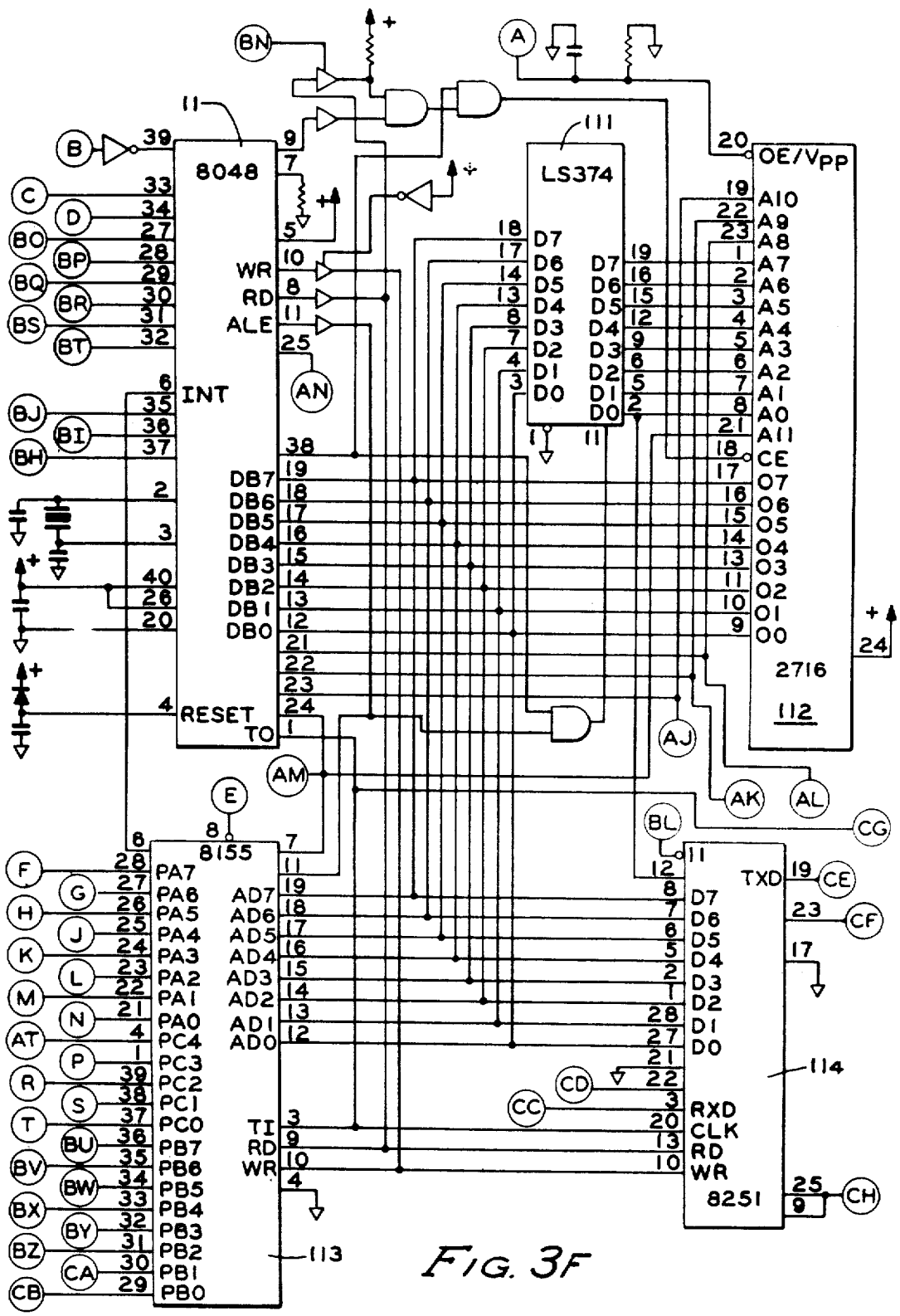

In FIG. 3F, microcomputer 11 is shown connected to the various control and input/output circuitry shown in the other figures of the drawing. For example, input terminal B is derived from the output of the conversion circuitry shown in FIG. 3B. Input terminals C and D come from FIG. 3J which shows input lines which may be connected to sensors. The pulse 1 and pulse 2 input lines may be programmed as totalizer or run time inputs in the same fashion as the digital inputs. Inputs BO-BT are taken from level converter 102 associated with the digital inputs shown in FIG. 3D. Outputs BJ, BI and BH control decoder 103 shown in FIG. 3D so that level converter 102 may time share the outputs from buffers 101. Data output lines DB0-DB7 are connected to corresponding inputs of latch 111, from corresponding outputs of EPROM 112, to address lines AD0-AD7 of random access memory (RAM) 113 and to input/output lines D0-D7 of universal asynchronous receiver transmitter (transceiver) 114. As shown, EPROM 112 is also connected to terminal A from the power supply for the supply of regulated 24 volts thereto. Latch 111 interfaces the data bus of microcomputer 11 to the address inputs of EPROM 112.

RAM 113 is enabled by an output from decoder 103 at terminal E. Outputs F-T from RAM 113 under control of microcomputer 11 are used to provide the digital inputs to digital-to-analog converter 79 shown in FIG. 3B. Moreover, RAM 113 under control of microcomputer 11 reads inputs BU-CB also shown in FIG. 3H. These terminals are connected to switch bank 116 and through series resistors 117 to a source of voltage. Switches 116 may be operated to define the address of data gathering panel 10. These switches are read on each power up so that the data gathering panel will know its own address. Furthermore, these outputs from RAM 113 are connected through voltage driver 118 to various terminals for control purposes. It will be seen, for example, that the control of the input multiplexers 62 and 63 of FIG. 3A is under control of terminals AD, AE and AF. Moreover, the control of reference mux 75 is under control of terminals AD and AE. The output multiplexers 68 and 69 of FIG. 3A are under control of terminals AA-AC. In addition, terminal AG is used to enable output mux 68 and terminal AH is used to enable output mux 69. Terminals AD, AE and AF are used for controlling output analog multiplexer 91 shown in FIG. 3C. RAM 113 also provides an output over its pin 6, a timer out signal, for interrupting microcomputer 11.

EPROM 112 of data gathering panel 10 is used to hold a variable portion of the program depending on the PROM configuration used and to hold the variable data file. Also, each hardware block (digital outputs, digital inputs, analog inputs, analog outputs, as well as custom firmware options such as totalizer, run time and interpolation tables useful when sensors are non-linear) may be customized for the selected input sensors and output control hardware by individual data files programmed in the PROM. The particular EPROM chosen for this application is a UV erasable device. Individual program data files can be "erased" by zeroing out the first location of the data file and resetting the data gathering panel. As such, individual point definition can be arbitrarily changed (erased and reprogrammed) for as many times as there is space in the data file area.

PROM programming can be done from a remote station through the transmission bus. A program message is sent to data gathering panel 10 specifying the quadrant (256 byte multiple), address (address within 256 bytes) and data to be programmed in that byte. The PROM programmer then controls the actual manipulation of the data and storage in the address storage location. This routine then implements the timing diagram shown in FIG. 3K to program the specified location. After the programming is complete, the PROM location programmed is read through the normal data file reading technique. It is to be noted that all instructions executed during the programming must reside in microcomputer 11 or else the OE pin of PROM 112 will not be steady. In order to facilitate the reconfiguration of the data file and program stored in PROM 112, it is connected through terminal A to a regulated 24 volt source.

The heart of transmission mechanism for data gathering panel 10 is the universal asynchronous receiver transmitter 114 shown in FIG. 3F. This transceiver receives serial data over input terminal CC from the receiving network shown in FIG. 3G. Transceiver 114 converts the serial data into parallel information on its output lines D0–D7 for supply to microcomputer 11.

Figure 3G:
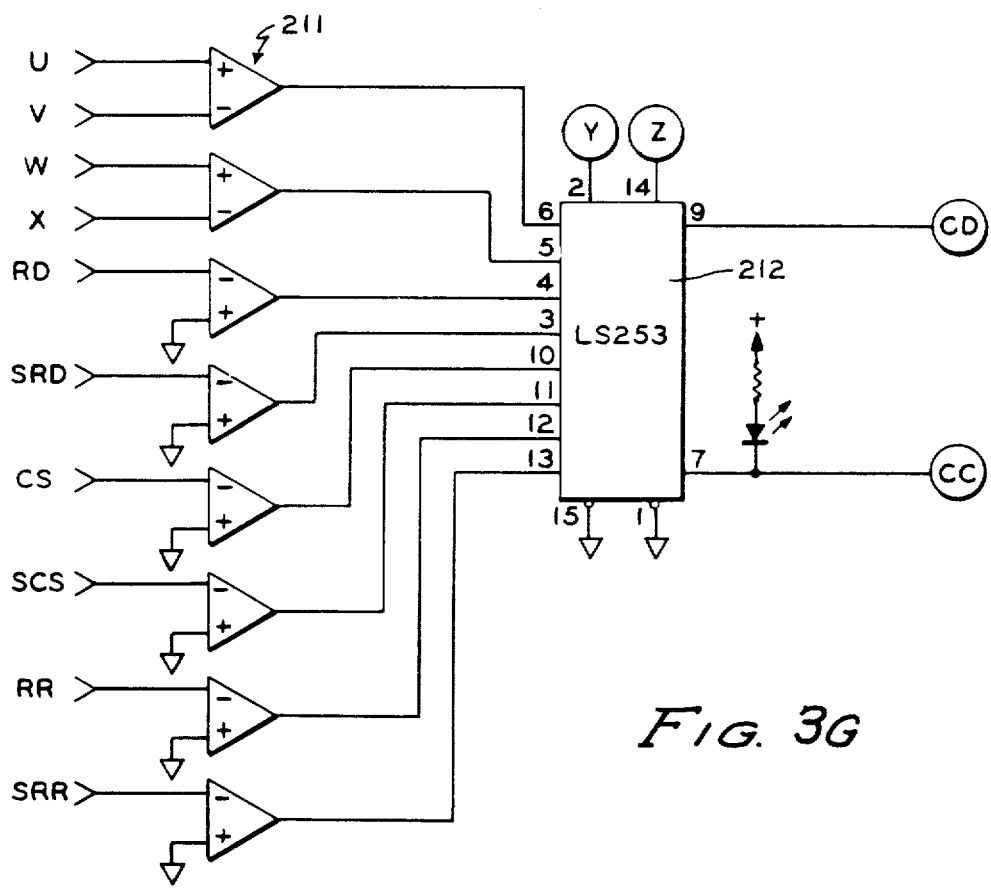
Figure 3H:
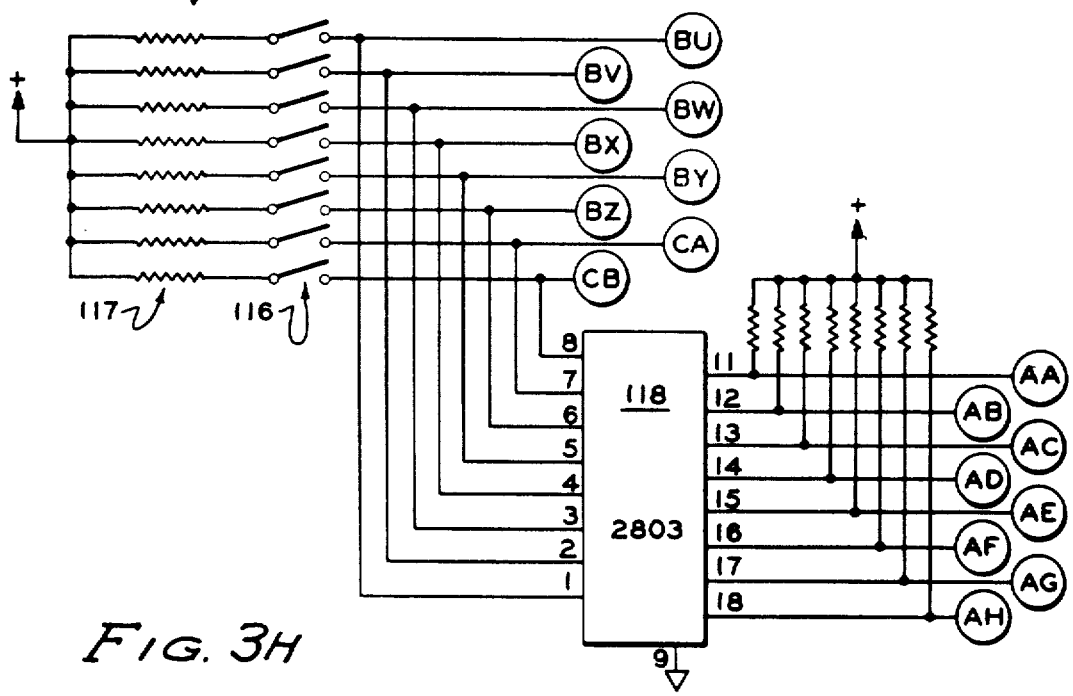

A flexible transmission hardware configuration is provided on data gathering panel 10 that allows receiving and sending data on four send and four receive channels. One channel is used for sending and another for receiving at any given time. The data gathering panel 10 has a flexible transmission interface that supports three distinct transmission interfaces which include an RS422 transmission system which is a 5 volt differential line driver/receiver, an RS232/RS449 point-to-point modem and a 600 baud tone modem. The bottom two switches of switchbank 116 shown in FIG. 3H are used to select the particular option or hybrid of these options. The RS422 interface is a balanced differential voltage signalling method. Up to eight data gathering panels can reside on a RS422 line with multi-point signalling being transmitted over one twisted pair of wires per channel. Channel signalling rate is 2400 baud nominally but can be jumpered to 9600, 2400 or 1200 baud using the jumper terminal set 201 shown in FIG. 3I, with the 300 jumper terminals translating to 1200 baud, the 600 terminals translating to 2400 baud, the 1200 terminals translating to 4800 baud and the 9600 terminals translating to 9600 baud.

The RS232/RS449 interface is used to communicate to 600 baud and customer provided modems. As shown in FIG. 3G, the RD terminal is the receive data terminal, the SRD terminal is the secondary receive data terminal, the CS terminal is the clear to send terminal, the SCS is the secondary clear to send terminal, the RR terminal is the receiver ready terminal, and the SRR is the secondary receiver ready terminal. Likewise, in the transmitter portion (FIG. 3I), the SD terminal is the send data terminal, the SSD terminal is the secondary send data terminal, the RS terminal is the request to send terminal and the SRS terminal is the secondary request to send terminal. When the RS232 interface is used, the 300 jumper terminals stand for 300 baud, the 600 jumper terminals stand for 600 baud, the 1200 jumper terminals stand for 1200 baud and the 9600 jumper terminals stand for 2400 baud. Since the jumper terminals 201 stand for different baud rates depending on the interface selected, it is these jumper terminals together with the bottom two switches of switch bank 116 which will determine the actual baud rate.

Figure 3I:
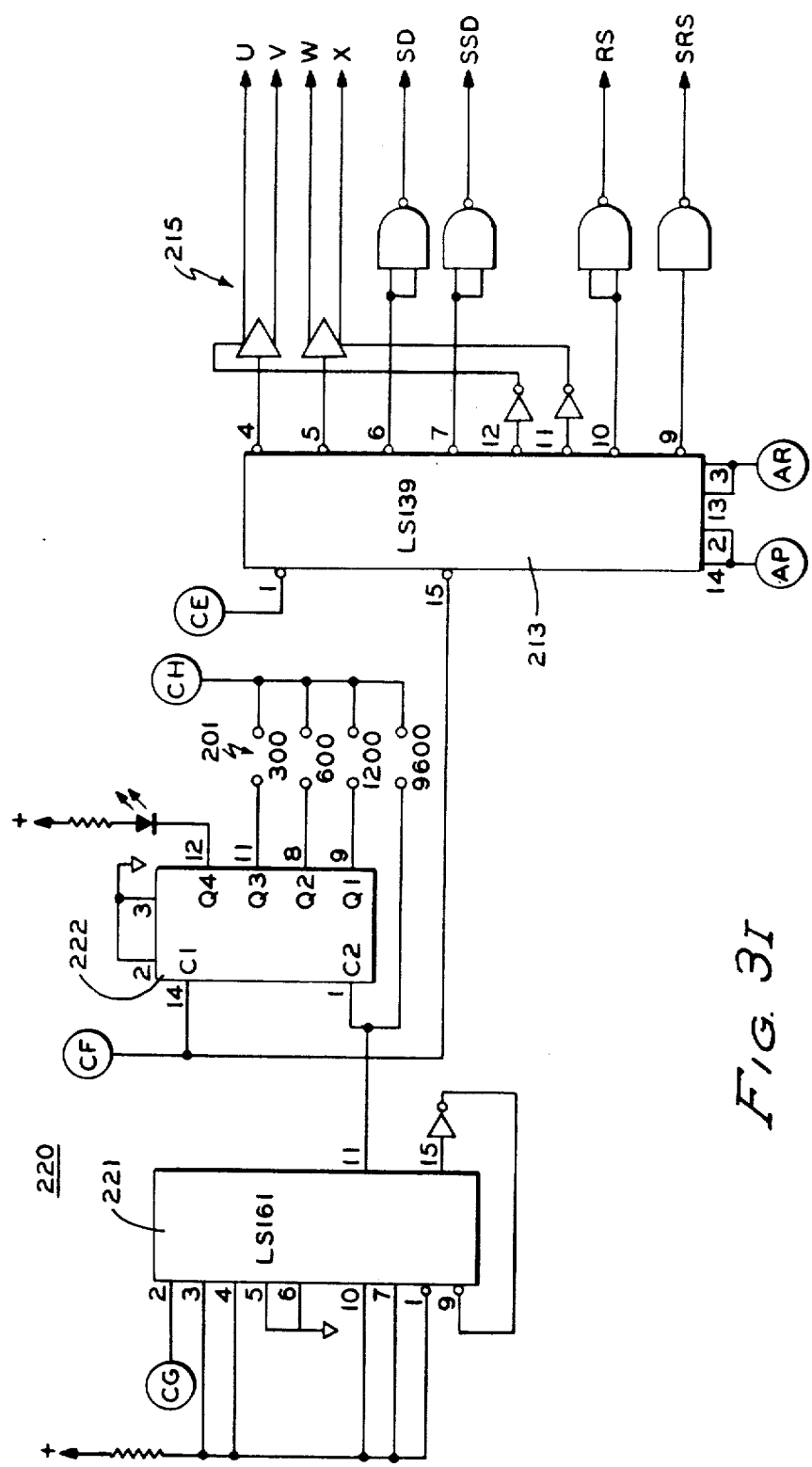
Figure 3K:
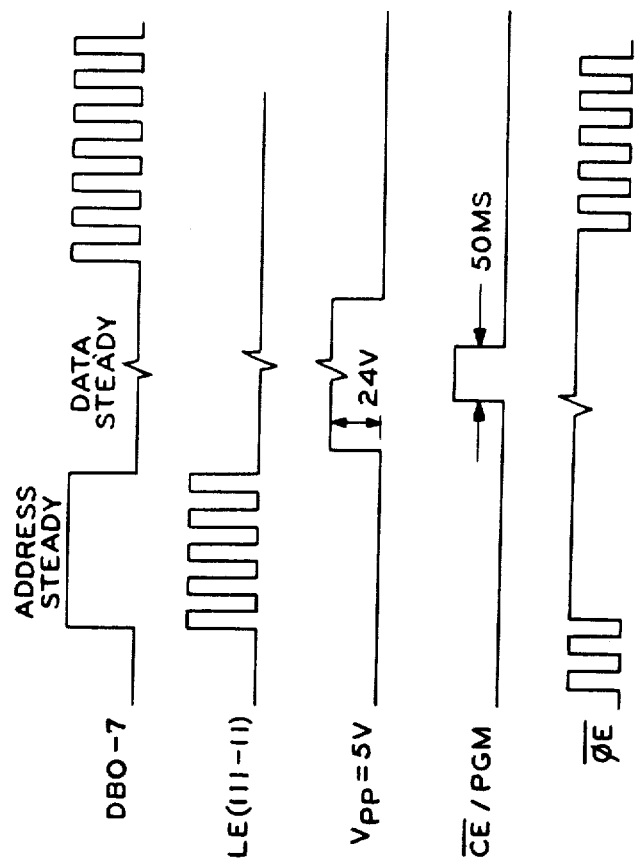
Figure 3J:
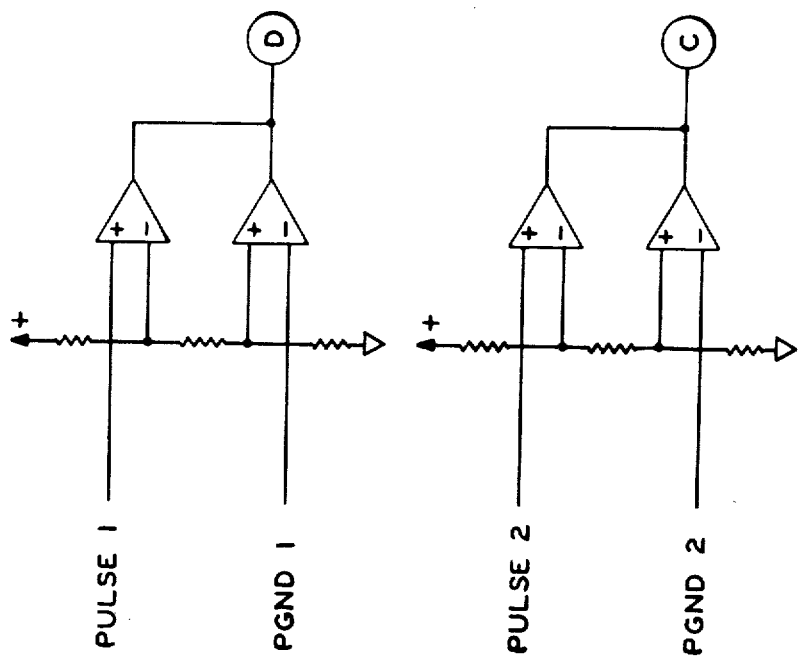

As shown in FIG. 3G, the four channels to which data gathering panel 10 may be connected are represented by the letters U and V, W and X, RD, and SRD. This is also shown in FIG. 3I for outgoing data. The remaining lines shown in FIG. 3G are the control lines from the modem interface. In the case of the RS422 interface, only U and V or W and X are used for the transmission of data. In the case of the RS232 interface, data is received on RD or SRD and transmitted via SD or SSD to and from modems. The RR, SRR, CS, SCS, RS and SRS terminals are used to control the modems. Control terminals from the modems and the four input channels are connected to line receivers 211 and then through multiplexer 212 to transceiver 114 shown in FIG. 3F for connection to microcomputer 11. On the transmission side, the data is supplied from the microcomputer to transceiver 114 which then supplies the data through multiplexer 213 and then through drivers 215 to the output channels and control lines. The control terminals Y and Z of multiplexer 212 in FIG. 3G are derived from corresponding outputs of port expander 81 shown in FIG. 3B. The control lines AP and AR of multiplexer 213 shown in FIG. 3I are also derived from port expander 81. The enable terminal CE of multiplexer 213 is derived from transceiver 114 as is the enable terminal CF of counter 222.

As discussed above, jumper terminals 201 determine the receive and transmit baud rate for data gathering panel 10. These jumpers act in conjunction with bit rate timer 220 for controlling this baud rate. Bit rate timer 220 is comprised of four bit binary counter 221 which receives a clock signal from the output clock signal at pin 1 for microcomputer 11. The output of counter 221 is fed through a further counter 222 for providing the receive and transmit clock signal to transceiver 114 over terminal CH.

The software for accomplishing the hex slope conversion and for allowing the programming and reconfiguration of memory 18 is attached as the Appendix hereto.

```
    LOC  OBJ         LINE        SOURCE STATEMENT

1  ;
                       2  $TITLE('540-FIRMWARE REV.G DATED FEB 04, 1981 .BR,   .')
                       3  ;*********************************************************************
                       4  ;
                       5  ;          540 DGP REV G, WITH 4K O.S. AND 1K BYTES OF DATA FILES
                       6  ;          UNUSED LOCATIONS IN PROMS ARE FILLED WITH FF CODE
                       7  ;
                       8  ;*********************************************************************
                       9  ;          REV.E   REVISED TO MAKE LOGIC CORRECTIONS IN
                      10  ;          THE PROM-BURNING FUNCTION DATED JULY 16,80
                      11  ;REV.F:   CLASS-B SWITCH SELECTION, LOGIC CHANGED
                      12  ;          IF CLASS-B SELECTED, LINE SWITCH IS DISABLED
                      13  ;          ADDRESS IS LIMITED FROM GRP 1 THRU' 15
                      14  ;          ADDX, LINFSW ROUTINES REVISED ON AUG.12,80
                      15  ;          SWITCH 251 BIT8=1 MEANS CLASS=A; BIT8=0 IS CLASS-B
                      16  ;          540 REPEATER LOGIC ADDED, 9-05-80
                      17  ;          AFTER THE PROM BURN, DISABLE ALL THE ACTIVITIES
                      18  ;REV. ON 10-14-80.THIS IS DONE BY SETTING A NEW FLAG
                      19  ;          IN WS BIT6, CALLED PROM-BURN FLAG.ALL THE EXEC. ACTIVITIES
                      20  ;          BUT THE TSMN TASK , BIT0, ARE DISABLED. ALSO .NO COS ARE
                      21  ;          PROCESSED AFTER RECEIVING AN I'M OK, INSTEAD RESPOND WITH
                      22  ;          AN I'M OK. EVERY THING ELSE WOULD FUNCTION NORMALLY.
                      23  ;          CHECK FOR VALID CONTROL BYTE ,GROUP ADDRESS, AND VALID
                      24  ;          LENGTH OF MESSGE LOGIC ADDED AS PART OF REC LOGIC.
                      25  ;REV.OCT.16     DELAY BETN. XMSN OF BYTES IS 4 MS, THIS IS
```

```
26 ;           DONE TO AVOID TEMPORARILY ANY OVER-RUN ERRORS
27 ;REV.NOV.05  REPEATER LOGIC CORRECTION IMPLEMENTED.
28 ;REV.DEC.04  560-540 NO RESPONSE AND ERROR PROBLEM RESOLVED.
29 ;            FOR RS-422 TRANSMISSION, 540 STRAPPING WILL
30 ;            BE FIXED AT 2400 BAUD, THIS ENABLED EIAIF BOARD
31 ;            SOFTWARE DELAYS TO BE ELIMINATED.
32 ;            ALSO THE 422 LINES ARE CONDITIONED TO SEND MESSAGE
33 ;            IF THE TRANSMISSION IS FOR THIS REMOTE FOR 4.5 MS.
34 ;            BEFORE THE MESSAGE IS ACTUALLY TRANSMITTED, THIS IS ALSO
35 ;            REQUIRED FOR EIA BOARD TO TURN AROUND TO RECEIVE
36 ;            THE 540-RESPONSE.
37 ;            THE NET THROUGHPUT TO REMAIN THE SAME AS
38 ;            BEFORE, AND FREE UP A LOT OF PROCESS TIME IN
39 ;            THE 8085A PROCESSOR ON THE EIAIF BOARD.
40 ;
41 ;
42 ;NOTE: 9600 AND 4800 BAUDS NOW READ AS 2400 BAUD IN THE COMMENTS.
43 ;
44 ;REV G: JAN 6, 81.  ENABLED FS20 LOGIC. CORRECTIONS AND ADDITIONS ALSO MADE.
45 ;            CHANGED D/A OFFSET FOR "RRR"=100 TO 2.1V FOR EACH INTEGRATION.
46 ;REV G: JAN 19, 1981. CHANGED FS20 LOGIC SO THAT THE DATA FROM THE FS MODULES
47 ;            HAS A "HOME" IN THE "DIGSI" AREA. THE DIGITAL INPUT MASK IS
48 ;            MODIFIED SO THAT BYTE 5 CONTAINS THE NUMBER OF FS20 MODULES
49 ;            CONNECTED AND THE ID NUMBER ASSIGNED TO THE FIRST POINT.
50 ;            THAT ID NUMBER IS CHOSEN TO BE SUCH THAT THE FIRST FS20 DATA
51 ;            POINT FALLS INTO THE FIRST POSITION OF A NEW DATA BYTE IN THE
52 ;            DATA STREAM. CHANGED "RRR"=100 OFFSET TO 2.5V.
53 ;REV G: JAN 22, 1981. FIXED FS20 RELAY OPERATION AND MISCELLANEOUS ERRORS IN
54 ;            THE PREVIOUS ASSEMBLY.
55 ;REV G: JAN 26, 1981.  RELOCATED COSEM ROUTINE, ADDED CODE TO DETERMINE
56 ;            CONDITION OF FS20 MODULES WITHOUT CLEARING COS.
57 ;FEB.04,81:  ANALOG CONVERSION PROCESS HAS A TIMING PROBLEM WHEN
58 ;            INT AND T1 INTERRUPTS OCCURED AT THE SAME TIME DURING
59 ;            THE OVERFLOW CHECK OF THE TIMER IN POLLING MODE. THIS
60 ;            IS DUE TO THE FACT BOTH THE TIMERS ARE ASYNCHRONOUS AND
61 ;            IT IS POSSIBLE TO MISS AN OVERFLOW COUNT RESULTING IN
62 ;            "HOLES" IN THE FINAL HEX READINGS . THIS HAS BEEN
63 ;            RECTIFIED ,AS AFIRMWARE SOLUTION, IN THIS REVISION.
64 ;            THIS CONSISTS OF MAKING A CHECK OF THE TIMER VALUES
65 ;            WITH PROCESS TIME CALCULATIONS AND BY MAKING INT SIGNAL
66 ;            PROCESSED UNDER INTERRUPT CONTROL AND TOTALLY ELIMINATING
67 ;            THE POLLING ROUTINES DURING GS3 PHASE OF DUAL SLOPE
68 ;            INTEGRATION. THERE IS STILL SOME CHANCES OF SMALL ERRORS
69 ;            IN THIS APPROACH,BUT AVOIDS ANY BIG HOLES IN THE RANGE
70 ;            OF MEASUREMENTS ABOVE ALL NO HARDWARE SWD REQUIRED.
71 ;            THIS BEING CHANGE IN THE INT PROCESSES,THE CODE HAS
72 ;            TO RESIDE IN MEMORY BANK 0 ONLY.
73 ;
74 ;************************************************************
75 ;
76 ;     Z-20    8748-PROM PART# 14504295-004
77 ;
78 ;     Z-18    2732-PROM PART #14504246-004
79 ;
80 ;************************************************************
81 $EJECT
82 ;
83 ;     THE FOLLOWING SECTION DEALS WITH A PROCEDURE TO MAKE ANY
84 ;     CHANGES TO 540 SOURCE CODE, CHECK OUT AFTER ANY LOGIC CHANGES,
85 ;     MAKING MASTER EPROMS, AND UPDATING THE CONTROL DOCUMENTATION
86 ;
87 ;1.TO MAKE CHANGES IN THE SOURCE CODE:
88 ;     THE FOLLOWING EQUIPMENT IS NEEDED: INTEL'S MDS SYSTEM MODEL 230
89 ;     OR EQUIVALENT, LATEST 540.SRC DISK, ASM4A SYSTEM DISK
90 ;     USING THE CREDIT FACILITY OF INTEL, LOAD THE 540.SRC INTO THE MDS,
91 ;     UPDATE THE REVISION LETTER, DATE CODE AND DESCRIBE THE CHANGE TO BE
92 ;     MADE AND PROVIDE THE P-CODE WHEREEVER THE CHANGES ARE MADE.
93 ;     TO ASSEMBLE THE ABOVE CODE USE A SEPARATE DISK TO STORE THE 540.LST,
94 ;     COPY THE EDITED 540.SRC ONTO THE 540 SYSTEM DISK
95 ;     START THE ASSEMBLY BY ISSUING THE COMMAND
96 ;     "ASM48 540.SRC DEBUG XREF PRINT(:F1:540.LST)"
97 ;     WHEN THE ASSEMBLY IS COMPLETE THE 540.HEX WOULD END UP ON THE
98 ;     SYSTEM DISK AND THE 540.LST ON THE DRIVE 1 DISK
99 ;
100 ;2.  CHECK OUT AFTER AN ASSEMBLY
101 ;    EFFORT SHOULD BE MADE TO CHECK OUT ALL THE 540 FUNCTIONS
102 ;    TO EXERCISE THE ENTIRE CODE. AS A MINIMUM THE FOLLOWING
103 ;    FUNCTIONS SHOULD BE CHECKED OUT:
104 ;    NEW EPROMS SHOULD BE BURNT. DATA FILE PROGRAMMED TO CONTAIN
105 ;    ALL TYPES OF DATA FILES.
106 ;    CHECK OUT ALL ANALOG TYPE INPUTS,OUTPUTS,DIGITAL INPUTS
107 ;    DIGITAL OUTPUTS, PULSE TYPE INPUTS,THRESHOLD INPUTS ETC.
108 ;    CHECK OUT TRANSMISSION TYPES RS-422, RS-232 MODEM AND 600
109 ;    BAUD TONE AND REPEATER INTERFACES.
110 ;
111 ;3.  PROCEDURE TO BURN EPROMS.
112 ;    WE NEED AN INTEL'S UNIVERSAL PROM PROGRAMMER, BLANK EPROMS--
113 ;    8748 AND 2732 --,SYSTEM DISK WITH THE LATEST 540.HEX CODE
114 ;    LOAD IN THE 540.HEX BY ISSUING THE COMMAND
115 ;    "READ HEX FILE 540.HEX INTO 0"
116 ;    ENTER THE *TYPE=8748 AND *SOC=1
117 ;    WE ARE NOW READY TO BURN 8748 EPROM.ISSUE THE COMMAND
118 ;    AFTER A BLANK EPROM IS PLACED IN THE SOCKET 1
119 ;    "PRO FRO 0 TO 3FFH STA 0"
120 ;    MAKE FIVE SUBMASTERS AND TWO MASTER SETS TO RELEASE TO PRODUCTION.
121 ;    TO BURN 2732 EPROMS, WE HAVE TO LOAD BLANK CODE INTO THE FIRST
122 ;    1000 LOCATIONS .
123 ;    TYPE IN *TYPE=2732 AND *SOC=2 FOR THE 2732 EPROMS.
124 ;    PLACE A BLANK 2732 EPROM IN SOCKET 2 AND ISSUE THE COMMAND
125 ;    "INA FRO 0 TO 3FFH"
126 ;    THEN ISSUE THE COMMAND "PRO FRO 0 TO 0FFFH STA 0".
127 ;    MAKE TWO MASTERS AND FIVE SUB-MASTERS.
128 ;    LABEL THE EPROMS WITH THE LATEST DASH# AND DATE CODE.
129 ;
```

```
       130 ;4.   UPDATE CONTROL DOCUMENTATION
       131 ;     UPDATE MASTER CONTROL DOCUMENTATION
       132 ;     UPDATE THE APPLICABLE ESN IF NECESSARY
       133 ;     UPDATE THE SOUCE HISTORY DISK
       134 ;     COPY THE 540.SRC, 540.HEX AND 540.LST FILES
       135 ;     ONTO A BLANK DISK FOR VAULT
       136 ;
       137 ;*************************************************************
       138 ;#############################################################
       139 ;
       140 SEJECT
       141 ; TM                                540 DGP
       142 ;
       143 ;
       144 ;
       145 ;MEMORY MAP (INTERNAL)
       146 ;
       147 ;
       148 ;   MNEUMONIC     BYTE           DEFINITION
       149 ;                                REGISTER BANK 0
       150 ;R0            0                 SCRATCH
       151 ;R1            1                    .
       152 ;R2            2                    .
0003   153 REG3    EQU   3                  ;  .
       154 ;R4            4                    .
       155 ;R5            5                 TASK REQUEST BUFFER
       156 ;R6            6                 TRANSMISSION MODE
       157 ;R7            7                 WORD COUNT
       158 ;STACK         8-13              6 LEVEL SUBROUTINE STACK
0014   159 ADTMP   EQU   14H                ;ANALOG TEMPORARY STORE
       160 ;             15H                   .
0016   161 ADTMP1  EQU   16H                ;ANALOG TEMPORARY STORE
       162 ;             17H                   .
       163 ;                                REGISTER BANK 1
       164 ;R0            18                SCRATCH
       165 ;R1            19                   .
001A   166 REG2    EQU   1AH                ;  .
       167 ;R3            1B                MS COUNT FROM TIMER (14 BIT DOWN COUNT)
       168 ;R4            1C                LS COUNT FROM TIMER (14 BIT DOWN COUNT)
       169 ;R5            1D                SAVED ACCUMULATOR
       170 ;R6            1E                SAVED OPEN PORT
       171 ;R7            1FH               INT/ ENTRY PT INTO CONVERSION ROUTINE
       172 ;
       173 ;                                INTERNAL MEMORY
       174 ;
       175 ;
0020   176 ADDRES  EQU   20H                ;HARDWARE ADDRESS: RAAAAFTT  WHERE A=ADDRESS,
       177 ;                                   B=0 IS CLASS-B,AND B=1 CLASS-A
       178 ;                                   T=01  RS422;  1;  RS232
       179 ;                                   T=2:  RS422 (A) CLASS-A REPEATER
       180 ;                                   T=3:  RS232 (A), RS422 (A) REPEATER
       181 ;                                   F=0:  NO FS PANELS;  1:  FS PANELS
       182 ; NOTE* THE REPEATER WILL HAVE THE SAME BAUD RATE AS THE PRIMARY 540
       183 ;       CONNECTED TO THE 560 ,NAMELY 1200 BAUD(MODEMS) OR 600 BAUD TONE.
0021   184 CKSM    EQU   21H                ;CHECKSUM
0022   185 TSMPTR  EQU   22H                ;TRANSMISSION BUFFER PTR (CURRENT)
0023   186 TDELAY  EQU   23H                ;TRANSMIT DELAY (PER CYCLE WAIT).
0024   187 LINE    EQU   24H                ;LINE SELECT AND PORT SELECT
0025   188 SECOND  EQU   25H                ;4 MS CLOCK
0026   189 EIP     EQU   26H                ;EIP STATUS
0027   190 TOTLST  EQU   27H                ;TOTALIZER LAST STATUS 1 OR 0
0028   191 TOTINC  EQU   28H                ;TOTALIZER INCREMENT FLAG 1=> INCREMENT
       192 ;
       193 ;#############################################################
       194 ;
0029   195 COSBUF  EQU   29H                ;CHANGE OF STATE FLAG => NONZERO=COS
       196 ;                                ;BIT 7=1=> DIGITAL COS.
       197 ;                                ;BIT 6=1=> ANALOG COS.
       198 ;                                ;BIT 5=1=> FS20 FAILURE, GO OFF LINE. 1/16/81
       199 ;
       200 ;#############################################################
002A   201 RFSH    EQU   2AH                ;ANALOG REFRSH ENTRY
002B   202 WATCHD  EQU   2BH                ;WATCHDOG CLOCK
002C   203 WATCHE  EQU   2CH                ;   .
002D   204 WATCHF  EQU   2DH                ;   .
002E   205 RLYCT   EQU   2EH                ;PULSED RELAY INACTIVE COUNTER
002F   206 TOTIMR  EQU   2FH                ;RUN TIME TIMER
0030   207 ANALOG  EQU   30H                ;ANALOG IN PROCESS DATA FILE
       208 ;                                   .
0035   209 SPAN    EQU   35H
       210 ;
0038   211 DIGITL  EQU   38H                ;DIGITAL IN PROCESS DATA FILE
       212 ;                                   .
003C   213 MSBIT   EQU   3CH
       214 ;                                   .
       215 ;             3FH                   .
       216 SEJECT
       217 ;MEMORY MAP (EXTERNAL)-----256 BIT MEMORY IN 8155 IC
       218 ;
       219 ;   MNEUMONIC     BYTE           DEFINITION
       220 ;
0000   221 TSMBUF  EQU   0                  ;TRANSMISSION BUFFER
0001   222 MSG     EQU   1                  ;START OF MESSAGE
0002   223 LENGTH  EQU   2                  ;MESSAGE LENGTH
0003   224 EXT     EQU   3                  ;CONTROL EXTENSION BYTE
0004   225 INFO    EQU   4                  ;INFORMATION BYTE
       226 ;                                   .
       227 ;                                   .
       228 ;             47H                   .
0048   229 TMPLT   EQU   48H                ;TEMPLATE BYTES
       230 ;                                   0: ANALOG QTY, 1: DIGITAL QTY
       231 ;#############################################################
       232 ;
```

```
004A           233 ANAST   EQU     4AH             ;ANALOG VALUES 1 TO 28 (INCLUDES TOTALIZERS
               234 ;                                              AND RUN TIMES)
               235 ;
               236 ;********************************************************************
               237 ;
               238 ;
               239 ;
0082           240 DIGST   EQU     82H             ;DIGITAL STATUS (0-24--4 PER BYTE) 6BYTES
               241 ;
               242 ;
008E           243 SLFCAL  EQU     8EH             ;SELF CAL STATUS (X1)(8 BITS ONLY)
               244 ;               8FH             ;SELF CAL STATUS (X10)
0090           245 DIGPT   EQU     90H             ;DIGITAL PT DATA FILE
               246 ;
               247 ;
0080           248 ANAPT   EQU     0B0H            ;ANALOG PT DATA FILE
               249 ;
               250 ;
00D0           251 DIGDLY  EQU     0D0H            ;DIGITAL DELAY STORE (ONLY ON BOARD DRIVERS)
00E0           252 ANAID   EQU     0E0H            ;ANALOG OUTPUT REFRESH VALUE
               253 ;
               254 ;
00F0           255 ANAIN   EQU     0F0H            ;CURRENT ANALOG INPUT BEING CONVERTED
               256 ;               0F1H            ;       CURRENT ANALOG ENTRY PT
00F2           257 RLYSCH  EQU     0F2H            ;PULSED RELAY ENTRY PT
00F3           258 TOTSCH  EQU     0F3H            ;CURRENTLY PROCESSED TOTALIZER INPUT
00F4           259 TOTASS  EQU     0F4H            ;ASSIGNED TOTALIZERS
00F5           260 TOTRUN  EQU     0F5H            ;TOTALIZER=0, RUNTIME=1
00F6           261 TOTACT  EQU     0F6H            ;COUNT ACTIVE=1
00F7           262 TABLE0  EQU     0F7H            ;INTERPOLATION TABLE PTRS
00F8           263 TABLE1  EQU     0F8H
00F9           264 TABLE2  EQU     0F9H
00FA           265 TABLE3  EQU     0FAH
00FB           266 DIGMSK  EQU     0FBH            ;DIGITAL INPUT DATA FILE LOCATION
00FC           267 DUMMY   EQU     0FCH            ;RESULT OF THRESHOLD CONVERSION AND DUMMY LOCATION
               268 ;               0FDH            ;SPARE
               269 ;               0FEH            ;SPARE
00FF           270 NRTMR   EQU     0FFH            ;540-REPEATER NO RESPONSE TIMER
               271 $EJECT
               272 ;
               273 ;
               274 ;HARDWARE PORT ADDRESSES---USED TO OPEN HARDWARE PORT
               275 ;
0000           276 XRAM1   EQU     00H             ;RAM OPEN, PROM DISABLED
0080           277 XRAM    EQU     80H             ;EXTERNAL RAM MEMORY (256 BYTES)
0090           278 UART    EQU     90H             ;TRANSMISSION INTERFACE PORT
00A0           279 RLYB1   EQU     0A0H            ;RELAY BANK 1--DIGOUT 8-15
00B0           280 RLYB0   EQU     0B0H            ;RELAY BANK 0--DIGOUT 0-7
00C0           281 DIGIN   EQU     0C0H            ;DIGITAL INPUTS 0-5
00D0           282 DIGIN1  EQU     0D0H            ;DIGITAL INPUTS 6-11
00E0           283 DIGIN2  EQU     0E0H            ;DIGITAL INPUTS 12-17
00F0           284 DIGIN3  EQU     0F0H            ;DIGITAL INPUTS 18-23
00A8           285 ANACP   EQU     0A8H            ;ANALOG CONTROL PORT
0060           286 DATAID  EQU     0H0H            ;PROM INPUT ENABLE
0070           287 PROG    EQU     070H            ;PROM PROGRAM PULSE ENABLE
               288 ;
               289 ;
               290 ;TRANSMISSION DEFINITIONS
               291 ;          T
               292 ;                 T
               293 ;
               294 ;          C                                             6       XRAM
               295 ;
               296 ;          IOPORT 6--XRAM OPEN
               297 ;
000A           298 IN232   EQU     00001010B       ;RS232 RECEIVE
0002           299 OUT232  EQU     00000010B       ;RS232 TRANSMIT
0000           300 IN422   EQU     00000000B       ;RS422 RECEIVE
0000           301 OUT422  EQU     00000000B       ;RS422 TRANSMIT
               302 ;          UART OPEN
0000           303 UARTIO  EQU     0               ;UART INPUT/OUTPUT ADDRESS
0001           304 UARTCS  EQU     1               ;UART CONTROL/STATUS ADDRESS
               305 ;          COMMAND WORD
0080           306 EH      EQU     10000000B       ;ENTER HUNT MODE (NOT USED)
0040           307 IR      EQU     01000000B       ;INTERNAL RESET =>SET TO MODE FORMAT
0020           308 RTS     EQU     00100000B       ;"1" ENABLES TRANSMIT
0010           309 RESET   EQU     00010000B       ;RESET ERROR FLAGS (PE,OE,FE)
0008           310 SBRK    EQU     00001000B       ;SEND BREAK (FORCES OUTPUT SPACE)
0006           311 RXE     EQU     00000110B       ;RECEIVE ENABLE (TURNS ON DATA INPUT)
0001           312 TXEN    EQU     00000001B       ;TRANSMIT ENABLE
               313 ;          STATUS WORD
0080           314 DSR     EQU     10000000B       ;DATA SET READY (DR OR CTS)
0038           315 ERROR   EQU     00111000B       ;FRAMING, OVERRUN, AND PARITY ERRORS
0004           316 TXE     EQU     00000100B       ;TRANSMITTER EMPTY
0002           317 RXRDY   EQU     00000010B       ;RECEIVE DATA READY
0001           318 TXRDY   EQU     00000001B       ;TRANSMIT ENABLE
               319 ;          MODE INSTRUCTION
0040           320 ST      EQU     01000000B       ;STOP BIT SELECT => 1 STOP BIT
0000           321 PARITY  EQU     00000000B       ;ODD PARITY
0010           322 PEN     EQU     00010000B       ;PARITY ENABLE
000C           323 CHARL   EQU     00001100B       ;CHARACTER LENGTH => 8 BITS
0002           324 B9600   EQU     00000010B       ;9600 BAUD SELECT
0003           325 B1200   EQU     00000011B       ;300, 600, OR 1200 BAUD SELECT
005E           326 TF96    EQU     ST+PARITY+PEN+CHARL+B9600       ;9600 BAUD TRANSMIT FORMAT
005F           327 TF12    EQU     ST+PARITY+PEN+CHARL+B1200       ;1200 BAUD TRANSMIT FORMAT
               328
               329 ;
               330 ;
               331 ;
               332 ;
               333 ;
               334 ;ANALOG I/O DEFINITIONS
               335 ;       THE 8155 I/O PORT IS ENABLED BY THE ANALOG CONTROL PORT ENABLE
```

```
                    336 ;         THIS PORTS INCLUDES 3 I/O PORTS AND A TIMER WITH CONTROL PORT
                    337 ;         PORTA IS USED TO INPUT THE ADDRESS AND TRANSMISSION MODE OF THE
                    338 ;         540 DGP.
                    339 ;
                    340 ;         TIMER IS A DOWN COUNTER (14 BITS) CLOCKED AT 1.997MHZ
                    341 ;         MAXIMUM REP RATE FOR COUNTER IS 2.735 MS
                    342 ;
0000                343 ANACS    EQU     0                       ;ANALOG CONTROL BYTE PTR
0001                344 PORTA    EQU     1
0002                345 PORTB    EQU     2                       ;ANALOG INPUT/OUTPUT SELECT AND ADDRESS
0003                346 PORTC    EQU     3                       ;D/A OUTPUT MS NIBBLE
0004                347 TIMERL   EQU     4                       ;TIMER REGISTER LS BYTE
0005                348 TIMERH   EQU     5                       ;TIMER REGISTER MS 6BITS + CONTROL MODE
                    349 ;                                                MMTTTTTT => M=
                    350 ;                                                         0:LOW IN SECOND HALF OF COUNT
                    351 ;                                                         1:SQUARE WAVE
                    352 ;                                                         2:SINGLE PULSE ON TERMINAL CT
                    353 ;                                                         3:SINGLE PULSE WITH AUTO RELOAD
                    354 ;                       COMMAND WORD
00CF                355 IODEF    EQU     11001111B               ;PORT A,B,C AS OUTPUTS AND START CNTR
00CF                356 STRTCT   SET     11001111B               ;START COUNTER
004F                357 STOPCT   SET     01001111B               ;STOP COUNTER
                    358 ;
                    359 $EJECT
0000                360          ORG     0
0000 F5             361          SEL     MB1                     ; GO TO MEM BANK 1
0001 8425           362          JMP     START                   ;ENTRY PT FOR HARDWARE RESET
0003                363          ORG     3
0003 046E           364          JMP     INTPR                   ;ENTRY PT FOR INT/ INTERRUPT
0005 FF             365          DB      0FFH,0FFH               ;REV.1-26-81
0006 FF
0007                366          ORG     7                       ;REV1 1-26-81
                    367 ;
                    368 ;*****************************************************************
                    369 ;         T1 INTERRUPT PROCESS REV.1-26-81
                    370 ;         AFTER INCREMENTING R7
                    371 ;         IF R7=11H THEN STOP TIDMER
                    372 ;                 IF F1 IS SET
                    373 ;                         THEN EXIT WITHOUT READING TIMER VALUES
                    374 ;                 ELSE READ TIMER VALUES
                    375 ;                 AND CHECK IF OVERFLOW MISSED
                    376 ;                         IF R3,R4 VALUES+02CF= CARRY SET THEN OVERFLOW IS
                    377 ;                 MISSED.
                    378 ;                 ELSE    JUMP TO CONVRT ROUTINE
                    379 ;
                    380 ;*****************************************************************
                    381 ;
002A                382 LOLMT    EQU     02AH                    ;FOR TESTING LIMITS TO DETECT MISSED
0003                383 HILMT    EQU     003H                    ; OVERFLOW COUNT
                    384 ;
0007 D5             385 TINTP:   SEL     RB1                     ;SELECT INTERRUPT REGISTER BANK
0008 AD             386          MOV     R5,A                    ;SAVE A-REG
0009 0A             387          IN      A,P2                    ;SAVE OPEN PORT
000A AE             388          MOV     R6,A
000B 15             389          DIS     I
000C 1F             390          INC     R7                      ;DIS I, AND INCR R7
000D 2388           391          MOV     A,#ANACP                ;OPEN TIMER PORT
000F 3A             392          OUTL    P2,A
0010 FF             393          MOV     A,R7                    ;IS R7=10H?
0011 D310           394          XRL     A,#10H                  ;IF SO RELOAD TIMER, JUMP TO DS3
0013 C657           395          JZ      TINT50
0015 FF             396          MOV     A,R7                    ;IS R7=11H
0016 D311           397          XRL     A,#11H
0018 C61C           398          JZ      TINT10  ;YES
001A 241E           399          JMP     CNVRT   ; ON PAGE 1
001C 8804           400 TINT10:  MOV     R0,#TIMERL              ;STOP TIMER
001E 8900           401          MOV     R1,#ANACS
0020 234F           402          MOV     A,#STOPCT
0022 91             403          MOVX    @R1,A                   ;STOPPED TIMER
0023 763F           404          JF1     TINT20                  ;IS F1 SET?
0025 80             405 TINT30:  MOVX    A,@R0                   ;READ TIMER VALUES
0026 AC             406          MOV     R4,A                    ;SAVE IN R3,R4
0027 18             407          INC     R0
0028 80             408          MOVX    A,@R0
0029 43C0           409          ORL     A,#0C0H                 ;SET R7,R6
002B AB             410          MOV     R3,A
002C 97             411          CLR     C                       ;CHECK IF R3,R4>FC83?
002D FC             412          MOV     A,R4
002E 132A           413          ADDC    A,#LOLMT                ;COMPL OF LOW LIMIT
0030 FB             414          MOV     A,R3
0031 1303           415          ADDC    A,#HILMT                ; AND HI LIMIT
0033 E651           416          JNC     TINTXX                  ;OVER FLOW NOT MISSED
0035 CA             417          DEC     R2                      ;OVERFLOW MISSED
0036 97             418 TINTYY:  CLR     C                       ; ADD 1C0H IFF OVERFLOW OCCURED
0037 FC             419          MOV     A,R4                    ; TO R3,R4 VALUES
0038 13C0           420          ADDC    A,#0C0H
003A AC             421          MOV     R4,A
003B FB             422          MOV     A,R3
003C 1301           423          ADDC    A,#01H
003E AB             424          MOV     R3,A
003F A5             425 TINT20:  CLR     F1                      ;CLEAR F1 FLAG
0040 B805           426 TINT40:  MOV     R0,#TIMERH              ;RELOAD TIMER CONSTANTS
0042 237F           427          MOV     A,#TIMEH
0044 90             428          MOVX    @R0,A
0045 B804           429          MOV     R0,#TIMERL
0047 23FF           430          MOV     A,#TIMEL
0049 90             431          MOVX    @R0,A
004A B800           432          MOV     R0,#ANACS
004C 23CF           433          MOV     A,#IODEF                ;RESTART TIMER
004E 90             434          MOVX    @R0,A
004F 2431           435          JMP     JCNVRT                  ;ON P.1
0051 FA             436 TINTXX:  MOV     A,R2                    ;WAS THERE AN OVERFLOW BEFORE?
0052 37             437          CPL     A                       ; IF SO ADD 1C0H 0 R3,R4
0053 9636           438          JNZ     TINTYY                  ; ELSE EXIT
```

```
0055 043F          419          JMP      TINT20
                   440 ;
                   441 ;***********************************************************
                   442 $EJECT
                   443 ;
007E               444 OTIMEH   EQU      07EH     ;TIMER VALUES LOADED AT THE END
003E               445 OTIMEL   EQU      03EH     ;OS3 PROCESS TO COMPENSATE TO GET 4.096MS.
                   446 ;                          AND ENABLE INTERRUPT    REV.1-26-80
                   447 ;
                   448 ;***********************************************************
                   449 ;
0057 B900          450 TINT50:  MOV      R1,#ANACS     ;STOP TIMER
0059 234F          451          MOV      A,#STOPCT
005B 91            452          MOVX     @R1,A
                   453 ;
005C B805          454 OS3A:    MOV      R0,#TIMERH    ;RELOAD TIMER TO GIVE 4.096 MS.
005E 237E          455          MOV      A,#OTIMEH     ;AT THE NEXT INT
0060 90            456          MOVX     @R0,A
0061 B804          457          MOV      R0,#TIMERL
0063 233E          458          MOV      A,#OTIMEL
0065 90            459          MOVX     @R0,A
0066 B800          460          MOV      R0,#ANACS
0068 23CF          461          MOV      A,#TODEF      ;START TIMER
006A 90            462          MOVX     @R0,A
006B 05            463          EN       I             ;ENABLE INTERRUPT
006C 2486          464          JMP      OS3
                   465 ;
                   466 $EJECT
                   467 ;***********************************************************
                   468 ;        INT PROCESS REV.1-26-81
                   469 ;        DURING OS3 PHASE OF DUAL SLOPE INTEGRATION
                   470 ;        INT IS ENABLED AND OVERFLOWS COUNTED UNDER INTERRUPTS
                   471 ;        THE TIMER IS LOADED WITH VALUES SUCH THAT 4.096 MS
                   472 ;        TIME OUT OCCURS PRECISELY
                   473 ;            IF NOT IN OS3 MODE WITH R7 NOT EQUAL TO 10,THEN
                   474 ;        PROCESS AS BEFORE
                   475 ;            THE VALUES LOADED INTO R3,R4 --WHEN F1 FLAG IS SET--
                   476 ;        ARE CALCULATED BY DIVIDING THE TIME WINDOW BETWEEN
                   477 ;        THE OCCURENCE OF INT. AND THE RESTARTING THE TIMER TO
                   478 ;        THREE EQUAL VALUES , , ,,DIVIDING THE "HOLE" OF
                   479 ;        OCCURENCE OF T1INT INTO 3 AND MINIMIZING THE ERROR
                   480 ;        INTRODUCED BY THIS SOLUTION.
                   481 ;
                   482 ;***********************************************************
                   483 ;
00FF               484 FTIMEH   EQU      0FFH     ;FIRST SAMPLE TIMER HI VALUE IN R3
0009               485 FTIMEL   EQU      009H     ;   "      "      "    LO   "    IN R4
00FF               486 STIMEH   EQU      0FFH     ;SECOND SAMPLE TIMER HI VALUE IN R3
001C               487 STIMEL   EQU      01CH     ;  "       "     "    LO  "    IN R4
007E               488 ITIMEH   EQU      07EH     ;INT TIMER 4.096 MS. CONSTANTS
003E               489 ITIMEL   EQU      03EH     ;ALLOWING FOR PROCESS TIME
                   490 ;
                   491 ;***********************************************************
006E 05            492 INTPR:   SEL      RB1
006F AD            493          MOV      R5,A          ;SAVE A AND OPEN PORT
0070 0A            494          IN       A,P2
0071 AE            495          MOV      R6,A
0072 2388          496          MOV      A,#ANACP      ;OPEN TIMER PORT
0074 3A            497          OUTL     P2,A
0075 FF            498          MOV      A,R7          ;IS R7=10H?
0076 D310          499          XRL      A,#10H
0078 C67C          500          JZ       INT10         ;YES.
007A 241E          501          JMP      CNVRT         ;NO, GO TO PREV. CLOCK ROUTINE
007C CA            502 INT10:   DEC      R2            ;GET AN OVERFLOW COUNT
007D B900          503          MOV      R1,#ANACS
007F 234F          504          MOV      A,#STOPCT     ;STOP TIMER
0081 91            505          MOVX     @R1,A
0082 4695          506          JNT1     INT20         ;SAMPLE T1 INPUT
0084 B805          507 INT30:   MOV      R0,#TIMERH
0086 237E          508          MOV      A,#ITIMEH     ;RELOAD TIMER VALUES
0088 90            509          MOVX     @R0,A
0089 B804          510          MOV      R0,#TIMERL
008B 233E          511          MOV      A,#ITIMEL
008D 90            512          MOVX     @R0,A
008E 23CF          513          MOV      A,#TODEF      ;START TIMER
0090 91            514          MOVX     @R1,A
0091 46AA          515          JNT1     INT40         ; SAMPLE T1 INTERRUPT SECOND TIME
0093 2433          516          JMP      INTE          ;EXIT
                   517 ;
                   518 ;        IF T1 IS HIGH
                   519 ;            CASE OF FIRST SAMPLE: LOAD R3,R4=FD,9BH
                   520 ;            CASE OF SECOND SAMPLE LOAD R3,R4=FD,25H
                   521 ;        AND SET F1
                   522 ;        ELSE EXIT TO INTE AFTER STARTING TIMER
                   523 ;
0095 B5            524 INT20:   CPL      F1            ;SET F1 FLAG
0096 23FF          525          MOV      A,#FTIMEH     ;FIRST SAMP VALUES
0098 AB            526          MOV      R3,A
0099 23D9          527          MOV      A,#FTIMEL
009B AC            528          MOV      R4,A
009C B805          529          MOV      R0,#TIMERH    ;RESET TIMER TO 3E15H FOR 4 MS
009E 237E          530          MOV      A,#07EH
00A0 90            531          MOVX     @R0,A
00A1 CB            532          DEC      R0
00A2 2315          533          MOV      A,#015H
00A4 90            534          MOVX     @R0,A
00A5 23CF          535          MOV      A,#TODEF      ;RESTART TIMER
00A7 91            536          MOVX     @R1,A
00A8 2433          537          JMP      INTE          ;EXIT FROM INT
                   538 ;
00AA B5            539 INT40:   CPL      F1            ;SECOND SAMPLE
00AB 23FF          540          MOV      A,#STIMEH
00AD AB            541          MOV      R3,A
00AE 231C          542          MOV      A,#STIMEL
```

```
00B0 AC         543         MOV     R4,A
00B1 2453       544         JMP     INIE
                545 ;**********************************************************
                546 SEJECT
                547 ;       REPEATER PATCHES
                548 ;       GROUP ADDRESS MATCH LOGIC
00B3 F1         549 ADDXA:  MOV     A,@R1           ; GET SWITCH ADDRESS
00B4 5303       550         ANL     A,#03           ;IS IT RS 232-REPEAT
00B6 0303       551         XRL     A,#03
00B8 C6CB       552         JZ      ADDXC           ;YES.
00BA F1         553         MOV     A,@R1           ;NO.
00BB 5303       554         ANL     A,#03           ;IS IT 422-REPEAT?
00BD 0302       555         XRL     A,#02
00BF 96C9       556         JNZ     ADDXB           ;NO.
00C1 80         557         MOVX    A,@R0           ; YES; COMPARE THE GROUP,ADDRESS OF 540 ON RS422
00C2 01         558         XRL     A,@R1
00C3 5378       559         ANL     A,#78H          ; COMPARE BITS 3 THRU 6 ONLY
00C5 C6C9       560         JZ      ADDXB           ;COMPARED
00C7 BE00       561         MOV     R6,#XIDLE AND 0FFH     ;NOT COMPARED,INITIALIZE REC.
00C9 E4D2       562 ADDXB:  JMP     ADDXE           ;EXIT
00CB E4CC       563 ADDXC:  JMP     ADDX2           ; GO TO ADDX ROUTINE
                564 SEJECT
                565 ;1. TITLE
                566 ;       DATA--GET PROM DATA FILE
                567 ;2. CALL AND RETURN
                568 ;       INPUTS
                569 ;               A=PTR TO THE BYTE, R3=QUADRANT, RAM OPEN
                570 ;       OUTPUTS
                571 ;               R4=DATA BYTE
                572 ;       RETURN
                573 ;3. CALLED ROUTINES
                574 ;4. EQUATES
                575 ;**********************************************************
                576 ;
                577 ;
00CD A8         578 DATA:   MOV     R0,A            ;SET BYTE PTR
00CE FB         579         MOV     A,R3            ;GET QUADRANT PTR
00CF 4380       580         ORL     A,#DATAID
00D1 3A         581         OUTL    P2,A            ;OPEN QUADRANT
00D2 80         582         MOVX    A,@R0           ;GET BYTE
00D3 AC         583         MOV     R4,A
00D4 2380       584         MOV     A,#XRAM         ;OPEN RAM
00D6 3A         585         OUTL    P2,A
00D7 93         586         RETR
                587 SEJECT
                588 SEJECT
                589 ;1. TITLE
                590 ;       BURNT--BURN TIMER FOR PROM PROGRAMMING
                591 ;2. CALL AND RETURN
                592 ;       INPUTS
                593 ;               A=COUNT
                594 ;       OUTPUTS
                595 ;               DELAY WITH NO OTHER ROUTINES RUN
                596 ;       RETURN
                597 ;3. CALLED ROUTINES
                598 ;4. EQUATES
                599 ;**********************************************************
                600 ;
                601 ;
00D8 65         602 BURNT:  STOP    TCNT            ;STOP COUNTER
00D9 62         603         MOV     T,A
00DA 55         604         STRT    T
00DB 16E0       605 BURNL:  JTF     BURNE           ;WAIT UNTIL TIME EXPIRED
00DD 00         606         NOP                     ; REQUIRED FOR PROPER COUNT REV 10-3-80
00DE 04DB       607         JMP     BURNL
00E0 93         608 BURNE:  RETR
                609 ;
00E1 F0         610 THR1B:  MOV     A,@R0           ;DELAY OF 1B USEC FOR THRESHOLD TEST
00E2 91         611         MOVX    @R1,A
00E3 00         612         NOP                     ; FOR DELAY
00E4 24F1       613         JMP     THR1C           ;JUMP BACK TO THR1 ROUTINE
                614 ;**********************************************************
                615 ;       REPEATER PATCHES
                616 ;       IF RS232.REPAETER.REPEATER STATE
                617 ;               THEN DO NOT ENABLE RTS
                618 ;       ELSE ENABLE RTS AS BEFORE
                619 ;
                620 ;       IF RS422.REPEATER DO NOT ENABLE RTS,
                621 ;               GO TO SEND MODE
                622 ;
00E6 8824       623 RPT232: MOV     R0,#LINE
00E8 230F       624         MOV     A,#0FH          ; LINE =XXXX0000?
00EA 50         625         ANL     A,@R0
00EB C6F1       626         JZ      RPT20           ;YES.
00ED BE06       627         MOV     R6,#XCTS AND 0FFH      ;NO.
00EF 44E6       628         JMP     RTSEND
00F1 44E0       629 RPT20:  JMP     R1S422
                630 ;
00F3 8824       631 IDLE5:  MOV     R0,#LINE
00F5 230F       632         MOV     A,#0FH          ; IS IT 232-REPEATER STATE?
00F7 50         633         ANL     A,@R0
00F8 C6FE       634         JZ      IDLE6           ;YES.
00FA BE02       635         MOV     R6,#XREC AND 0FFH      ;NO.
00FC 4412       636         JMP     TXEND           ; GO TO REC MODE
00FE 444A       637 IDLE6:  JMP     IDLE4           ; GO BACK TO IDLE ROUTINE
                638 ;       FILL-IN CODE.
                639 ;
0100 FF         640         DB      0FFH,0FFH,0FFH,0FFH,0FFH,0FFH,0FFH,0FFH ; 060H-06FH
0101 FF
0102 FF
0103 FF
0104 FF
0105 FF
0106 FF
```

```
0107 FF
                    641 ;
                    642 ;
                    643 $EJECT
0100                644          ORG      100H
                    645 ;         NOTE:    IF CONVERSION IS ACTIVE, ONE OF THE CONVERSION ROUTINES
                    646 ;                  IS ENTERED. EVENTUALLY THESE ROUTINES WILL RETURN THROUGH
                    647 ;                  THE "INTE" EXIT POINT
                    648 ;
                    649 ;                  THE AREA SET OFF BY '*' BELOW MUST BE FACTORED INTO THE R/P
                    650 ;                  CONVERSION ROUTINE AS AN INITIAL OFFSET.
                    651 ;2. CALL AND RETURN
                    652 ;         INPUTS
                    653 ;                  TIMEOUT OF HARDWARE TIMER IN 8155
                    654 ;         OUTPUTS
                    655 ;                  CLOCK INCREMENTED
                    656 ;         RETURN
                    657 ;3. CALLED ROUTINES
0100                658          ORG      0100H
0100 38             659 XINTE:   DB       RFRSH AND 0FFH           ;IDLE A/D CONVERT EXIT
0101 38             660 ADCAL:  DB       RFRSH AND 0FFH           ;NOT USED
0102 73             661 XT2:    DB       RP AND 0FFH              ;TYPE 2 ANALOG: R/P
0103 D9             662 XT3:    DB       THR1 AND 0FFH            ;TYPE 3 ANALOG: THRESHOLD
0104 A7             663 XT4:    DB       DS0 AND 0FFH             ;TYPE 4 ANALOG: VOLTAGE
0105 A7             664 XT5:    DB       DS0 AND 0FFH             ;TYPE 5 ANALOG: RTD
0106 A7             665 XT6:    DB       DS0 AND 0FFH             ;TYPE 6 ANALOG:
0107 A7             666 XT7:    DB       DS0 AND 0FFH             ;TYPE 7 ANALOG:
0108 98             667 XFAIL1: DB       FAIL AND 0FFH            ;FAIL
0109 7F             668 XRP1:   DB       RP1 AND 0FFH             ;R/P REENTRY 1
010A 7F             669         DB       RP1 AND 0FFH             ;R/P REENTRY 2
010B 85             670 XRP2:   DB       RP2 AND 0FFH             ;R/P REENTRY 3
010C E0             671 XTHR2:  DB       THR2 AND 0FFH            ;THRESHOLD REENTRY 1
010D AH             672 XDS1:   DB       DS1 AND 0FFH             ;D/S REENTRY 1
010E H4             673 XDS2:   DB       DS2 AND 0FFH             ;D/S REENTRY 2
010F H4             674         DB       DS2 AND 0FFH             ;D/S REENTRY 3
0110 B6             675 XDS3:   DB       DS3 AND 0FFH             ;D/S REENTRY 4
0111 C4             676 XDS4:   DB       DS4 AND 0FFH             ;D/S REENTRY 5
0112 9C             677 XRES:   DB       RESULT AND 0FFH          ;RESULT EXIT
0113 98             678 XFAIL:  DB       FAIL AND 0FFH            ;FAIL
                    679 ;4. EQUATES
                    680 ;***********************************************************************
                    681 ;
                    682 ;
0114 05             683 CONVRT: SEL      RB1
0115 15             684         DIS      I
0116 1F             685         INC      R7
0117 05             686 CLOCK:  SEL      RB1                      ;SELECT INTERRUPT REGISTER BANK
0118 AD             687         MOV      R5,A
0119 0A             688         IN       A,P2                     ;SAVE OPEN PORT
011A AE             689         MOV      R6,A
011B 23B8           690         MOV      A,#ANACP                 ;OPEN PORT
011D 3A             691         OUTL     P2,A       ;CODE FRM 114H--11AH NOT EXECUTED REV 1-28-81
011E B804           692 CNVRT:  MOV      R0,#TIMERL               ;GET TIMER PTR
0120 B900           693         MOV      R1,#ANACS                ;GET TIMER CONTROL PTR
0122 00             694         NOP
0123 00             695         NOP                               ;REV.1-26-81
                    696 ;       CALL     OVRFL                    ;TEST OVERFLOW
0124 240F           697         MOV      A,#STOPCT                ;STOP COUNTER
0126 91             698         MOVX     @R1,A          ;2**************************************
0127 F0             699         MOVX     A,@R0          ;2         GET COUNT
0128 AC             700         MOV      R4,A           ;1         SAVE COUNT
0129 18             701         INC      R0             ;1         GET MS COUNT
012A F0             702         MOVX     A,@R0          ;2
012B 45C0           703         ORL      A,#0C0H        ;2
012D AB             704         MOV      R3,A           ;1
012E 23CF           705         MOV      A,#STRTCT      ;2         START COUNTER
0130 91             706         MOVX     @R1,A          ;****** 13 CYCLES TOTAL TIME CRITICAL*********
0131 FF             707 JCNVRT: MOV      A,R7                     ;GET CONVERSION ENTRY
0132 B3             708         JMPP     @A
                    709 $EJECT
                    710 ;1. TITLE
                    711 ;       INTE--INTERRUPT EXIT--RESTORE ALL REGISTERS AND ENTRY PTS
                    712 ;2. CALL AND RETURN
                    713 ;       INPUTS
                    714 ;                R3=PORT, R4=ACC
                    715 ;       OUTPUTS
                    716 ;                REGISTERS RESTORED
                    717 ;       RETURN
                    718 ;3. CALLED ROUTINES
                    719 ;4. EQUATES
                    720 ;***********************************************************************
                    721 ;
                    722 ;
0133 FE             723 INTE:   MOV      A,R6                     ;GET PORT
0134 3A             724         OUTL     P2,A
0135 FD             725         MOV      A,R5                     ;GET ACC
0136 C5             726         SEL      RB0
0137 93             727         RETR
                    728 $EJECT
                    729 ;1. TITLE
                    730 ;       RFSH--REFRESH ANALOG OUTPUTS
                    731 ;2. CALL AND RETURN
                    732 ;       INPUTS
                    733 ;                ANALOG I/O PORT OPEN
                    734 ;       OUTPUTS
                    735 ;                ANALOG OUTPUT REFRESHED
                    736 ;       RETURN
                    737 ;3. CALLED ROUTINES
                    738 ;4. EQUATES
                    739 ;***********************************************************************
                    740 ;
                    741 ;
0138 27             742 RFRSH:  CLR      A                        ;DISABLE REFRESH
```

```
0139 30         743            MOVD    P5,A
013A 9A2A       744            MOV     R0,#RFSH           ;GET REFRESH PTR
013C F0         745            MOV     A,@R0
013D 1244       746            JB0     OLDVAL             ;IF NEW VALUE (WITH HYSTERIS RESET)
013F 27         747 NEWVAL:    CLR     A
0140 AA         748            MOV     R2,A               ; SET 0 VALUE
0141 AC         749            MOV     R4,A
0142 244E       750            JMP     RFSH1              ;ELSE (OLD VALUE OR NEW VALUE WITHOUT RESET)
0144 F42C       751 OLDVAL:    CALL    PANA               ; GET VALUE ADDRESS
0146 23B0       752            MOV     A,#XRAM            ; OPEN RAM
0148 3A         753            OUTL    P2,A
0149 81         754            MOVX    A,@R1              ; GET PORTC VALUE
014A AA         755            MOV     R2,A
014B 19         756            INC     R1
014C 81         757            MOVX    A,@R1              ; GET PORT A VALUE
014D AC         758            MOV     R4,A               ;ENDIF
014E F0         759 RFSH1:     MOV     A,@R0              ;GET PORT ADDRESS
014F 37         760            CPL     A
0150 AB         761            MOV     R3,A
0151 23A8       762            MOV     A,#ANACP           ;OPEN I/O
0153 3A         763            OUTL    P2,A
0154 B803       764            MOV     R0,#PORTC
0156 891A       765            MOV     R1,#REG2
0158 F1         766 RFSHL:     MOV     A,@R1              ;DO WHILE VALUES
0159 90         767            MOVX    @R0,A              ; GET VALUE
015A 19         768            INC     R1                 ; INCREMENT PTRS
015B E85A       769            DJNZ    R0,RFSHL           ;ENDWHILE
015D 2308       770            MOV     A,#8               ;START REFRESH
015F 3D         771            MOVD    P5,A
0160 BA2A       772            MOV     R0,#HFSH
0162 F0         773            MOV     A,@R0
0163 0308       774            ADD     A,#8
0165 43C7       775            ORL     A,#0C7H
0167 A0         776            MOV     @R0,A              ;SET VALUE
0168 C5         777            SEL     RB0                ;SCHEDULE A/D ROUTINE
0169 2308       778            MOV     A,#8
016B 4D         779            ORL     A,R5
016C AD         780            MOV     R5,A
016D D5         781            SEL     RB1
016E B925       782            MOV     R1,#SECOND         ;TICK CLOCK
0170 11         783            INC     @R1
0171 2433       784 RFSH3:     JMP     INTE
                785 $EJECT
                786 $1. TITLE
                787 ;        RP--R/P CONVERT ROUTINE
                788 $2. CALL AND RETURN
                789 ;        INPUTS
                790 ;               R4=MS COUNT, R3=LS COUNT, I/O PORT OPEN
                791 ;        OUTPUTS
                792 ;               INPUT CONVERTED
                793 ;        RETURN
                794 $3. CALLED ROUTINES
                795 ;--RANGE
                796 ;        INPUTS
                797 ;               R3=MS, R4=LS COUNT
                798 ;        OUTPUTS
                799 ;               ANALOG+7=RANGE, R7 SET TO REENTRY PT
                800 $4. EQUATES
                801 ;************************************************************
                802 ;
                803 ;
0173 BF0B       804 RP:        MOV     R7,#XFAIL1 AND 0FFH ;SET DEFAULT ENTRY
0175 2305       805            MOV     A,#5               ;OPEN R/P PORT
0177 3C         806            MOVD    P4,A
0178 23FF       807            MOV     A,#-1              ;SET INTERNAL COUNT
017A 62         808            MOV     T,A
017B 25         809            EN      TCNTI
017C 45         810            STRT    CNT                ;START COUNTER
017D 2433       811            JMP     INTE
                812 ;
                813 ;
017F 42         814 RP1:       MOV     A,T                ;GET TIMER VALUE
0180 03FE       815            ADD     A,#-2
0182 62         816            MOV     T,A                ;SET COUNTER TO 3
0183 2433       817            JMP     INTE
                818 ;
                819 ;
0185 42         820 RP2:       MOV     A,T                ;SET TIMEOUT ACCUMULATOR (20 COUNTS)
0186 03EC       821            ADD     A,#-20
0188 62         822            MOV     T,A
0189 BF11       823            MOV     R7,#XRES-1 AND 0FFH ;SET RESULT ENTRY PT
018B 0312       824            ADD     A,#18              ;IF COUNT TOO FAST THEN
018D F292       825            JB7     RP2A
018F 1F         826            INC     R7                 ; FAILED RESULT
0190 2496       827            JMP     RPE
0192 B833       828 RP2A:      MOV     R0,#ANALOG+3       ;ELSE (WITHIN RANGE)
0194 F481       829            CALL    MOVERI+2           ; SAVE RANGE MEASURE
0196 2433       830 RPE:       JMP     INTE               ;ENDIF
                831 $EJECT
                832 $1. TITLE
                833 ;        CONVERSION EXIT--ENTER AT FAIL OR RESULT
                834 $2. CALL AND RETURN
                835 ;        INPUTS
                836 ;               R3=MS, R4=LS COUNT
                837 ;        OUTPUTS
                838 ;               ANALOG+1=MS, ANALOG+2=LS
                839 ;        RETURN
                840 $3. CALLED ROUTINES
                841 $4. EQUATES
                842 ;************************************************************
                843 ;
                844 ;
019A B800       845 FAIL:      MOV     R3,#0              ;STORE 0 (FAIL) VALUE
```

```
019A BC00      846            MOV    R4,#0
019C F4AF      847 RESULT: CALL   MOVER1              ;SAVE MS,LS STATUS
019E 27        848            CLR    A                ;TURN OFF CONVERSION
019F 3C        849            MOVD   P4,A
01A0 65        850            STOP   TCNT             ;DISABLE TIMER
01A1 35        851            DIS    TCNTI
01A2 BF00      852            MOV    R7,#XINTE AND 0FFH  ;SET REENTRY PT
01A4 05        853            EN     I
01A5 2433      854            JMP    INTE
               855 $EJECT
               856 ;1. TITLE
               857 ;      DS--DUAL SLOPE INTEGRATION
               858 ;2. CALL AND RETURN
               859 ;         INPUTS
               860 ;              R3=MS COUNT, R4=LS COUNT, I/O PORT OPEN
               861 ;         OUTPUTS
               862 ;              INPUT CONVERTED
               863 ;         RETURN
               864 ;3. CALLED ROUTINES
               865 ;4. EQUATES
               866 ;************************************************************
               867 ;
               868 ;
01A7 BF0D      869 DS0:       MOV    R7,#XDS1 AND 0FFH   ;WAIT FOR LINE TO CHARGE
01A9 2433      870            JMP    INTE
               871 ;
               872 ;
01AB 1F        873 DS1:       INC    R7               ;SET REENTRY PT
01AC 2346      874            MOV    A,#70            ;PRESET COUNTER
01AE 62        875            MOV    T,A
01AF 2309      876            MOV    A,#9             ;START INTEGRATION
01B1 3C        877            MOVD   P4,A
01B2 55        878            STRT   T                ;START COUNTER
01B3 25        879            EN     TCNTI
01B4 2433      880 DS2:       JMP    INTE
               881 ;
               882 ;
01B6 65        883 DS3:       STOP   TCNT             ;STOP COUNTER
01B7 4698      884            JNT1   FAIL             ;IF INVALID RESULT THEN
               885 ;                                     FAILED RESULT
               886 ;                                  ELSE (VALID RESULT)
01B9 BAFF      887            MOV    R2,#0FFH
01BB A5        888            CLR    F1               ;  RESET OVERFLOW COUNTER
01BC 23FF      889            MOV    A,#-1            ;  WAIT FOR INTEGRATION COMPLETE
01BE 62        890            MOV    T,A
01BF 45        891            STRT   CNT
01C0 27        892            CLR    A                ;  STOP INTEGRATION (EXTERNAL)
01C1 3C        893            MOVD   P4,A
01C2 2433      894            JMP    INTE             ;ENDIF
               895 ;
               896 ;
01C4 97        897 DS4:       CLR    C                ;NORMALIZE R3,R4 COUNT
01C5 B903      898            MOV    R1,#3
01C7 FB        899 DS4LP:     MOV    A,R3             ;DO FOR 3 BITS
01C8 67        900            RRC    A                ;  SHIFT RIGHT
01C9 AB        901            MOV    R3,A
01CA FC        902            MOV    A,R4
01CB 67        903            RRC    A
01CC AC        904            MOV    R4,A             ;  SET INTO NEXT REGISTER
01CD E4C7      905            DJNZ   R1,DS4LP         ;ENDDO
01CF FA        906            MOV    A,R2             ;GET OVERFLOW COUNT
01D0 47        907            SWAP   A
01D1 77        908            RR     A
01D2 2B        909            XCH    A,R3             ;PACK OVERFLOW WITH R3 COUNT
01D3 43F8      910            ORL    A,#0F8H
01D5 5B        911            ANL    A,R3
01D6 AB        912            MOV    R3,A
01D7 249C      913            JMP    RESULT
               914 $EJECT
               915 ;1. TITLE
               916 ;      THR1--THRESHOLD INPUT HANDLER
               917 ;2. CALL AND RETURN
               918 ;         INPUTS
               919 ;         OUTPUTS
               920 ;         RETURN
               921 ;3. CALLED ROUTINES
               922 ;4. EQUATES
0080           923 ALARM   EQU    10000000B           ;ALARM MASK,REV.6-9-80
0040           924 TBL     EQU    01000000B           ;TROUBLE MASK
               925 ;************************************************************
               926 ;
               927 ;
01D9 2305      928 THR1:      MOV    A,#5             ;OPEN THRESH PORT
01DB 3C        929            MOVD   P4,A
01DC AF0C      930            MOV    R7,#XTHR2 AND 0FFH  ;SCHEDULE REENTRY
01DE 2433      931            JMP    INTE
               932 ;
               933 ;
01E0 46E6      934 THR2:      JNT1   THR1A            ;IF ALARM THEN
01E2 2380      935            MOV    A,#ALARM         ;  GET ALARM
01E4 24F5      936            JMP    THR2A            ;ELSE
01E6 B835      937 THR1A:     MOV    R0,#ANALOG+5     ;  SET TROUBLE LEVEL
01E8 A903      938            MOV    R1,#PORTC
01EA F0        939            MOV    A,@R0
01EB 91        940            MOVX   @R1,A
01EC 18        941            INC    R0
01ED A901      942            MOV    R1,#PORTA
01EF 04F1      943            JMP    THR1B
01F1 56F9      944 THR1C:     JT1    THR2A            ;IF TROUBLE THEN
01F3 2540      945            MOV    A,#TBL           ;  GET TROUBLE
01F5 B837      946 THR2A:     MOV    R0,#ANALOG+7     ;  SET VALUE
01F7 40        947            ORL    A,@R0
01F8 A0        948            MOV    @R0,A
```

```
01F9 BF00      949 THR2B:  MOV    R7,#XINTE AND OFFH    ;ENDIF
01FB 27        950         CLR    A                     ;RESET ENTRY TO IDLE
01FC 3C        951         MOVD   P4,A                  ;TURN OFF INPUT
01FD 2433      952         JMP    INTE
01FF FF        953         DB     OFFH            ;FILL IN CODE
               954 $EJECT
               955 ;1. TITLE
               956 ;          TSM--TRANSMISSION ROUTINE
               957 ;2. CALL AND RETURN
               958 ;        INPUTS
               959 ;        OUTPUTS
               960 ;        RETURN
               961 ;3. CALLED ROUTINES
0200           962         ORG    0200H
0200 2A        963 XIDLE:  DB     IDLE AND OFFH         ;IDLE ROUTINE (SET UP RECEIVE)
0201 13        964 XWAIT:  DB     WAIT AND OFFH         ;WAIT FOR DELAY SYNC FOR TRANSMISSION
0202 52        965 XREC:   DB     REC AND OFFH          ;RECEIVE ROUTINE
0203 CF        966 XRTS:   DB     SRTS AND OFFH         ;REQUEST TO SEND (SET UP SEND)
0204 B7        967 XSEND:  DB     SEND AND OFFH         ;SEND
0205 F7        968 XRRCHK: DB     RRCHK AND OFFH        ;CARRIER DETECT ROUTINE
0206 EE        969 XCTS:   DB     CTSCHK AND OFFH       ;CLEAR TO SEND WAIT (RS232 ONLY)
               970 ;4. EQUATES
               971 ;****************************************************************
               972 ;
               973 ;
               974 ;
0207 00        975 TSM:    NOP              ; SEL      RB1
0208 00        976         NOP
0209 00        977         NOP              ;REV: 1-26-81
               978 ;       CALL   OVRFL                 ;TEST OVERFLOW
020A 00        979         NOP              ;  SEL     RB0
020B 2390      980         MOV    A,#UART               ;OPEN UART PORT
020D 3A        981         OUTL   P2,A
020E B901      982         MOV    R1,#UARTCS            ;OPEN CONTROL/STATUS PORT
0210 FE        983         MOV    A,R6                  ;GET TRANSMISSION
0211 B3        984         JMPP   @A                    ;CASE OF TRANSMIT MODE OF:
               985 ;                                         IDLE
               986 ;                                         REC
               987 ;                                         SRTS
               988 ;                                         SEND
               989 ;                                         RRCHK
               990 ;                                         CTSCHK
               991 ;                                    ENDCASE
0212 93        992 TXEND:  RETR
               993 $EJECT
               994 ;1. TITLE
               995 ;      WAIT--WAIT FOR QUIET TIME TO EXPIRE WITHOUT RECEIVING ANY TRANSMISSION
               996 ;2. CALL AND RETURN
               997 ;        INPUTS
               998 ;             R1=UART STATUS PTR, UART OPEN
               999 ;        OUTPUTS
               1000 ;            WAIT IMPLEMENTED
               1001 ;        RETURN
               1002 ;3. CALLED ROUTINES
               1003 ;4. EQUATES
               1004 ;****************************************************************
               1005 ;
               1006 ;
0213 81        1007 WAIT:   MOVX  A,@R1                 ;GET STATUS
0214 B923      1008         MOV   R1,#TDELAY            ;GET DELAY PTR
0216 321A      1009         JB1   WAIT1                 ;IF UART RECEIVED DATA THEN
0218 4422      1010         JMP   WAIT2
021A B800      1011 WAIT1:  MOV   R0,#UARTID            ;  GET UART DATA PTR
021C 80        1012         MOVX  A,@R0                 ;  READ DATA
021D 237B      1013         MOV   A,#123                ;  RESET TIMER
021F A1        1014         MOV   @R1,A
0220 4428      1015         JMP   WAIT3                 ;ELSE
0222 11        1016 WAIT2:  INC   @R1                   ;  COUNT TIMER
0223 F1        1017         MOV   A,@R1
0224 4628      1018         JNZ   WAIT3                 ; TEST DONE
0226 BE00      1019         MOV   R6,#XIDLE AND OFFH
               1020 ;                                   ENDIF
0228 4412      1021 WAIT3:  JMP   TXEND
               1022 $EJECT
               1023 ;1. TITLE
               1024 ;         IDLE
               1025 ;2. CALL AND RETURN
               1026 ;        INPUTS
               1027 ;             R1=UART STATUS PTR, UART OPEN
               1028 ;        OUTPUTS
               1029 ;             RECEIVE ENABLED
               1030 ;3. CALLED ROUTINES
               1031 ;4. EQUATES
0017           1032 RTSRES EQU    RXE+TXEN+RESET        ;RTS RESET
               1033 ;****************************************************************
               1034 ;       REV. DEC.04,A0
               1035 ;
022A 81        1036 IDLE:   MOVX  A,@R1                 ;GET UART STATUS
022B 522F      1037         JB2   IDLE3                 ;IF NOT READY THEN
022D 4412      1038 IDLE2:  JMP   TXEND                 ; EXIT
               1039 ;                                   ELSE
022F BF00      1040 IDLE3:  MOV   R7,#0                 ; CLEAR WORD COUNT
0231 B621      1041         MOV   R0,#CKSM              ; CLEAR CHECKSUM
0233 27        1042         CLR   A
0234 A0        1043         MOV   @R0,A
0235 18        1044         INC   R0                    ; CLEAR TRANSMISSION BUFFER PTR
0236 A0        1045         MOV   @R0,A
0237 2317      1046         MOV   A,#RTSRES             ; DISABLE OUTPUT DRIVERS
0239 91        1047         MOVX  @R1,A
023A 81        1048         MOVX  A,@R1                 ; DUMMY READ STATUS
023B B900      1049         MOV   R1,#UARTIO            ; DUMMY READ DATA
023D 81        1050         MOVX  A,@R1
023E 2380      1051         MOV   A,#XRAM               ;. OPEN RAM
0240 3A        1052         OUTL  P2,A
```

```
0241 BB24        1053           MOV     R0,#LINE              ; GET LINE
0243 F0          1054           MOV     A,@R0
0244 3E          1055           MOVD    P6,A
0245 BB20        1056           MOV     R0,#ADDRES            ; GET ADDRES
0247 F0          1057           MOV     A,@R0                 ;ENDIF
0248 124E        1058           JB0     IDLE1                 ;IF RS422 THEN
024A BE02        1059  IDLE4:   MOV     R6,#XREC AND 0FFH     ;   ENABLE RECEIVE ROUTINE
024C 4420        1060           JMP     IDLE2                 ;ELSE (RS232)
024E 04F3        1061  IDLE1:   JMP     IDLE5                 ;   ENABLE CARRIER DETECT CHECK
                 1062  ;        SEE REPEATER PATCH            ENDIF
0250 A4EA        1063  IDLE8:   JMP     IDLE4                 ; SEE DELAY PATCH
                 1064          SEJECT
                 1065  ;1. TITLE
                 1066  ;        REC--RECEIVE DATA
                 1067  ;2. CALL AND RETURN
                 1068  ;        INPUTS
                 1069  ;        OUTPUTS
                 1070  ;        RETURN
                 1071  ;3. CALLED ROUTINES
                 1072  ;4. EQUATES
0003             1073  MSGL     EQU     3                     ;BASE MESSAGE LENGTH
0001             1074  REQ1     EQU     00000001B             ;REQUEST RECV
00FE             1075  MCASE    EQU     11111110B             ;CASE 1 MASK
0003             1076  MTYPE    EQU     3                     ;MESSAGE TYPE MASK
                 1077  ;***********************************************************
                 1078  ;
                 1079  ;
                 1080  ;
0252 81          1081  REC:     MOVX    A,@R1                 ;GET STATUS WORD
0253 3257        1082           JB1     RDATA                 ;IF DATA READY THEN
0255 A4C8        1083           JMP     RDATAA
0257 5338        1084  RDATA:   ANL     A,#ERROR              ; SET ERROR FLAG
0259 96A1        1085           JNZ     ERRSET
                 1086  ;        MOV     R1,#EIP               ; CLEAR NO RESPONSE WATCHDOG
025B A4B9        1087           JMP     RDATAH                ; SEE REPEATER PATCH
025D 23FC        1088  RDATAC:  MOV     A,#0FCH
025F 51          1089           ANL     A,@R1
0260 A1          1090           MOV     @R1,A
0261 B900        1091           MOV     R1,#UARTIO            ; OPEN UART IO
0263 81          1092           MOVX    A,@R1                 ; GET DATA
0264 AC          1093           MOV     R4,A                  ; SAVE BYTE
0265 B821        1094           MOV     R0,#CKSM              ; GET CHECKSUM PTR
0267 60          1095           ADD     A,@R0                 ; TALLY CHECKSUM
0268 A0          1096           MOV     @R0,A
                 1097  ;        INC     R7                    ; INCREMENT WORD COUNT
                 1098  ;        MOV     A,#KRAM               ; OPEN RAM
0269 F5          1099           SEL     MB1                   ; PATCH IN MB1
026A 84BC        1100           JMP     RDATAF                ; SEE PAGE C IN MEM. BANK 1
026C 3A          1101  RDATAH:  OUTL    P2,A
026D FF          1102           MOV     A,R7                  ; GET WORD COUNT
026E 1274        1103           JB0     CASE1                 ; CASE RECEIVE WORD COUNT OF
0270 32A9        1104           JB1     CASE2
0272 4492        1105           JMP     CASE3
0274 53FE        1106  CASE1:   ANL     A,#MCASE              ;    1: GET MESSAGE TYPE
0276 9692        1107           JNZ     CASE3
0278 FD          1108           MOV     A,R5
0279 537F        1109           ANL     A,#7FH
027B AD          1110           MOV     R5,A
027C FC          1111           MOV     A,R4
027D 32B1        1112           JB1     TYPE2                 ;       IF TYPE2 THEN
027F 44A9        1113           JMP     STORE
0281 12A9        1114  TYPE2:   JB0     STORE                 ;          SET LONG FORM FLAG
0283 FD          1115           MOV     A,R5
0284 43B0        1116           ORL     A,#R0H
0286 AD          1117           MOV     R5,A
0287 44A9        1118           JMP     STORE                 ;       ENDIF
0289 53FD        1119  CASE2:   ANL     A,#0FDH
028B 9692        1120           JNZ     CASE3
028D FD          1121           MOV     A,R5
028E F2A9        1122           JB7     STORE                 ;    2: IF NOT LONG FORM THEN
0290 4499        1123           JMP     EOM                   ;       END OF MESSAGE
                 1124  ;                                              ELSE
                 1125  ;                                                CONTINUE RECEIVE
                 1126  ;                                              ENDIF
0292 B802        1127  CASE3:   MOV     R0,#LENGTH            ;    3-N:
0294 80          1128           MOVX    A,@R0                 ;       IF WORD COUNT >= LENGTH THEN
0295 37          1129           CPL     A
0296 6F          1130           ADD     A,R7
0297 E6A9        1131           JNC     STORE                 ;          END OF MESSAGE
                 1132  ;                                              ENDIF
                 1133  ;                                           ENDCASE
                 1134  ;
0299 B821        1135  EOM:     MOV     R0,#CKSM              ; IF EOM
029B 10          1136           INC     @R0
029C F0          1137           MOV     A,@R0                 ;    GET CHECKSUM
029D BE00        1138           MOV     R6,#XIDLE AND 0FFH    ;    INITIALIZE REC.
029F C6A5        1139           JZ      REQ                   ;    IF CHECKSUM ERROR THEN
                 1140  ;                                              WAIT FOR QUIET TIME
02A1 BE01        1141  ERRSET:  MOV     R6,#KWAIT AND 0FFH
02A3 44B5        1142           JMP     RDATAE
02A5 2301        1143  REQ:     MOV     A,#REQ1               ;    ELSE
02A7 40          1144           ORL     A,R5                  ;       SET RECEIVE PROCESS AND DIG IN
02A8 AD          1145           MOV     R5,A                  ;    ENDIF
                 1146  ;                                           ELSE
02A9 B822        1147  STORE:   MOV     R0,#TSMPTR            ;    GET TRANSMISSION PTR
02AB 10          1148           INC     @R0                   ;    INCREMENT PTR
02AC F0          1149           MOV     A,@R0
02AD 53C0        1150           ANL     A,#0C0H
02AF 96B5        1151           JNZ     RDATAE
02B1 F0          1152           MOV     A,@R0
02B2 A8          1153           MOV     R0,A
02B3 FC          1154           MOV     A,R4                  ; GET BYTE
02B4 90          1155           MOVX    @R0,A                 ; QUEUE BYTE
```

```
                        1156 ;                                                  ENDIF
02B5 4412               1157 RDATAE: JMP       TXEND                            ;ENDIF
                        1158 $EJECT
                        1159 ;1. TITLE
                        1160 ;        SEND--TRANSMIT ROUTINE
                        1161 ;         NOTE:   THIS ROUTINE ASSUMES WORD COUNT, TRANSMISSION PTR ,CKSM
                        1162 ;                 ARE PRESET.  ONLY WORD COUNT IS SET BY THE TRANSMISSION FORMATER
                        1163 ;2.  CALL AND RETURN
                        1164 ;        INPUTS
                        1165 ;                UART OPEN, R1=STATUS REGISTER, F1=0 => 2 BYTE MESSAGE
                        1166 ;                WITH NO "P" BYTE
                        1167 ;        OUTPUTS
                        1168 ;                BYTE SENT WHEN READY
                        1169 ;        RETURN
                        1170 ;3. CALLED ROUTINES
                        1171 ;4. EQUATES
                        1172 ;************************************************************
                        1173 ;
                        1174 ;
02B7 81                 1175 SEND:    MOVX     A,@R1                            ;GET STATUS BYTE
02B8 37                 1176          CPL      A
02B9 12C0               1177          JB0      SNDEND                           ;IF UART READY THEN
02BB B823               1178          MOV      R0,#TDELAY                       ;  INCREMENT DELAY TIMER
02BD 10                 1179          INC      @R0
02BE F0                 1180          MOV      A,@R0
02BF 96CD               1181          JNZ      SNDEND                           ;  IF TIMER EXPIRED THEN
02C1 230F               1182          MOV      A,#0DFH                          ;     RESET TIMER FOR 4.5 MS. TOTAL
02C3 A0                 1183          MOV      @R0,A
02C4 F496               1184          CALL     GETBYT                           ;     GET BYTE
02C6 B900               1185          MOV      R1,#UARTIO                       ;     GET DATA PTR
02C8 91                 1186          MOVX     @R1,A                            ;     SEND DATA
02C9 B821               1187          MOV      R0,#CKSM                         ;     GET CHECKSUM PTR
02CB 60                 1188          ADD      A,@R0                            ;     TALLY CHECKSUM
02CC A0                 1189          MOV      @R0,A                            ;  ENDIF
                        1190 ;                                                  ENDIF
02CD 4412               1191 SNDEND:  JMP      TXEND
                        1192 $EJECT
                        1193 ;1. TITLE
                        1194 ;        SRTS--SET REQUEST TO SEND
                        1195 ;2. CALL AND RETURN
                        1196 ;        INPUTS
                        1197 ;                UART OPEN, R1=STATUS REGISTER
                        1198 ;        OUTPUTS
                        1199 ;                ENABLE OUTPUTS AND SET CTS DELAY IF RS232
                        1200 ;3. CALLED ROUTINES
                        1201 ;4. EQUATES
0027                    1202 RTSREQ   EQU      RTS+HXE+TXEN                     ;RTS REQUEST
                        1203 ;************************************************************
                        1204 ;
                        1205 ;
02CF 2327               1206 SRTS:    MOV      A,#RTSREQ                        ;ENABLE RTS
02D1 91                 1207          MOVX     @R1,A
02D2 2380               1208          MOV      A,#XRAM                          ;OPEN RAM
02D4 3A                 1209          OUTL     P2,A
02D5 B824               1210          MOV      R0,#LINE                         ;SET LINE
02D7 2307               1211          MOV      A,#7
02D9 50                 1212          ANL      A,@R0
02DA 3E                 1213          MOVD     P6,A
02DB B820               1214          MOV      R0,#ADDRES                       ;GET ADDRESS
02DD F0                 1215          MOV      A,@R0
02DE 12E4               1216          JB0      SRS232                           ;IF RS422 THEN
02E0 BE04               1217 RTS422:  MOV      R6,#XSEND AND 0FFH               ;  ENABLE SEND
02E2 04E6               1218          JMP      RTSEND                           ;ELSE
02E4 04E6               1219 SRS232:  JMP      RPT232                           ;  ENABLE CTS WAIT
                        1220 ;        SEE REPEATER PATCH
02E6 B821               1221 RTSEND:  MOV      R0,#CKSM                         ;ENDIF
02E8 27                 1222          CLR      A                                ;CLEAR CKSM
02E9 A0                 1223          MOV      @R0,A
02EA 18                 1224          INC      R0                               ;CLEAR TSM PTR
02EB A0                 1225          MOV      @R0,A
02EC 4412               1226          JMP      TXEND                            ;ENDIF
                        1227 $EJECT
                        1228 ;1. TITLE
                        1229 ;        CTSCHK--CHECK CLEAR TO SEND
                        1230 ;2.  CALL AND RETURN
                        1231 ;        INPUTS
                        1232 ;                UART OPEN, R1=UARTCS
                        1233 ;        OUTPUTS
                        1234 ;                CTS CHECKED AND SEND ENABLED IF READY
                        1235 ;3. CALLED ROUTINES
                        1236 ;4. EQUATES
                        1237 ;************************************************************
                        1238 ;
                        1239 ;
02EE 81                 1240 CTSCHK:  MOVX     A,@R1                            ;GET STATUS
02EF F2F3               1241          JB7      CTSCK1                           ;IF CTS THEN
02F1 44F5               1242          JMP      CTSEND
02F3 BE04               1243 CTSCK1:  MOV      R6,#XSEND AND 0FFH               ;  ENABLE SEND
02F5 4412               1244 CTSEND:  JMP      TXEND                            ;ENDIF
                        1245 $EJECT
                        1246 ;1. TITLE
                        1247 ;        RRCHK--RECEIVER READY CHECK
                        1248 ;2.  CALL AND RETURN
                        1249 ;        INPUTS
                        1250 ;                UART OPEN, R1=UARTCS
                        1251 ;        OUTPUTS
                        1252 ;                RR CHECKED AND RECEIVE ENABLED IF READY
                        1253 ;3. CALLED ROUTINES
                        1254 ;4. EQUATES
                        1255 ;************************************************************
                        1256 ;
                        1257 ;
02F7 81                 1258 RRCHK:   MOVX     A,@R1                            ;GET STATUS
02F8 F2FC               1259          JB7      RRCHK1                           ;IF RR THEN
```

```
02FA 44FE      1260        JMP     RHEND
02FC RE02      1261 RHCHK1: MOV    R6,#XREC AND 0FFH      ; ENABLE RECEIVE
02FE 4412      1262 RHEND:  JMP    TXEND
               1263        SEJECT
               1264 ;
               1265 ;**************************************************************
               1266 ;
0300           1267        ORG     0300H
               1268 ;1. TITLE
               1269 ;        RECV--RECEIVE PROCESS ROUTINE
               1270 ;            ALL RECEIVED MESSAGES ARE PROCESSED BY THE RECEIVE PROCESS
               1271 ;        ROUTINE AFTER THE TOTAL MESSAGE IS RECEIVED. MESSAGES COME IN 4
               1272 ;        TYPES:   0:  LINE SWITCH
               1273 ;                 1:  POLL
               1274 ;                 2:  LONG FORM
               1275 ;                 3:  REPEAT
               1276 ;        MESSAGES 0,1,3 HAVE 2 BYTE FORMATS WITH THE SECOND BYTE BEING THE
               1277 ;        COMPLEMENT (1'S) OF THE FIRST BYTE
               1278 ;            TYPE                          BIT
               1279 ;              0       ABXXXX00=> A(B): SWITCH TO A(B), X: UNASSIGNED
               1280 ;              1       MMMML01=> M: MODULE ADDRESS IN BINARY
               1281 ;                                  L: LINE 0=A, 1=B
               1282 ;              3       MMMML11=> M: MODULE ADDRESS IN BINARY
               1283 ;        MESSAGE TYPE 2 HAS A VARIABLE LENGTH FORMAT DEFINED ACCORDING TO
               1284 ;            BYTE                          DEFINITION
               1285 ;        1,3...........63.
               1286 ;        CLE....MSG......P         C:CONTROL BYTE  0MMML10
               1287 ;                                  L:LENGTH #> LENGTH OF MESSAGE=P
               1288 ;                                  E:CONTROL EXTENSION
               1289 ;                                      0:  COS
               1290 ;                                      1:  DEMAND
               1291 ;                                      2:  COMMAND RELAYS
               1292 ;                                      3:  NO RESPONSE (INTER PROCESSOR)
               1293 ;                                      4:  DOWN LINE LOAD
               1294 ;                                      5:  UP LINE LOAD
               1295 ;                                      6:  COMMAND ANALOG OUTPUT (CPA)
               1296 ;                                      7:  DIAGNOSTIC
               1297 ;                                      8:  SELF RESET
               1298 ;2. CALL AND RETURN
               1299 ;        INPUTS
               1300 ;            RAM OPEN, MESSAGE IN REC BUFFER
               1301 ;        OUTPUTS
               1302 ;            OUTPUT FORMATTED (AS REQUESTED)
               1303 ;        RETURN
               1304 ;3. CALLED ROUTINES
0300 71        1305 CE:     DB      REC1 AND 0FFH          ;0: COS--SET RECEIVE MODE
0301 18        1306         DB      XCOSFM AND 0FFH        ;1: DEMAND--SET COS FORMAT
0302 16        1307         DB      XRELAY AND 0FFH        ;2: COMMAND RELAY--SET UP RELAY COMMAND
0303 71        1308         DB      REC1 AND 0FFH          ;3: NO RESPONSE--SET UP RECEIVE MODE
0304 80        1309         DB      PRGRAM AND 0FFH        ;4: DOWN LINE LOAD--SET PROGRAM
0305 73        1310         DB      UPLINE AND 0FFH        ;5: UPLINE LOAD--UP LINE LOAD
0306 1A        1311         DB      XCPA AND 0FFH          ;6: COMMAND CPA--SET CPA VALUE
0307 12        1312         DB      XDIAG AND 0FFH         ;7: DIAGNOSTIC
0308 10        1313         DB      HWRES AND 0FFH         ;8: HARDWARE RESET
0309 71        1314         DB      REC1 AND 0FFH          ;9: COS DIGITAL ONLY--SET RECEIVE MODE
030A 71        1315         DB      REC1 AND 0FFH          ;10:COS ANALOG ONLY--SET RECEIVE MODE
030B 71        1316         DB      REC1 AND 0FFH          ;11: SPARE
030C 71        1317         DB      REC1 AND 0FFH          ;12: SPARE
030D 71        1318         DB      REC1 AND 0FFH          ;13: SPARE
030E 71        1319         DB      REC1 AND 0FFH          ;14: SPARE
030F 71        1320         DB      REC1 AND 0FFH          ;15: SPARE
               1321 ;NOTE: CONTROL EXTENSIONS E0H THRU' FFH ARE RESERVED FOR GERMAN-DDC
               1322 ;      PROJECT
               1323 ;;;;;;;;;;;;;;;;;;;;;;;;;;;;;;;;;;;;;;;;;;;;;;;;;;;;;;;;;;;;;;
0310 0400      1324 HWRES:  JMP     0                      ;HARDWARE RESET
0312 6471      1325 XDIAG:  JMP     REC1
0314 C422      1326 XCPA:   JMP     CPA
0316 A402      1327 XRELAY: JMP     RELAY
0318 643F      1328 XCOSFM: JMP     COSFMA
               1329 ;4. EQUATES
000F           1330 CENUM   EQU     0FH                    ;NUMBER OF CONTROL EXTENSIONS
               1331 ;**************************************************************
               1332 ;
               1333 ;
031A B801      1334 RECV:   MOV     R0,#MSG                ;GET MESSAGE START
031C 80        1335         MOVX    A,@R0
031D 1225      1336         JB0     TYP1                   ;CASE OF MESSAGE TYPE OF
031F 3242      1337         JB1     TYP2                   ;      0: SWITCH LINES
0321 F411      1338 TYP0:   CALL    LINESW
0323 6471      1339         JMP     REC1
0325 324E      1340 TYP1:   JB1     TYP3
0327 F40E      1341         CALL    ADDX                   ;      1: IF ADDRESS MATCH THEN
0329 3265      1342         JB1     TYP4
032B 4671      1343         JNZ     REC1
032D F0        1344         MOV     A,R5                   ;IF R5 BIT 6 SET SEND I'M OK BACK
032E 5340      1345         ANL     A,#40H                 ; ELSE PROCESS NORMALLY
0330 9665      1346         JNZ     TYP4
0332 F5        1347         SEL     MB1
0333 0400      1348         CALL    DIG                    ;ID#1 THROUGH #24
0335 7414      1349         CALL    FSSTAT                 ;FOR F&S COS
0337 E5        1350         SEL     MB0
0338 8929      1351         MOV     R1,#COSBUF
033A F1        1352         MOV     A,@R1
033B B271      1353         JB5     REC1                   ;FS20 FAILURE; DO NOT ANSWER 560 SCAN
033D C665      1354         JZ      TYP4                   ;      ENDIF
033F F5        1355 COSFMA: SEL     MB1                    ; SELECT MB1
0340 C4B0      1356         JMP     COSFM
0342 F4BE      1357 TYP2:   CALL    ADDX                   ;      2: IF ADDRESS MATCH THEN
0344 3262      1358         JB1     TYP6
0346 9671      1359         JNZ     REC1
0348 B803      1360         MOV     R0,#EXT                ;         GET CONTROL EXTENSION
034A 80        1361         MOVX    A,@R0
034B 530F      1362         ANL     A,#CENUM
```

```
034D 83        1363       JMPP    @A                      ;       EXECUTE EXTENSION ROUTINE
               1364 ;                                     ;       ENDIF
034E F48E      1365 TYP3: CALL    ADDX                    ;  3: IF ADDRESS MATCH THEN
0350 9671      1366       JNZ     REC1
0352 B800      1367       MOV     R0,#TSMBUF              ;       GET LAST MESSAGE LENGTH
0354 80        1368       MOVX    A,@R0
0355 AA        1369       MOV     R2,A
0356 BBFE      1370       MOV     R3,#0FEH
0358 EA5C      1371       DJNZ    R2,TYP5                 ;       IF POLL LAST MESSAGE THEN
035A BBFD      1372       MOV     R3,#0FDH
035C BB01      1373 TYP5: MOV    R0,#MSG                  ;       GET ADDRESS BYTE
035E 80        1374       MOVX    A,@R0
035F 5B        1375       ANL     A,R3
0360 90        1376       MOVX    @R0,A                   ;       SET POLL FORMAT
0361 1A        1377       INC     R2                      ;       ENDIF
0362 FA        1378 TYP6: MOV    A,R2
0363 6467      1379       JMP     RECVE                   ;       ENDIF
0365 2301      1380 TYP4: MOV    A,#1
               1381 ;                                     ENDCASE
               1382 ;
               1383 ;
0367 B802      1384 RECVE: MOV    R0,#LENGTH              ;SET LENGTH
0369 B900      1385       MOV     R1,#TSMBUF              ;GET LENGTH RECORD PTR
036B 91        1386       MOVX    @R1,A
036C 90        1387       MOVX    @R0,A
036D 17        1388       INC     A
036E AF        1389       MOV     R7,A
036F BE03      1390       MOV     R6,#XRTS AND 0FFH
0371 840F      1391 REC1: JMP     EXEC
               1392 ;************************************************************
               1393 ;
               1394 SEJECT
               1395 ;1. TITLE
               1396 ;      UPLINE--UPLINE LOAD OF DATA FILE
               1397 ;2. CALL AND RETURN
               1398 ;      INPUTS
               1399 ;             RAM OPEN, MESSAGE PER: BYTE0 => QUADRANT
               1400 ;                                    BYT1  => STARTING BYTE
               1401 ;      OUTPUTS
               1402 ;             DATA FILE TRANSFERED TO MESSAGE
               1403 ;      RETURN
               1404 ;3. CALLED ROUTINES
               1405 ;--DATA
               1406 ;      INPUT
               1407 ;             R0=PTR TO BYTE AND QUADRANT
               1408 ;      OUTPUT
               1409 ;             A=DATA BYTE
               1410 ;4. EQUATES
0020           1411 XFERCT EQU    32                      ;NUMBER OF BYTES IN MESSAGE
0025           1412 LEN    EQU    37                      ;LENGTH OF MESSAGE
               1413 ;************************************************************
               1414 ;
               1415 ;
0373 8906      1416 UPLINE: MOV   R1,#INFO+2              ;GET PTR TO NEW MSG
0375 AA20      1417        MOV    R2,#XFERCT              ;GET TRANSFER COUNT
0377 B804      1418        MOV    R0,#INFO
0379 80        1419        MOVX   A,@R0                   ;GET QUADRANT
037A 5307      1420        ANL    A,#7
037C AB        1421        MOV    R3,A
037D B805      1422 LOAD:  MOV    R0,#INFO+1              ;DO WHILE COUNT
037F 80        1423        MOVX   A,@R0
0380 17        1424        INC    A                       ;  GET BYTE PTR
0381 90        1425        MOVX   @R0,A
0382 14CD      1426        CALL   DATA                    ;  GET BYTE
0384 FC        1427        MOV    A,R4
0385 91        1428        MOVX   @R1,A                   ;  STORE BYTE
0386 19        1429        INC    R1                      ;  INCREMENT DATA PTR
0387 EA7D      1430        DJNZ   R2,LOAD                 ;ENDWHILE
0389 2525      1431        MOV    A,#LEN                  ;SET MESSAGE LENGTH
038B 6467      1432        JMP    RECVE                   ;SEND MESSAGE
               1433 SEJECT
               1434 ;1. TITLE
               1435 ;      PRGRAM--PROGRAM DATA FILE. NOTE: WHEN BURNING DATA FILE ALL
               1436 ;              OTHER CONTROL OPERATIONS OF THE 540 CEASE.
               1437 ;              THE PROGRAM MESSAGE HAS THE FOLLOWING FORMAT:
               1438 ;                     BYTE       FORMAT
               1439 ;                      1         0000QQQQ       Q:QUADRANT ADDRESS
               1440 ;                      2         AAAAAAAA       A:ADDRESS TO PROGRAMMED
               1441 ;                      3         DDDDDDDD       D:DATA TO BE PROGRAMMED
               1442 ;2. CALL AND RETURN
               1443 ;      INPUTS
               1444 ;             RAM OPEN
               1445 ;      OUTPUTS
               1446 ;             PROM PROGRAMMED
               1447 ;      RETURN
               1448 ;3. CALLED ROUTINES
               1449 ;--DATA
               1450 ;      INPUTS
               1451 ;             R0=PTR TO BYTE, QUADRANT
               1452 ;      OUTPUTS
               1453 ;             A=BYTE, R1 RESTORED
               1454 ;4. EQUATES
0090           1455 T50MS  EQU    90H                     ;50 MS TIME OUT
0006           1456 PROGL  EQU    6                       ;LENGTH OF PROGRAM MESSAGE
               1457 ;************************************************************
               1458 ;
               1459 ;
038D 15        1460 PRGRAM: DIS   I             ;DISABLE INTERRUPTS, REV.6-6-80
038E 35        1461        DIS    TCNTI         ; DISABLE TIMER INT.
038F 2340      1462        MOV    A,#40H        ; SET BIT 6 OF R5,PROM BURN FLAG
0391 4D        1463        ORL    A,R5          ; REV. 10-3-80
0392 AD        1464        MOV    R5,A
0393 B904      1465        MOV    R1,#INFO               ;GET INFO PTR
```

```
0395 81        1466           MOVX    A,@R1           ;GET BYTE QUADRANT
0396 5307      1467           ANL     A,#7
0398 AB        1468           MOV     R3,A            ;SAVE BYTE QUADRANT
0399 19        1469           INC     R1              ;GET BYTE PTR
039A 81        1470           MOVX    A,@R1           ;GET BYTE
039B AA        1471           MOV     R2,A            ;SAVE BYTE PTR
039C 19        1472           INC     R1
039D 81        1473           MOVX    A,@R1           ;GET BYTE
039E AC        1474           MOV     R4,A
039F 2301      1475           MOV     A,#1
03A1 3F        1476           MOVD    P7,A
03A2 FA        1477           MOV     A,R2            ;GET BYTE ADDRESS
03A3 02        1478           OUTL    BUS,A           ;SET BYTE ADDRESS
03A4 2340      1479           MOV     A,#40H          ;TURN ON 25 V AND DISABLE RAM.
03A6 3A        1480           OUTL    P2,A
03A7 FC        1481           MOV     A,R4
03A8 02        1482           OUTL    BUS,A           ;SET BYTE TO PROGRAM
03A9 FB        1483           MOV     A,R3
03AA 4370      1484           ORL     A,#PROG
03AC 3A        1485           OUTL    P2,A            ;PROGRAM BYTE
03AD 27        1486           CLR     A               ;START 50 MS PROGRAM
03AE 14D8      1487           CALL    BURNT           ;PROGRAM IT
03B0 14D8      1488           CALL    BURNT
03B2 14D8      1489           CALL    BURNT
03B4 237F      1490           MOV     A,#7FH          ;TO GIVE TOTAL 50MS DELAY
03B6 14D8      1491           CALL    BURNT
03B8 23A0      1492           MOV     A,#XRAM         ;OPEN RAM AND STOP PROGRAMMING
03BA 3A        1493           OUTL    P2,A
03BB 2376      1494           MOV     A,#76H          ; TURN OFF CR20,CR21 AND 24V.
03BD 3F        1495           MOVD    P7,A            ; AND PROGRAM DELAY OF
               .1496 ;                                ;10MS. POST BURN DELAY
03BE 14D8      1497           CALL    BURNT           ;POST BURN DELAY
03C0 FA        1498           MOV     A,R2            ;GET BYTE ADDRESS
03C1 14CD      1499           CALL    DATA            ; GET BYTE
03C3 FC        1500           MOV     A,R4            ;SEND VERIFY BYTE
03C4 91        1501           MOVX    @R1,A           ;SAVE IT IN XMSN BUFFER
03C5 2390      1502           MOV     A,#RLYB0        ;DISABLE RELAY DRIVERS
03C7 F40A      1503           CALL    OFF
03C9 23A0      1504           MOV     A,#RLYB1        ;TURN OFF ALL DRIVERS AFTER PROM BURN
03CB F40A      1505           CALL    OFF
03CD 2380      1506           MOV     A,#XRAM         ;OPEN RAM PORT
03CF 3A        1507           OUTL    P2,A
03D0 2306      1508           MOV     A,#PROGL        ; LENGTH OF 6
03D2 6467      1509           JMP     RECVE           ; SEND THE MESSAGE
               1510 ;
               1511 ;
               1512 ;                         FILL-IN CODE
               1513 ;
03D4 FF        1514           DB      0FFH,0FFH,0FFH,0FFH,0FFH                   ; 3D3H-3DFH
03D5 FF
03D6 FF
03D7 FF
03D8 FF
03D9 FF        1515           DB      0FFH,0FFH,0FFH,0FFH,0FFH,0FFH,0FFH,0FFH
03DA FF
03DB FF
03DC FF
03DD FF
03DE FF
03DF FF
03E0 FF
03E1 FF        1516           DB      0FFH,0FFH,0FFH,0FFH,0FFH,0FFH,0FFH,0FFH ; 3E0H-3EFH
03E2 FF
03E3 FF
03E4 FF
03E5 FF
03E6 FF
03E7 FF
03E8 FF
03E9 FF        1517           DB      0FFH,0FFH,0FFH,0FFH,0FFH,0FFH,0FFH,0FFH
03EA FF
03EB FF
03EC FF
03ED FF
03EE FF
03EF FF
03F0 FF
03F1 FF        1518           DB      0FFH,0FFH,0FFH,0FFH,0FFH,0FFH,0FFH,0FFH ; 3F0H-3FAH
03F2 FF
03F3 FF
03F4 FF
03F5 FF
03F6 FF
03F7 FF
03F8 FF
03F9 FF        1519           DB      0FFH,0FFH,0FFH
03FA FF
03FB FF
               1520 ;
               1521 $EJECT
03FB           1522           ORG     3FBH
03FB FF        1523           DB      0FFH            ;DATA FILE TERMINATOR
03FC 47        1524 REV:      DB      'G'             ;REV. LETTER OF 540 ASSEMBLY
03FD 02        1525 DATE:     DB      02H,04H,81H     ;DATE FEB. 04, 1981
03FE 04
03FF 81
               1526 $EJECT
               1527 ;1. TITLE
               1528 ;     EXEC--REAL TIME EXECUTIVE THAT CONTROLS TASK INITIATION IN THE 540
               1529 ;     DGP.  THE EXEC SCHEDULES TASKS ON A REQUEST BASIS AND ON A POLLED
               1530 ;     BASIS.  THE POLLED ROUTINES ARE CRITICAL TO EXECUTE OFTEN (WITHIN
               1531 ;     1 MS) AND MUST EXECUTE QUICKLY.
               1532 ;                     POLLED ROUTINE                   COMMENT
```

```
                        1533 ;                    TSM               TRANSMISSION HANDLER
                        1534 ;                    WATCH             WATCH DOG TIMER
                        1535 ;     THE REQUEST BASIS IS USED TO SCHEDULE TIME OR EVENT DRIVEN ROUTINES
                        1536 ;     REGISTER 5 IS DESIGNATED THE TASK REQUEST BUFFER. UP TO 5 TASKS
                        1537 ;     CAN BE INITIATED BY REQUEST.  ONE TASK IS EXECUTED PER EXEC LOOP.
                        1538 ;     THESE TASKS ARE PRIORITIZED ON A FIXED BASIS FROM RIGHT TO LEFT IN
                        1539 ;     THE TASK REQUEST BUFFER.  THE TASKS ARE DEFINED AS BELOW:
                        1540 ;               TASK REQUEST BUFFER => 76543210
                        1541 ;                                  7:      ASSIGNED FOR 'RFC' ROUTINE
                        1542 ;                                  6:      ASSIGNED FOR PROM-BURN FLAG
                        1543 ;                                  5:      ASSIGNED FOR ODC RE. OCT.3.80
                        1544 ;                                  4:      EIP=> 2 SECOND EVENT PROGRAM
                        1545 ;                                  3:      A/D CONVERT => SCHEDULED BY INTERRUPT
                        1546 ;                                          DRIVEN CONVERTER ROUTINE
                        1547 ;                                  2:      RELAY ACTIVATE => SCHEDULED BY RELAY
                        1548 ;                                          COMMAND
                        1549 ;                                  1:      TOTALIZER => SCHEDULED BY WATCH DOG
                        1550 ;                                          AND BY ITSELF
                        1551 ;                                  0:      TRANSMISSION PROCESS => SCHED-
                        1552 ;                                          ULED BY RECEIVED TSM.
                        1553 ;     AN INTERRUPT DRIVEN CLOCK AND A/D CONVERSION ROUTINE IS USED FOR TIME
                        1554 ;     KEEPING, DELAYS, AND CONVERSION. THIS ROUTINE IS USED TO SCHEDULE
                        1555 ;     THE CONVERT ROUTINE
                        1556 ;2.  CALL AND RETURN
                        1557 ;        INPUTS
                        1558 ;        OUTPUTS
                        1559 ;        RETURN
                        1560 ;3.  CALLED ROUTINES
0400                    1561         ORG      400H
0400 641A               1562 TASK0:  JMP      RECV            ;  PROCESS RECEIVE TRANSMISSION
0402 843F               1563 TASK1:  JMP      TOTAL           ;  TOTALIZER
0404 8471               1564 TASK2:  JMP      RLY             ;  RELAY TIMER
0406 C400               1565 TASK3:  JMP      AD              ;  A/D CONVERT
0408 C46E               1566 TASK4:  JMP      EIPP            ;  EIP PROGRAMS
                        1567 ;4.  EQUATES
00FF                    1568 MASK1   EQU      0FFH
040A FE                 1569 BITMSK: DB       11111110B
040B FD                 1570         DB       11111101B
040C FB                 1571         DB       11111011B
040D F7                 1572         DB       11110111B
040E EF                 1573         DB       11101111B
                        1574 ;************************************************************
                        1575 ;
                        1576 ;
040F 5407               1577 EXEC:   CALL     TSM
0411 2380               1578         MOV      A,#XRAM         ;OPEN RAM PORT
0413 3A                 1579         OUTL     P2,A
0414 94A9               1580         CALL     WATCH
0416 BBFF               1581 TASKR0: MOV      R3,#0FFH
0418 FD                 1582         MOV      A,R5            ; IF R5 BIT6 IS SET DISABLE ALL EXEC.
0419 5340               1583         ANL      A,#40H          ; TASKS, EXCEPT TASK0
041B C621               1584         JZ       NTASK           ;     ELSE NORMAL FUCTIONS,10-3-80
041D 23C1               1585         MOV      A,#0C1H         ;CLEAR BITS 5 THRU 1
041F 5D                 1586         ANL      A,R5
0420 AD                 1587         MOV      R5,A
0421 FD                 1588 NTASK:  MOV      A,R5            ;GET TASK REQUEST
0422 531F               1589 TASK:   ANL      A,#1FH
0424 C60F               1590         JZ       EXEC            ;IF TASK REQUEST THEN
0426 67                 1591         RRC      A               ;  GET TASK
0427 1B                 1592         INC      R3              ;
0428 E622               1593         JNC      TASK
042A F9                 1594         MOV      A,R3            ; GET TASK PTR
042B 030A               1595         ADD      A,#BITMSK AND 0FFH    ; GET TASK REQ MASK
042D A3                 1596         MOVP     A,@A
042E AB                 1597         MOV      R3,A            ; SAVE TASK DESIGNATOR
042F 5D                 1598         ANL      A,R5            ; RESET TASK REQUEST
0430 AD                 1599         MOV      R5,A
0431 FB                 1600         MOV      A,R3            ; GET TASK TABLE BAS
0432 37                 1601         CPL      A
0433 1200               1602         JB0      TASK0
0435 3202               1603         JB1      TASK1
0437 5204               1604         JB2      TASK2
0439 7206               1605         JB3      TASK3
043B 9208               1606         JB4      TASK4
                        1607 ;                                          ENDIF
                        1608 SEJECT
                        1609 ;1. TITLE
                        1610 ;      TOTAL--TOTALIZER
                        1611 ;2. CALL AND RETURN
                        1612 ;      INPUTS
                        1613 ;            TOTSCH--CURRENTLY PROCESSED TOTALIZER INPUT
                        1614 ;            TOTASS--ASSIGNED TOTALIZERS
                        1615 ;            TOTRUN--TOTALIZER-1, RUN TIME-0
                        1616 ;            TOTLST--LAST STATUS OF INPUT (1 => "1" LAST TIME)
                        1617 ;            TOTINC--PULSE TRANSITION TO 1 DEBOUNCE
                        1618 ;            TOTACT--ACTIVE TOTALIZERS NEEDING COUNT (1=> COUNT)
                        1619 ;            TOTTMR--RUN TIME DELAY 2.00 SEC
                        1620 ;      OUTPUTS
                        1621 ;            TOTALIZER INCREMENTED WHEN COUNT
                        1622 ;      RETURN
                        1623 ;3. CALLED ROUTINES
                        1624 ;--ONE--INPUT ONE PROCESSING
                        1625 ;      INPUTS
                        1626 ;            R0=TOTLST, R1=TOTINC, R2=VALUE, R3=POSITION MASK (TOTALIZER NUM);    OUTPUTS
                        1627 ;            POINT INCREMENTED
                        1628 ;4. EQUATES
043D 50                 1629 XTOT1:  DB       TOTAL1 AND 0FFH       ;TOTALIZER COS CHECK
043E CA                 1630 XTOT2:  DB       ONE AND 0FFH          ;TOTALIZER INCREMENT ENTRY
                        1631 ;************************************************************
                        1632 ;
                        1633 ;
043F 88F3               1634 TOTAL:  MOV      R0,#TOTSCH            ;GET TOTALIZER SCHEDULE PTR
0441 80                 1635         MOVX     A,@R0
0442 C649               1636         JZ       TOTALA
```

```
0444 B3        1637          JMPP    @A
               1638 ;
0445 2302      1639 TOTALY: MOV     A,#2                    ;SCHEDULE REENTR
0447 40        1640         ORL     A,R5
0448 AD        1641         MOV     R5,A
0449 233E      1642 TOTALA: MOV     A,#XTOT2 AND OFFH       ;SCHEDULE TOTALIZER COS CHECK
044B B9F3      1643 TOTALX: MOV     R1,#TOTSCH              ;GET TOTALIZER SCHEDULE PTR
044D 91        1644         MOVX    @R1,A
044E 840F      1645 TOTALE: JMP     EXEC
               1646 ;
               1647 ;
0450 23C0      1648 TOTALI: MOV     A,#DIGIN                ;GET DATA
0452 3A        1649         OUTL    P2,A
0453 09        1650         IN      A,P1
0454 37        1651         CPL     A
0455 AA        1652         MOV     R2,A
0456 2384      1653         MOV     A,#XRAM+4
0458 3A        1654         OUTL    P2,A
0459 3F        1655         MOVD    P7,A                    ;TURN ON LED
045A B8F4      1656         MOV     R0,#TOTASS              ;GET TOTALIZER ASSIGNMENT PTR
045C B927      1657         MOV     R1,#TOTLST              ;GET LAST VALUE PTR
045E A0        1658         MOVX    A,@R0
045F 5A        1659         ANL     A,R2
0460 21        1660         XCH     A,@R1                   ;UPDATE LAST VALUE
0461 D1        1661         XRL     A,@R1                   ;GET COS
0462 51        1662         ANL     A,@R1                   ;GET NEW WAIT INPUT (INPUT * COS)
0463 B828      1663         MOV     R0,#TOTINC              ;GET WAIT PTR
0465 20        1664         XCH     A,@R0                   ;UPDATE WAIT
0466 B82F      1665         MOV     R0,#TOTTMR              ;GET RUN TIME TIMER
0468 40        1666         ORL     A,@R0                   ;GET WAIT OR RUN
0469 51        1667         ANL     A,@R1                   ;GET (WAIT OR RUN)*INPUT
046A B9F6      1668         MOV     R1,#TOTACT
046C 91        1669         MOVX    @R1,A                   ;TOTALIZER PULSE ACTIVE=WAIT*INPUT OR
               1670 ;                                         RUN*INPUT
046D 27        1671         CLR     A
046E A0        1672         MOV     @R0,A                   ;RESET RUN TIME
046F 8445      1673         JMP     TOTALY                  ;
               1674 ;
               1675 SEJECT
               1676 ;1. TITLE
               1677 ;       RLY--PULSED DRIVER ACTIVATION AND TIMING
               1678 ;       NOTE:   THE RELAY DELAY FILE CAN HOLD 8 CURRENTLY ACTIVE PULSED RELAYS.
               1679 ;               THE FILE IS ARRANGED AS:
               1680 ;                       BYTE            FUNCTION
               1681 ;                       EVEN            TIMER ENTRY;
               1682 ;                       ODD             RELAY ACTIVATION ENTRY FOR 'REGRLY'
               1683 ;2. CALL AND RETURN
               1684 ;       INPUTS
               1685 ;               RLYSCH=ENTRY PT, RLYENT=NEXT RELAY TO PROCESS, RLYCT=INACTIVE COUNT
               1686 ;       OUTPUTS
               1687 ;               RELAY PULSED FOR SPECIFIED TIME
               1688 ;       RETURN
               1689 ;3. CALLED ROUTINES
               1690 ;--REGRLY
               1691 ;       INPUTS
               1692 ;               A=LH10-ID- WHERE L=LOW DRIVER ACTIVATE, H=HIGH DRIVER ACTIVATE
               1693 ;                          ID=DRIVER TO PULSE
               1694 ;       OUTPUTS
               1695 ;               RELAY ID SPECIFIED TURNED OFF
               1696 ;4. EQUATES
               1697 ;************************************************************************
               1698 ;
               1699 ;
0471 89F2      1700 RLY:    MOV     R1,#RLYSCH              ;GET CURRENT ENTRY PT
0473 81        1701         MOVX    A,@R1
0474 968B      1702         JNZ     RLY2
               1703 ;
               1704 ;
0476 A82E      1705 RLY1:   MOV     R0,#RLYCT               ;GET COUNT
0478 F0        1706         MOV     A,@R0
0479 C6A7      1707         JZ      RLYE                    ;IF RELAYS IN QUEUE THEN
047B AA        1708         MOV     R2,A
047C B8D0      1709         MOV     R0,#DIGDLY              ;   GET RLY PTR
047E 80        1710 RLY1L:  MOVX    A,@R0                   ;   DO WHILE COUNT AND NO EXPIRED TIMERS
047F 07        1711         DEC     A                       ;       GET TIMER
0480 90        1712         MOVX    @R0,A                   ;       DECREMENT TIMER
0481 18        1713         INC     R0
0482 C6A3      1714         JZ      RLYE1                   ;       TEST EXPIRED
0484 18        1715         INC     R0
0485 EA7E      1716         DJNZ    R2,RLY1L                ;   ENDWHILE
0487 B800      1717         MOV     R0,#0
0489 84A3      1718         JMP     RLYE1                   ;ENDIF
               1719 ;
               1720 ;
048B A8        1721 RLY2:   MOV     R0,A                    ;GET TIMER VALUE
048C 80        1722         MOVX    A,@R0
048D B46F      1723         CALL    REGRLY                  ;DO RELAY ACTION
048F 23A0      1724         MOV     A,#XRAM                 ;OPEN RAM
0491 3A        1725         OUTL    P2,A
0492 B92E      1726         MOV     R1,#RLYCT               ;GET RELAY COUNT
0494 F1        1727         MOV     A,@R1
0495 07        1728         DEC     A                       ;DECREMENT ACTIVE RELAY COUNT
0496 A1        1729         MOV     @R1,A
0497 E7        1730         RL      A
0498 03D1      1731         ADD     A,#DIGDLY+1
049A A9        1732         MOV     R1,A                    ;EXCHANGE SORT LAST AND CURRENT ENTRY
049B 81        1733         MOVX    A,@R1                   ;GET LAST ENTRY
049C 90        1734         MOVX    @R0,A                   ;STORE IN CURRENTLY ACTIVATED ENTRY
049D C8        1735         DEC     R0
049E C9        1736         DEC     R1
049F 81        1737         MOVX    A,@R1
04A0 90        1738         MOVX    @R0,A
04A1 B800      1739         MOV     R0,#0
```

```
04A3 H9F2      1740 RLYE1:  MOV     R1,#RLYSCH
04A5 FH        1741         MOV     A,#0                    ;EXIT RELAY ROUTINE
04A6 91        1742         MOVX    @R1,A
04A7 B40F      1743 RLYE:   JMP     EXEC
               1744 SEJECT
               1745 ;1. TITLE
               1746 ;        WATCH--WATCHDOG TIMER
               1747 ;2.  CALL AND RETURN
               1748 ;        INPUTS
               1749 ;                SECOND CLOCK
               1750 ;        OUTPUTS
               1751 ;                IF SECOND CLOCK STOPPED FOR LONGER THEN 25EC MINIMUM THEN
               1752 ;                THE SECOND CLOCK IS TICKED AND INTERRUPTS ENABLED.  IF THE
               1753 ;                8 MS COUNT EXPIRES, THE TOTALIZER ROUTINE IS SCHEDULED.
               1754 ;        RETURN
               1755 ;3.  CALLED ROUTINES
               1756 ;4.  EQUATES
               1757 ;********************************************************************
               1758 ;
               1759 ;
04A9 B828      1760 WATCH:  MOV     R0,#WATCHD              ;GET WATCHDOG TIMER PTR
04AB 10        1761         INC     @R0
04AC F0        1762         MOV     A,@R0                   ;GET WATCHDOG TIMER
04AD 96C9      1763         JNZ     WATCH2                  ;IF EXPIRED THEN
04AF 2302      1764         MOV     A,#-06                  ;  TEST CLOCK EXTENSION
04B1 A0        1765         MOV     @R0,A
04B2 2306      1766         MOV     A,#2+4                  ;  SCHEDULE TOTALIZER AND RLY
04B4 4D        1767         ORL     A,R5
04B5 AD        1768         MOV     R5,A
04B6 18        1769         INC     R0                      ;  TEST  CLOCK EXTENSION
04B7 10        1770         INC     @R0
04B8 F0        1771         MOV     A,@R0
04B9 96C9      1772         JNZ     WATCH2
04BB H925      1773         MOV     R1,#SECOND              ;  TICK SECOND CLOCK
04BD 18        1774         INC     R0                      ;  GET LAST SECOND ENTRY
04BE F0        1775         MOV     A,@R0
04BF 01        1776         XRL     A,@R1                   ;  TEST SECOND TICK
04C0 96C3      1777         JNZ     WATCH1                  ;  IF SECOND CLOCK NOT TICKING THEN
04C2 05        1778         EN      I                       ;    ENABLE INTERRUPTS (FAILED SENSOR)
04C3 F1        1779 WATCH1: MOV     A,@R1                   ;  ENDIF
04C4 A0        1780         MOV     @R0,A                   ;  UPDATE LAST SECOND ENTRY
04C5 B92F      1781         MOV     R1,#TOTTMR
04C7 E4F2      1782         JMP     WATCHX          ;PATCHED ELSE WHERE FOR WANT OF SPACE
               1783 ;               MOV     R0,#TOTRUN              ;  SCHEDULE RUN TIME INCREMENT
               1784 ;               MOV     R1,#TOTTMR
               1785 ;               MOVX    A,@R0
               1786 ;               MOV     @R1,A
               1787 ;               MOV     A,#16                   ;  SCHEDULE EIP PROGRAM (2 SECONDS)
               1788 ;               ORL     A,R5
               1789 ;               MOV     R5,A
04C9 93        1790 WATCH2: RETR                            ;ENDIF
               1791 ;
               1792 SEJECT
               1793 ;
               1794 ;1. TITLE
               1795 ;        ONE--ONE INPUT PROCESS
               1796 ;2.  CALL AND RETURN
               1797 ;        INPUTS
               1798 ;                R0=TOTLST, R1=TOTINC, R2=VALUE, R3=POSITION MASK (TOTALIZER NUM
               1799 ;        OUTPUTS
               1800 ;                POINT INCREMENTED
               1801 ;3.  CALLED ROUTINES
               1802 ;4.  EQUATES
               1803 ;********************************************************************
               1804 ;
               1805 ;
04CA B9F6      1806 ONE:    MOV     R1,#TOTACT              ;GET INPUTS TO COUNT
04CC 81        1807         MOVX    A,@R1
04CD 9606      1808         JNZ     ONE0
04CF 2306      1809         MOV     A,#6                    ;TURN OFF LED
04D1 3F        1810         MOVD    P7,A
04D2 2330      1811         MOV     A,#XTOT1 AND 0FFH
04D4 B44B      1812         JMP     TOTALX
04D6 BAFE      1813 ONE0:   MOV     R2,#-2
04D8 BBFE      1814         MOV     R3,#0FEH
04DA 97        1815         CLR     C
04DB F7        1816 ONE1:   RLC     A                       ;DO WHILE PT NOT FOUND
04DC 2B        1817         XCH     A,R3
04DD 77        1818         RR      A                       ;  TEST POINT
04DE 2B        1819         XCH     A,R3                    ;  ROTATE MASK
04DF 1A        1820         INC     R2                      ;  INCREMENT PTR OFFSET
04E0 1A        1821         INC     R2
04E1 E6DB      1822         JNC     ONE1                    ;ENDWHILE
04E3 81        1823         MOVX    A,@R1
04E4 5B        1824         ANL     A,R3
04E5 91        1825         MOVX    @R1,A                   ;UPDATE INPUTS TO COUNT
04E6 234A      1826 ONE2:   MOV     A,#ANAST                ;GET STATUS PTR
04E8 6A        1827         ADD     A,R2
04E9 17        1828         INC     A
04EA A8        1829         MOV     R0,A
04EB 80        1830         MOVX    A,@R0
04EC 17        1831         INC     A
04ED 90        1832         MOVX    @R0,A
04EE 96FE      1833         JNZ     ONEE                    ;IF OVERFLOW THEN
04F0 CB        1834         DEC     R0
04F1 80        1835         MOVX    A,@R0                   ;  GET VALUE
04F2 17        1836         INC     A
04F3 90        1837         MOVX    @R0,A                   ;  INCREMENT STATUS
04F4 53F0      1838         ANL     A,#0F0H
04F6 C6FE      1839         JZ      ONEE                    ;  IF 12 BIT OVERFLOW THEN
04F8 27        1840         CLR     A
04F9 90        1841         MOVX    @R0,A                   ;    WRAP COUNTER AROUND
04FA 18        1842         INC     R0
```

```
04FB 235F       1843            MOV     A,#95                   ;  PRESET COUNTER TO 95
04FD 90         1844            MOVX    @R0,A
                1845    ;                                       ENDIF
                1846    ;                                       ENDIF
04FE F4B7       1847 ONEE:      CALL    ANACOS                  ;SET ANALOG COS
0500 8445       1848            JMP     TOTALY
                1849    ;
                1850    ;
                1851 $EJECT
                1852 ;1. TITLE
                1853    ;       RELAY--RELAY COMMAND EXECUTION IF DATA FILE
                1854 ;2. CALL AND RETURN
                1855    ;       INPUTS
                1856    ;       OUTPUTS
                1857    ;               RELAY COMMANDED, R0 RESTORED
                1858    ;       RETURN
                1859 ;3. CALLED ROUTINES
                1860 ;--FILE--GET DATA FILE
                1861    ;       INPUT
                1862    ;               R0=PTR TO POINT NUMBER (MUST BE MASKED)
                1863    ;               A=0 => ANALOG, A=NONZERO => DIGITAL
                1864    ;       OUTPUT
                1865    ;               R1=PTR TO FILE(BEGINNING) ,R0=PTR TO POINT NUMBER
                1866 ;--RLYACT--RELAY ACTIVATION
                1867    ;       INPUTS
                1868    ;               R0=RELAY COMMAND PTR, R1=RELAY FILE,A7=ON=1, OFF=0
                1869    ;       OUTPUTS
                1870    ;               RELAY COMMANDED
                1871 ;--POINT
                1872    ;       INPUTS
                1873    ;               B7=STATUS, R1=DATA FILE PTR
                1874    ;       OUTPUTS
                1875    ;               POINT UPDATED
                1876 ;4. EQUATES
0004            1877 SSLEN  EQU  4                              ;LENGTH OF START STOP MESSAGE
                1878 ;***************************************************************
                1879 ;
                1880 ;
0502            1881            ORG     0502H
0502 B804       1882 RELAY: MOV      R0,#INFO                   ;GET PTR TO MSG
0504 F4B7       1883            CALL    FILE                    ;GET POINT DATA FILE
0506 B938       1884            MOV     R1,#DIGITL
0508 F1         1885            MOV     A,@R1
0509 C612       1886            JZ      SS
050B F440       1887            CALL    POINT                   ;UPDATE STATUS
050D B804       1888            MOV     R0,#INFO
050F 80         1889            MOVX    A,@R0
0510 B938       1890            MOV     R1,#DIGITL              ;GET DATA FILE PTR
0512 H423       1891 SS:        CALL    RLYACT                  ;EXECUTE BIT 0 START STOP
0514 B93C       1892            MOV     R1,#MSBIT               ;GET BIT 1 FILE
0516 F1         1893            MOV     A,@R1
0517 C61F       1894            JZ      SSE                     ;IF 3 MODE THEN
0519 B804       1895            MOV     R0,#INFO
051A 80         1896            MOVX    A,@R0
051C E7         1897            RL      A
051D H423       1898 SS1:       CALL    RLYACT                  ;  EXECUTE BIT 1 START STOP
                1899 ;                                               ENDIF
051F 2304       1900 SSE:       MOV     A,#SSLEN                ;SEND RESPONSE
0521 64B7       1901            JMP     RECVE
                1902 $EJECT
                1903 ;1. TITLE
                1904    ;       RLYACT--RELAY ACTIVATE   THIS ROUTINE ACCEPTS INPUTS ACCORDING TO
                1905    ;               THE FOLLOWING FILE ENTRIES:
                1906    ;                       TYPE            ASSIGNMENT
                1907    ;                       REGULAR         LH10-ID=         L:LOW DRIVER ACTIVE
                1908    ;                                                        H:HIGH DRIVER ACTIVE
                1909    ;                                                        ID: 0-15 RELAY ID
                1910    ;                       CIM MAGLATCH    0011-ID=
                1911    ;                       FS MODULE       000--ID=
                1912    ;               NOTE THAT UP TO 32 FS RELAYS MAY BE COMMANDED
                1913 ;2. CALL AND RETURN
                1914    ;       INPUTS
                1915    ;               R0=RELAY COMMAND PTR (INFO), R1=RELAY FILE,A7=ON=1,OFF=0
                1916    ;       OUTPUTS
                1917    ;               RELAY COMMANDED
                1918    ;       RETURN
                1919 ;3. CALLED ROUTINES
                1920 ;--ONBRD--COMMAND ON BOARD DRIVERS (APPLIES TO MAINTAINED RELAY BOARD)
                1921 ;--FSRLY--COMMAND OFF BOARD RELAYS ON FS MODULES
                1922 ;--CIMSS--COMMAND CIM MAGLATCH MODULES
                1923    ;       INPUTS
                1924    ;               A=COMMAND BYTE
                1925    ;       OUTPUTS
                1926    ;               DRIVER COMMANDED
                1927 ;4. EQUATES
                1928 ;***************************************************************
                1929 ;
                1930 ;
0523 AB         1931 RLYACT: MOV     R3,A                        ;SAVE COMMAND
0524 F1         1932            MOV     A,@R1                    ;GET FILE ENTRY
0525 962A       1933            JNZ     RL1                      ;IF NO DATA FILE THEN
0527 80         1934            MOVX    A,@R0                    ;  GET COMMAND BYTE
0528 A437       1935            JMP     RL2                      ;ELSE IF DATA FILE THEN
052A 19         1936 RL1:       INC     R1                       ;  INCREMENT DATA FILE PTR
052B F1         1937            MOV     A,@R1                    ;  GET DELAY BYTE
052C C631       1938            JZ      RL3                      ;  IF TIMER THEN
052E H452       1939            CALL    PULSE                    ;    SET TIMEOUT AND RELAY
0530 C9         1940            DEC     R1                       ;  ENDIF
0531 FB         1941 RL3:       MOV     A,R3                     ;  GET COMMAND
0532 19         1942            INC     R1
0533 F236       1943            JB7     RL4                      ;  IF 0 COMMAND THEN
0535 19         1944            INC     R1                       ;    INCREMENT DATA FILE PTR
                1945 ;                                                ELSE 1 COMMAND
```

```
0536 F1      1946 RL4:     MOV   A,@R1                ;    GET COMMAND
             1947 ;                                        ENDIF
0537 8244    1948 RL2:     JB5   ONBRD                ; IF FS MODULE THEN
0539 F230    1949          JB7   RL5
053B A44E    1950          JMP   RL99
053D A8      1951 RL5:     MOV   R3,A
053E F5      1452          SEL   MB1
053F 74B5    1953          CALL  FSRLY                ;    START STOP
0541 E5      1954          SEL   MB0
0542 A44E    1955          JMP   RL99
             1956 ;                                        ELSE IF REGULAR START STOP
0544 924A    1957 ONBRD:   JB4   CIMSS
0546 B46F    1958          CALL  REGRLY               ;    EXECUTE REGULAR START STOP
0548 A44E    1959          JMP   RL99                 ;    ELSE IF CIM THEN
054A F5      1960 CIMSS:   SEL   MB1
054B 74E4    1961          CALL  CIM                  ;    EXECUTE START STOP
054D E5      1962          SEL   MB0
             1963 ;                                        ENDIF
054E 2380    1964 RL99:    MOV   A,#XRAM              ;OPEN RAM
0550 3A      1965          OUTL  P2,A
0551 93      1966          RETR
             1967 SEJECT
             1968 ;1. TITLE
             1969 ;        PULSE            REV. 5-23-80
             1970 ;2. CALL AND RETURN
             1971 ;        INPUTS
             1972 ;                R1=PTR TO DELAY AND ACTION
             1973 ;        OUTPUTS
             1974 ;                ACTION AND DELAY SCHEDULED
             1975 ;        RETURN
             1976 ;3. CALLED ROUTINES
             1977 ;4. EQUATES
             1978 ;*************************************************************
             1979 ;
             1980 ;
0552 BA2E    1981 PULSE:   MOV   R0,#RLYCT            ;    INCREMENT RELAY PULSED COUNT
0554 10      1982          INC   @R0
0555 F0      1983          MOV   A,@R0
0556 E7      1984          RL    A
0557 03CE    1985          ADD   A,#DIGDLY-2
0559 A8      1986          MOV   R0,A
055A F1      1987          MOV   A,@R1                ;    SET DELAY
055B 90      1988          MOVX  @R0,A
055C 18      1989          INC   R0
055D 19      1990          INC   R1                   ;    INCREMENT PTRS
055E FB      1991          MOV   A,R3                 ;COMMAND IN A
055F F266    1992          JB7   PULSA                ;1 COMMAND,ACT ON BYTE 2 OF D.F.
0561 19      1993          INC   R1                   ;0-COMMAND ,ACT ON BYTE 3 OF D.F.
0562 F1      1994          MOV   A,@R1
0563 C4      1995          DEC   R1
0564 A467    1996          JMP   PULSB
0566 F1      1997 PULSA:   MOV   A,@R1                ;    SET ACTION
0567 533F    1998 PULSB:   ANL   A,#3FH
0569 90      1999          MOVX  @R0,A
056A 93      2000          RETR
             2001 SEJECT
             2002 ;1. TITLE
             2003 ;        REGRLY--REGULAR RELAY DRIVER
             2004 ;2. CALL AND RETURN
             2005 ;        INPUTS
             2006 ;                A=COMMAND
             2007 ;        OUTPUTS
             2008 ;                RELAY COMMANDED
             2009 ;3. CALLED ROUTINES
             2010 ;4. EQUATES
056B 0E      2011 BCOM:    DB    00001110B            ;RELAY POSITION 0 MASK
056C 0D      2012          DB    00001101B            ;RELAY POSITION 1 MASK
056D 0B      2013          DB    00001011B            ;RELAY POSITION 2 MASK
056E 07      2014          DB    00000111B            ;RELAY POSITION 3 MASK
             2015 ;*************************************************************
             2016 ;
             2017 ;
056F AA      2018 REGRLY:  MOV   R2,A
0570 7276    2019          JB3   BANK1                ;IF BANK0 THEN
0572 23B0    2020          MOV   A,#RLYB0             ;    GET BANK 0
0574 A478    2021          JMP   BANK
             2022 ;                                        ELSE
0576 23A0    2023 BANK1:   MOV   A,#RLYB1             ;    GET BANK 1
             2024 ;                                        ENDIF
0578 3A      2025 BANK:    OUTL  P2,A                 ;OPEN RELAY BANK
0579 FA      2026          MOV   A,R2
057A 5303    2027          ANL   A,#3                 ;GET ON/OFF MASK
057C 036B    2028          ADD   A,#BCOM AND 0FFH
057E A3      2029          MOVP  A,@A
057F AB      2030          MOV   R3,A                 ;SAVE MASK PTR
0580 FA      2031          MOV   A,R2                 ;GET COMMAND
0581 97      2032          CLR   C
0582 5286    2033          JB2   HI1                  ;IF LOWER 4 OUTPUTS (PORT 4(HI),6(LO))
0584 A487    2034          JMP   HIOUT
0586 A7      2035 HI1:     CPL   C                    ;    SET C FLAG
             2036 ;                                        ELSE
             2037 ;                                        ;    RESET C FLAG
             2038 ;                                        ENDIF
0587 FB      2039 HIOUT:   MOV   A,R3                 ;IF LOWER 4 OUTPUTS (PORTS 4,6)
0588 F68E    2040          JC    HIOFF
058A 9C      2041          ANLD  P4,A
058B 9E      2042          ANLD  P6,A                 ;    TURN BOTH OFF
058C A490    2043          JMP   LOWCHK               ;ELSE IF HIGHER 4 (PORTS 5,7) THEN
058E 9D      2044 HIOFF:   ANLD  P5,A
058F 9F      2045          ANLD  P7,A                 ;    TURN BOTH OFF
             2046 ;                                        ENDIF
0590 FA      2047 LOWCHK:  MOV   A,R2                 ;GET COMMAND
0591 F297    2048          JB7   LOW1                 ;IF NO ON COMMAND THEN
```

```
0593 D2A1      2049            JB6     HI              ; EXIT
0595 A4A9      2050            JMP     BANKE           ;ELSE IF LOW ON COMMAND THEN
0597 FB        2051 LOW1:      MOV     A,R3            ; GET MASK PTR
0598 37        2052            CPL     A
0599 F69E      2053            JC      P7LO            ; IF PORT 6 THEN
059B 8E        2054            ORLD    P6,A            ;   SET LOW OUTPUT
059C A4A9      2055            JMP     BANKE           ; ELSE PORT 7
059E 8F        2056 P7LO:      ORLD    P7,A            ;   SET LOW OUTPUT
059F A4A9      2057            JMP     BANKE           ; ENDIF
05A1 FB        2058 HI1:       MOV     A,R3            ;ELSE IF HI ON COMMAND THEN
05A2 37        2059            CPL     A
05A3 F6A8      2060            JC      P5HI            ; IF LOWER OUTPUT (PORT4) THEN
05A5 8C        2061            ORLD    P4,A            ;    TURN ON
05A6 A4A9      2062            JMP     BANKE           ; ELSE
05A8 8D        2063 P5HI:      ORLD    P5,A            ;    TURN ON
               2064 ;                                   ENDIF
               2065 ;                                  ENDIF
05A9 93        2066 BANKE:     RETR
               2067 ;
               2068 ;                  FILL-IN CODE
               2069 ;
05AA FF        2070            DB      0FFH,0FFH,0FFH,0FFH,0FFH,0FFH,0FFH,0FFH
05AB FF
05AC FF
05AD FF
05AE FF
05AF FF
05B0 FF
05B1 FF
05B2 FF        2071            DB      0FFH,0FFH,0FFH,0FFH,0FFH,0FFH,0FFH
05B3 FF
05B4 FF
05B5 FF
05B6 FF
05B7 FF
05B8 FF
               2072 ;
               2073 SEJECT
               2074 ;****************************************************
               2075 ;NR TIMER FOR THE REPEATER
               2076 ;     IF RS-232 REPEATER 540 DOES NOT GET THE RESPONSE FROM
               2077 ;     RS-422 REPEATER IT WILL TIME OUT AFTER 50MS AND SWAP
               2078 ;     LINES TO LISTEN TO 560 POLLS.
               2079 ;
05B9 2380      2080 RDATAB:    MOV     A,#XRAM         ; OPEN THE XRAM PORT
05BB 3A        2081            OUTL    P2,A
05BC 2301      2082            MOV     A,#01H          ; INITIALIZE THE TIMER FOR 50 MS.
05BE B9FF      2083            MOV     R1,#NRTMR
05C0 91        2084            MOVX    @R1,A
05C1 2390      2085            MOV     A,#UART         ; OPEN UART PORT
05C3 3A        2086            OUTL    P2,A
05C4 8926      2087            MOV     R1,#EIP
05C6 4450      2088            JMP     RDATAC          ; GO TO REC ROUTINE
               2089 ;
               2090 ;****************************************************
               2091 ;540 REPEATER PATCH
               2092 ;
               2093 ;     IF RS232.REPEATER.REPEAT STATE .NRTMR EXPIRED
               2094 ;                THEN SWAP LINES
               2095 ;     ELSE EXIT
               2096 ;
05C8 2380      2097 RDATAA:    MOV     A,#XRAM         ;OPEN RAM PORT
05CA 3A        2098            OUTL    P2,A
05CB B9FF      2099            MOV     R1,#NRTMR
05CD 81        2100            MOVX    A,@R1           ;INCR NRTMR AND TEST IF EXPIRED
05CE 17        2101            INC     A
05CF 91        2102            MOVX    @R1,A           ;RESTORE INCR. VALUE
05D0 D3FF      2103            XRL     A,#0FFH         ;TIMER EXPIRED?50 MS. UP?
05D2 96E8      2104            JNZ     RDATAD          ;NO
05D4 8920      2105            MOV     R1,#ADDRES      ;YES. IS IT 232.REPEATER?
05D6 F1        2106            MOV     A,@R1
05D7 5303      2107            ANL     A,#03
05D9 D303      2108            XRL     A,#03
05DB 96E8      2109            JNZ     RDATAD          ;NO.EXIT FROM TSM.
05DD B924      2110            MOV     R1,#LINE        ;YES. IN REPEATER STATE?
05DF F1        2111            MOV     A,@R1
05E0 530F      2112            ANL     A,#0FH
05E2 96E8      2113            JNZ     RDATAD          ;NO.INITALIZE REC.
05E4 F418      2114            CALL    LNSWAP          ;YES. SWAP LINES
05E6 BE00      2115 RDATAX:    MOV     R6,#IDLE AND 0FFH
05E8 4412      2116 RDATAD:    JMP     TXEND           ;EXIT
               2117 ;         REV. NOV.21.80
               2118 ;         DELAY FOR 1.5MS AFTER THE UART EMPTY IS
               2119 ;         ESTABLISHED BEFORE DISABLING RS422 DRIVERS
               2120 ;
05EA 8823      2121 IDLE9:     MOV     R0,#TDELAY
05EC 10        2122            INC     @R0
05ED F0        2123            MOV     A,@R0
05EE 96F5      2124            JNZ     IDLE7           ;NO.
05F0 23F0      2125            MOV     A,#0F0H         ;YES.RESET TDELAY TO 3MS
05F2 A0        2126            MOV     @R0,A
05F3 442F      2127            JMP     IDLE3           ; DISABLE THE RS-422 DRIVERS
05F5 442D      2128 IDLE7:     JMP     IDLE2           ;EXIT FROM TSM
               2129 ;
               2130 ;                  FILL-IN CODE
               2131 ;                                                 ; 5F7H=5FFH
05F7 FF        2132            DB      0FFH
05F8 FF        2133            DB      0FFH,0FFH,0FFH,0FFH,0FFH,0FFH,0FFH,0FFH
05F9 FF
05FA FF
05FB FF
05FC FF
05FD FF
```

```
05FE FF
05FF FF
                  2134 ;
                  2135 ;************************************************************
                  2136 ;
                  2137 SEJECT
                  2138 ;1.TITLE
                  2139 ;     AD--ANALOG TO DIGITAL CONVERSION ROUTINES
                  2140 ;2. CALL AND RETURN
                  2141 ;     INPUTS
                  2142 ;           RAM OPEN
                  2143 ;     OUTPUTS
                  2144 ;           CONVERSION SCHEDULED AND ENABLED
                  2145 ;     RETURN
                  2146 ;3. CALLED ROUTINES
                  2147 ;--OPNPRT--OPEN ANALOG PORT
                  2148 ;     INPUT
                  2149 ;           ANALOG DATA FILE PRESENT
                  2150 ;     OUTPUT
                  2151 ;           ANALOG PORT ENABLED
                  2152 ;4. EQUATES
000F              2153 XADN    EQU    0FH                  ;NUMBER OF AD CONVERSION ROUTINES
0600              2154         ORG    600H
                  2155 ;************************************************************
                  2156 ;
                  2157 ;
0600 B8F1         2158 AD:     MOV    R0,#ANAIN+1          ;GET ENTRY PT
0602 80           2159         MOVX   A,@R0
0603 530F         2160         ANL    A,#XADN
0605 C60A         2161         JZ     ADIDL
0607 F5           2162         SEL    MB1
0608 4410         2163         JMP    ADXM1
                  2164                                     ;ENTER ROUTINE
                  2165 ;
                  2166 ;
                  2167 ;
060A B8F0         2168 ADIDL:  MOV    R0,#ANAIN            ;GET ANALOG INPUT PTR
060C 80           2169         MOVX   A,@R0                ;GET NEXT PT
060D 17           2170         INC    A
060E 531F         2171         ANL    A,#01FH
0610 90           2172         MOVX   @R0,A
0611 27           2173         CLR    A
0612 F467         2174         CALL   FILE                 ;GET P1 FILE
0614 B8F1         2175         MOV    R0,#ANAIN+1          ;GET ANALOG INPUT
0616 B932         2176         MOV    R1,#ANALOG+2
0618 F1           2177         MOV    A,@R1
0619 C620         2178         JZ     AD1                  ;IF NO DATA FILE OR OUTPUT THEN
061A 7220         2179         JB3    AD1
061C 2508         2180         MOV    A,#XOPEN AND 0FFH    ;   EXIT
                  2181 ;                                         ELSE
061F 90           2182         MOVX   @R0,A                ;   SET REENTRY PT
                  2183 ;                                         ENDIF
0620 840F         2184 AD1:    JMP    EXEC
                  2185 SEJECT
                  2186 ;1. TITLE
                  2187 ;     CPA--ANALOG SETPOINT ADJUST
                  2188 ;2. CALL AND RETURN
                  2189 ;     INPUTS
                  2190 ;           RAM OPEN, MESSAGE READY
                  2191 ;     OUTPUTS
                  2192 ;           ANALOG OUTPUT POINT UPDATED, ANALOG ID VALUE CALCULATED
                  2193 ;           AND STORED
                  2194 ;     RETURN
                  2195 ;3. CALLED ROUTINES
                  2196 ;--FILE
                  2197 ;     INPUTS
                  2198 ;           R0=PTR TO POINT NUMBER (MUST BE MASKED)
                  2199 ;     OUTPUTS
                  2200 ;           R1=PTR TO FILE(BEGINNING), R0=PTR TO POINT NUMBER
                  2201 ;--MULT
                  2202 ;     INPUTS
                  2203 ;           R0=PTR TO MULTIPLIER, R1=PTR TO MULTIPLICAND
                  2204 ;     OUTPUTS
                  2205 ;           R3,R4=RESULT(MS 16 BITS), R0=PTR TO LS BYTE
                  2206 ;--ADD16
                  2207 ;     INPUTS
                  2208 ;           R1=PTR TO ADDEND, R2,R4=AUGEND
                  2209 ;     OUTPUTS
                  2210 ;           R3,R4=RESULT
                  2211 ;--REVRSE
                  2212 ;     INPUTS
                  2213 ;           DIGITL+1 BIT 1=1 => FORWARD ACTING
                  2214 ;                    BIT 1=0 => REVERSE ACTING
                  2215 ;     OUPUTS
                  2216 ;           COMMAND=3FF-COMMAND
                  2217 ;4. EQUATES
0005              2218 CPAL    EQU    5                    ;LENGTH OF CPA MESSAGE
                  2219 ;************************************************************
                  2220 ;
0622 B804         2221 CPA:    MOV    R0,#INFO             ;GET PT NUMBER
0624 B93F         2222         MOV    R1,#DIGITL+7
0626 BAB0         2223         MOV    R2,#ANAPT
0628 F473         2224         CALL   FILE2
062A B93A         2225         MOV    R1,#DIGITL+2         ;TEST CPA FILE
062C F1           2226         MOV    A,@R1
062D 7231         2227         JB3    CPA1
062F C46A         2228         JMP    CPA2
0631 80           2229 CPA1:   MOVX   A,@R0
0632 AC           2230         MOV    R4,A
0633 E7           2231         RL     A
0634 E7           2232         RL     A
0635 5303         2233         ANL    A,#3                 ;GET MS BITS OF COMMAND
0637 AB           2234         MOV    R3,A
```

```
063A 1A        2235            INC     R0
0639 80        2236            MOVX    A,@R0
063A BA02      2237            MOV     R2,#2
063C 97        2238 CPALP:     CLR     C               ;MULTIPLY COMMAND BY 4
063D F7        2239            RLC     A
063E 3B        2240            XCH     A,R3
063F F7        2241            RLC     A
0640 2B        2242            XCH     A,R3
0641 EA3C      2243            DJNZ    R2,CPALP
0643 2C        2244            XCH     A,R4            ;GET LS BITS OF COMMAND
0644 F434      2245            CALL    PANAST          ;GET PTR TO STATUS LOCATION
0646 F426      2246            CALL    MOVEH           ;SET ANALOG STATUS FOR COMMAND
0648 B83E      2247            MOV     R0,#DIGITL+6
064A F441      2248            CALL    MOVEI
064C F4D3      2249            CALL    REVNSE          ;PROCESS REVERSE/FORWARD ACTING OPTION
064E F5        2250            SEL     MB1
064F 27        2251            CLR     A               ;PRESET RESULT
0650 AB        2252            MOV     R3,A
0651 AC        2253            MOV     R4,A
0652 B83D      2254            MOV     R0,#DIGITL+5    ;GET MULTPLIER
0654 B93E      2255            MOV     R1,#DIGITL+6
0656 14AE      2256            CALL    MULT
0658 B93B      2257            MOV     R1,#DIGITL+3    ;GET BASE PTR
065A 14C4      2258            CALL    ADD16
065C E5        2259            SEL     MB0
065D B839      2260            MOV     R0,#DIGITL+1    ;STORE CPA VALUE
065F F0        2261            MOV     A,@R0
0660 F42C      2262            CALL    PANA            ;GET ANALOG PTR
0662 F426      2263            CALL    MOVEH           ;STORE ANALOG VALUES
0664 B92A      2264            MOV     R1,#NFSH
0666 F0        2265            MOV     A,@R0           ;SET NEW VALUE INDICATOR
0667 A1        2266            MOV     @R1,A
0668 F4B7      2267            CALL    ANACOS          ;SET COS INDICATOR
066A 2305      2268 CPA2:      MOV     A,#CPAL
066C B467      2269            JMP     RECVE
               2270 SEJECT
               2271 ;1. TITLE
               2272 ;      EIP--EVENT INTIATED ACTION ROUTINE
               2273 ;      NOTE:   THIS ROUTINE WILL RUN EVERY TWO SECONDS UNDER THE CONTROL OF
               2274 ;              THE 'WATCH' ROUTINE.  THIS IS THE LOWEST PRIORITY TASK OF
               2275 ;              THE 540 DGP.
               2276 ;              THE PURPOSE OF THE ROUTINE IS TWO DO ONE OF 3 ACTIONS POSSIBLE
               2277 ;              FOR A GIVE EVENT INTITATION.  IF NO EXTERNAL ACTION IS DONE
               2278 ;              TO THE EVENT MASK THEN EACH ACTION WILL BE DONE IN TURN.  THE
               2279 ;              ACTIONS ARE SCHEDULED BY THE STATE OF TWO 'ACTION' BITS.
               2280 ;              THREE POSSIBLE SEPARATE EIPS ARE POSSIBLE, BUT ONLY ONE IS
               2281 ;              IMPLEMENTED.  THIS ONE IS USED TO MONITOR TRANSMISSION.
               2282 ;
               2283 ;
               2284 ;              THE TRANSMISSION MONITOR IS USED TO LOOK FOR NO TRANSMISSION
               2285 ;              RESPONSE.  IF NO TRANSMISSION IS RECEIVED FOR MORE THEN 2 SECONS
               2286 ;              THE ROUTINE WILL INITIATE A LINE SWITCH.  IF 2 LINE SWITCHES ARE
               2287 ;              NOT SUCCESSFUL IN BRINGING A RECEIVED BYTE, A PROGRAMMABLE RELAY
               2288 ;              DRIVER ACTION WILL BE INITIATED.
               2289 ;
               2290 ;
               2291 ;              THREE POSSIBLE EIPS COULD BE PROGRAMMED USING THE DATA FILE
               2292 ;              FOR DIGITAL INPUTS.  THE DATA FILE FORMAT FOLLOWS:
               2293 ;                      BYTE    BITS    FUNCTION
               2294 ;                      0       10100001        HEADER BYTE OF DATA FILE
               2295 ;                      1       MMMMMMMM        ID 1-8 NORMALLY OPEN/CLOSED ASSIGNMENT
               2296 ;                      2       MMMMMMMM        ID 9-16 NO/NC ASSIGNMENT
               2297 ;                      3       MMMMMMMM        ID 17-24 NO/NC ASSIGNMENT
               2298 ;                      4       RRRRRRRR        M1 RELAY ACTION
               2299 ;                                              RELAY ACTION USES THE FORMATS
               2300 ;                                              USED IN THE DIGITAL OUTPUT 'R'
               2301 ;                                              ASSIGNMENTS.  THIS INPUT IS
               2302 ;                                              USED AS AN INPUT TO 'REGRLY'
               2303 ;                      5       0               SPARE
               2304 ;                      6       0               SPARE
               2305 ;                      7       0               SPARE
               2306 ;2. CALL AND RETURN
               2307 ;       INPUTS
               2308 ;              EIP WITH STATUS
               2309 ;       OUTPUTS
               2310 ;              ACTIVITY EXECUTED OR SCHEDULED
               2311 ;       RETURN
               2312 ;3. CALLED ROUTINES
               2313 ;--FILE3
               2314 ;       INPUTS
               2315 ;              R0=PTR TO PACKED FILE PTR, R1=PTR TO LAST LOCATION OF 8 TO BE LOADED
               2316 ;       OUTPUTS
               2317 ;              8 LOCATIONS MOVED TO WORKSPACE
               2318 ;--REGRLY
               2319 ;       INPUTS
               2320 ;              A=COMMAND
               2321 ;       OUTPUTS
               2322 ;              RELAY COMMANDED
               2323 ;--LINESW
               2324 ;       INPUTS
               2325 ;              LINE
               2326 ;       OUTPUTS
               2327 ;              LINE SWITCHED
               2328 ;4. EQUATES
0003           2329 EIPEN  EQU     00000011B           ;MASK TO ENABLE EIPS
               2330 ;******************************************************************
               2331 ;
               2332 ;
066E B826      2333 EIPP:      MOV     R0,#EIP
0670 F0        2334            MOV     A,@R0           ;GET ASSIGNED EIP VALUE
0671 C68A      2335            JZ      EIP2            ;CASE OF EIP OF
0673 37        2336            CPL     A
0674 1286      2337            JB0     EIP1            ;  0: NO ACTION
```

```
0676 3246      2338       JB1    EIP1
067A 10        2339       INC    @R0
067B 8AFA      2340       MOV    R0,#DIGMSK              ;GET DIGITAL INPUT FILE
067D 893F      2341       MOV    R1,#DIGITL+7
067D F47C      2342       CALL   FILE3
067F 895C      2343       MOV    R1,#DIGITL+4            ;  1,2: LINESWITCH
0681 F1        2344       MOV    A,@R1
0682 C6B6      2345       JZ     FIP1
0684 846F      2346       CALL   REGRLY                  ;  3: TURN ON (OFF) ASSIGNED RELAY
0686 F411      2347 EIP1: CALL   LINESW
0688 BE00      2348       MOV    R6,#XIDLE AND 0FFH
068A 8B26      2349 EIP2: MOV    R0,#EIP                 ;ENDCASE
068C F0        2350       MOV    A,@R0
068D 17        2351       INC    A                       ;INCREMENT EIP COUNTER
068E 5303      2352       ANL    A,#EIPEN
0690 A0        2353       MOV    @R0,A
0691 840F      2354       JMP    EXEC
0693 FF        2355       DB     0FFH,0FFH,0FFH,0FFH,0FFH,0FFH,0FFH,0FFH
0694 FF
0695 FF
0696 FF
0697 FF
0698 FF
0699 FF
069A FF
069B FF        2356       DB     0FFH,0FFH,0FFH,0FFH,0FFH,0FFH,0FFH,0FFH
069C FF
069D FF
069E FF
069F FF
06A0 FF
06A1 FF
06A2 FF
06A3 FF        2357       DB     0FFH,0FFH,0FFH,0FFH,0FFH,0FFH,0FFH,0FFH
06A4 FF
06A5 FF
06A6 FF
06A7 FF
06A8 FF
06A9 FF
06AA FF
06AB FF        2358       DB     0FFH,0FFH,0FFH,0FFH,0FFH,0FFH,0FFH,0FFH
06AC FF
06AD FF
06AE FF
06AF FF
06B0 FF
06B1 FF
06B2 FF
06B3 FF        2359       DB     0FFH,0FFH,0FFH,0FFH,0FFH,0FFH,0FFH,0FFH
06B4 FF
06B5 FF
06B6 FF
06B7 FF
06B8 FF
06B9 FF
06BA FF
06BB FF        2360       DB     0FFH,0FFH,0FFH,0FFH,0FFH,0FFH,0FFH,0FFH
06BC FF
06BD FF
06BE FF
06BF FF
06C0 FF
06C1 FF
06C2 FF
06C3 FF        2361       DB     0FFH,0FFH,0FFH,0FFH,0FFH,0FFH,0FFH,0FFH
06C4 FF
06C5 FF
06C6 FF
06C7 FF
06C8 FF
06C9 FF
06CA FF
06CB FF        2362       DB     0FFH,0FFH,0FFH,0FFH,0FFH,0FFH,0FFH,0FFH
06CC FF
06CD FF
06CE FF
06CF FF
06D0 FF
06D1 FF
06D2 FF
06D3 FF        2363       DB     0FFH,0FFH,0FFH,0FFH,0FFH,0FFH,0FFH,0FFH
06D4 FF
06D5 FF
06D6 FF
06D7 FF
06D8 FF
06D9 FF
06DA FF
06DB FF        2364       DB     0FFH,0FFH,0FFH,0FFH,0FFH,0FFH,0FFH,0FFH
06DC FF
06DD FF
06DE FF
06DF FF
06E0 FF
06E1 FF
06E2 FF
06E3 FF        2365       DB     0FFH,0FFH,0FFH,0FFH,0FFH,0FFH,0FFH,0FFH
06E4 FF
06E5 FF
06E6 FF
06E7 FF
06E8 FF
```

```
06E9 FF
06EA FF
06EB FF            2366          DB       0FFH,0FFH,0FFH,0FFH
06EC FF
06ED FF
06EE FF
                   2367 $EJECT
                   2368 ;1. TITLE
                   2369 ;       COS--CHANGE OF STATE
                   2370 ;2. CALL AND RETURN
                   2371 ;    INPUTS
                   2372 ;            R2=COS MASK, R1=PTR TO CURRENT STATUS
                   2373 ;    OUTPUTS
                   2374 ;            STATUS UPDATED, COS BITS SET IF CHANGE
                   2375 ;    RETURN
                   2376 ;3. CALLED ROUTINES
                   2377 ;4. EQUATES
                   2378 ;************************************************************
                   2379 ;
                   2380 ;
06FD               2381          ORG      6FDH
06FD A8            2382 COS:     MOV      R0,A              ;SAVE STATUS
06FE 81            2383          MOVX     A,@R1             ;GET OLD STATUS
06FF D8            2384          XRL      A,R0
0700 C609          2385          JZ       COSE              ;IF COS THEN
0702 F8            2386          MOV      A,R0
0703 91            2387          MOVX     @R1,A             ; UPDATE STATUS
0704 B829          2388          MOV      R0,#COSBUF        ; SET COS
0706 FA            2389          MOV      A,R2
0707 40            2390          ORL      A,@R0
0708 A0            2391          MOV      @R0,A
0709 93            2392 COSE:    RETR                       ;ENDIF
                   2393 $EJECT
                   2394 ;1. TITLE
                   2395 ;       OFF--INITIALIZE OUTPUT DRIVERS TO 0
                   2396 ;2. CALL AND RETURN
                   2397 ;    INPUTS
                   2398 ;    OUTPUTS
                   2399 ;            ALL OUTPUT DRIVERS DRIVEN LOW
                   2400 ;    RETURN
                   2401 ;3. CALLED ROUTINES
                   2402 ;4. EQUATES
                   2403 ;************************************************************
                   2404 ;
                   2405 ;
070A 3A            2406 OFF:     OUTL     P2,A
070B 27            2407          CLR      A
070C 3C            2408          MOVD     P4,A              ;TURN ON OUTPUTS LOW
070D 3D            2409          MOVD     P5,A
070E 3E            2410          MOVD     P6,A
070F 3F            2411          MOVD     P7,A
0710 93            2412          RETR
                   2413 $EJECT
                   2414 ;1. TITLE
                   2415 ;       LINESW--LINE SWITCH
                   2416 ;2. CALL AND RETURN
                   2417 ;    INPUTS
                   2418 ;            RAM OPEN, A=COMMAND
                   2419 ;    OUTPUTS
                   2420 ;            LINE SELECTED
                   2421 ;    RETURN
                   2422 ;3. CALLED ROUTINES
                   2423 ;4. EQUATES
0005               2424 BLINE    EQU      5                 ;B LINE MASK
                   2425 ;************************************************************
                   2426 ;REV. 8-12-80
                   2427 ;       IF CLASS-B SELECTED DO NOT SWITCH LINES
                   2428 ;       SWITCH BIT 8 IN ADDRESS IS CLASS-B BIT
                   2429 ;
                   2430 ;
0711 B820          2431 LINESW:  MOV      R0,#ADDRES        ;IS IT CLASS-B?
0713 F0            2432          MOV      A,@R0
0714 5380          2433          ANL      A,#80H            ;IS BIT7=0?
0716 C61D          2434          JZ       LSWE              ;YES.
0718 B824          2435 LNSWAP:  MOV      R0,#LINE          ;GET LINE PTR
071A F0            2436          MOV      A,@R0
071B 47            2437          SWAP     A                 ;CHANGE LINES
071C A0            2438          MOV      @R0,A
071D 93            2439 LSWE:    RETR
                   2440 $EJECT
071E 81            2441 MOVE:    MOVX     A,@R1             ; GET DATA
071F 90            2442          MOVX     @R0,A             ; STORE DATA
0720 18            2443          INC      R0
0721 19            2444          INC      R1                ; INCREMENT PTRS
0722 1B            2445          INC      R3                ; INCREMENT LENGTH
0723 EA1E          2446          DJNZ     R2,MOVE           ;ENDWHILE
0725 93            2447          RETR
                   2448 $EJECT
                   2449 ;1. TITLE
                   2450 ;       MOVER--MOVE REGISTER 3,4 TO EXTERNAL MEMORY
                   2451 ;2. CALL AND RETURN
                   2452 ;    INPUTS
                   2453 ;            VALUE 1,2 IN R3,R4, PTR IN R1
                   2454 ;    OUTPUTS
                   2455 ;            VALUES MOVED TO MEMORY
                   2456 ;    RETURN
                   2457 ;3. CALLED ROUTINES
                   2458 ;4. EQUATES
                   2459 ;************************************************************
                   2460 ;
                   2461 ;
0726 FB            2462 MOVER:   MOV      A,R3              ;GET VALUE1
0727 91            2463          MOVX     @R1,A
0728 19            2464          INC      R1
```

```
0729 FC         2465            MOV     A,R4                    ;GET VALUE2
072A 91         2466            MOVX    @R1,A
072B 93         2467            RETR
                2468    SEJECT
                2469    ;1. TITLE
                2470    ;       PANA--FIND PTR TO ANALOG OUTPUT STORE
                2471    ;2. CALL AND RETURN
                2472    ;       INPUTS
                2473    ;               A=PACKED POINT VALUE
                2474    ;       OUTPUTS
                2475    ;               R1=PTR TO EXTERNAL MEMORY MOST SIGNIFICANT BYTE
                2476    ;       RETURN
                2477    ;3. CALLED ROUTINES
                2478    ;4. EQUATES
                2479    ;************************************************************
                2480    ;
                2481    ;
072C 77         2482    PANA:   RR      A
072D 77         2483            RR      A
072E 530E       2484            ANL     A,#0EH
0730 03E0       2485            ADD     A,#ANAID
0732 A9         2486            MOV     R1,A                    ;CALCULATE PTR VALUE
0733 83         2487            RET
                2488    SEJECT
                2489    ;1. TITLE
                2490    ;       PANAST--GET PTR TO ANALOG STATUS LOCATION
                2491    ;2. CALL AND RETURN
                2492    ;       INPUTS
                2493    ;               A=ID NUMBER
                2494    ;       OUTPUT
                2495    ;               R1=PTR TO EXTERNAL MEMORY LOCATION FOR STATUS UPDATE
                2496    ;       RETURN
                2497    ;3. CALLED ROUTINES
                2498    ;4. EQUATES
                2499    ;************************************************************
                2500    ;
                2501    ;
0734 07         2502    PANAST: DEC     A                       ;DECREMENT ID
0735 531F       2503            ANL     A,#1FH
0737 E7         2504            RL      A
0738 034A       2505            ADD     A,#ANAST
073A A9         2506            MOV     R1,A                    ;SET PTR
073B 93         2507            RETR
                2508    SEJECT
                2509    ;1. TITLE
                2510    ;       POINT--UPDATE POINT STATUS
                2511    ;2. CALL AND RETURN
                2512    ;       INPUTS
                2513    ;               R0=PTR TO POINT NUMBER AND STATUS (SSOPPPPP) S=STATUS,
                2514    ;               P=POINT NUMBER
                2515    ;       OUTPUTS
                2516    ;               POINT STATUS UPDATED
                2517    ;       RETURN
                2518    ;3. CALLED ROUTINES
                2519    ;4. EQUATES
073C 3F         2520    MPOS:   DB      00111111B               ;0 POINT POSITION MASK
073D CF         2521            DB      11001111B               ;1 POINT POSITION MASK
073E F3         2522            DB      11110011B               ;2 POINT POSITION MASK
073F FC         2523            DB      11111100B               ;3 POINT POSITION MASK
                2524    ;************************************************************
                2525    ;
                2526    ;
0740 80         2527    POINT:  MOVX    A,@R0                   ;GET PTR TO POINT STATUS BYTE
0741 07         2528            DEC     A
0742 AA         2529            MOV     R2,A
0743 77         2530            RR      A
0744 77         2531            RR      A
0745 5307       2532            ANL     A,#7
0747 0385       2533            ADD     A,#DIGST+3
0749 A9         2534            MOV     R1,A
074A FA         2535            MOV     A,R2                    ;GET PT POSITION NUMBER
074B 5303       2536            ANL     A,#3
074D AA         2537            MOV     R2,A
074E 033C       2538            ADD     A,#MPOS AND 0FFH
0750 A3         2539            MOVP    A,@A
0751 AB         2540            MOV     R3,A                    ;GET PT POSITION MASK
0752 1A         2541            INC     R2
0753 80         2542            MOVX    A,@R0
0754 53C0       2543            ANL     A,#0C0H
0756 EA5A       2544    POINTL: DJNZ   R2,POINT1                ;DO WHILE COUNT
0758 E45E       2545            JMP     POINT2
075A 77         2546    POINT1: RR      A
075B 77         2547            RR      A                       ; MOVE POSITION 1
075C E456       2548            JMP     POINTL                  ;ENDWHILE
075E AA         2549    POINT2: MOV     R2,A
075F 81         2550            MOVX    A,@R1                   ;GET STATUS
0760 53         2551            ANL     A,R3
0761 4A         2552            ORL     A,R2
0762 BA80       2553            MOV     R2,#80H
0764 D4FD       2554            CALL    COS                     ;UPDATE STATUS
0766 93         2555            RETR
                2556    SEJECT
                2557    ;1. TITLE
                2558    ;       FILE--FILE RETRIEVER
                2559    ;       NOTE: TO ENSURE NO ERRONEOUS RESULTS, FILE LOCATION QUAD 0, BYTE 0
                2560    ;               MUST BE SET TO ALL ZEROS!!!!!!! THIS CAUSES NON EXISTING DATA
                2561    ;               FILES TO BE LOADED AS ZERO.
                2562    ;2. CALL AND RETURN
                2563    ;       INPUTS
                2564    ;               R0=PTR TO POINT NUMBER (MUST BE MASKED)
                2565    ;               A=0 => ANALOG, A NOT 0 => DIGITAL
                2566    ;       OUTPUTS
                2567    ;               R1=PTR TO FILE, R0=INFO PTR
```

```
                  2568 ;3.  CALLED ROUTINES
                  2569 ;4.  EQUATES
                  2570 ;***********************************************************************
                  2571 ;
                  2572 ;
0767 966F         2573 FILE:    JNZ     FILE1             ;IF ANALOG THEN
0769 8937         2574          MOV     R1,#ANALOG+7      ;  GET FILE DESTINATION PTR
076B BAB0         2575          MOV     R2,#ANAPT         ;  GET PT LOCATION
076D E473         2576          JMP     FILE2             ;ELSE
076F B93F         2577 FILE1:   MOV     R1,#DIGTIL+7      ;  GET FILE DESTINATION PTR
0771 BA90         2578          MOV     R2,#DIGPT         ;  GET PT LOCATION
                  2579 ;                                  ;ENDIF
0773 80           2580 FILE2:   MOVX    A,@R0             ;GET POINT
0774 07           2581          DEC     A
0775 531F         2582          ANL     A,#01FH
0777 6A           2583          ADD     A,R2
0778 A8           2584          MOV     R0,A
0779 F47C         2585          CALL    FILE3             ;GET FILE
077B 93           2586          RETR
                  2587 SEJECT
                  2588 ;1. TITLE
                  2589 ;         FILE3--GET FILE
                  2590 ;2. CALL AND RETURN
                  2591 ;      INPUTS
                  2592 ;              R0=PTR TO PACKED FILE PTR
                  2593 ;              R1=PTR TO LAST LOCATION OF 8 TO BE LOADED INTO
                  2594 ;      OUTPUTS
                  2595 ;              8 LOCATIONS MOVED INTO WORKSPACE
                  2596.;      RETURN
                  2597 ;3. CALLED ROUTINES
                  2598 ;4. EQUATES
                  2599 ;***********************************************************************
                  2600 ;
                  2601 ;
077C 80           2602 FILE3:   MOVX    A,@R0             ;GET POINT FILE LOCATION
077D 5307         2603          ANL     A,#07H
077F A8           2604          MOV     R3,A              ;GET QUADRANT
0780 80           2605          MOVX    A,@R0
0781 4307         2606          ORL     A,#07H            ;GET BYTE ADDRESS
0783 AA           2607          MOV     R2,A
0784 FA           2608 FILELP:  MOV     A,R2              ;DOWHILE MORE DATA
0785 14CD         2609          CALL    DATA              ;  GET BYTE
0787 FC           2610          MOV     A,R4
0788 A1           2611          MOV     @R1,A             ;  SAVE BYTE
0789 C9           2612          DEC     R1
078A CA           2613          DEC     R2                ;  DECREMENT PTRS
078B FA           2614          MOV     A,R2              ;  TEST DONE
078C 5307         2615          ANL     A,#7
078E 43F8         2616          ORL     A,#0F8H
0790 37           2617          CPL     A
0791 96B4         2618          JNZ     FILELP            ;ENDWHILE
0793 B800         2619 FILEE:   MOV     R0,#INFO          ;GET INFO PTR
0795 93           2620          RETR
                  2621 SEJECT
                  2622 ;1. TITLE
                  2623 ;         GETBYT
                  2624 ;2. CALL AND RETURN
                  2625 ;      INPUTS
                  2626 ;              UART OPEN, R1=UARTCS
                  2627 ;      OUTPUTS
                  2628 ;              A=SEND BYTE
                  2629 ;      RETURN
                  2630 ;3. CALLED ROUTINES
                  2631 ;4. EQUATES
                  2632 ;***********************************************************************
                  2633 ;
                  2634 ;
0796 EFA0         2635 GETBYT:  DJNZ    R7,MORE           ;IF LAST BYTE THEN
0798 BE00         2636          MOV     R6,#XIDLE AND 0FFH ;  SET RECEIVE INITIALIZATION
079A B821         2637          MOV     R0,#CKSM          ;  GET CHECKSUM
079C F0           2638          MOV     A,@R0             ;  ENDIF
079D 37           2639          CPL     A
079E E4AE         2640          JMP     GETEND            ;ELSE
07A0 23B0         2641 MORE:    MOV     A,#XRAM           ;  OPEN RAM
07A2 3A           2642          OUTL    P2,A
07A3 8822         2643          MOV     R0,#TSMPTR        ;  GET OUTPUT PTR
07A5 10           2644          INC     @R0
07A6 F0           2645          MOV     A,@R0             ;  GET PTR
07A7 A8           2646          MOV     R0,A
07A8 80           2647          MOVX    A,@R0             ;  GET BYTE
07A9 AC           2648          MOV     R4,A              ;  SAVE BYTE
07AA 2390         2649          MOV     A,#UART           ;  OPEN UART PORT
07AC 3A           2650          OUTL    P2,A
07AD FC           2651          MOV     A,R4              ;  GET BYTE
                  2652 ;                                  ;ENDIF
07AE 93           2653 GETEND:  RETR
                  2654 SEJECT
                  2655 ;1. TITLE
                  2656 ;         MOVERI--SAVE REGISTERS INTERNAL
                  2657 ;2. CALL AND RETURN
                  2658 ;      INPUTS
                  2659 ;              R3, R4 TO BE SAVED
                  2660 ;      OUTPUTS
                  2661 ;              SAVED AT ANALOG+1,2
                  2662 ;      RETURN
                  2663 ;3. CALLED ROUTINES
                  2664 ;4. EQUATES
                  2665 ;***********************************************************************
                  2666 ;
                  2667 ;
07AF B831         2668 MOVERI:  MOV     R0,#ANALOG+1      ;MOVE ANALOG VALUES TO TEMP STORE
07B1 FB           2669 MOVEI:   MOV     A,R3
07B2 A0           2670          MOV     @R0,A
07B3 18           2671          INC     R0
```

```
07B4 FC       2672        MOV    A,R4
07B5 A0       2673        MOV    @R0,A
07B6 83       2674        RET
              2675 $EJECT
              2676 ;1. TITLE
              2677 ;       ANACOS
              2678 ;2. CALL AND RETURN
              2679 ;       INPUTS
              2680 ;               NONE
              2681 ;       OUTPUTS
              2682 ;               ANALOG COS SET
              2683 ;       RETURN
              2684 ;3. CALLED ROUTINES
              2685 ;4. EQUATES
              2686 ;****************************************************************
              2687 ;
              2688 ;
07B7 B929     2689 ANACOS: MOV    R1,#COSBUF          ;SET ANALOG COS
07B9 2340     2690        MOV    A,#40H
07BB 41       2691        ORL    A,@R1
07BC A1       2692        MOV    @R1,A
07BD 93       2693        RETR
              2694 $EJECT
              2695 ;1. TITLE
              2696 ;       ADDX--ADDRESS MATCH ROUTIJNE
              2697 ;2. CALL AND RETURN
              2698 ;       INPUTS
              2699 ;               R0=MESSAGE PTR , A=MESSAGE
              2700 ;       OUTPUTS
              2701 ;               A=0 => MATCH BIT1 SET => REPEATER
              2702 ;       RETURN
              2703 ;3. CALLED ROUTINES
              2704 ;--LINESW
              2705 ;       INPUTS
              2706 ;               'LINE' WITH CURRENT LINE SET
              2707 ;       OUTPUTS
              2708 ;               'LINE' SWAPPED
              2709 ;4. EQUATES
              2710 ;****************************************************************
              2711 ;
              2712 ;
07BE B920     2713 ADDX:   MOV    R1,#ADDRES          ;GET ADDRESS
07C0 D1       2714        XRL    A,@R1
07C1 537B     2715        ANL    A,#7BH              ;BITS 6 THRU 3 IS 540= GROUP ADDRESS
07C3 C6D2     2716        JZ     ADDXE               ;IF NO MATCH THEN
07C5 41       2717        ORL    A,@R1               ; GET REPEATER INFO
07C6 AA       2718        MOV    R2,A
07C7 37       2719        CPL    A
07C8 32D1     2720        JB1    ADDX1               ; IF REPEATER THEN
07CA 04B3     2721        JMP    ADDXA       ; SEE REPEATER PATCH
07CC F41B     2722 ADDX2:  CALL   LNSWAP              ;   SWITCH LINES UNCONDITIONALLY
07CE B802     2723        MOV    R0,#LENGTH          ;   GET MESSAGE LENGTH
07D0 80       2724        MOVX   A,@R0               ; ENDIF
07D1 2A       2725 ADDX1:  XCH    A,R2                ;ENDIF
07D2 93       2726 ADDXE:  RETR                       ;GET MATCHED INFO
              2727 $EJECT
              2728 ;1. TITLE
              2729 ;       REVRSE--REVERSE/FORWARD ACTING SWITCH FOR CPA
              2730 ;2. CALL AND RETURN
              2731 ;       INPUTS
              2732 ;               DIGITL+6,7=COMMAND*4
              2733 ;       OUTPUTS
              2734 ;               DIGITL+6,7=COMMAND*4 OR FFC-COMMAND*4
              2735 ;3. CALLED ROUTINES
              2736 ;--SUBT
              2737 ;       INPUTS
              2738 ;               R0=SUBTRAHEND, R1=MINUEND
              2739 ;       OUTPUTS
              2740 ;               R3,R4=RESULT
              2741 ;4. EQUATES
              2742 ;****************************************************************
              2743 ;
              2744 ;
07D3 B839     2745 REVRSE: MOV    R0,#DIGITL+1        ;GET REVERSE/FORWARD ACTING DATA FILE
07D5 F0       2746        MOV    A,@R0
07D6 32E6     2747        JB1    REV1                ;IF REVERSE ACTING THEN
07D8 B80F     2748        MOV    R3,#OFH             ; GET OFFCH
07DA BCFC     2749        MOV    R4,#OFCH
07DC B903     2750        MOV    R1,#REG3            ; GET OFFCH-COMMAND*4
07DE B83E     2751        MOV    R0,#DIGITL+6
07E0 F5       2752        SEL    MB1
07E1 1498     2753        CALL   SUBT
07E3 E5       2754        SEL    MB0
07E4 F4B1     2755        CALL   MOVE1               ;ELSE (FORWARD ACTING)
              2756 ;                                      GET COMMAND*4
              2757 ;                                 ENDIF
07E6 93       2758 REV1:   RETR
              2759 $EJECT
              2760 ;1. TITLE
              2761 ;       OVRFL--TIMER OVERFLOW CHECK
              2762 ;2. CALL AND RETURN
              2763 ;       INPUTS
              2764 ;               REGISTER BANK 1 SELECTED
              2765 ;       OUTPUTS
              2766 ;               IF CHANGE IN TIMER OVERFLOW STATUS, THEN R2 INCREMENTED
              2767 ;       RETURN
              2768 ;3. CALLED ROUTINES
              2769 ;4. EQUATES
              2770 ;****************************************************************
              2771 ;
              2772 ;
07E7 86E0     2773 OVRFL:  JNI    OVRFL2              ;IF NO INTERRUPT THEN
07E9 76EF     2774        JF1    OVRFL3              ; IF NOT INTERRUPT LAST TIME THEN
07EB E4F1     2775 OVRFL1: JMP    OVRFL4              ;  EXIT
```

```
                2776 ;                                      ELSE (INTERRUPT LAST TIME)
                2777 ;                                          INCREMENT COUNTER
                2778 ;                                      ENDIF
                2779 ;                                  ELSE
07ED 76E8       2780 OVRFL2: JF1    OVRFL1               ; IF INTERRUPT LAST TIME THEN
                2781 ;                                          EXIT
                2782 ;                                      ELSE (NO INTERRUPT LAST TIME)
07EF B5         2783 OVRFL3: CPL    F1
07F0 CA         2784         DEC    R2                   ;    INCREMENT DOWN COUNTER
07F1 83         2785 OVRFL4: RET                         ;ENDIF
                2786 ;
07F2 B8F5       2787 WATCHX: MOV    R0,#TOTRUN           ;SCHEDULE RUN TIME INCREMENT
07F4 80         2788         MOVX   A,@R0
07F5 A1         2789         MOV    @R1,A
07F6 2310       2790         MOV    A,#16
07F8 40         2791         ORL    A,R5                 ;SCHEDULE E1P PROGRAM (2 SECONDS)
07F9 AD         2792         MOV    R5,A
07FA 93         2793         RETR
                2794 ;       DB     0FFH,0FFH,0FFH,0FFH,0FFH,0FFH
                2795 $EJECT
                2796 ;DATE CODE AND 540 FIRMWARE REV LETTER ARE FOUND AT THE END OF THE DATA FILE
                2797 ;AREA.  THE DATA FILE IS TERMINATED IN A 'FF'.
                2798 ;DATE CODE.    SEE 3FDH AREA
                2799 ;
                2800 ;
0800            2801         ORG    800H
                2802 ;DATA FILE TERMINATOR IS AT 3FBH
                2803 $EJECT
                2804 ;1.  TITLE
                2805 ;       RANGE--DETERMINE INPUT RANGE OF R/P
                2806 ;2.  CALL AND RETURN
                2807 ;       INPUTS
                2808 ;          R3=MS ,R4=LS COUNT
                2809 ;       OUTPUTS
                2810 ;          A=0 => INVALID, ANALOG+6=RANGE
                2811 ;       RETURN
                2812 ;3.  CALLED ROUTINES
                2813 ;--ADD16
                2814 ;       INPUTS
                2815 ;          R3,R4=AUGEND, R1=PTR TO ADDEND (INTERNAL)
                2816 ;       OUTPUTS
                2817 ;          R3,R4=RESULT
                2818 ;4.  EQUATES
0001            2819 LIMIT1  EQU    (75*2*4-130)/256     ;75 MICROSECOND OFFSET
0006            2820 LIMIT2  EQU    (75*2*4-130) MOD 256 ;
0006            2821 LIMIT3  EQU    6                    ;200*2*4=COUNT RANGE OF 4 PULSES
0040            2822 LIMIT4  EQU    040H                 ;
0800 F20E       2823 RANG1:  DW     -((5870+5*16000) MOD 16384)+95*4  ;RANGE 1,1075-1275
0802 F08E       2824         DW     -((5870+4*16000) MOD 16384)+95*4  ;RANGE 2
0804 EF0E       2825         DW     -((5870+3*16000) MOD 16384)+95*4  ;RANGE 3
0806 ED8E       2826         DW     -((5870+2*16000) MOD 16384)+95*4  ;RANGE 4
0808 EC0E       2827         DW     -((5870+1*16000) MOD 16384)+95*4  ;RANGE 5
080A EA8E       2828         DW     -5870+95*4.                       ;RANGE 6,75-275
080C 017C       2829 RANG7:  DW     95*4                 ;RANGE7--RANGE DEFAULT LOW
080E 3FFC       2830 RANG8:  DW     4095*4               ;RANGE8--RANGE DEFAULT HIGH
0810 0000       2831 RANG9:  DW     0
                2832 ;*********************************************************************
                2833 ;
                2834 ;
0812 B933       2835 RANGE:  MOV    R1,#ANALOG+3         ;GET PTRS
0814 BB01       2836         MOV    R3,#LIMIT1           ;GET BASE OFFSET
0816 BC06       2837         MOV    R4,#LIMIT2           ;GET BASE OFFSET (LS)
0818 14C4       2838         CALL   ADD16                ;SUBTRACT OFFSET
081A B810       2839         MOV    R0,#RANG9 AND 0FFH   ;GET '0' DEFAULT FOR NO COUNTS
081C F220       2840         JB7    RANGE1               ;IF WITHIN RANGES THEN
081E 0448       2841         JMP    RANGE5
0820 2306       2842 RANGE1: MOV    A,#LIMIT3            ;  GET RANGE LENGTH
0822 A1         2843         MOV    @R1,A
0823 19         2844         INC    R1
0824 2340       2845         MOV    A,#LIMIT4
0826 A1         2846         MOV    @R1,A
0827 C9         2847         DEC    R1
0828 B80C       2848         MOV    R0,#RANG7 AND 0FFH   ;  GET RANGE PTR
082A BA07       2849         MOV    R2,#7                ;  GET RANGE COUNT
082C EA30       2850 RANGE2: DJNZ   R2,RANGE3            ;  DO WHILE NO RANGE AND COUNT
082E 0446       2851         JMP    RANGE4
0830 14C4       2852 RANGE3: CALL   ADD16    ; SUBTRACT RANGE LENGTH
0832 CB         2853         DEC    R0                   ;    GET NEXT RANGE PTR
0833 CA         2854         DEC    R0
0834 F22C       2855         JB7    RANGE2               ;  ENDWHILE
                2856 ;                                   ENDIF
0836 B936       2857         MOV    R1,#ANALOG+6         ;GET PROGRAMMED RANGE
0838 F1         2858         MOV    A,@R1
0839 C64E       2859         JZ     RANGE6               ;IF PROGRAMMED RANGE THEN
083B 37         2860         CPL    A
083C 17         2861         INC    A
083D 6A         2862         ADD    A,R2                 ;  GET MEASURED RANGE - PROGRAMMED RANGE
083E C64E       2863         JZ     RANGE6               ;  IF NO MATCH THEN
0840 F246       2864         JB7    RANGE4               ;    IF LOWER RANGE THEN
0842 B80C       2865         MOV    R0,#RANG7 AND 0FFH   ;      SET '95' RESULT
0844 0448       2866         JMP    RANGE5               ;    ELSE (HIGHER RANGE)
0846 B80E       2867 RANGE4: MOV    R0,#RANG8 AND 0FFH   ;      SET '4095' RESULT
                2868 ;                                         ENDIF
                2869 ;                                       ENDIF
0848 B931       2870 RANGE5: MOV    R1,#ANALOG+1         ; GET RESULT PTR
084A 27         2871         CLR    A
084B A1         2872         MOV    @R1,A                ; CLEAR RAW VALUE
084C 19         2873         INC    R1
084D A1         2874         MOV    @R1,A
                2875 ;                                   ENDIF
084E F8         2876 RANGE6: MOV    A,R0                 ;GET OFFSET PTR
```

```
084F A3          2877            MOVP   A,@A
0850 AB          2878            MOV    R3,A
0851 18          2879            INC    R0
0852 F0          2880            MOV    A,@R0
0853 A3          2881            MOVP   A,@A
0854 AC          2882            MOV    R4,A
0855 93          2883 RANGEE: RETR
                 2884 SEJECT
                 2885 ;1. TITLE
                 2886 ;     TABLE--GET TABLE PTR TO ENTRY
                 2887 ;2. CALL AND RETURN
                 2888 ;     INPUTS
                 2889 ;           A=TABLE NUMBER
                 2890 ;     OUTPUTS
                 2891 ;           TABLE ENTRY PTR , 0=> NO ADDITION DONE
                 2892 ;     RETURN
                 2893 ;3. CALLED ROUTINES
                 2894 ;4. EQUATES
                 2895 ;************************************************************
                 2896 ;
                 2897 ;
0856 03F6        2898 TABLE:  ADD    A,#TABLE0-1
0858 A8          2899            MOV    R0,A                  ; GET TABLE DIRECTORY PTR
0859 80          2900            MOVX   A,@R0                 ; GET TABLE PTR
085A C671        2901            JZ     TABLEE
085C 5307        2902            ANL    A,#7
085E A8          2903            MOV    R3,A                  ; GET TABLE QUADRANT
085F 80          2904            MOVX   A,@R0
0860 53F8        2905            ANL    A,#0F8H               ; GET TABLE START LOCATION
0862 03E8        2906            ADD    A,#-24
0864 AC          2907            MOV    R4,A
0865 B932        2908            MOV    R1,#ANALOG+2          ; GET MS BIT OF LS BYTE
0867 F1          2909            MOV    A,@R1
0868 F7          2910            RLC    A
0869 C9          2911            DEC    R1                    ; INCLUDE BIT IN MS BYTE
086A F1          2912            MOV    A,@R1
086B F7          2913            RLC    A
086C 531F        2914            ANL    A,#1FH
086E C671        2915            JZ     TABLEE
0870 6C          2916            ADD    A,R4                  ; GET TABLE ADDRESS (1 OF 31)
0871 93          2917 TABLEE: RETR
                 2918 SEJECT
                 2919 ;1. TITLE
                 2920 ;     DIVD--15 BIT DIVIDE
                 2921 ;     NOTE:  THE DIVIDEND AND DIVISOR MUST HAVE BIT 15 SET TO 0 TO WORK
                 2922 ;            IN ALL CASES.
                 2923 ;2. CALL AND RETURN
                 2924 ;     INPUTS
                 2925 ;           R1=PTR TO DIVIDEND, R0=PTR TO DIVISOR (BOTH INTERNAL)
                 2926 ;           DIVIDEND=32 BITS AS:    (R1)=MOST SIGNIFICANT
                 2927 ;                                   (R1+1)=NEXT     "
                 2928 ;                                   (R1+2)=NEXT     "
                 2929 ;                                   (R1+3)=LEAST SIGNIFICANT
                 2930 ;           DIVISOR=16 BITS AS:     (R0)=MOST SIGNIFICANT
                 2931 ;                                   (R0+1)=LEAST SIGNIFICANT
                 2932 ;     OUTPUTS
                 2933 ;           R1+2=PTR TO QUOTIENT
                 2934 ;           R3,R4=REMAINDER
                 2935 ;     RETURN
                 2936 ;3. CALLED ROUTINES
                 2937 ;4. EQUATES
                 2938 ;************************************************************
                 2939 ;
                 2940 ;
0872 BA10        2941 DIVD:   MOV    R2,#16                ;DO WHILE COUNT
0874 1498        2942 DIVDL:  CALL   SUBT                  ; GET DIVISOR=HIGH ORDER
0876 E67E        2943           JNC    DIVD1                ; IF NEGATIVE (BORROW) THEN
0878 FB          2944           MOV    A,R3                 ;   GET REMAINDER
0879 A1          2945           MOV    @R1,A
087A 19          2946           INC    R1
087B FC          2947           MOV    A,R4
087C A1          2948           MOV    @R1,A
087D C9          2949           DEC    R1
087E 1483        2950 DIVD1:  CALL   LINK                  ; GET LOW ORDER INTO HIGH ORDER
0880 EA74        2951           DJNZ   R2,DIVDL             ;ENDWHILE
0882 93          2952           RETR
                 2953
                 2954 ;
                 2955 ;
0883 B804        2956 LINK:   MOV    R3,#4                 ;DO WHILE BYTES
0885 19          2957           INC    R1
0886 19          2958           INC    R1
0887 19          2959           INC    R1
0888 19          2960           INC    R1
0889 C9          2961 LINKLP: DEC    R1
088A 21          2962           XCH    A,@R1                 ; GET BYTE
088B F7          2963           RLC    A                     ; MOVE MS BIT INTO LINK
088C 21          2964           XCH    A,@R1                 ; SAVE NEW VALUE
088D EB89        2965           DJNZ   R3,LINKLP             ;ENDWHILE
088F 83          2966           RET
                 2967 SEJECT
                 2968 ;1. TITLE
                 2969 ;     SUBT--SUBTRACT TWO 16 BIT NUMBERS
                 2970 ;2. CALL AND RETURN
                 2971 ;     INPUTS
                 2972 ;           R1=PTR TO MINUEND, R0=PTR TO SUBTRAHEND
                 2973 ;     OUTPUTS
                 2974 ;           R3,R4=RESULT, IF NEGATIVE RESULT, BORROW IS MARKED BY FLAG
                 2975 ;           0 AND NO CARRY
                 2976 ;     RETURN
                 2977 ;3. CALLED ROUTINES
                 2978 ;4. EQUATES
                 2979 ;************************************************************
```

```
                        2980 ;
                        2981 ;
0890 1498               2982 SUBTV: CALL    SUBT            ;SUBTRACT
0892 F697               2983         JC      SUBTV1         ;IF OVERFLOW THEN
0894 27                 2984         CLR     A              ;   SET RESULT=0
0895 AB                 2985         MOV     R3,A
0896 AC                 2986         MOV     R4,A           ;ENDIF
0897 83                 2987 SUBTV1: RET
                        2988 ;
                        2989 ;
                        2990 ;
0898 18                 2991 SUBT:   INC     R0             ;GET LS PTR
0899 19                 2992         INC     R1
089A 85                 2993         CLR     F0             ;INITIALIZE BORROW
089B F0                 2994         MOV     A,@R0          ;GET LS SUBTRAHEND
089C 37                 2995         CPL     A
089D 0301               2996         ADD     A,#1
089F F6A2               2997         JC      SUBT1          ;IF BORROW THEN
08A1 95                 2998         CPL     F0             ;   SET FLAG 0
08A2 61                 2999 SUBT1:  ADD     A,@R1          ;ENDIF
08A3 AC                 3000         MOV     R4,A           ;SAVE MINUEND-SUBTRAHEND
08A4 C8                 3001         DEC     R0             ;GET MS PTRS
08A5 C9                 3002         DEC     R1
08A6 F0                 3003         MOV     A,@R0          ;GET MS SUBTRAHEND
08A7 37                 3004         CPL     A
08A8 B6AB               3005         JF0     SUBT2          ;IF BORROW THEN
08AA 17                 3006         INC     A              ;   SUBTRACT 1
08AB 71                 3007 SUBT2:  ADDC    A,@R1          ;ENDIF
08AC AB                 3008         MOV     R3,A           ;SAVE MINUEND -SUBTRAHEND
08AD 83                 3009         RET
                        3010 SEJECT
                        3011 ;1. TITLE
                        3012 ;       MULT--8 X 16 BIT MULTIPLY ROUTINE
                        3013 ;2. CALL AND RETURN
                        3014 ;       INPUTS
                        3015 ;               R0=PTR TO MULTIPLIER, R1=PTR TO MULTIPLICAND
                        3016 ;               R1, R1+1=PTR TO MULTIPLIER
                        3017 ;       OUTPUTS
                        3018 ;               R3,R4=MS RESULT, R0=PTR TO LS BYTE OF RESULT
                        3019 ;       RETURN
                        3020 ;3. CALLED ROUTINES
                        3021 ;4. EQUATES
                        3022 ;****************************************************************
                        3023 ;
                        3024 ;
08AE BA09               3025 MULT:   MOV     R2,#9           ;SET COUNTER
08B0 97                 3026         CLR     C
08B1 20                 3027 MULTLP: XCH     A,@R0           ;DO WHILE COUNT
08B2 67                 3028         RRC     A               ;  GET MULTIPLIER BIT
08B3 20                 3029         XCH     A,@R0
08B4 EAB7               3030         DJNZ    R2,MULT1        ;  TEST COUNT
08B6 93                 3031         RETR
08B7 E6BB               3032 MULT1:  JNC     MULT2           ;  IF BIT SET THEN
08B9 14C4               3033         CALL    ADD16           ;    ADD MULTIPLICAND
08BB 97                 3034 MULT2:  CLR     C               ;  ENDIF
08BC FB                 3035         MOV     A,R3            ;  SHIFT OUT LEAST SIGNIFICANT BIT
08BD 67                 3036         RRC     A
08BE AB                 3037         MOV     R3,A
08BF FC                 3038         MOV     A,R4
08C0 67                 3039         RRC     A
08C1 AC                 3040         MOV     R4,A
08C2 04B1               3041         JMP     MULTLP          ;ENDWHILE
                        3042 SEJECT
                        3043 ;1. TITLE
                        3044 ;       ADD16--ADD TWO 16 BIT VALUES, GET 16 BIT RESULT (OVERFLOW IN CARRY)
                        3045 ;2. CALL AND RETURN
                        3046 ;       INPUTS
                        3047 ;               R3=MS, R4=LS, R1=PTR TO ADDEND (INTERNAL)
                        3048 ;       OUTPUTS
                        3049 ;               R3,R4=RESULT
                        3050 ;       RETURN
                        3051 ;3. CALLED ROUTINES
                        3052 ;4. EQUATES
                        3053 ;****************************************************************
                        3054 ;
                        3055 ;
08C4 97                 3056 ADD16:  CLR     C               ;CLEAR CARRY
08C5 19                 3057         INC     R1
08C6 F1                 3058         MOV     A,@R1
08C7 6C                 3059         ADD     A,R4            ;ADD LEAST SIGN. ADDEND
08C8 AC                 3060         MOV     R4,A            ;SAVE LS ENTRY
08C9 C9                 3061         DEC     R1
08CA F1                 3062         MOV     A,@R1           ;GET MS ADDEND
08CB 7B                 3063         ADDC    A,R3            ;AND MOST SIGN. ADDEND
08CC AB                 3064         MOV     R3,A            ;SAVE MS ENTRY
08CD 83                 3065         RET
                        3066 SEJECT
                        3067 ;1. TITLE
                        3068 ;       DIVIDE BY 2 (RIGHT SHIFT MULTIPLE)
                        3069 ;2. CALL AND RETURN
                        3070 ;       INPUTS
                        3071 ;               R2=DIVISOR/2, R3=MS, R4=LS
                        3072 ;       OUTPUTS
                        3073 ;               R3=MS, R4=LS
                        3074 ;       RETURN
                        3075 ;3. CALLED ROUTINES
                        3076 ;4. EQUATES
                        3077 ;****************************************************************
                        3078 ;
                        3079 ;
08CE 97                 3080 NORMAL: CLR     C               ;DO WHILE DIVISOR
08CF FB                 3081         MOV     A,R3
```

```
0800 67        3082            RRC     A
0801 AB        3083            MOV     R3,A
0802 FC        3084            MOV     A,R4                        ; SHIFT DOUBLE REGISTER
0803 67        3085            RRC     A
0804 AC        3086            MOV     R4,A
0805 EACE      3087            DJNZ    R2,NORMAL                   ;ENDWHILE
0807 93        3088            RETR
               3089    ;
               3090    ;       SET UP GAIN BIT OUTPUT, ADDED 6-6-80
               3091    ;       LOOK AT GAIN BIT IN THE DATAFILE
               3092    ;       IF G=0, OUTPUT X10 GAIN
               3093    ;       IF G=1, OUTPUT X1 GAIN
0808 B833      3094   BASEEA:  MOV     R0,#ANALOG+3                ;D.F. BYTE 3
080A F0        3095            MOV     A,@R0
080B F2E5      3096            JB7     BASEEB                      ;EXIT IF NOT VOLTAGE TYPE
080D 0418      3097            JMP     BASEED                      ;PATCHED 6-19-80
080F 92E6      3098   BASEEF:  JB4     BASEEC                      ;GAIN BIT SET?
08E1 81        3099            MOVX    A,@R1                       ;NO, SET X10 GAIN
08E2 04F3      3100            JMP     BASEEZ                      ;RESET BIT4, PATCHED 6-12-80
08E4 91        3101   BASEEY:  MOVX    @R1,A                       ;OUTPUT TO PORT C
08E5 93        3102   BASEEB:  RETR                                ;EXIT
08E6 81        3103   BASEEC:  MOVX    A,@R1                       ;OUTPUT X1 GAIN
08E7 4510      3104            ORL     A,#10H                      ;SET R4
08E9 91        3105            MOVX    @R1,A                       ;OUTPUT TO PORT C
08EA 93        3106            RETR
               3107    ;
08EB F0        3108   NUM:     MOV     A,@R0                       ;GET MASKED VALUE
08EC 530F      3109            ANL     A,#0FH
08EE AB        3110            MOV     R3,A
08EF 18        3111            INC     R0
08F0 F0        3112            MOV     A,@R0
08F1 AC        3113            MOV     R4,A
08F2 93        3114            RETR
               3115    ;
08F3 530F      3116   BASEEZ:  ANL     A,#0FH          ;PATCHED 6-12-80
08F5 17        3117            INC     A
08F6 17        3118            INC     A               ;INCREASE D/A OUTPUT BY 200H
08F7 04E4      3119            JMP     BASEEY          ;FOR X10 GAIN INPUTS
08F9 FF        3120            DB      0FFH,0FFH,0FFH,0FFH,0FFH,0FFH,0FFH,0FFH
08FA FF
08FB FF
08FC FF
08FD FF
08FE FF
08FF FF
0900 FF
               3121   $EJECT
               3122   ;1. TITLE     ,REV.6-6-80
               3123   ;     BASE--CALCULATE BASE FROM 'RRR' ENTRY IN DATA FILE
               3124   ;2. CALL AND RETURN
               3125   ;     INPUTS
               3126   ;     OUTPUTS
               3127   ;     RETURN
               3128   ;3. CALLED ROUTINES
0900           3129            ORG     0900H
               3130   ;                                            CASE OF 'RRR' OF
0900 73        3131   RANGES:  DB      BASEE AND 0FFH              ;0: W/P,THRESHOLD=>NO PROCESSING
0901 12        3132            DB      BASE1 AND 0FFH              ;1: FULL RANGE>5V
0902 1C        3133            DB      BASE2 AND 0FFH              ;2: 0-5V VOLTAGE/CURRENT
0903 2B        3134            DB      BASE3 AND 0FFH              ;3: 5-10V VOLTAGE/CURRENT
0904 3D        3135            DB      BASE4 AND 0FFH              ;4: 3.7MA, 10X RTD
0905 43        3136            DB      BASE5 AND 0FFH              ;5: 3.7MA, 1X RTD
0906 49        3137            DB      BASE6 AND 0FFH              ;6: 1.2MA, 10X RTD
0907 4F        3138            DB      BASE7 AND 0FFH              ;7: 1.2MA, 1X RTD
               3139   ;                                            ENDCASE
               3140   ;4. EQUATES
               3141   ;************************************************************
               3142   ;
               3143   ;
0908 B932      3144   BASE:    MOV     R1,#ANALOG+2                ;GET ENTRY POINTER
090A B833      3145            MOV     R0,#ANALOG+3                ;GET RANGE VALUE
090C F0        3146            MOV     A,@R0
090D 47        3147            SWAP    A
090E 77        3148            RR      A
090F 5307      3149            ANL     A,#7
0911 B3        3150            JMPP    @A                          ;CASE RANGE OF
               3151   ;                                             0: USE BASE DATA FILE ENTRY
               3152   ;
0912 B835      3153   BASE1:   MOV     R0,#ANALOG+5    ; 1:  GET RANGE
0914 14EB      3154            CALL    NUM
0916 BA01      3155            MOV     R2,#1
0918 14CE      3156            CALL    NORMAL          ;     GET RANGE/2
091A 2455      3157            JMP     BASEP           ;     CASE OF ENTRY OF:
               3158   ;                                          1:   A/D=800H-RANGE/2
               3159   ;                                          2:   A/D=800H+RANGE/2
               3160   ;                                          3:   A/D=800H
               3161   ;                                          ENDCASE
               3162   ;
091C F1        3163   BASE2:   MOV     A,@R1           ; 2:  CASE ENTRY OF:
091D F223      3164            JB7     BASE2A          ;          1:   A/D=800H-BASE
091F 14EB      3165            CALL    NUM
0921 2455      3166            JMP     BASEP
0923 9255      3167   BASE2A:  JB4     BASEP           ;          2:   A/D=800H+RANGE-BASE
0925 B833      3168            MOV     R0,#ANALOG+3
0927 14EB      3169            CALL    NUM             ;          3:   A/D=800H
0929 6400      3170            JMP     BASE2B          ;     ENDCASE
               3171   ;
               3172   ;
092B F1        3173   BASE3:   MOV     A,@R1           ; 3:  CASE ENTRY OF:
092C F233      3174            JB7     BASE3A          ;          1:   A/D=0
092E 27        3175            CLR     A
092F AB        3176            MOV     R3,A
```

```
0930 AC        3177            MOV     R4,A
0931 2471      3178            JMP     BASEEX
0933 9254      3179 BASE3A:    JB4     BASE3B              ;       2:      A/D=RANGE
0935 BB35      3180            MOV     R0,#ANALOG+5
0937 2473      3181            JMP     BASEE               ;       3:      A/D=BASE
0939 BB33      3182 BASE3B:    MOV     R0,#ANALOG+3
093B 2473      3183            JMP     BASEE
               3184    ;                                           ENDCASE
               3185    ;
093D BB04      3186 BASE4:     MOV     R3,#(1024/256)      ;       4:      A/D=2.5V
093F BC00      3187            MOV     R4,#(1024) MOD 256  ;               ** REV 1/16/81 **
0941 2471      3188            JMP     BASEEX
               3189    ;
0943 BB17      3190 BASE5:     MOV     R3,#((4095/2)/256)+10H ;    5:      A/D=5V + 1K INPUT
0945 BCFF      3191            MOV     R4,#(4095/2) MOD 256
0947 2471      3192            JMP     BASEEX
               3193    ;
0949 BB01      3194 BASE6:     MOV     R3,#(4095/10)/256   ;       6:      A/D=1.0V,REV.6-6-80
094B BC99      3195            MOV     R4,#(4095/10) MOD 256  ;LOAD 01,99 IN R3,R4 RESPLY.
094D 2471      3196            JMP     BASEEX
               3197    ;
094F BB17      3198 BASE7:     MOV     R3,#(1924/256)+10H  ;       7:      A/D=4.7V + 1X INPUT
0951 BC84      3199            MOV     R4,#(1924)MOD 256   ;LOAD 17,34 IN R3,R4 RESPLY.
0953 2471      3200            JMP     BASEEX
               3201    ;                                           END CASE
0955 BB39      3202 BASEP:     MOV     R0,#DIGITL+1        ;RESET LOC.38,39 TO 07FFH
0957 23FF      3203            MOV     A,#0FFH
0959 A0        3204            MOV     @R0,A
095A C8        3205            DEC     R0
095B 2307      3206            MOV     A,#07H
095D A0        3207            MOV     @R0,A
095E F1        3208            MOV     A,@R1
095F B903      3209            MOV     R1,#REG3
0961 F26B      3210            JB7     BASEP1
0963 B803      3211            MOV     R0,#REG3            ;POINTER FOR SUBTRAHEND
0965 B93A      3212            MOV     R1,#DIGITL          ;POINTER FOR MINUEND
0967 1498      3213            CALL    SUBT                ;GET 800-X
0969 2471      3214            JMP     BASEEX
096B 9273      3215 BASEP1:    JB4     BASEE               ;GET 800+X
096D B93A      3216            MOV     R1,#DIGITL          ;POINT R1 AT DBYT 38H
096F 14C4      3217            CALL    ADD16
               3218    ;
0971 B803      3219 BASEEX:    MOV     R0,#REG3            ;GET PTR TO SOURCE
0973 B903      3220 BASEE:     MOV     R1,#PORTC           ;GET D/A PTR
0975 F0        3221            MOV     A,@R0
0976 91        3222            MOVX    @R1,A               ;OUTPUT D/A VALUE
0977 18        3223            INC     R0
0978 B901      3224            MOV     R1,#PORTA
097A F0        3225            MOV     A,@R0
097B 91        3226            MOVX    @R1,A
097C 040B      3227            JMP     BASEFA
               3228    ;
               3229    ;
               3230    SEJECT
               3231    ;1. TITLE
               3232    ;       OFFSET--OFFSET RESULT
               3233    ;2. CALL AND RETURN
               3234    ;       INPUTS
               3235    ;                   R4=OFFSET (VVVVVVVS) WHERE V=VALUE, S=SIGN
               3236    ;                           OFFSET RANGES FROM 0 TO 254 IN INCREMENTS OF 2
               3237    ;                           OFFSET RANGES NEGATIVE FROM -1 TO -255 IN INCREMENTS OF 2
               3238    ;       OUTPUTS
               3239    ;                   OFFSET ADDED (SUBTRACTED) FROM VALUE AT ANALOG+1
               3240    ;       RETURN
               3241    ;3. CALLED ROUTINES
               3242    ;--SUBT
               3243    ;       INPUTS
               3244    ;                   R0=MINUEND, R1=SUBTRAHEND PTR
               3245    ;       OUTPUTS
               3246    ;                   R3,R4=RESULT
               3247    ;--ADD16
               3248    ;       INPUTS
               3249    ;                   R1=PTR TO ADDEND, R3,R4=AUGEND
               3250    ;       OUTPUTS
               3251    ;                   R3,R4=RESULT
               3252    ;--MOVER1
               3253    ;       INPUTS
               3254    ;                   R3,R4=DATA, ANALOG+1,2=DESTINATION
               3255    ;       OUTPUTS
               3256    ;                   VALUES MOVED
               3257    ;4. EQUATES
               3258    ;*****************************************************************
               3259    ;
               3260    ;
097E 8803      3261 OFFSET:    MOV     R0,#REG3            ;GET SUBTRAHEND(AUGEND ) PTR
0980 8931      3262            MOV     R1,#ANALOG+1
0982 27        3263            CLR     A
0983 AB        3264            MOV     R3,A
0984 FC        3265            MOV     A,R4
0985 12BB      3266            JB0     OFF1                ;IF POSITIVE OFFSET THEN
0987 14C4      3267            CALL    ADD16               ; ADD RESULT
0989 24BD      3268            JMP     OFF2                ;ELSE (NEGATIVE OFFSET)
098B 1490      3269 OFF1:      CALL    SUBTV               ; SUBTRACT RESULT
098D E5        3270 OFF2:      SEL     MB0                 ;ENDIF
098E F4AF      3271            CALL    MOVER1              ;SAVE RESULT
0990 F5        3272            SEL     MB1
0991 93        3273            RETR
               3274    SEJECT
               3275    ;1. TITLE
               3276    ;       FINAL--ADDING OFFSET TO R3,R4 AND CHECKING FOR 4095 OVERFLOW
               3277    ;               IF OVERFLOW, THEN FORCE TO 4095
               3278    ;2. CALL AND RETURN
               3279    ;       INPUTS
```

```
            3280 ;           R4=OFFSET, ANALOG+1,2=VALUE TO BE OFFSET
            3281 ;    OUTPUTS
            3282 ;           ANALOG+1,2 UPDATED WITH NEW VALUE
            3283 ;    RETURN
            3284 ;3.  CALLED ROUTINES
            3285 ;--ADD16
            3286 ;    INPUTS
            3287 ;           R1=PTR TO ADDEND, R3,R4=AUGEND
            3288 ;    OUTPUTS
            3289 ;           R3,R4=RESULT
            3290 ;4.  EQUATES
            3291 ;************************************************************
            3292 ;
            3293 ;
0992 B803   3294 FINAL: MOV   R0,#REG3          ;GET ADD PTRS
0994 B931   3295        MOV   R1,#ANALOG+1
0996 27     3296        CLR   A                 ;PRESET MSB
0997 AB     3297        MOV   R3,A
0998 14C4   3298        CALL  ADD16             ;OFFSET
099A FB     3299        MOV   A,R3              ;IF OVERFLOW THEN
099B 53F0   3300        ANL   A,#0F0H
099D CAA3   3301        JZ    FINAL3
099F BBOF   3302        MOV   R3,#0FH           ;   VALUE= 0FFFH (MAX VALUE POSSIBLE)
09A1 BCFF   3303        MOV   R4,#0FFH
09A3 3480   3304 FINAL3: CALL OFF2              ;ENDIF
09A5 4445   3305        JMP   ADRP3             ;STORE RESULT
            3306 SEJECT
            3307 ;1. TITLE
            3308 ;2. CALL AND RETURN
            3309 ;    INPUTS
            3310 ;    OUTPUTS
            3311 ;    RETURN
            3312 ;3. CALLED ROUTINES
            3313 ;4. EQUATES
            3314 ;************************************************************
            3315 ;
            3316 ;
09A7 B931   3317 PV:    MOV   R1,#ANALOG+1      ;GET BASE VALUE PTR
09A9 B814   3318        MOV   R0,#ADTMP         ;GET MEASURED VALUE PTR
09AB 1490   3319        CALL  SUBTV             ;GET MEASURE-BASE
09AD B803   3320        MOV   R0,#REG3          ;SAVE RESULT
09AF 3489   3321        CALL  DIVDEN            ;GET DIVIDEND
09B1 B931   3322        MOV   R1,#ANALOG+1      ;GET BASE VALUE PTR
09B3 B816   3323        MOV   R0,#ADTMP1        ;GET RANGE VALUE PTR
09B5 1498   3324        CALL  SUBT              ;GET RANGE-BASE
09B7 24C3   3325        JMP   DIVIDE            ;DIVIDE
            3326 SEJECT
            3327 ;1. TITLE
            3328 ;   DIVDEN--SET UP 32 BIT DIVIDEND TO DIVIDE
            3329 ;2. CALL AND RETURN
            3330 ;    INPUTS
            3331 ;           R0=PTR TO DIVIDEND (16 BITS)
            3332 ;    OUTPUTS
            3333 ;           DIVIDEND MOVED AND EXTENDED BY 16 BITS OF 0
            3334 ;    RETURN
            3335 ;3. CALLED ROUTINES
            3336 ;4. EQUATES
            3337 ;************************************************************
            3338 ;
            3339 ;
09B9 B938   3340 DIVDEN: MOV  R1,#DIGITL
09BB 34F7   3341        CALL  MOVEMM
09BD 27     3342        CLR   A
09BE 19     3343        INC   R1
09BF A1     3344        MOV   @R1,A
09C0 19     3345        INC   R1
09C1 A1     3346        MOV   @R1,A             ;CLEAR LS BITS FOR DIVIDE
09C2 93     3347        RETR
            3348 SEJECT
            3349 ;1. TITLE
            3350 ;   DIVIDE--MOVE DIVISOR AND DIVIDE AND OFFSET RESULT
            3351 ;2. CALL AND RETURN
            3352 ;    INPUTS
            3353 ;           R3,R4=DIVISOR, DIGITL+0-4=DIVIDEND
            3354 ;    OUTPUTS
            3355 ;           QUOTIENT (12 BITS) IN ANALOG+1,2
            3356 ;    RETURN
            3357 ;3. CALLED ROUTINES
            3358 ;4. EQUATES
            3359 ;************************************************************
            3360 ;
            3361 ;
09C3 B803   3362 DIVIDE: MOV  R0,#REG3
09C5 B93C   3363        MOV   R1,#DIGITL+4      ;SAVE RESULT
09C7 34F7   3364        CALL  MOVEMM
09C9 B938   3365        MOV   R1,#DIGITL        ;GET (MEASURE-BASE)/(RANGE-BASE)
09CB B83C   3366        MOV   R0,#DIGITL+4
09CD 1472   3367        CALL  DIVD
09CF B83A   3368        MOV   R0,#DIGITL+2      ;GET RESULT PTR
09D1 B903   3369        MOV   R1,#REG3          ;GET SAVE PTR
09D3 34F7   3370        CALL  MOVEMM            ;SAVE RESULT
09D5 BA03   3371        MOV   R2,#3             ;NORMALIZE RESULT
09D7 14CE   3372        CALL  NORMAL
09D9 3480   3373        CALL  OFF2              ;SAVE RESULT
09DB 93     3374        RETR
            3375 SEJECT
            3376 ;1. TITLE
            3377 ;   SAVE--SAVE RESULT
            3378 ;2. CALL AND RETURN
            3379 ;    INPUTS
            3380 ;           R1=PTR TO DESTINATION
            3381 ;           R2=REENTRY PTR
            3382 ;           A=PORT ASSIGNMENT
```

```
                            3363 ;       OUTPUTS
                            3364 ;               VALUES STORED IN DATA FILE WORKSPACE
                            3365 ;       RETURN
                            3366 ;3. CALLED ROUTINES
                            3367 ;--MOVEMM
                            3368 ;       INPUTS
                            3369 ;               R0=SOURCE PTR1, R1=SOURCE PTR 2
                            3390 ;       OUTPUTS
                            3391 ;               MEMORY VALUES EXCHANGED
                            3392 ;4. EQUATES
                            3393 ;*********************************************************
                            3394 ;
                            3395 ;
090C B833                   3396 SAVE:   MOV     R0,#ANALOG+3            ;GET ENTRY TYPE
090E F0                     3397         MOV     A,@R0
090F F2E5                   3398         JB7     SAVE1                   ;IF VOLTAGE TYPE THEN
09E1 2308                   3399         MOV     A,#11011000B            ;   ENABLE SELF CAL GROUND
09E3 24ED                   3400         JMP     SAVE4                   ;ELSE IF RTD 10X THEN
09E5 B2EA                   3401 SAVE1:  JB5     SAVE2                   ;
09E7 27                     3402         CLR     A                       ;   SET SELF CAL PORT INPUT
09E8 24EC                   3403         JMP     SAVE3                   ;ELSE IF RTD 1X THEN
09EA 2308                   3404 SAVE2:  MOV     A,#8                    ;   SET SELF CAL ENTRY
09EC 6B                     3405 SAVE3:  ADD     A,R3                    ;ENDIF
09ED A1                     3406 SAVE4:  MOV     @R1,A
09EE 19                     3407         INC     R1
09EF FA                     3408         MOV     A,R2                    ;ENABLE RETURN
09F0 A1                     3409         MOV     @R1,A
09F1 C9                     3410         DEC     R1
09F2 B831*                  3411         MOV     R0,#ANALOG+1            ;SAVE MS BYTE OF COUNT
09F4 34F7                   3412         CALL    MOVEMM
09F6 93                     3413         RETR
                            3414 SEJECT
                            3415 ;1. TITLE
                            3416 ;       MOVEMM--MOVE MEMORY TO MEMORY (INTERNAL)
                            3417 ;2. CALL AND RETURN
                            3418 ;       INPUTS
                            3419 ;               R0=SOURCE PTR, R1=DESTINATION PTR
                            3420 ;       OUTPUTS
                            3421 ;               2 BYTES MOVED, PTRS= LAST MOVED BYTE
                            3422 ;       RETURN
                            3423 ;3. CALLED ROUTINES
                            3424 ;4. EQUATES
                            3425 ;*********************************************************
                            3426 ;
                            3427 ;
09F7 F0                     3428 MOVEMM: MOV     A,@R0
09F8 21                     3429         XCH     A,@R1
09F9 20                     3430         XCH     A,@R0
09FA 18                     3431         INC     R0
09FB 19                     3432         INC     R1
09FC F0                     3433         MOV     A,@R0
09FD 21                     3434         XCH     A,@R1
09FE 20                     3435         XCH     A,@R0
09FF 93                     3436         RETR
                            3437 SEJECT
                            3438 ;1. TITLE
                            3439 ;       AOMH--ANALOG CONVERSION DISTRIBUTION
                            3440 ;2. CALL AND RETURN
                            3441 ;       INPUTS
                            3442 ;               A=VALUE OF LOCATION TO JUMP TO
                            3443 ;       OUTPUTS
                            3444 ;               PER ROUTINE ENTERED
                            3445 ;       RETURN
                            3446 ;3. CALLED ROUTINES
0A00                        3447         ORG     0A00H
0A00 1B                     3448 XADIDL: DB      ADE AND OFFH            ;IMPOSSIBLE ENTRY
0A01 1B                     3449 XADE:   DB      ADE AND OFFH            ;CLEAN UP AND STORE ENTRY
0A02 2E                     3450 XADT2:  DB      ADWP AND OFFH           ;TYPE 2 ANALOG: R/P
0A03 4A                     3451 XADT3:  DB      ADTHR AND OFFH          ;TYPE 3 ANALOG: THRESHOLD
0A04 7E                     3452 XADT4:  DB      ADV AND OFFH            ;TYPE 4 ANALOG: VOLTAGE
0A05 AA                     3453 XADT5:  DB      ADRTD AND OFFH          ;TYPE 5 ANALOG: RTD
0A06 7E                     3454 XADT6:  DB      ADV AND OFFH            ;TYPE 6 ANALOG: CURRENT
0A07 7E                     3455 XADT7:  DB      ADV AND OFFH            ;TYPE 7 ANALOG: SPARE VOLTAGE TYPE
0A08 57                     3456 XOPEN:  DB      OPNPRT AND OFFH         ;OPEN I/O PORT
0A09 E4                     3457 XINTP:  DB      INTP AND OFFH           ;INTERPOLATION AND OFFSET ENTRY
0A0A D6                     3458 XFNL:   DB      ADFNL AND OFFH          ;FINAL VALUE CALULATION
0A0B C0                     3459 XADR3:  DB      ADRTD3 AND OFFH         ;RTD REENTRY 3
0A0C BA                     3460 XADR2:  DB      ADRTD2 AND OFFH         ;RTD REENTRY 2
0A0D B2                     3461 XADR1:  DB      ADRTD1 AND OFFH         ;RTD REENTRY 1
0A0E 9E                     3462 XADVR1: DB      ADV1 AND OFFH           ;VOLTAGE REENTRY 1
0A0F A4                     3463 XADVR2: DB      ADV2 AND OFFH           ;VOLTAGE REENTRY 2
                            3464 ;4. EQUATES
                            3465 ;*********************************************************
                            3466 ;
                            3467 ;
0A10 B3                     3468 ADMH1:  JMPP    @A
                            3469 ;
                            3470 ;
0A11 340C                   3471 ADVEX:  CALL    SAVE
0A13 2308                   3472         MOV     A,#XOPEN AND OFFH       ;SET NEW INTEGRATION ENTRY
0A15 B8F1*                  3473 ADVE:   MOV     R0,#ANAIN+1
0A17 90                     3474         MOVX    @R0,A
0A18 F5                     3475 ADVE1:  SEL     MB0
0A19 B40F                   3476         JMP     EXEC
                            3477 SEJECT
                            3478 ;1. TITLE
                            3479 ;       ADE--A/D CONVERSION END
                            3480 ;2. CALL AND RETURN
                            3481 ;       INPUTS
                            3482 ;               ANALOG+1,2=FINAL CONVERTED VALUE
                            3483 ;       OUTPUTS
                            3484 ;               VALUE STORED IN POINT STATUS FILE, COS DETECTED AND STORED
```

```
                        3485 ;        RETURN
                        3486 ;3.  CALLED ROUTINES
                        3487 ;4.  EQUATES
                        3488 ;************************************************************
                        3489 ;
                        3490 ;
0A1B E5                 3491 ADE:    SEL     MH0
0A1C B830               3492         MOV     R0,#ANALOG             ;STORE VALUES
0A1E F0                 3493         MOV     A,@R0
0A1F F434               3494         CALL    PANAST
0A21 B832               3495         MOV     R0,#ANALOG+2           ;GET VALUES
0A23 F0                 3496         MOV     A,@R0
0A24 AC                 3497         MOV     R4,A
0A25 C8                 3498         DEC     R0
0A26 F0                 3499         MOV     A,@R0
0A27 AB                 3500         MOV     R3,A
0A28 F426               3501         CALL    MOVER                  ;STORE STATUS
0A2A F5                 3502         SEL     MH1
0A2B 27                 3503         CLR     A
0A2C 4415               3504         JMP     ADVE                   ;ENABLE REENTRY AT IDLE
                        3505 $EJECT
                        3506 ;1. TITLE
                        3507 ;        ADRP--RP CONVERTER PROCESSING RAW COUNT
                        3508 ;        NOTES:  THE RP CONVERTER IS DERIVED FROM A FREE RUNNING COUNTER IN THE
                        3509 ;        8155 AND A PARALLEL PULSE COUNTER IN THE 8049 PROCESSOR. THE FREE
                        3510 ;        RUNNING COUNTER COUNTS THE TIME BETWEEN 20 PULSES TO ACCUMULATE AN
                        3511 ;        R/P COUNT.
                        3512 ;
                        3513 ;        THE COUNTER RUNS AT 6.0000 MHZ/3 OR 0.50000 MICROSECONDS PER COUNT.
                        3514 ;
                        3515 ;        THE R/P ROUTINE HAS SIX RANGES OF CALIBRATION THAT ARE DIGITIZED. THE
                        3516 ;        RANGES EACH RESULT IN A VALUE OF 4000 STATES FROM 95 TO 4095 TO MAKE
                        3517 ;        A 12 BIT VALUE (ALMOST). THE ACTUAL INPUT RANGE IS DIGITIZED TO 16000
                        3518 ;        SIGNIFICANT STATES THEN DIVIDED BY 4 TO GET THE RESULTANT 4000 STATES.
                        3519 ;        FOR EXAMPLE, THE CALIBRATION RANGE OF 75-275 MICROSECONDS HAS A
                        3520 ;        DIGITIZED VALUE OF:
                        3521 ;                DIGITIZED VALUE(LOW)=75*4*20=6000 COUNTS
                        3522 ;                DIGITIZED VALUE(HIGH)=275*4*20=22000 COUNTS
                        3523 ;
                        3524 ;                DIGITIZED VALUE (HIGH-LOW)=22000-6000=16000 COUNTS POSSIBLE
                        3525 ;                FINAL VALUE= DIGITIZED VALUE (HIGH-LOW)/4=4000 COUNTS POSSIBLE
                        3526 ;
                        3527 ;        DIGITIZED VALUES ARE ACCUMULATED BY THE 14 BIT COUNTER IN THE 8155.
                        3528 ;        ACTUAL VALUES FOR THE RANGES MAY EXCEED SOME MULTIPLE OF THE 16384 STATES
                        3529 ;        POSSIBLE IN THE COUNTER. IF THE COUNTER OVERFLOWS IN THE RANGE, A
                        3530 ;        OVERFLOW COMPENSATION MUST BE USED.
                        3531 ;
                        3532 ;        EACH COUNTER RANGE HAS AN OFFSET THAT IS ADDED IN TO THE COUNT'S ACTUAL
                        3533 ;        VALUE.
                        3534 ;
                        3535 ;        THE FOLLOWING EQUATIONS ARE USED FOR DETERMINING THE ACTUAL R/P VALUE:
                        3536 ;                VALUE1=(NORMALIZED COUNT-(DIGITIZED VALUE(LOW))MOD 2**14)/4)+95
                        3537 ;        IF OVERFLOW THEN
                        3538 ;                VALUE=VALUE1+2**14
                        3539 ;
                        3540 ;
                        3541 ;        THE FOLLOWING TABLE GIVES THE RANGES POSSIBLE:
                        3542 ;                WHERE COUNT= DIGITIZED VALUE(LOW) MOD 2**14
                        3543 ;                        OVERFLOW= 2**14
                        3544 ;        THE ACTUAL VALUES ARE OFFSET BY 130 COUNTS (32.5 MICROSECONDS)
                        3545 ;        BECAUSE OF THE DIFFERENTIAL TIME BETWEEN STOPPING THE COUNTER
                        3546 ;        TO READ THE VALUE AND RESTARTING THE COUNTER IS 32.5 MICROSECONDS
                        3547 ;
                        3548 ;
                        3549 ;        RANGE   CALIBRATION     DIGITIZED       COUNT    COUNTS
                        3550 ;                (MICROSECONDS)  (COUNTS)        (IDEAL)  (ACTUAL)
                        3551 ;        6       75-275          6000-22000      6000     6000-130=5870
                        3552 ;        5       275-475         22000-38000     5616     (5870+1*16000)MOD 2**14
                        3553 ;        4       475-675         38000-54000     5232     (5870+2*16000)MOD 2**14
                        3554 ;        3       675-875         54000-70000     4848     (5870+3*16000)MOD 2**14
                        3555 ;        2       875-1075        70000-86000     4464     (5870+4*16000)MOD 2**14
                        3556 ;        1       1075-1275       86000-102000    4080     (5870+5*16000)MOD 2**14
                        3557 ;
                        3558 ;
                        3559 ;        THE CONVERSION PROCESS HAS SEVERAL POSSIBLE ERRORS THAT HAVE A
                        3560 ;        MAXIMUM BIAS THAT IS NON ACCUMULATIVE. THESE ERRORS ARE TABULATED
                        3561 ;        BELOW:
                        3562 ;        POSSIBLE ERRORS                         MAX ERROR       MAX ERROR
                        3563 ;                                                (MICROSECONDS)  (COUNTS)
                        3564 ;        START INTERRRUPT                        2               2
                        3565 ;        STOP INTERRUPT                          2               2
                        3566 ;        R/P JITTER                              1               1
                        3567 ;        ----------------                        ----------      ----------
                        3568 ;        TOTAL                                   5               5
                        3569 ;
                        3570 ;
                        3571 ;        TOTAL ERROR OUT OF ONE CONVERSION IS 10/8000 COUNTS OR 0.125%.
                        3572 ;        THIS RESULTS IS A MAXIMUM ERROR OF 0.125 DEGREE ERROR OUT OF
                        3573 ;        A 100 DEGREE RANGE SENSOR DUE TO THE POWER AND CONVERSION PROCESS.
                        3574 ;
                        3575 ;
                        3576 ;2.  CALL AND RETURN
                        3577 ;        INPUTS
                        3578 ;                ANALOG+1=MS, ANALOG+2=LS COUNT
                        3579 ;        OUTPUTS
                        3580 ;        RETURN
                        3581 ;3.  CALLED ROUTINES
                        3582 ;--RANGE
                        3583 ;        INPUTS
                        3584 ;                ANALOG+3,4=RANGE MEASURE, ANALOG+6=PROGRAMMED RANGE
                        3585 ;        OUTPUTS
```

```
3586 ;                ANALOG+3,4=OFFSET TO SUBTRACT FROM MEASURE
3587 ;                ANALOG+1,2=0 IF OUT OF RANGE CONDITION.
3588 ;--SUBT
3589 ;         INPUTS
3590 ;                R1=PTR TO MINUEND, R0=PTR TO SUBTRAHEND
3591 ;         OUTPUTS
3592 ;                R3,4=RESULT, IF MESSAGE RESULTS, BORROW IS MARKED BY NO CARRY
3593 ;--MOVERI
3594 ;         INPUTS
3595 ;                R0=PTR TO DESTINATION, R3,R4=DATA TO BE MOVED
3596 ;         OUTPUTS
3597 ;                R3,R4 MOVED
3598 ;4.  EQUATES
3599 ;*************************************************************
3600 ;
3601 ;
```

| | | | | | |
|---|---|---|---|---|---|
|0A2E 1412|3602 ADRP:|CALL|RANGE|;GET RANGE OF INPUT|
|0A30 BB31|3603|MOV|R0,#ANALOG+1|;GET SUBTRAHEND PTR|
|0A32 B903|3604|MOV|R1,#REG3|;GET MINUEND PTR|
|0A34 149B|3605|CALL|SUBT|;GET FINAL VALUE|
|0A36 F23A|3606|JB7|ADRP1|;IF NEGATIVE THEN|
|0A38 443E|3607|JMP|ADRP2|; ADD 2**16|
|0A3A 2340|3608 ADRP1:|MOV|A,#40H|
|0A3C 6B|3609|ADD|A,R3|
|0A3D AB|3610|MOV|R3,A|
|0A3E BA02|3611 ADRP2:|MOV|R2,#2|;ENDIF|
|0A40 14CE|3612|CALL|NORMAL|;NORMALIZE RESULT|
|0A42 E5|3613 ADRP4:|SEL|MB0|
|0A43 F44F|3614|CALL|MOVERI|;MOVE RESULT TO INTERNAL STORE|
|0A45 230F|3615 ADRP3:|MOV|A,#XADE AND 0FFH|;SET REENTRY TO AD END|
|0A47 F5|3616|SEL|MB1|
|0A48 4415|3617|JMP|ADVE|

```
3618 $EJECT
3619 ;1. TITLE
3620 ;        ADTHR--CONVERT SUPERVISED LOOP (ANALOG INPUT ACTING AS A DIGITAL INPUT)
3621 ;2. CALL AND RETURN
3622 ;        INPUTS
3623 ;                ANALOG=CC00PPPP WHERE CC=STATUS, P=POINT NUMBER
3624 ;        OUTPUTS
3625 ;                POINT NUMBER CALLED OUT IS UPDATED
3626 ;        RETURN
3627 ;3.  CALLED ROUTINES
3628 ;--POINT
3629 ;        INPUT
3630 ;                R1=PTR TO POINT NUMBER AND STATUS
3631 ;        OUTPUT
3632 ;                POINT STATUS AND COS UPDATED
3633 ;4.  EQUATES
3634 ;*************************************************************
3635 ;
3636 ;
```

| | | | | | |
|---|---|---|---|---|---|
|0A4A E5|3637 ADTHR:|SEL|MB0|
|0A4B B937|3638|MOV|R1,#ANALOG+7|
|0A4D B8FC|3639|MOV|R0,#DUMMY|;GET THRESHOLD RESULT PTR|
|0A4F F1|3640|MOV|A,@R1|
|0A50 90|3641|MOVX|@R0,A|;SET POINT VALUE|
|0A51 F440|3642|CALL|POINT|;UPDATE POINT|
|0A53 F5|3643|SEL|MB1|
|0A54 27|3644|CLR|A|
|0A55 4415|3645|JMP|ADVE|;SET REENTRY TO IDLE|

```
3646 $EJECT
3647 ;1. TITLE
3648 ;        OPEN PORT--OPEN ANALOG PORT
3649 ;2. CALL AND RETURN
3650 ;        INPUTS
3651 ;                ANALOG FILE LOADED
3652 ;        OUTPUTS
3653 ;                ANALOG PORT OPEN
3654 ;        RETURN
3655 ;3.  CALLED ROUTINES
3656 ;--BASE
3657 ;        INPUTS
3658 ;                ANALOG+3=RRRGVVVV WHERE RRR IS USED TO DETERMINE
3659 ;                WHAT IS DONE WITH THE BASE AND RANGE VALUES ON THE ENTRIES
3660 ;                INTO A CONVERSION ROUTINE.  ANALOG+2'S IIII HAS BITS TELLING
3661 ;                THE ENTRY NUMBER.
3662 ;        OUTPUTS
3663 ;                D/A OUTPUT SET
3664 ;4.  EQUATES
3665 ;*************************************************************
3666 ;
3667 ;
```

| | | | | | |
|---|---|---|---|---|---|
|0A57 B8F1|3668 OPNPRT:|MOV|R0,#ANAIN+L|;GET ANALOG INPUT|
|0A59 B932|3669|MOV|R1,#ANALOG+2|
|0A5B F1|3670|MOV|A,@R1|
|0A5C 47|3671|SWAP|A|
|0A5D 530F|3672|ANL|A,#0FH|;GET ANALOG INPUT TYPE|
|0A5F 90|3673|MOVX|@R0,A|;SET ANALOG ENTRY PT|
|0A60 5307|3674|ANL|A,#7|
|0A62 15|3675|DIS|I|
|0A63 D5|3676|SEL|RB1|;ENABLE CONVERSION|
|0A64 AF|3677|MOV|R7,A|
|0A65 C5|3678|SEL|RB0|
|0A66 27|3679|CLR|A|
|0A67 30|3680|MOVD|P5,A|;DISABLE REFRESH|
|0A68 23B8|3681|MOV|A,#ANACP|;OPEN ANALOG PORT|
|0A6A 3A|3682|OUTL|P2,A|
|0A6B 8802|3683|MOV|R0,#PORTB|;GET PORT B PTR|
|0A6D B931|3684|MOV|R1,#ANALOG+1|;GET PORT PTR|
|0A6F F1|3685|MOV|A,@R1|;TRANSFER DATA|
|0A70 37|3686|CPL|A|
|0A71 90|3687|MOVX|@R0,A|

```
0A72 3408      3688          CALL    BASE                    ;SET D/A OUTPUT
0A74 23A0      3689          MOV     A,#XRAM                 ;OPEN RAM PORT
0A76 3A        3690          OUTL    P2,A
0A77 8932      3691          MOV     R1,#ANALOG+2            ;GET ANALOG SOURCE DATA
0A79 F1        3692          MOV     A,@R1
0A7A 3D        3693          MOVD    P5,A
0A7B 05        3694          EN      I
0A7C 4418      3695          JMP     ADVE1
               3696 $EJECT
               3697 ;1. TITLE
               3698 ;         ADV--INPUT VOLTAGE A/D CONVERSION
               3699 ;         NOTES: THE VOLTAGE A/D CONVERSION REQUIRES 5 ENTRIES TO THIS
               3700 ;                ROUTINE TO DO A CONVERSION AND A ENTRY TO THE 'ADE' ROUTINE.
               3701 ;                INPUTS COME IN TWO CATEGORIES
               3702 ;                   1: MAXIMUM SPAN IS LESS THEN 5V
               3703 ;                   2: MAXIMUM SPAN IS MORE THEN 5V
               3704 ;                CATEGORY 2 INPUTS ARE DENOTED 'FULL RANGE' TYPES.
               3705 ;                THE 6 ENTRIES DO THIS:
               3706 ;                   ENTRY              PURPOSE
               3707 ;                     1               GET INPUT RAW VALUE
               3708 ;                     2               GET RANGE RAW VALUE
               3709 ;                     3               GET OFFSET (5.5V) RAW VALUE
               3710 ;                     4               CALCULATE FINAL RESULT
               3711 ;                     5               ADD INTERPOLATE RESULT TO FINAL
               3712 ;                     6               STORE FINAL RESULT
               3713 ;2. CALL AND RETURN
               3714 ;         INPUTS
               3715 ;         OUTPUTS
               3716 ;         RETURN
               3717 ;3. CALLED ROUTINES
               3718 ;--SAVE
               3719 ;         INPUTS
               3720 ;                R1=DESTINATION PTR (BOTH INTERNAL)
               3721 ;                R2=REENTRY PTR, A=PORT ASSIGNMENT
               3722 ;         OUTPUTS
               3723 ;                2 BYTES OF DATA MOVED FROM ANALOG+1 AND BASE AND RANGE EXCHANGED
               3724 ;--NORMAL
               3725 ;         INPUTS
               3726 ;                R3=MS, R4=LS, R2=RIGHT SHIFT COUNT
               3727 ;         OUTPUTS
               3728 ;                R3,R4=RESULT
               3729 ;--DATA
               3730 ;         INPUTS
               3731 ;                A=ADDRESS, R3=QUADRANT
               3732 ;         OUTPUTS
               3733 ;                R4=DATA
               3734 ;--SUBT
               3735 ;         INPUTS
               3736 ;                R0=PTR TO SUBTRAHEND, R1=PTR TO MINUEND
               3737 ;         OUTPUTS
               3738 ;                R3, R4=RESULT
               3739 ;--DIVD
               3740 ;         INPUTS
               3741 ;                R1=PTR TO DIVIDEND, R0=PTR TO DIVISOR (BOTH INTERNAL)
               3742 ;         OUTPUTS
               3743 ;                R0+2=PTR TO QUOTIENT
               3744 ;4. EQUATES
0044           3745 XADV     EQU     (XADT4 AND 0FH)*16+04H   ;REENTRY FOR FULL RANGE READING
00E4           3746 XADV1    EQU     (XADVR1 AND 0FH)*16+04H  ;REENTRY 2+OPEN SELF CAL INPUT
00F4           3747 XADV2    EQU     (XADVR2 AND 0FH)*16+04H  ;REENTRY 3+OPEN SELF CAL INPUT
               3748 ;*********************************************************************
               3749 ;
               3750 ;
DA7E 8914      3751 ADV:     MOV     R1,#ADTMP                ;SAVE RESULT
0A80 8831      3752          MOV     R0,#ANALOG+1             ;GET RESULT
0A82 F0        3753          MOV     A,@R0
0A83 C6A9      3754          JZ      ADV10                    ;IF NONZERO RESULT THEN
0A85 8AE4      3755 ADV0:    MOV     R2,#XADV1                ;  GET REENTRY
0A87 4411      3756          JMP     ADVEX
               3757
               3758
0A89 8833      3759 ADV10:   MOV     R0,#ANALOG+3             ;ELSE IF NOT FULL RANGE THEN
0A8B F0        3760          MOV     A,@R0
0A8C 8292      3761          JB5     ADV11                    ;  SCHEDULE RESULT STOR
0A8E 2301      3762 ADV10A:  MOV     A,#XADE AND 0FFH
0A90 4415      3763          JMP     ADVE
0A92 D2BE      3764 ADV11:   JB6     ADV10A                   ;TEST IF RRR TYPE 1,REV.6-6-80
0A94 2308      3765          MOV     A,#08                    ;ELSE (FULL RANGE)
0A96 A0        3766          MOV     @R0,A                    ;  FORCE RRR TYPE TO 0
0A97 18        3767          INC     R0                       ;  SET UP 0800H TO D/A OUTPUT FOR BASE
0A98 27        3768          CLR     A
0A99 A0        3769          MOV     @R0,A
0A9A BA44      3770          MOV     R2,#XADV                 ;  GET REENTRY
0A9C 4411      3771          JMP     ADVEX                    ;  SCHEDULE RETRY
               3772 ;                                         ENDIF
               3773 ;
               3774 ;
0A9E 8916      3775 ADV1:    MOV     R1,#ADTMP1               ;SAVE RESULT
0AA0 8AF4      3776          MOV     R2,#XADV2                ;SCHEDULE REENTYR
0AA2 4411      3777          JMP     ADVEX
               3778 ;
               3779 ;
0AA4 34A7      3780 ADV2:    CALL    PV                       ;CALCULATE PROPORTIONAL VALUE
0AA6 2309      3781          MOV     A,#XINTP AND 0FFH        ;GET REENTRY
0AA8 4415      3782          JMP     ADVE
               3783 $EJECT
               3784 ;1. TITLE
               3785 ;         ADR--A/D CONVERT RESISTANCE INPUT
               3786 ;         NOTE: THE RESISTANCE INPUT MEASURE USES A HEX SLOPE CONVERSION THAT
               3787 ;               ENABLES THE MEASURED VALUE, THEN THE HIGH END SELF CAL RESISTOR,
               3788 ;               AND FINALLY THE LOW END SELF CAL RESISTOR.
```

```
               3789 ;
               3790 ;
               3791 ;         AFTER THESE THREE MEASUREMENTS, THE RAW VALUE, RV, IS CALCULATED
               3792 ;         USING THE 'PV' SUBROUTINE. THEN ON THE NEXT ENTRY, THE
               3793 ;         PROPORTIONAL VALUE, PV, IS CALCULATED IN 'ADRTD3'. FOLLOWING
               3794 ;         THIS, THE FINAL PROPORTIONAL VALUE, FPV, IS CALCULATED BY
               3795 ;         ADDING THE 'OFFSET' AND 'INTERPOLATION TABLE' ENTRY IN 'INTP'.
               3796 ;
               3797 ;         ON THE NEXT ENTRY, THE FINAL VALUE, FV, IS CALCULATED TO
               3798 ;         SCALE 'FPV' TO A 95 TO 4095 (4000 COUNT) RESULT IN THE 'ADFNL'
               3799 ;         ROUTINE.
               3800 ;
               3801 ;         THE EQUATIONS FOR EACH OF THESE STEPS ARE:
               3802 ;
               3803 ;         RV=4095* (MV-MB)/(MR-MB)      = RAW VALUE
               3804 ;         PV=4095* (RV-BV)/R            = PROPROTIONAL VALUE
               3805 ;         FPV=4095*(PV+OFFSET+INTERPOLATION ENTRY)
               3806 ;         FV= ((4095*FPV)/(4095/4000))+95
               3807 ;
               3808 ;         WHERE RV=RAW VALUE, MV=MEASURE VARIABLE (RESISTOR BEING MEASURED)
               3809 ;         MB=MEASURED BASE SELF CAL RESISTOR (365 OHMS (10X) OR 732 OHMS(1X)
               3810 ;         MR=MEASURE RANGE SELF CAL RESISTOR (732 OHMS(10X) OR 4530 OHMS (1X)
               3811 ;         BV=BASE VALUE OF RANGE OF INTEREST
               3812 ;         R=RANGE VALUE OF RANGE OF INTEREST
               3813 ;
               3814 ;         THE RANGE AND BASE VALUES OF INTEREST ARE FOUND IN THE DATA
               3815 ;         FILE FOR A PARTICULAR INPUT. THESE ARE CALCULATED USING THE
               3816 ;         FOLLOWING FORMULAS:
               3817 ;
               3818 ;         BV=4095* (SR-MF)/(MR-MB)
               3819 ;         R= 4095* (SR-SN)/(MR-MB)
               3820 ;
               3821 ;         WHERE  SN=SENSOR MINIMUM RESISTANCE
               3822 ;                SR=SENSOR MAXIMUM RESISTANCE
               3823 ;2. CALL AND RETURN
               3824 ;     INPUTS
               3825 ;     OUTPUTS
               3826 ;     RETURN
               3827 ;3. CALLED ROUTINES
               3828 ;4. EQUATES
0004           3829 KADRR1  EQU    (KADR1 AND 0FH)*16+04H   ;REENTRY 2* OPEN SELF CAL
00C4           3830 KADRR2  EQU    (KADR2 AND 0FH)*16+04H   ;REENTRY 3* OPEN SELF CAL
               3831 ;***************************************************************
               3832 ;
               3833 ;
0AAA 8914      3834 ADRTD:  MOV    R1,#ADTMP        ;SAVE RESULT
0AAC 8AD4      3835         MOV    R2,#XADRR1       ;GET REENTRY
0AAE 8BCA      3836         MOV    R3,#11001000B    ;GET SELF CAL RANGE VALUE
0AB0 4411      3837         JMP    ADVEX
               3838 ;
               3839 ;
0AB2 8916      3840 ADRTD1: MOV    R1,#ADTMP1       ;SAVE RESULT
0AB4 8AC4      3841         MOV    R2,#XADRR2       ;GET REENTRY
0AB6 8BC0      3842         MOV    R3,#11000000B    ;GET SELF CAL RANGE VALUE
0AB8 4411      3843         JMP    ADVEX
               3844 ;
               3845 ;
0ABA 34A7      3846 ADRTD2: CALL   PV               ;GET PROPORTIONAL RAW VALUE (RV)
0ABC 2306      3847         MOV    A,#XADR3 AND 0FFH    ;GET REENTRY
0ABE 4415      3848         JMP    ADVE
               3849 ;
               3850 ;
0AC0 B833      3851 ADRTD3: MOV    R0,#ANALOG+3     ;GET BASE
0AC2 14EB      3852         CALL   NUM              ;GET RV
0AC4 B803      3853         MOV    R0,#REG3         ;GET (RV-BASE)
0AC6 B951      3854         MOV    R1,#ANALOG+1
0AC8 1490      3855         CALL   SUBTV
0ACA 34B9      3856         CALL   DIVDEN           ;SET DIVIDEND
0ACC 8835      3857         MOV    R0,#ANALOG+5     ;GET RANGE
0ACE 14EB      3858         CALL   NUM
0AD0 34C3      3859         CALL   DIVIDE           ;GET (RV-BASE)/RANGE
0AD2 2309      3860         MOV    A,#XINTP AND 0FFH    ;ENTER INTERPOLATION REENTRY
0AD4 4415      3861         JMP    ADVE
               3861 SEJECT
               3862 ;1. TITLE
               3863 ;       ADFNL--A/D FINAL VALUE CALCULATION
               3864 ;2. CALL AND RETURN
               3865 ;     INPUTS
               3866 ;            PROPORTIONAL 12 BIT VALUE IN ANALOG+1,2
               3867 ;     OUTPUTS
               3868 ;            PROPORTIONAL 4000 COUNT VALUE OFFSET BY 95 (95-4095)
               3869 ;     RETURN
               3870 ;3. CALLED ROUTINES
               3871 ;--DIVDEN--GET DIVIDEND
               3872 ;     INPUTS
               3873 ;            R0=PTR TO SUBTRAHEND, MINUEND IN ANALOG+1,2
               3874 ;     OUTPUTS
               3875 ;            DIVIDEND CALCULATED AND STORED
               3876 ;--DIVIDE
               3877 ;     INPUTS
               3878 ;            R3,R4=DIVISOR, DIGITL+0,1,2,3=DIVIDEND
               3879 ;     OUTPUTS
               3880 ;            QUOTIENT NORMALIZED TO 12 BITS AND SAVED IN ANALOG+1,2
               3881 ;--ADD16
               3882 ;     INPUTS
               3883 ;            R1=ADDEND, R3,R4=AUGEND
               3884 ;     OUTPUTS
               3885 ;            R3,R4=RESULT
               3886 ;4. EQUATES
               3887 ;***************************************************************
               3888 ;
0AD6 8831      3889 ADFNL:  MOV    R0,#ANALOG+1
0AD8 34B9      3890         CALL   DIVDEN           ;SET DIVIDEND
0ADA 8B10      3891         MOV    R3,#(4192)/256   ;GET DIVISOR=4095/4000 (IN 12 BIT FORMAT)
```

```
OADC 8C60      3892        MOV    R4,#(4192) MOD 256
OADE 34C3      3893        CALL   DIVIDE              ;NORMALIZE TO 4000 CTS
OAE0 8C5F      3894        MOV    R4,#45              ;GET '95' OFFSET
OAE2 2492      3895        JMP    FINAL
               3896 $EJECT
               3897 ;1. TITLE
               3898 ;        INTP--INTERPOLATION TABLE AND OFFSET PROCESS
               3899 ;2.  CALL AND RETURN
               3900 ;        INPUTS
               3901 ;               FINAL VALUE IN ANALOG+1,2; TABLE ASSIGNMENT, OFFSET ASSIGNMENT
               3902 ;               IN ANALOG+5,7 RESPECTIVELY
               3903 ;        OUTPUTS
               3904 ;               OUTPUT WITH OFFSET AND INTERPOLATION VALUE ADDED AND NORMALIZED
               3905 ;               TO FINAL VALUE.
               3906 ;        RETURN
               3907 ;3.  CALLED ROUTINES
               3908 ;--DATA
               3909 ;        INPUTS
               3910 ;               A=ADDRESS, R3=QUADRANT
               3911 ;        OUTPUTS
               3912 ;               R4=DATA
               3913 ;--OFFSET
               3914 ;        INPUTS
               3915 ;               R0=PTR TO OFFSET, ANALOG+1=VALUE TO BE OFFSET
               3916 ;        OUTPUTS
               3917 ;               ANALOG+1,2 OFFSET AND UPDATED
               3918 ;4.  EQUATES
               3919 ;****************************************************************
               3920 ;
               3921 ;
OAE4 B835      3922 INTP:  MOV    R0,#ANALOG+5        ;GET TABLE ASSIGNMENT
OAE6 F0        3923        MOV    A,@R0
OAE7 47        3924        SWAP   A
OAE8 5307      3925        ANL    A,#07H
OAEA C6F6      3926        JZ     INTPE               ;IF TABLE ASSIGNED THEN
OAEC 1456      3927        CALL   TABLE               ;  GET TABLE ENTRY PTR
OAEE C6F6      3928        JZ     INTPE               ;  IF NONZERO VALUE THEN
OAF0 E5        3929        SEL    MB0
OAF1 14CD      3930        CALL   DATA                ;    GET TABLE ENTRY
OAF3 F5        3931        SEL    MB1
OAF4 347E      3932        CALL   OFFSET              ;    OFFSET RESULT
               3933 ;                                  ENDIF
OAF6 B837      3934 INTPE: MOV    R0,#ANALOG+7        ;  ADD OFFSET
OAF8 F0        3935        MOV    A,@R0
OAF9 AC        3936        MOV    R4,A
OAFA 347E      3937        CALL   OFFSET
OAFC 230A      3938        MOV    A,#XFNL AND 0FFH    ;ENDIF
OAFE 4415      3939        JMP    ADVE                ;SET REENTRY
               3940 $EJECT
0B00           3941        ORG    0B00H
               3942 ; BASE ROUTINE LOGIC FOR RRR TYPE 2 CONTINUED REV.6-9-80
               3943 ;
0B00 B836      3944 BASE2B: MOV   R0,#ANALOG+6        ; A/D=7FFFH+RANGE-BASE IN D.F.
0B02 B939      3945        MOV    R1,#DIGITL+1        ;HAVE RANGE IN R3,R4
0B04 F0        3946        MOV    A,@R0               ; RANGE-BASE CALCULATION
0B05 A1        3947        MOV    @R1,A               ;MS BYTE OF BASE
0B06 C8        3948        DEC    R0
0B07 C9        3949        DEC    R1
0B08 F0        3950        MOV    A,@R0               ;MS BYTE OF BASE IN D.F.
0B09 530F      3951        ANL    A,#0FH
0B0B A1        3952        MOV    @R1,A
0B0C B803      3953        MOV    R0,#REG3            ;POINTER FOR MINUEND
0B0E 1498      3954        CALL   SUBT                ;RANGE-BASE IN R3,R4
0B10 B932      3955        MOV    R1,#ANALOG+2
0B12 2455      3956        JMP    BASEP
               3957 ; WANT RANGE IN BYT 38,39H MINUEND
               3958 ; WANT BASE IN R3,R4 SUBTRAHEND
               3959 ; WANT RESULT IN R3,R4
               3960 ;
               3961 $EJECT
               3962 ;
               3963 ;1. TITLE
               3964 ;        FSSTATUS--REPORT STATUS OF FS MODULE INPUTS
               3965 ;  NOTES: THE FS INTERFACE PROVIDES AN OFF BOARD CONNECTION TO FS
               3966 ;         MODULES OF THE FS20 TYPE.  INTERFACE IS PROVIDED BY REDEFINITION
               3967 ;         OF DIGITAL INPUTS 1-12 AND DIGITAL OUTPUTS 1-12 TO PROVIDE THE
               3968 ;         INTERFACE.  THESE INPUTS AND OUTPUTS ARE DEDICATED TO THIS TASK
               3969 ;         WHEN USED AS AN FS INTERFACE.
               3970 ;
               3971 ;
               3972 ;        A CROSS REFERENCE OF THE 540 DGP TO FS20 SIGNALS FOLLOWS:
               3973 ;          540 DEFINITION       FS20 DEFINITION         J6 PIN
               3974 ;             DIGIN1              ALA-1                   19
               3975 ;             DIGIN2              THLA-1                  24
               3976 ;             DIGIN3              ALB-1                   23
               3977 ;             DIGIN4              THLB-1                  20
               3978 ;             DIGIN5              ALC-1                   17
               3979 ;             DIGIN6              THLC-1                  18
               3980 ;             DIGIN7              ALD-1                   22
               3981 ;             DIGIN8              THLD-1                  21
               3982 ;             DIGIN9              VALID GROUP-0           34
               3983 ;             DIGIN10             CUS-0                   33
               3984 ;             DIGIN11             COMMON ALARM-0          14
               3985 ;             DIGIN12             COMMON TROUBLE-0        12
               3986 ;             DIGOUT1             POINT SELECT A-1         4
               3987 ;             DIGOUT2             POINT SELECT B-1        13
               3988 ;             DIGOUT3             GROUP SELECT A-1         3
               3989 ;             DIGOUT4             GROUP SELECT B-1         5
               3990 ;             DIGOUT5             GROUP SELECT C-1         7
               3991 ;             DIGOUT6             GROUP SELECT D-1         9
               3992 ;             DIGOUT7             START STOP 1/0-1        11
               3993 ;             DIGOUT8             COMMAND STROBE-1         2
```

```
                3994 ;          DIGOUT9         COS SET=1           6
                3995 ;          DIGOUT10        COS RESET=1         8
                3996 ;          DIGOUT11        STOP SCAN=1         15
                3997 ;          DIGOUT12        RESET FOLDBACK=0    10
                3998 ;2.  CALL AND RETURN
                3999 ;      INPUTS
                4000 ;              R0=PTR TO DATA STORE, R3=WORD COUNTER
                4001 ;      OUTPUTS
                4002 ;              COS SET, DATA TRANSFERED.
                4003 ;      RETURN
                4004 ;3.  CALLED ROUTINES
                4005 ;--FSCTL--FS CONTROL
                4006 ;      INPUTS
                4007 ;              R2=COMMAND
                4008 ;      OUTPUTS
                4009 ;              COMMAND OUTPUT ON DIGITAL OUTPUT LINES
                4010 ;4.  EQUATES
0007            4011 DISSCN  EQU   00000111B       ;DISABLE SCAN
0006            4012 COSSET  EQU   00000110B       ;CHANGE OF STATE SET
0005            4013 COSRES  EQU   00000101B       ;CHANGE OF STATE RESET
0003            4014 STOPSC  EQU   00000011B       ;STOP SCAN
000F            4015 RFLDBK  EQU   00001111B       ;RESET FOLDBACK
                4016 ;4.  EQUATES
                4017 ;*************************************************************
                4018 ;
                4019 ;
0814 8920       4020 FSSTAT: MOV   R1,#ADDRES
0816 F1         4021         MOV   A,@R1
0817 5218       4022         JB2   FSU
0819 6484       4023         JMP   FS3
081B 89FB       4024 FS0:    MOV   R1,#DIGMSK      ;GET FS20 ID AND # OF MODULES
081D 81         4025         MOVX  A,@R1
081E AA         4026         MOV   R2,A
081F 5307       4027         ANL   A,#07H
0821 AB         4028         MOV   R3,A            ;ISOLATE QUADRANT
0822 FA         4029         MOV   A,R2
0823 55F8       4030         ANL   A,#0F8H         ;ISOLATE ADDRESS OF FILE BEGINNING
0825 0305       4031         ADD   A,#05H          ;SELECT FS20 INFO BYTE
0827 AA         4032         MOV   R2,A
0828 E5         4033         SEL   MB0
0829 14CD       4034         CALL  DATA
082B F5         4035         SEL   MB1
082C FC         4036         MOV   A,R4
                4037 ;                             ;R4=NNNDDDDD
                4038 ;                             ;NNN=NUMBER OF MODULES-1
                4039 ;                             ;DDDDD=DIGITAL ID OF FIRST FS20 POINT
                4040 ;                             ;    =(ID-1)/8. ID IS SELECTED
                4041 ;                             ;SUCH THAT THE FS20 DATA BEGINS IN A
                4042 ;                             ;NEW BYTE IN THE DATA STREAM.
                4043 ;                             ; EX: NNN=011 MEANS 4 FS20 PANELS.
                4044 ;                             ;     DDDDD=01100 MEANS THE FIRST FS20
                4045 ;                             ;        POINT WILL HAVE ID 49 (DECIMAL)
082D 531F       4045         ANL   A,#01FH
082F 77         4046         RR    A
0830 0382       4047         ADD   A,#DIGST
0832 A8         4048         MOV   R0,A
0833 FC         4049         MOV   A,R4
0834 53E0       4050         ANL   A,#0E0H
0836 E7         4051         RL    A
0837 E7         4052         RL    A
0838 E7         4053         RL    A
0839 0301       4054         ADD   A,#01H
083A E7         4055         RL    A
083C E7         4056         RL    A
083D AB         4057         MOV   R3,A
                4058 ;
                4059 ;      BEFORE SCANNING FS20 MODULES, BE SURE ALL DEFINED MODULES
                4060 ;      ARE ACTIVE.  IF ANY MODULE FAILES THIS "QUICKY" SCAN, DO NOT
                4061 ;      DO THE REAL SCAN. THIS WILL PREVENT CLEARING OF ANY COS IN
                4062 ;      A GOOD MODULE WITHOUT FIRST REPORTING IT TO THE CENTRAL.
                4063 ;
083E BA07       4064 FS0K:   MOV   R2,#DISSCN      ;ENSURE CONTROL LINES ARE LOW
0840 94B6       4065         CALL  FSCTL
                4066 ;
0842 BC00       4067         MOV   R4,#000H
0844 B929       4068         MOV   R1,#COSBUF
0846 940F       4069 FS0KLP: CALL  COMAND          ;OUTPUT GROUP ADDRESS BUT NOT
0848 2300       4070         MOV   A,#DIGIN1       ;"STOP SCAN=1", UNIT WILL ANSWER
084A 3A         4071         OUTL  P2,A            ;WITH "VALID GROUP" IF IT IS THERE.
084B 09         4072         IN    A,P1
084C 525F       4073         JB2   FS0EAD          ;BIT2=VALID-GROUP=0
084E 2304       4074         MOV   A,#04H          ;THIS GROUP OK, INCREMENT GROUP NUMBER
0850 6C         4075         ADD   A,R4
0851 AC         4076         MOV   R4,A
0852 D8         4077         XRL   A,R3            ;LAST GROUP?
0853 9646       4078         JNZ   FS0KLP          ;NO, CONTINUE.
0855 230F       4079         MOV   A,#0FH          ;YES. SUCCESSFUL SCAN, CLEAR
0857 51         4080         ANL   A,@R1           ;COSBUF BITS.
0858 A1         4081         MOV   @R1,A
0859 940F       4082         CALL  COMAND          ;DESELECT ALL GROUPS, PREPARE FOR
                4083 ;                             ;"REAL SCAN"
085B BC00       4084         MOV   R4,#00H         ;INITIALIZE GROUP ADDRESS COUNTER.
085D 6469       4085         JMP   FSLP            ;DO "REAL" FS20 SCAN
085F 2320       4086 FS0EAD: MOV   A,#020H         ;GROUP DID NOT RESPOND, ABORT FS20
0861 41         4087         ORL   A,@R1           ;PROCESS, SET COSBUF BITS=1 AND RETURN.
0862 A1         4088         MOV   @R1,A
0863 BC20       4089         MOV   R4,#020H        ;DESELECT ALL GROUPS
0865 940F       4090         CALL  COMAND
0867 6484       4091         JMP   FS3
                4092 ;
0869 B900       4093 FSLP:   MOV   R1,#0           ;DO FROM GROUPS 0 TO 7
086B 940F       4094         CALL  COMAND
086D BA02       4095         MOV   R2,#COSSET .AND. STOPSC
```

```
086F 9486           4096           CALL    FSCTL              ; ISSUE COMMAND AND ADDRESS
0871 23C0           4097           MOV     A,#DIGIN           ; READ INPUTS
0873 3A             4098           OUTL    P2,A
0874 09             4099           IN      A,P1
0875 535F           4100           ANL     A,#5FH
0877 A9             4101           MOV     R1,A
0878 23D0           4102           MOV     A,#DIGIN1
087A 3A             4103           OUTL    P2,A
087B 09             4104           IN      A,P1
087C AA             4105           MOV     R2,A
087D 77             4106           RR      A
087E 77             4107           RR      A
087F 53C0           4108           ANL     A,#UCOM
0881 49             4109           ORL     A,R1
0882 A9             4110           MOV     R1,A
0883 2380           4111           MOV     A,#XRAM            ; OPEN RAM
0885 3A             4112           OUTL    P2,A
0886 6491           4113           JMP     FS1
0888 8929           4114 FSCOS:    MOV     R1,#COSBUF         ;     SET COS
088A 2380           4115           MOV     A,#80H
088C 41             4116           ORL     A,@R1
088D A1             4117           MOV     @R1,A              ;     ENDIF
088E FA             4118           MOV     A,R2
088F 649A           4119           JMP     FS1A
0891 948F           4120 FS1:      CALL    FSRDID             ;PUT FS DATA INTO ASCENDING ORDER
0893 80             4121           MOVX    A,@R0              ;READ OLD DATA
0894 A9             4122           MOV     R1,A
0895 FA             4123           MOV     A,R2
0896 D9             4124           XRL     A,R1               ;DIFFERENCE BETWEEN OLD AND NEW INFO?
0897 96B8           4125           JNZ     FSCOS              ;YES, FLAG DIGITAL COS
0899 FA             4126           MOV     A,R2               ;NO, STORE DATA
089A 90             4127 FS1A:     MOVX    @R0,A
089B BA01           4128           MOV     R2,#COSRES AND STOPSC
089D 9486           4129           CALL    FSCTL              ; RESET COS
089F BA07           4130           MOV     R2,#DISSCN
08A1 9486           4131           CALL    FSCTL              ; DISABLE SCAN
08A3 18             4132           INC     R0
08A4 2304           4133           MOV     A,#4               ; ENDIF
08A6 6C             4134           ADD     A,R4               ; INCREMENT GROUP
08A7 AC             4135           MOV     R4,A
08A8 DB             4136           XRL     A,R3
08A9 9669           4137           JNZ     FSLP               ;ENDDO
08AB 940F           4138           CALL    COMAND             ;SELECT NON-EXISTANT GROUP
08AD BA07           4139           MOV     R2,#DISSCN
08AF 9486           4140           CALL    FSCTL              ;DISABLE SCAN, PRIME FS20 FOR COS.
08B1 2380           4141           MOV     A,#XRAM
08B3 3A             4142           OUTL    P2,A
08B4 93             4143 FS3:      RETR
                    4144 ;
                    4145 SEJECT
                    4146 ;1. TITLE
                    4147 ;     FSRLY--FS RELAY
                    4148 ;2. CALL AND RETURN
                    4149 ;     INPUTS
                    4150 ;        BIT 7 OF R3=COMMAND, A=ACTION MASK (000PPPPP) P=ADDRESS
                    4151 ;     OUTPUTS
                    4152 ;        COMMAND INITIATED
                    4153 ;     RETURN
                    4154 ;3. CALLED ROUTINES
                    4155 ;--COMAND
                    4156 ;     INPUTS
                    4157 ;        R4=COMMAND ADDRESS
                    4158 ;     OUTPUTS
                    4159 ;        COMMAND ISSUED, R1=DIGIN 1-6, R2=DIGIN 7-12
                    4160 ;4. EQUATES
                    4161 ;********************************************************************
                    4162 ;
                    4163 ;
08B5 8920           4164 FSRLY:    MOV     R1,#ADDRES         ;TEST FS MODULES PRESENT
08B7 F1             4165           MOV     A,@R1
08B8 52BC           4166           JB2     FSR1
08BA 64E3           4167           JMP     FSR2
08BC FB             4168 FSR1:     MOV     A,R3               ;GET COMMAND (R3)
08BD 537F           4169           ANL     A,#07FH
08BF AC             4170           MOV     R4,A
08C0 940F           4171           CALL    COMAND             ;GROUP, POINT, AND COMMAND BIT SET-UP
08C2 BA03           4172           MOV     R2,#STOPSC         ;
08C4 9486           4173           CALL    FSCTL              ;SET STOP SCAN =1
08C6 23A0           4174           MOV     A,#RLYRO
08C8 3A             4175           OUTL    P2,A
08C9 FC             4176           MOV     A,R4
08CA 4380           4177           ORL     A,#080H
08CC AC             4178           MOV     R4,A
08CD 9415           4179           CALL    COMAN1             ;SET COMMAND STROBE=1
08CF 47             4180           SWAP    A
08D0 537F           4181           ANL     A,#07FH
08D2 9415           4182           CALL    COMAN1             ;REMOVE COMMAND STROBE
08D4 BA07           4183           MOV     R2,#DISSCN
08D6 9486           4184           CALL    FSCTL              ;REMOVE STOP-SCAN
08D8 23A0           4185           MOV     A,#RLYRO
08DA 3A             4186           OUTL    P2,A
08DB BC20           4187           MOV     R4,#020H           ;SELECT DUMMY GROUP TO PRIME OTHER
08DD 940F           4188           CALL    COMAND             ;PANELS FOR COS
08DF BA07           4189           MOV     R2,#DISSCN
08E1 9486           4190           CALL    FSCTL
08E3 93             4191 FSR2:     RETR
                    4192 SEJECT
                    4193 ;1. TITLE
                    4194 ;     CIM--CIM MODULE INTERFACE
                    4195 ;     NOTES: THE CIM MODULE INTERFACE RELIES ON THE REDEFINITION OF OUTPUT
                    4196 ;            DRIVERS INTO TWO 2 X 8 MATRICES. DIGOUT TERMINALS 1 TO 8 ARE
```

```
4197 ;                USED AS THE BY A PORTION, AND DIGOUT 14 (0) AND 15(1) ARE USED
4198 ;                AS THE 'OFF' AND 'ON' PULSES FOR THE FIRST 8 RELAYS. DIGOUT
4199 ;                12 (0) AND 13 (1) ARE USED LIKEWISE FOR THE SECOND 8 RELAYS.
4200 ;
4201 ;
4202 ;                THE CIM MODULE CONNECTS TO THE 540 THROUGH RELAY INTERFACE 1
4203 ;                VIA RIBBON CABLE. THE SIGNAL DEFINITION AT THAT INTERFACE FOLLOW:
4204 ;                540 OFF.         START STOP 1     START STOP 2
4205 ;                  DIGOUT1            U1
4206 ;                  DIGOUT2            U2
4207 ;                  DIGOUT3            U3
4208 ;                  DIGOUT4            U4
4209 ;                  DIGOUT5            U5
4210 ;                  DIGOUT6            U6
4211 ;                  DIGOUT7            U7
4212 ;                  DIGOUT8            U8
4213 ;                  DIGOUT9                              U1
4214 ;                  DIGOUT10                             U2
4215 ;                  DIGOUT11                             U3
4216 ;                  DIGOUT12                             U4
4217 ;                  DIGOUT13    RELAY 9-16 TUR           U5
4218 ;                  DIGOUT14    RELAY 9-16 TLR           U6
4219 ;                  DIGOUT15    RELAY 1-8 TUR            U7
4220 ;                  DIGOUT16    RELAY 1-8 TLR            U8
4221 ;
4222 ;
4223 ;                THE RELAYS ARE PULSED ONE AT A TIME BY TURNING ON THE 'U' DRIVER
4224 ;                HIGH AND TURNING ON THE APPROPRIATE LATCH 'TLR' OR UNLATCH 'TUR'
4225 ;                DRIVER LOW. NOTE THAT NO MORE THAN 2 RELAYS MAY BE PULSED AT THE
4226 ;                SAME TIME. THE PULSE PERIOD TO TURN ON (OFF) THE RELAYS IS 150 MS.
4227 ;
4228 ;2. CALL AND RETURN
4229 ;    INPUTS
4230 ;                BIT 7 OF R3=COMMAND, A=ACTION MASK (0011=ID=)
4231 ;    OUTPUTS
4232 ;                COMMAND INITIATED
4233 ;    RETURN
4234 ;3. CALLED ROUTINES
4235 ;--REGRLY
4236 ;    INPUTS
4237 ;                A=ACTION MASK (0101010=)
4238 ;    OUTPUTS
4239 ;                OUTPUT TURNED ON(OFF)
4240 ;--PULSE
4241 ;    INPUTS
4242 ;                R1=PTR TO DELAY AND ACTION
4243 ;    OUTPUTS
4244 ;                ACTION AND DELAY SCHEDULED
4245 ;--CIMSS
4246 ;    INPUTS
4247 ;                R2=COMMAND
4248 ;    OUTPUTS
4249 ;                DRIVER TURNED ON, DELAY SET FOR PULSE
4250 ;4. EQUATES
)0AF      4251 COM1A    EQU   10101111B        ;DRIVER 15 LOW (ON FOR RELAYS 1-8)
)0AD      4252 COM916   EQU   10101101B        ;DRIVER 13 LOW (ON FOR RELAYS 9-16)
)00F      4253 COMTIM   EQU   0FH              ;TIMER FOR PULSED LINES
          4254 ;********************************************************************
          4255 ;
          4256 ;
)8E4 AC   4257 CIM:     MOV   R4,A             ;SAVE COMMAND
)8E5 72EB 4258          JB3   CIM1             ;IF 1-8 THEN
)8E7 8AAF 4259          MOV   R2,#COM18        ; GET 1-8 COMMAND
)8E9 64E0 4260          JMP   CIM2             ;ELSE
)8EB 8AAD 4261 CIM1:    MOV   R2,#COM916       ; GET 9-16 COMMAND
)8ED FB   4262 CIM2:    MOV   A,R3             ;ENDIF
)8EE F2F1 4263          JB7   CIM3             ;IF '0' COMMAND THEN
)8F0 CA   4264          DEC   R2               ; DECREMENT 'COM'
          4265 ;                                ENDIF
)8F1 74FC 4266 CIM3:    CALL  CIMR             ;TURN ON COMMAND DRIVER
)8F3 FC   4267          MOV   A,R4
)8F4 4340 4268          ORL   A,#01000000B     ;GET RELAY NUMBER
)8F6 5367 4269          ANL   A,#01100111B
)8F8 AA   4270          MOV   R2,A
)8F9 74FC 4271          CALL  CIMR             ;TURN ON RELAY DRIVER
)8FB 93   4272          RETR
          4273 SEJECT
          4274 ;1. TITLE
          4275 ;       CIMR
          4276 ;2. CALL AND RETURN
          4277 ;    INPUTS
          4278 ;                R2=COMMAND
          4279 ;    OUTPUTS
          4280 ;                DRIVER TURNED ON, DELAY SET FOR PULSE
          4281 ;    RETURN
          4282 ;3. CALLED ROUTINES
          4283 ;4. EQUATES
          4284 ;********************************************************************
          4285 ;
          4286 ;
)8FC E5   4287 CIMR:    SEL   MB0
)8FD B93A 4288          MOV   R1,#DIGITL+2     ;GET COMMAND SET
)8FF FA   4289          MOV   A,R2
)C00 A1   4290          MOV   @R1,A
)C01 C9   4291          DEC   R1
)C02 230F 4292          MOV   A,#COMTIM        ;GET TIMEOUT SET
)C04 A1   4293          MOV   @R1,A
)C05 8452 4294          CALL  PULSE            ;SET TIMEOUT
)C07 FA   4295          MOV   A,R2
)C08 846F 4296          CALL  REGRLY           ;TURN ON OUTPUT
)C0A 2380 4297          MOV   A,#XRAM          ;GET RAM PORT OPEN
```

```
)C0C 34          4298          OUTL    P2,A
)C0D F5          4299          SEL     MH1
)C0E 93          4300          RETR
                 4301 $EJECT
                 4302 ;1. TITLE
                 4303 ;        COMMAND--COMMAND AND CONTROL OF FS MODULES.
                 4304 ;2. CALL AND RETURN
                 4305 ;     INPUTS
                 4306 ;             R4=COMMAND AND ADDRESS
                 4307 ;     OUTPUTS
                 4308 ;             COMMAND ISSUED
                 4309 ;     RETURN
                 4310 ;3. CALLED ROUTINES
                 4311 ;--OFF
                 4312 ;     INPUTS
                 4313 ;             A=RELAY BANK
                 4314 ;     OUTPUTS
                 4315 ;             ALL DRIVERS OFF
                 4316 ;
                 4317 ;4. EQUATES.
                 4318 ;**********************************************************
                 4319 ;
                 4320 ;
)C0F 2380        4321 COMAND: MOV    A,#RLYB0            ; TURN DRIVERS OFF
)C11 E5          4322         SEL    MH0
)C12 F40A        4323         CALL   OFF
)C14 F5          4324         SEL    MH1
)C15 FC          4325 COMAN1: MOV    A,R4                ; SET COMMAND AND ADDRESS
0C16 37          4326         CPL    A
0C17 3E          4327         MOVD   P6,A
0C18 47          4328         SWAP   A
0C19 3F          4329         MOVD   P7,A
0C1A 93          4330         RETR
                 4331 $EJECT
0C1B 53E0        4332 BASEED: ANL    A,#0F0H  ;IS RRR TYPE=0?
0C1D C624        4333         JZ     BASEEE
0C1F 8903        4334         MOV    R1,#PORTC
0C21 F0          4335         MOV    A,@R0
0C22 040F        4336         JMP    BASEEF              ;PATCHED 6-19-80
0C24 93          4337 BASEEE: RETR
                 4338 ;1. TITLE
                 4339 ;        START--INITIALIZE AFTER HARDWARE RESET
                 4340 ;2. CALL AND RETURN
                 4341 ;     INPUTS
                 4342 ;     OUTPUTS
                 4343 ;             RAM CLEARED, DIRECTORIES SET UP, AND I/O SET UP, CLOCKS
                 4344 ;             RUNNING AND INTERRUPTS ENABLED
                 4345 ;     RETURN
                 4346 ;3. CALLED ROUTINES
                 4347 ;4. EQUATES
003F             4348 MEMLEN  EQU    03FH                ;LENGTH OF MEMORY (INTERNAL)
00FF             4349 TIMEL   EQU    0FFH                ;LOW BYTE OF TIME SET
007F             4350 TIMEH   EQU    07FH                ;HIGH BYTE OF TIME SET
0008             4351 ADEN    EQU    00001000B           ;ENABLE A/D ROUTINE
                 4352 ;**********************************************************
                 4353 ;
                 4354 ;
0C25 75          4355 START:  ENT0   CLK                 ;START CLOCK
0C26 2380        4356         MOV    A,#XRAM             ;OPEN RAM PORT
0C28 3A          4357         OUTL   P2,A
0C29 B800        4358         MOV    R0,#0
0C2B 27          4359         CLR    A
0C2C D7          4360         MOV    PSW,A               ;CLEAR STATUS AND STACK
0C2D 90          4361 MEMCLR: MOVX   @R0,A               ;CLEAR EXTERNAL MEMORY
0C2E E82D        4362         DJNZ   R0,MEMCLR
0C30 C5          4363         SEL    RB0
0C31 B83E        4364         MOV    R0,#MEMLEN-1        ;CLEAR INTERNAL MEMORY
0C33 B901        4365         MOV    R1,#1
0C35 19          4366 INTCLR: INC    R1
0C36 A1          4367         MOV    @R1,A
0C37 EA35        4368         DJNZ   R0,INTCLR
0C39 238B        4369         MOV    A,#ANACP            ;OPEN ANALOG CONTROL PORT
0C3B 3A          4370         OUTL   P2,A
0C3C B800        4371         MOV    R0,#ANACS           ;PRESET I/O TO INPUTS
0C3E 27          4372         CLR    A
0C3F 90          4373         MOVX   @R0,A
0C40 B920        4374         MOV    R1,#ADDRES          ;GET ADDRESS PTR
0C42 BA02        4375         MOV    R0,#PORTB           ;GET ADDRESS HARDWARE INPUT
0C44 80          4376         MOVX   A,@R0               ;GET ADDRESS
0C45 A1          4377         MOV    @R1,A
0C46 B805        4378         MOV    R0,#TIMERH          ;SET UP 60 HZ TIMER
0C48 237F        4379         MOV    A,#TIMEH
0C4A 90          4380         MOVX   @R0,A
0C4B BA04        4381         MOV    R0,#TIMERL
0C4D 23FF        4382         MOV    A,#TIMEL
0C4F 90          4383         MOVX   @R0,A
0C50 B800        4384         MOV    R0,#ANACS           ;SET UP ANALOG CONTROL PORT
0C52 23CF        4385         MOV    A,#10DEF
0C54 90          4386         MOVX   @R0,A
0C55 9469        4387         CALL   UARTST   ; SET UP USART.
0C57 B40B        4388         CALL   DIR                 ;SET UP DIRECTORIES
0C59 E5          4389         SEL    MR0
0C5A 23B0        4390         MOV    A,#RLYB0            ;OPEN RELAY BANK 0
0C5C F40A        4391         CALL   OFF                 ;TURN ON OUTPUTS LOW
0C5E 23A0        4392         MOV    A,#RLYB1            ;OPEN RELAY BANK 1
0C60 F40A        4393         CALL   OFF                 ;TURN ON OUTPUTS LOW
0C62 05          4394         EN     I                   ;ENABLE INTERRUPTS
0C63 840F        4395         JMP    EXEC
                 4396 ;
                 4397 $EJECT
```

```
                    4398 ;1. TITLE
                    4399 ;      UARTST--START UART AND SET UP FOR OPERATION
                    4400 ;2. CALL AND RETURN
                    4401 ;      INPUTS
                    4402 ;      OUTPUTS
                    4403 ;           UART RESET, BIT RATE SET
                    4404 ;      RETURN
                    4405 ;3. CALLED ROUTINES
                    4406 ;4. EQUATES
0C65 50             4407 LINET: DB    01010000B              ;RS422 (A) , RS422 (B)
0C66 FA             4408        DB    11111010B              ;RS232 (A) , RS232 SEC (B)
0C67 00             4409        DB    00000000B              ;RS422 (A) ON SECONDARY REPEAT ONLY
0C68 0A             4410        DB    00001010B              ;RS232 (A) , RS422 (B)--REPEATER
                    4411 ;****************************************************************
                    4412 ;
                    4413 ;
0C69 2390           4414 UARTST: MOV   A,#UART               ;OPEN UART PORT
0C6B 3A             4415        OUTL  P2,A
0C6C B901           4416        MOV   R1,#UARTCS             ;OPEN UART CONTROL/STATUS REG
0C6E 27             4417        CLR   A                      ;CLEAR RESET CONDITION
0C6F 91             4418        MOVX  @R1,A
0C70 91             4419        MOVX  @R1,A
0C71 91             4420        MOVX  @R1,A
0C72 2340           4421        MOV   A,#IR                  ;RESET UART
0C74 91             4422        MOVX  @R1,A
0C75 B820           4423        MOV   R0,#ADDRES             ;GET ADDRES PTR
0C77 F0             4424        MOV   A,@R0
0C78 BB24           4425        MOV   R0,#LINE               ;GET LINE PTR
0C7A 5303           4426        ANL   A,#3
0C7C AA             4427        MOV   R2,A
0C7D 0365           4428        ADD   A,#(LINET MOD 256)
0C7F A3             4429        MOVP  A,@A
0C80 A0             4430        MOV   @R0,A
0C81 FA             4431        MOV   A,R2
0C82 9688           4432        JNZ   LOWSP                  ;IF RS422 ONLY THEN
0C84 235E           4433        MOV   A,#TF96                ;   FORMAT UART (9600 BPS)
0C86 91             4434        MOVX  @R1,A
0C87 93             4435        RETR                         ;  422 LINE PRESET TO A (EQUALS 0)
0C88 235F           4436 LOWSP: MOV   A,#TF12                ;ELSE
                    4437 ;                                         FORMAT UART (1200 BPS)
0C8A 91             4438        MOVX  @R1,A
0C8B 93             4439        RETR
                    4440 ;                                   ENDIF
                    4441 SEJECT
                    4442 ;     REV. OCT.12,80,REC LOGIC PATCH
                    4443 ;******************************************
                    4444 ;     CHECK FOR VALID GROUP ADDRESS AND VALID LENGTH IN THE
                    4445 ;     MESSAGE RECIEVED BY THE 540. IF ADDRESS IS OUT OF RANGE,
                    4446 ;     GREATER THAN 8 , OR LENGTH GREATER THAN 70 GO TO ERRSET
                    4447 ;     LOGIC.
                    4448 ;
0C8C 1F             4449 RDATAF: INC  R7                     ; INCR WORD COUNT OT RCTR
0C8D FF             4450        MOV   A,R7                   ;IS RCTR=1?
0C8E 0301           4451        XRL   A,#1
0C90 C69C           4452        JZ    RCT1                   ;YES
0C92 FF             4453        MOV   A,R7                   ;IS RCTR=2?
0C93 0302           4454        XRL   A,#2
0C95 C6AA           4455        JZ    RCT2                   ;YES.
0C97 2380           4456 RDATAG: MOV  A,#XRAM                ;NO . GO TO NORMAL REC. PROCESS
0C99 E5             4457        SEL   MB0                    ; SELECT MB0
0C9A 446C           4458        JMP   RDATAH
0C9C FC             4459 RCT1:  MOV   A,R4                   ;BYTE RECD IN R4.CHECK GROUP ADDR.
0C9D 77             4460        RR    A
0C9E 77             4461        RR    A                      ;TO LINE UP GROUP ADDR. TO B0
0C9F 77             4462        RR    A
0CA0 531F           4463        ANL   A,#1FH                 ;EXAM. LOWER 5 BITS ONLY
0CA2 00             4464        NOP
0CA3 03F6           4465        ADD   A,#0F6H                ;GROUP ADR >8?
0CA5 E697           4466        JNC   RDATAG                 ;NO.
0CA7 E5             4467 RCTEX: SEL  MB0                     ;YES. SET ERROR LOGIC
0CA8 4441           4468        JMP   ERRSET
                    4469 ;
0CAA FD             4470 RCT2:  MOV   A,R5                   ;IS  LONG MSG BEING RECD?
0CAB 37             4471        CPL   A                      ;LONG MSG FLAG SET?
0CAC F297           4472        JB7   RDATAG                 ;NO.SHORT MSG . EXIT
0CAE 23B9           4473        MOV   A,#0B9H                ; LENGTH >70?
0CB0 6C             4474        ADD   A,R4                   ;R4 HAS THE BYTE RECD. LAST
0CB1 E697           4475        JNC   RDATAG                 ;VALID LENGTH.PROCESS NORMALLY
0CB3 E5             4476        SEL   MB0
0CB4 44A7           4477        JMP   ERRSET
                    4478 ;
                    4479 SEJECT
                    4480 ;
                    4481 ;1. TITLE
                    4482 ;      FSCTL--CONTROL FS MODULE INTERFACE
                    4483 ;2. CALL AND RETURN
                    4484 ;      INPUTS
                    4485 ;           R2=COMMAND
                    4486 ;      OUTPUTS
                    4487 ;           COMMAND ISSUED ON DIGITAL OUTPUTS
                    4488 ;      RETURN
                    4489 ;3. CALLED ROUTINES
                    4490 ;4. EQUATES
                    4491 ;****************************************************************
                    4492 ;
                    4493 ;
0CB6 23A0           4494 FSCTL: MOV   A,#RLYB1               ;OPEN CONTROL DRIVER BANK
0CB8 3A             4495        OUTL  P2,A
0CB9 27             4496        CLR   A
0CBA 3C             4497        MOVD  P4,A
0CBB 3E             4498        MOVD  P6,A                   ;BE SURE HIGH DRIVERS ARE OFF AND
                    4499 ;                                   ;PROVIDE TIMING DELAYS.
```

```
OCBC FA        4500           MOV      A,R2
OCBD 3E        4501           MOVD     P6,A                    ;ISSUE COMMAND
OCBE 93        4502           RETR
               4503 $EJECT
               4504 ;
               4505 ;1.  TITLE:
               4506 ;           FSROTD--ROTATE FS20 DATA INTO ASCENDING ORDER
               4507 ;           ***** ROUTINE ADDED TO 1/6/81 ASSEMBLY *****
               4508 ;
               4509 ;2.  CALL AND RETURN:
               4510 ;           INPUT:  R1= T/A 4, T/A 3, T/A 2, T/A 1
               4511 ;           OUTPUT: R2= T/A 1, T/A 2, T/A 3, T/A 4
               4512 ;           RETURN
               4513 ;3.  CALLED ROUTINES:
               4514 ;                   NONE
               4515 ;
               4516 ;4.  EQUATES:
               4517 ;***************************************************************)
               4518 ;
OCBF F9        4519 FSROTD:   MOV      A,R1                    ;R1= 4-3-2-1
OCC0 53C0      4520           ANL      A,#0C0H
OCC2 E7        4521           RL       A
OCC3 E7        4522           RL       A
OCC4 AA        4523           MOV      R2,A                    ;R2= 0-0-0-4
OCC5 F9        4524           MOV      A,R1
OCC6 5330      4525           ANL      A,#030H
OCC8 77        4526           RR       A
OCC9 77        4527           RR       A
OCCA 4A        4528           ORL      A,R2
OCCB AA        4529           MOV      R2,A                    ;R2= 0-0-3-4
OCCC F9        4530           MOV      A,R1
OCCD 530C      4531           ANL      A,#0CH
OCCF E7        4532           RL       A
OCD0 E7        4533           RL       A
OCD1 4A        4534           ORL      A,R2
OCD2 AA        4535           MOV      R2,A                    ;R2= 0-2-3-4
OCD3 F9        4536           MOV      A,R1
OCD4 5503      4537           ANL      A,#03H
OCD6 77        4538           RR       A
OCD7 77        4539           RR       A
OCD8 4A        4540           ORL      A,R2
OCD9 AA        4541           MOV      R2,A                    ;R2= 1-2-3-4
OCDA 93        4542           RETR
               4543 $EJECT
               4544 ;
               4545 ;           FILL-IN CODE
               4546 ;
OCDB FF        4547           DB       0FFH,0FFH,0FFH,0FFH,0FFH,0FFH,0FFH,0FFH ; CFOH-CFFH
OCDC FF
OCDD FF
OCDE FF
OCDF FF
OCE0 FF
OCE1 FF
OCE2 FF
OCE3 FF        4548           DB       0FFH,0FFH,0FFH,0FFH,0FFH,0FFH,0FFH,0FFH
OCE4 FF
OCE5 FF
OCE6 FF
OCE7 FF
OCE8 FF
OCE9 FF
OCEA FF
OCEB FF        4549           DB       0FFH,0FFH,0FFH,0FFH,0FFH,0FFH,0FFH,0FFH
OCEC FF
OCED FF
OCEE FF
OCEF FF
OCF0 FF
OCF1 FF
OCF2 FF
OCF3 FF        4550           DB       0FFH,0FFH,0FFH,0FFH,0FFH,0FFH,0FFH,0FFH
OCF4 FF
OCF5 FF
OCF6 FF
OCF7 FF
OCF8 FF
OCF9 FF
OCFA FF
OCFB FF        4551           DB       0FFH,0FFH,0FFH,0FFH,0FFH,0FFH,0FFH,0FFH
OCFC FF
OCFD FF
OCFE FF
OCFF FF
0D00 FF
0D01 FF
0D02 FF
               4552 ;
               4553 $EJECT
               4554 ;
0D00           4555           ORG      0D00H
               4556 ;
               4557 ;1.  TITLE
               4558 ;           DIR--SET FILE DIRECTORIES
               4559 ;2.  CALL AND RETURN
               4560 ;           INPUTS
               4561 ;           OUTPUTS
               4562 ;                   FILE DIRECTORIES SET UP INCLUDING ANAPT, DIGPT
               4563 ;           RETURN
               4564 ;3.  CALLED ROUTINES
               4565 ;--DATA
               4566 ;           INPUT
```

```
                    4567 ;           A=PTR TO BYTE, R3=QUADRANT, RAM OPEN, USES R0
                    4568 ;    OUTPUT
                    4569 ;           R4=DATA BYTE
                    4570 ;4. EQUATES
0003                4571 MQUAD  EQU   3                    ;MAXIMUM NUMBER OF QUADRANTS
0000                4572 QUADST EQU   0                    ;BEGINING ADDRESS OF DATA FILES
0000 24             4573 XDIR:  DB    DIR0-0000H           ;ANALOG
0001 28             4574        DB    DIR1-0000H           ;THRESHOLD
0002 2E             4575        DB    DIR2-0000H           ;ANALOG TABLE
0003 70             4576        DB    DIR3-0000H           ;SPARE
0004 38             4577        DB    DIR4-0000H           ;DIGITAL OUTPUT
0005 3E             4578        DB    DIR5-0000H           ;DIGITAL INPUT
0006 44             4579        DB    DIR6-0000H           ;TOTALIZER
0007 62             4580        DB    DIR7-0000H           ;RUN TIME
                    4581 ;************************************************************
                    4582 ;
0008 BA0B           4583 DIR:   MOV   R2,#8                ;GET BYTE STARTING ADDRESS
000A BB00           4584        MOV   R3,#QUADST           ;GET STARTING QUADRANT
000C FA             4585 DIRLP: MOV   A,R2                 ;DOWHILE MEMORY AREA
000D E5             4586        SEL   MB0
000E 14CD           4587        CALL  DATA                 ; GET DATA
0010 F5             4588        SEL   MB1
0011 FC             4589        MOV   A,R4                 ; GET BYTE
0012 C670           4590        JZ    DIR8                 ; CASE BYTE OF
0014 37             4591        CPL   A                    ;   0:          NULL
0015 C67E           4592        JZ    DIRE                 ;   FF:         END OF DATA FILE
0017 37             4593        CPL   A                    ;   OTHER:
0018 07             4594        DEC   A
0019 531F           4595        ANL   A,#01FH
001B A9             4596        MOV   R1,A
001C FC             4597        MOV   A,R4
001D 47             4598        SWAP  A
001E 77             4599        RR    A
001F 5307           4600        ANL   A,#7
0021 0300           4601        ADD   A,#XDIR AND 0FFH
0023 B3             4602        JMPP  @A
                    4603 ;
0024 B848           4604 DIR0:  MOV   R0,#TMPLT            ;        XXX=0:  ANALOG
0026 442A           4605        JMP   DIR1A
0028 B849           4606 DIR1:  MOV   R0,#TMPLT+1          ;        XXX=1:  THRESHOLD
002A 2380           4607 DIR1A: MOV   A,#ANAPT
002C A466           4608        JMP   DIRL
002E B8FC           4609 DIR2:  MOV   R0,#DUMMY            ;        XXX=2:  ANALOG TABLE
0030 231A           4610        MOV   A,#24                ;                ALLOW 32 LOCATIONS
0032 6A             4611        ADD   A,R2
0033 AA             4612        MOV   R2,A
0034 23F7           4613        MOV   A,#TABLED
0036 A466           4614        JMP   DIRL
0038 BB49           4615 DIR4:  MOV   R0,#TMPLT+1          ;        XXX=4:  DIGITAL
003A 2590           4616        MOV   A,#DIGPT
003C A466           4617        JMP   DIRL
003E B8FC           4618 DIR5:  MOV   R0,#DUMMY            ;        XXX=5:  DIGITAL INPUT
0040 23FB           4619        MOV   A,#DIGMSK
0042 A466           4620        JMP   DIRL
0044 B8FC           4621 DIR6:  MOV   R0,#DUMMY            ;        XXX=6:  TOTALIZER
0046 F9             4622 DIR6A: MOV   A,R1                 ;                GET TOTALIZER ID
0047 AC             4623        MOV   R4,A
0048 E7             4624        RL    A
0049 034B           4625        ADD   A,#ANAST+1
004B A9             4626        MOV   R1,A
004C 235F           4627        MOV   A,#95               ;        INITIALIZE VALUE TO 95
004E 91             4628        MOVX  @R1,A
004F 1C             4629        INC   R4
0050 2301           4630        MOV   A,#1
0052 77             4631 DIR6B: RR    A
0053 EC52           4632        DJNZ  R4,DIR6B
0055 B9F4           4633        MOV   R1,#TOTASS          ;        UPDATE ASSIGNMENT
0057 AC             4634        MOV   R4,A
0058 81             4635        MOVX  A,@R1
0059 4C             4636        ORL   A,R4
005A 91             4637        MOVX  @R1,A
005B 80             4638        MOVX  A,@R0
005C 4C             4639        ORL   A,R4
005D 90             4640        MOVX  @R0,A
005E B848           4641        MOV   R0,#TMPLT
0060 A46D           4642        JMP   DIRLA
0062 BAF5           4643 DIR7:  MOV   R0,#TOTRUN          ;        XXX=7   RUN TIME
0064 A446           4644        JMP   DIR6A
0066 69             4645 DIRL:  ADD   A,R1
0067 A9             4646        MOV   R1,A                ;                GET PTR
0068 FA             4647        MOV   A,R2
0069 53F8           4648        ANL   A,#0F8H             ;                STORE LOCATION
006B 4B             4649        ORL   A,R3
006C 91             4650        MOVX  @R1,A
006D 80             4651 DIRLA: MOVX  A,@R0               ;                INCREMENT TEMPLATE
006E 17             4652        INC   A
006F 90             4653        MOVX  @R0,A
                    4654 ;                                         ENDCASE
0070 2308           4655 DIR8:  MOV   A,#8                ;        GET NEXT LOCATION
0072 6A             4656        ADD   A,R2
0073 AA             4657        MOV   R2,A
0074 967C           4658        JNZ   DIR3                ;        IF PAGE COMPLETE THEN
0076 1B             4659        INC   R3
0077 2303           4660        MOV   A,#MQUAD            ;                TEST DONE
0079 5B             4661        ANL   A,R3
007A C67E           4662        JZ    DIRE                ;        ENDIF
007C A40C           4663 DIR3:  JMP   DIRLP               ;ENDWHILE
007F BA09           4664 DIRE:  MOV   R0,#TMPLT+1         ;GET DIGITAL TEMPLATE
0080 80             4665        MOVX  A,@R0
0081 040C           4666        ADD   A,#12               ;ADD DIGITAL INPUTS
0083 90             4667        MOVX  @R0,A
```

```
                         4668 ;                              ;NOW CHECK FOR FS20 IDS.
                         4669 ;
0084 8920                4670        MOV     R1,#ADDRES
0086 F1                  4671        MOV     A,@R1
0087 52AB                4672        JB2     DIRFS             ;FS20 ENABLED? YES, ADD IDS
0089 A44C                4673        JMP     DIRQ              ;NO, EXIT NORMALLY.
008B B9FB                4674 DIRFS: MOV     R1,#DIGMSK        ;GET POINTER TO DIGITAL INPUT FILE.
008D 81                  4675        MOVX    A,@R1             ;A = AAAAADQQ
008E AA                  4676        MOV     R2,A
008F 5307                4677        ANL     A,#07H
0091 AB                  4678        MOV     R3,A              ;R3= 00000QQQ = QUADRANT
0092 FA                  4679        MOV     A,R2
0093 53F8                4680        ANL     A,#0F8H
0095 0305                4681        ADD     A,#05H
0097 AA                  4682        MOV     R2,A              ;R2= ADDRESS OF FS20 MASK
0098 E5                  4683        SEL     MB0
0099 14CD                4684        CALL    DATA
009B F5                  4685        SEL     MB1
009C FC                  4686        MOV     A,R4              ;R4= NNNQDDDD
009D 53E0                4687        ANL     A,#0E0H
009F E7                  4688        RL      A
00A0 E7                  4689        RL      A
00A1 E7                  4690        RL      A
00A2 0301                4691        ADD     A,#01H             ;A = ACTUAL NUMBER OF FS MODULES (1-8)
00A4 E7                  4692        RL      A
00A5 E7                  4693        RL      A                 ;MULTIPLY #PANELS BY 4 IDS PER PANEL
00A6 AA                  4694        MOV     R2,A
00A7 B849                4695        MOV     R0,#TMPLT+1
00A9 F0                  4696        MOV     A,@R0
00AA 6A                  4697        ADD     A,R2              ;ADD FS20 IDS TO OTHER IDS
00AB 90                  4698        MOVX    @R0,A
00AC 93                  4699 DIRQ:  RETR
                         4700 ;
                         4701 $EJECT
                         4702 ;
                         4703 ;              FILL-IN CODE
                         4704 ;
0DAD FF                  4705        DB      0FFH,0FFH,0FFH                              ; DADH-DAFH
0DAE FF
0DAF FF
0DB0 FF                  4706        DB      0FFH,0FFH,0FFH,0FFH,0FFH,0FFH,0FFH,0FFH  ; DB0H-DB8H
0DB1 FF
0DB2 FF
0DB3 FF
0DB4 FF
0DB5 FF
0DB6 FF
0DB7 FF
0DB8 FF                  4707        DB      0FFH,0FFH,0FFH,0FFH,0FFH,0FFH,0FFH,0FFH
0DB9 FF
0DBA FF
0DBB FF
0DBC FF
0DBD FF
0DBE FF
0DBF FF
0DC0 FF                  4708        DB      0FFH,0FFH,0FFH,0FFH,0FFH,0FFH,0FFH,0FFH  ; DC0H-DCFH
0DC1 FF
0DC2 FF
0DC3 FF
0DC4 FF
0DC5 FF
0DC6 FF
0DC7 FF
0DC8 FF                  4709        DB      0FFH,0FFH,0FFH,0FFH,0FFH,0FFH,0FFH,0FFH
0DC9 FF
0DCA FF
0DCB FF
0DCC FF
0DCD FF
0DCE FF
0DCF FF
0DD0 FF                  4710        DB      0FFH,0FFH,0FFH,0FFH,0FFH,0FFH,0FFH,0FFH  ; DD0H-DDFH
0DD1 FF
0DD2 FF
0DD3 FF
0DD4 FF
0DD5 FF
0DD6 FF
0DD7 FF
0DD8 FF                  4711        DB      0FFH,0FFH,0FFH,0FFH,0FFH,0FFH,0FFH,0FFH
0DD9 FF
0DDA FF
0DDB FF
0DDC FF
0DDD FF
0DDE FF
0DDF FF
0DE0 FF                  4712        DB      0FFH,0FFH,0FFH,0FFH,0FFH,0FFH,0FFH,0FFH  ; DE0H-DEFH
0DE1 FF
0DE2 FF
0DE3 FF
0DE4 FF
0DE5 FF
0DE6 FF
0DE7 FF
0DE8 FF                  4713        DB      0FFH,0FFH,0FFH,0FFH,0FFH,0FFH,0FFH,0FFH
0DE9 FF
0DEA FF
0DEB FF
0DEC FF
0DED FF
```

```
00EE FF
00EF FF
00F0 FF      4714        DB      0FFH,0FFH,0FFH,0FFH,0FFH,0FFH,0FFH,0FFH ; DF0H=0FFH
00F1 FF
00F2 FF
00F3 FF
00F4 FF
00F5 FF
00F6 FF
00F7 FF
00F8 FF      4715        DB      0FFH,0FFH,0FFH,0FFH,0FFH,0FFH,0FFH,0FFH
00F9 FF
00FA FF
00FB FF
00FC FF
00FD FF
00FE FF
00FF FF
             4716 $EJECT
             4717 ;
0E00         4718        ORG     0E00H
             4719 ;
             4720 ;1. TITLE
             4721 ;        DIG--DIGITAL INPUT HANDLER
             4722 ;2. CALL AND RETURN
             4723 ;        INPUTS
             4724 ;                DIGITAL I/O PORTS
             4725 ;        OUTPUTS
             4726 ;                DIGITAL VALUES IN 'DIGST' UPDATED
             4727 ;        RETURN
             4728 ;3. CALLED ROUTINES
             4729 ;--FILE3
             4730 ;        INPUT
             4731 ;                R0=PTR TO DATA FILE(PACKED), R1=DESTINATION PTR OF DATA FILE
             4732 ;        OUTPUT
             4733 ;                8 BYTES LOADED
             4734 ;--UPDATE
             4735 ;        INPUT
             4736 ;                A=INPUT PORT, R0=PTR TO BUFFER LOCATION
             4737 ;        OUTPUT
             4738 ;                DATA READ, SAVED, R0 INCREMENTED
             4739 ;--PACK
             4740 ;        INPUT
             4741 ;                4 SIX BIT INPUTS BUFFERED AT DIGITL+4 TO DIGITL+7
             4742 ;        OUTPUT
             4743 ;                3 EIGHT BIT BUFFERED WITH IDS ORDERED 1-24
             4744 ;--INVERT
             4745 ;        INPUTS
             4746 ;                3 EIGHT BIT INPUTS AT DIGITL+4, 3 EIGHT BIT NO/NC PROGRAM LINES
             4747 ;                AT DIGITL+1
             4748 ;        OUTPUTS
             4749 ;                NO/NC INVERSION DONE ON PER BIT BASIS
             4750 ;--COS
             4751 ;        INPUTS
             4752 ;                R2=COS MASK, R1=PTR TO CURRENT STATUS, A=NEW STATUS
             4753 ;        OUTPUTS
             4754 ;                STATUS UPDATED, COS BITS SET IF CHANGE
             4755 ;4. EQUATES
             4756 ;**********************************************************************
             4757 ;
             4758 ;
0E00 B8F8    4759 DIG:   MOV     R0,#DIGMSK              ;GET DIGITAL INPUT FILE
0E02 B93F    4760        MOV     R1,#DIGITL+7
0E04 E5      4761        SEL     MB0
0E05 F47C    4762        CALL    FILE3                   ;MOVE FILE INTO TEMP STORAGE
0E07 F5      4763        SEL     MB1
0E08 BA3C    4764        MOV     R0,#DIGITL+4            ;GET CURRENT STATUS
0E0A 8920    4765        MOV     R1,#ADDRES              ;IF FS20 OPERATION IS ENABLED,
0E0C F1      4766        MOV     A,@R1                   ;FORCE DI#1 TO DI#12 TO 0
0E0D 5211    4767        JB2     DIGFS
0E0F C419    4768        JMP     DIGNFS                  ;NO FS20, SCAN DI#1 - 24 AS NORMAL
0E11 B000    4769 DIGFS: MOV     @R0,#000H
0E13 18      4770        INC     R0
0E14 B000    4771        MOV     @R0,#000H
0E16 18      4772        INC     R0
0E17 C421    4773        JMP     DIGA
0E19 23C0    4774 DIGNFS:MOV     A,#DIGIN
0E1B 0444    4775        CALL    UPDATE                  ;GET DIGIN STATUS
0E1D 23D0    4776        MOV     A,#DIGIN1               ;GET DIGIN 1 STATUS.
0E1F 0444    4777        CALL    UPDATE
0E21 23E0    4778 DIGA:  MOV     A,#DIGIN2               ;GET DIGIN 2 STATUS
0E23 0444    4779        CALL    UPDATE
0E25 23F0    4780        MOV     A,#DIGIN3               ;GET DIGIN 3 STATUS
0E27 0444    4781        CALL    UPDATE
0E29 2380    4782        MOV     A,#XWAM                 ;OPEN RAM PORT
0E2B 3A      4783        OUTL    P2,A
0E2C 044A    4784        CALL    PACK                    ;PACK INPUTS AS IDS 1-24
0E2E 0469    4785        CALL    INVERT                  ;SET NO/NC STATUS
0E30 B9B2    4786        MOV     R1,#DIGST               ;GET DIGITAL STATUS PTR
0E32 BAB0    4787        MOV     R2,#0B0H                ;GET DIGITAL COS MARKER
0E34 BB03    4788        MOV     R3,#3
0E36 BC3C    4789        MOV     R4,#DIGITL+4            ;GET SOURCE PTR
0E38 FC      4790 DIGLP: MOV     A,R4                    ;DO WHILE MORE DIGITAL BYTES
0E39 A8      4791        MOV     R0,A                    ; GET PTR
0E3A F0      4792        MOV     A,@R0                   ; GET DATA
0E3B E5      4793        SEL     MB0
0E3C 04FD    4794        CALL    COS                     ; CHECK COS AND UPDATE
0E3E F5      4795        SEL     MB1
0E3F 19      4796        INC     R1                      ; INCREMENT PTR
0E40 1C      4797        INC     R4
0E41 EB38    4798        DJNZ    R3,DIGLP                ;ENDWHILE
0E43 93      4799        RETR
             4800 $EJECT
```

```
         4801 ;1. TITLE
         4802 ;     UPDATE
         4803 ;2. CALL AND RETURN
         4804 ;    INPUTS
         4805 ;        A=PORT NUM., R0=DESTINATION PTR
         4806 ;    OUTPUTS
         4807 ;        PORT READ AND DESTINATION UPDATED
         4808 ;    RETURN
         4809 ;3. CALLED ROUTINES
         4810 ;4. EQUATES
         4811 ;*********************************************************
         4812 ;
         4813 ;
0E44 3A  4814 UPDATE: OUTL   P2,A              ;OPEN PORT
0E45 09  4815         IN     A,P1              ;GET DATA
0E46 37  4816         CPL    A
0E47 A0  4817         MOV    @R0,A             ;STORE DATA
0E48 18  4818         INC    R0
0E49 93  4819         RETR
         4820 SEJECT
         4821 ;1. TITLE
         4822 ;     PACK
         4823 ;2. CALL AND RETURN
         4824 ;    INPUTS
         4825 ;        4 SIX BIT INPUTS BUFFERED AT DIGITL+4 TO DIGITL+7
         4826 ;    OUTPUTS
         4827 ;        3 EIGHT BIT OUTPUTS BUFFERED AT DIGITL+4 WITH IDS ORDERED AND
         4828 ;        INVERTED
         4829 ;3. CALLED ROUTINES
         4830 ;4. EQUATES
         4831 ;*********************************************************
         4832 ;
         4833 ;
0E4A B83C 4834 PACK:   MOV    R0,#DIGITL+4      ;GET INPUT PTR
0E4C B93C 4835         MOV    R1,#DIGITL+4      ;GET DESTINATION PTR
0E4E BA18 4836         MOV    R2,#24            ;GET ID COUNTER
0E50 BB06 4837         MOV    R3,#6             ;GET BIT COUNTER FOR INPUT
0E52 BC08 4838         MOV    R4,#8             ;GET BIT COUNTER FOR OUTPUT
0E54 27   4839         CLR    A
0E55 20   4840 PACKLP: XCH    A,@R0             ;DO FROM 1 TO 24
0E56 97   4841         CLR    C
0E57 67   4842         RRC    A                 ;  GET BITY
0E58 20   4843         XCH    A,@R0             ;  SAVE BIT
0E59 F7   4844         RLC    A
0E5A EB5F 4845         DJNZ   R3,PACK1          ;  DECREMENT INPUT COUNTER
0E5C BB06 4846         MOV    R3,#6             ;  RESET INPUT COUNTER
0E5E 18   4847         INC    R0                ;  INCREMENT INPUT PTR
0E5F EC66 4848 PACK1:  DJNZ   R4,PACK2          ;  DECREMENT OUTPUT COUNTER
0E61 BC08 4849         MOV    R4,#8             ;  RESET OUTPUT COUNTER
0E63 A1   4850         MOV    @R1,A             ;  SAVE PACKED RESULT
0E64 19   4851         INC    R1                ;  INCREMENT OUTPUT PTR
0E65 27   4852         CLR    A
0E66 EA55 4853 PACK2:  DJNZ   R2,PACKLP         ;ENDDO
0E68 93   4854         RETR
         4855 SEJECT
         4856 ;1. TITLE
         4857 ;     INVERT
         4858 ;     NOTES: IN THE DIGITAL INPUT DATA FILE, BYTES 1 TO 3 HAVE THE NORMALLY
         4859 ;            OPEN/ NORMALLY CLOSED STATUS PROGRAMMED.  AN ENTRY OF '1' IMPLIES
         4860 ;            THE INPUT IS NORMALLY OPEN, AND TO GET THE ABNORMAL '1' STATE THE
         4861 ;            INPUT MUST BE INVERTED.  AN ENTRY OF '0' IMPLIES THAT THE INPUT
         4862 ;            IS NORMALLY CLOSED (0) AND THE INPUT IS NOT INVERTED.
         4863 ;
         4864 ;
         4865 ;            THE BOOLEAN EQUATION HAS TWO INPUTS VARIABLES (INPUT) AND
         4866 ;            (INVERT) WHERE 'INVERT' IS THE PROGRAMMED INVERSION. THE
         4867 ;            EQUATION IS:
         4868 ;              RESULT=(NOT INVERT AND INPUT) OR (NOT INPUT AND INVERT)
         4869 ;
         4870 ;
         4871 ;            THE ABOVE EQUATION WILL PROCESS 8 DIGITAL INPUTS IN PARALLEL.
         4872 ;2. CALL AND RETURN
         4873 ;    INPUTS
         4874 ;        3 EIGHT BIT INPUTS AT DIGITL+4, 3 EIGHT BIT NO/NC PROGRAM LINES
         4875 ;        AT DIGITL+1
         4876 ;    OUTPUTS
         4877 ;        NO/NC INVERSIONS DONE ON PER BIT BASIS
         4878 ;    RETURN
         4879 ;3. CALLED ROUTINES
         4880 ;4. EQUATES
         4881 ;*********************************************************
         4882 ;
         4883 ;
0E69 BB03 4884 INVERT: MOV    R3,#3
0E6B B839 4885         MOV    R0,#DIGITL+1      ;GET 'INVERT' PTR
0E6D B93C 4886         MOV    R1,#DIGITL+4      ;GET 'INPUT' PTR
0E6F F1   4887 INVLP:  MOV    A,@R1             ;DO WHILE INPUTS
0E70 37   4888         CPL    A                 ;  GET INPUT
0E71 50   4889         ANL    A,@R0             ;  CALCULATE OUTPUT
0E72 AA   4890         MOV    R2,A
0E73 F0   4891         MOV    A,@R0
0E74 37   4892         CPL    A
0E75 51   4893         ANL    A,@R1
0E76 4A   4894         ORL    A,R2
0E77 A1   4895         MOV    @R1,A
0E78 18   4896         INC    R0
0E79 19   4897         INC    R1                ;  INCREMENT PTRS
0E7A EB6F 4898         DJNZ   R3,INVLP          ;ENDWHILE
0E7C 93   4899         RETR
         4900 SEJECT
```

```
0E7D FF        4901           DB      0FFH,0FFH,0FFH
0E7E FF
0E7F FF
               4902 ;1. TITLE
               4903 ;        COSFM--FORMAT CHANGE OF STATE
               4904 ;2. CALL AND RETURN
               4905 ;    INPUTS
               4906 ;            RAM OPEN
               4907 ;    OUTPUTS
               4908 ;            COS FORMATED INTO TRANSMISSION BUFFER
               4909 ;    RETURN
               4910 ;3. CALLED ROUTINES
               4911 ;4. EQUATES
               4912 ;**********************************************************
               4913 ;
0E80 B801      4914 COSFM:  MOV     R0,#MSG                 ;GET CONTROL BYTE PTR
0E82 80        4915         MOVX    A,@R0
0E83 1287      4916         JB0     COSFM0                  ;IF DEMAND THEN
0E85 C4A3      4917         JMP     COSFM3                  ; CE=UNCHANGED
               4918 ;                                        ENDIF
0E87 55FC      4919 COSFM0: ANL     A,#0FCH                 ;SET TYPE2 MESSAGE
0E89 4302      4920         ORL     A,#2
0E8B 90        4921         MOVX    @R0,A
0E8C B803      4922         MOV     R0,#EXT                 ;GET EXTENSION PTR
0E8E B929      4923         MOV     R1,#COSBUF              ;GET COS BUFFER PTR
0E90 F1        4924         MOV     A,@R1                   ;GET COS TYPE
0E91 97        4925         CLR     C
0E92 F7        4926         RLC     A
0E93 E69B      4927         JNC     COSFM1                  ;IF DIGITAL ONLY COS THEN
0E95 96A2      4928         JNZ     COSFM2
0E97 2309      4929         MOV     A,#9                    ; CE=9
0E99 C4A3      4930         JMP     COSFM3                  ;ELSE IF ANALOG ONLY COS THEN
0E9B F7        4931 COSFM1: RLC     A
0E9C E6A2      4932         JNC     COSFM2
0E9E 230A      4933         MOV     A,#10                   ; CE=10
0EA0 C4A3      4934         JMP     COSFM3                  ;ELSE
0EA2 27        4935 COSFM2: CLR     A                       ; CE=0
0EA3 90        4936 COSFM3: MOVX    @R0,A                   ;ENDIF
0EA4 27        4937         CLR     A
0EA5 B929      4938         MOV     R1,#COSBUF              ;GET COS BUFFER PTR
0EA7 A1        4939         MOV     @R1,A                   ;CLEAR COS BUFFER
0EA8 B803      4940         MOV     R3,#3                   ;PRESET LENGTH COUNT
0EAA B804      4941         MOV     R0,#INFO                ;GET INFO PTR
0EAC B948      4942         MOV     R1,#TMPLT               ;GET TEMPLATE PTR
0EAE 81        4943         MOVX    A,@R1                   ;GET COUNT OF ANALOG BYTES
0EAF 17        4944         INC     A
0EB0 E7        4945         RL      A
0EB1 AA        4946         MOV     R2,A
0EB2 E5        4947         SEL     MB0
0EB3 F41E      4948         CALL    MOVE                    ;MOVE BYTES INTO BUFFER
0EB5 F5        4949         SEL     MB1
               4950 ;**********************************************************
               4951 ;      THIS ROUTINE MODIFIED 1/16/81. PREVENT EXTRA BYTE AFTER LAST DIGITAL
               4952 ;      IN DATA STREAM TO 560
               4953 ;
0EB6 B949      4954         MOV     R1,#TMPLT+1             ;GET DIGITAL TEMPLATE (# DIGITALS)
0EB8 81        4955         MOVX    A,@R1
0EB9 12BF      4956         JB0     CINCR                   ;IF BITS 0 OR 1 SET, NEED EXTRA BYTE
0EBB 32BF      4957         JB1     CINCR                   ;FOR TRANSMISSION.
0EBD C4C1      4958         JMP     CNDINC                  ;IF MULTIPLE OF 4, DON'T NEED IT.
0EBF 0304      4959 CINCR:  ADD     A,#04H
0EC1 77        4960 CNDINC: RR      A
0EC2 77        4961         RR      A
0EC3 530F      4962         ANL     A,#0FH
0EC5 AA        4963         MOV     R2,A                    ;R2= # OF BITS REQUIRED FOR DIGITALS
0EC6 B982      4964         MOV     R1,#DIGST               ;GET DIGITAL BYTES
0EC8 E5        4965         SEL     MB0
0EC9 F41E      4966         CALL    MOVE
0ECB FB        4967         MOV     A,R3
0ECC 6467      4968         JMP     RECVE
               4969 ;
               4970 ;**********************************************************
0ECE FF        4971         DB      0FFH                    ; ECFH-EFFH
0ECF FF        4972         DB      0FFH,0FFH,0FFH,0FFH,0FFH,0FFH,0FFH,0FFH
0ED0 FF
0ED1 FF
0ED2 FF
0ED3 FF
0ED4 FF
0ED5 FF
0ED6 FF
0ED7 FF        4973         DB      0FFH,0FFH,0FFH,0FFH,0FFH,0FFH,0FFH,0FFH
0ED8 FF
0ED9 FF
0EDA FF
0EDB FF
0EDC FF
0EDD FF
0EDE FF
0EDF FF        4974         DB      0FFH,0FFH,0FFH,0FFH,0FFH,0FFH,0FFH,0FFH
0EE0 FF
0EE1 FF
0EE2 FF
0EE3 FF
0EE4 FF
0EE5 FF
0EE6 FF
0EE7 FF        4975         DB      0FFH,0FFH,0FFH,0FFH,0FFH,0FFH,0FFH,0FFH
0EE8 FF
0EE9 FF
0EEA FF
```

```
OEEB FF
OEEC FF
OEED FF
OEEE FF
OEEF FF      4976    DB      0FFH,0FFH,0FFH,0FFH,0FFH,0FFH,0FFH,0FFH
OEF0 FF
OEF1 FF
OEF2 FF
OEF3 FF
OEF4 FF
OEF5 FF
OEF6 FF
OEF7 FF      4977    DB      0FFH,0FFH,0FFH,0FFH,0FFH,0FFH,0FFH,0FFH
OEF8 FF
OEF9 FF
OEFA FF
OEFB FF
OEFC FF
OEFD FF
OEFE FF
OEFF FF      4978    DB      0FFH,0FFH,0FFH,0FFH,0FFH,0FFH,0FFH,0FFH ; F00H-F7FH
OF00 FF
OF01 FF
OF02 FF
OF03 FF
OF04 FF
OF05 FF
OF06 FF
OF07 FF      4979    DB      0FFH,0FFH,0FFH,0FFH,0FFH,0FFH,0FFH,0FFH
OF08 FF
OF09 FF
OF0A FF
OF0B FF
OF0C FF
OF0D FF
OF0E FF
OF0F FF      4980    DB      0FFH,0FFH,0FFH,0FFH,0FFH,0FFH,0FFH,0FFH
OF10 FF
OF11 FF
OF12 FF
OF13 FF
OF14 FF
OF15 FF
OF16 FF
OF17 FF      4981    DB      0FFH,0FFH,0FFH,0FFH,0FFH,0FFH,0FFH,0FFH
OF18 FF
OF19 FF
OF1A FF
OF1B FF
OF1C FF
OF1D FF
OF1E FF
OF1F FF      4982    DB      0FFH,0FFH,0FFH,0FFH,0FFH,0FFH,0FFH,0FFH
OF20 FF
OF21 FF
OF22 FF
OF23 FF
OF24 FF
OF25 FF
OF26 FF
OF27 FF      4983    DB      0FFH,0FFH,0FFH,0FFH,0FFH,0FFH,0FFH,0FFH
OF28 FF
OF29 FF
OF2A FF
OF2B FF
OF2C FF
OF2D FF
OF2E FF
OF2F FF      4984    DB      0FFH,0FFH,0FFH,0FFH,0FFH,0FFH,0FFH,0FFH
OF30 FF
OF31 FF
OF32 FF
OF33 FF
OF34 FF
OF35 FF
OF36 FF
OF37 FF      4985    DB      0FFH,0FFH,0FFH,0FFH,0FFH,0FFH,0FFH,0FFH
OF38 FF
OF39 FF
OF3A FF
OF3B FF
OF3C FF
OF3D FF
OF3E FF
OF3F FF      4986    DB      0FFH,0FFH,0FFH,0FFH,0FFH,0FFH,0FFH,0FFH
OF40 FF
OF41 FF
OF42 FF
OF43 FF
OF44 FF
OF45 FF
OF46 FF
OF47 FF      4987    DB      0FFH,0FFH,0FFH,0FFH,0FFH,0FFH,0FFH,0FFH
OF48 FF
OF49 FF
OF4A FF
OF4B FF
OF4C FF
OF4D FF
OF4E FF
OF4F FF      4988    DB      0FFH,0FFH,0FFH,0FFH,0FFH,0FFH,0FFH,0FFH
OF50 FF
```

```
0F51 FF
0F52 FF
0F53 FF
0F54 FF
0F55 FF
0F56 FF
0F57 FF      4989    DB      0FFH,0FFH,0FFH,0FFH,0FFH,0FFH,0FFH,0FFH
0F58 FF
0F59 FF
0F5A FF
0F5B FF
0F5C FF
0F5D FF
0F5E FF
0F5F FF      4990    DB      0FFH,0FFH,0FFH,0FFH,0FFH,0FFH,0FFH,0FFH
0F60 FF
0F61 FF
0F62 FF
0F63 FF
0F64 FF
0F65 FF
0F66 FF
0F67 FF      4991    DB      0FFH,0FFH,0FFH,0FFH,0FFH,0FFH,0FFH,0FFH
0F68 FF
0F69 FF
0F6A FF
0F6B FF
0F6C FF
0F6D FF
0F6E FF
0F6F FF      4992    DB      0FFH,0FFH,0FFH,0FFH,0FFH,0FFH,0FFH,0FFH
0F70 FF
0F71 FF
0F72 FF
0F73 FF
0F74 FF
0F75 FF
0F76 FF
0F77 FF      4993    DB      0FFH,0FFH,0FFH,0FFH,0FFH,0FFH,0FFH,0FFH
0F78 FF
0F79 FF
0F7A FF
0F7B FF
0F7C FF
0F7D FF
0F7E FF
0F7F FF      4994    DB      0FFH,0FFH,0FFH,0FFH,0FFH,0FFH,0FFH,0FFH ; F80H-FFFH
0F80 FF
0F81 FF
0F82 FF
0F83 FF
0F84 FF
0F85 FF
0F86 FF
0F87 FF      4995    DB      0FFH,0FFH,0FFH,0FFH,0FFH,0FFH,0FFH,0FFH
0F88 FF
0F89 FF
0F8A FF
0F8B FF
0F8C FF
0F8D FF
0F8E FF
0F8F FF      4996    DB      0FFH,0FFH,0FFH,0FFH,0FFH,0FFH,0FFH,0FFH
0F90 FF
0F91 FF
0F92 FF
0F93 FF
0F94 FF
0F95 FF
0F96 FF
0F97 FF      4997    DB      0FFH,0FFH,0FFH,0FFH,0FFH,0FFH,0FFH,0FFH
0F98 FF
0F99 FF
0F9A FF
0F9B FF
0F9C FF
0F9D FF
0F9E FF
0F9F FF      4998    DB      0FFH,0FFH,0FFH,0FFH,0FFH,0FFH,0FFH,0FFH
0FA0 FF
0FA1 FF
0FA2 FF
0FA3 FF
0FA4 FF
0FA5 FF
0FA6 FF
0FA7 FF      4999    DB      0FFH,0FFH,0FFH,0FFH,0FFH,0FFH,0FFH,0FFH
0FA8 FF
0FA9 FF
0FAA FF
0FAB FF
0FAC FF
0FAD FF
0FAE FF
0FAF FF      5000    DB      0FFH,0FFH,0FFH,0FFH,0FFH,0FFH,0FFH,0FFH
0FB0 FF
0FB1 FF
0FB2 FF
0FB3 FF
0FB4 FF
0FB5 FF
0FB6 FF
```

```
0FB7 FF         5001       DB      0FFH,0FFH,0FFH,0FFH,0FFH,0FFH,0FFH,0FFH
0FB8 FF
0FB9 FF
0FBA FF
0FBB FF
0FBC FF
0FBD FF
0FBE FF
0FBF FF         5002       DB      0FFH,0FFH,0FFH,0FFH,0FFH,0FFH,0FFH,0FFH
0FC0 FF
0FC1 FF
0FC2 FF
0FC3 FF
0FC4 FF
0FC5 FF
0FC6 FF
0FC7 FF         5003       DB      0FFH,0FFH,0FFH,0FFH,0FFH,0FFH,0FFH,0FFH
0FC8 FF
0FC9 FF
0FCA FF
0FCB FF
0FCC FF
0FCD FF
0FCE FF
0FCF FF         5004       DB      0FFH,0FFH,0FFH,0FFH,0FFH,0FFH,0FFH,0FFH
0FD0 FF
0FD1 FF
0FD2 FF
0FD3 FF
0FD4 FF
0FD5 FF
0FD6 FF
0FD7 FF         5005       DB      0FFH,0FFH,0FFH,0FFH,0FFH,0FFH,0FFH,0FFH
0FD8 FF
0FD9 FF
0FDA FF
0FDB FF
0FDC FF
0FDD FF
0FDE FF
0FDF FF         5006       DB      0FFH,0FFH,0FFH,0FFH,0FFH,0FFH,0FFH,0FFH
0FE0 FF
0FE1 FF
0FE2 FF
0FE3 FF
0FE4 FF
0FE5 FF
0FE6 FF
0FE7 FF         5007       DB      0FFH,0FFH,0FFH,0FFH,0FFH,0FFH,0FFH,0FFH
0FE8 FF
0FE9 FF
0FEA FF
0FEB FF
0FEC FF
0FED FF
0FEE FF
0FEF FF         5008       DB      0FFH,0FFH,0FFH,0FFH,0FFH,0FFH,0FFH,0FFH
0FF0 FF
0FF1 FF
0FF2 FF
0FF3 FF
0FF4 FF
0FF5 FF
0FF6 FF
0FF7 FF         5009       DB      0FFH,0FFH,0FFH,0FFH,0FFH,0FFH,0FFH,0FFH ; LAST OF FILL-IN CODE
0FF8 FF
0FF9 FF
0FFA FF
0FFB FF
0FFC FF
0FFD FF
0FFE FF
0FF0            5010       ORG     0FF0H  ; SO THAT CODE DOES NOT WRAP AROUND
                5011 ;
0FF0 FF         5012       DB      0FFH,0FFH,0FFH,0FFH,0FFH,0FFH,0FFH,0FFH
0FF1 FF
0FF2 FF
0FF3 FF
0FF4 FF
0FF5 FF
0FF6 FF
0FF7 FF
0FF8 FF         5013       DB      0FFH,0FFH,0FFH,0FFH,0FFH,0FFH,0FFH,0FFH
0FF9 FF
0FFA FF
0FFB FF
0FFC FF
0FFD FF
0FFE FF
0FFF FF
                5014 $EJECT
                5015       END
```

USER SYMBOLS
| | | | | | | | | | | | | | | |
|---|---|---|---|---|---|---|---|---|---|---|---|---|---|---|
| A0 | 0600 | AD1 | 0620 | ADCAL | 0101 | ADD16 | 0BC4 | ADDRES | 0020 | ADDX | 070E | ADDX1 | 0701 | ADDX2 | 07CC |
| ADDXA | 0083 | ADDXB | 00C9 | ADDXC | 00CB | ADDXE | 07D2 | ADE | 0A1B | ADEN | 000B | ADFNL | 0AD6 | ADTDL | 060A |
| ADMB1 | 0A10 | ADRP | 0A2E | ADRP1 | 0A3A | ADRP2 | 0A3E | ADRP3 | 0A45 | ADRP4 | 0A42 | ADRT0 | 0AAA | ADRT01 | 0AB2 |
| ADRT02 | 0ABA | ADRT03 | 0AC0 | ADTHR | 0A4A | ADTMP | 0014 | ADTMP1 | 0016 | ADV | 0A7E | ADV0 | 0AA5 | ADV1 | 0A9E |
| ADV10 | 0AA9 | ADV10A | 0ABE | ADV11 | 0A92 | ADV2 | 0AA4 | ADVE | 0A15 | ADVE1 | 0A1B | ADVEX | 0A11 | ALARM | 00B0 |
| ANACOS | 07B7 | ANACP | 00A6 | ANACS | 0000 | ANA1D | 00F0 | ANA1N | 00F0 | ANALOG | 0030 | ANAPT | 00B0 | ANAST | 004A |
| B1200 | 0003 | B9600 | 0002 | BANK | 0578 | BANK1 | 0576 | BANKE | 0549 | BASE | 0908 | BASE1 | 0912 | BASE2 | 091C |
| BASE2A | 0923 | BASE2B | 0H00 | BASE3 | 092B | BASE3A | 0933 | BASE3B | 0939 | BASE4 | 0930 | BASE5 | 0943 | BASE6 | 0949 |

| | | | | | | | | | | | | |
|---|---|---|---|---|---|---|---|---|---|---|---|---|
| BASE7 | 094F | BASEE | 0973 | BASEEA | 0A0B | BASEEB | 0BE5 | BASEEC | 0BE6 | BASEED | 0C1B | BASEEE | 0C24 | BASEEF | 0ADF |
| BASEEX | 0973 | BASEEY | 0BE4 | BASEEZ | 0BF3 | BASEP | 0955 | BASEP1 | 09BB | BCOM | 056B | BITMSK | 040A | BLINE | 0005 |
| BURNE | 00E0 | BURNL | 000B | BURNT | 000B | CASE1 | 0274 | CASE2 | 02B9 | CASE3 | 0292 | CE | 0300 | CENUM | 000F |
| CHARL | 000C | CIM | 0BEA | CIM1 | 0BEB | CIM2 | 0BFD | CIM3 | 0BF1 | CIMR | 0BFC | CIMSS | 054A | CINCR | 0EBF |
| CKSM | 0021 | CLOCK | 0117 | CNOINC | 0EC1 | CNVRT | 011E | COM1B | 0BAF | COM916 | 00A0 | COMAN1 | 0C15 | COMAND | 0COF |
| COM11M | 000F | CONVRT | 0114 | COS | 06FD | COSBUF | 0029 | COSE | 0709 | COSFM | 0EB0 | COSFMO | 0EB7 | COSFM1 | 0F9B |
| COSFM2 | 0E42 | COSFM3 | 0EA3 | COSFMA | 033F | COSRES | 0015 | COSSET | 0006 | CPA | 0622 | CPA1 | 0631 | CPA2 | 066A |
| CPAL | 0005 | CPALP | 063C | CTSCHK | 02EE | CTSCK1 | 02F3 | C1SEND | 02F5 | DATA | 00CD | DATAIO | 00B0 | DATE | 03F0 |
| DIG | 0E00 | DIGA | 0E21 | DIGDLY | 0D00 | DIGFS | 0E11 | DIGIN | 00C0 | DIGIN1 | 00D0 | DIGIN2 | 00E0 | DIGIN3 | 00D1 |
| DIGITL | 0038 | DIGLP | 0E38 | DIGMSK | 0UFB | DIGNFS | 0E19 | DIGPT | 0090 | DIGST | 0082 | DIK | 000A | DIM0 | 0024 |
| DIR1 | 002A | DIR1A | 002A | DIR2 | 002E | DIR3 | 007C | DIR4 | 003B | DIR5 | 003E | DIR6 | 0044 | DIR6A | 0046 |
| DIR6B | 0052 | DIR7 | 0062 | DIR8 | 0070 | DIRE | 007E | DIRFS | 00BB | DIRL | 0066 | DIRLA | 0060 | DIRLP | 000C |
| DIRD | 00AC | DISSCN | 0007 | DIVD | 0672 | DIVD1 | 0A7E | DIVDEN | 0489 | DIVOL | 0B74 | DIVIDE | 04C3 | DSO | 01A7 |
| DS1 | 01AB | DS2 | 01B4 | DS3 | 01B6 | DS3A | 005C | DS4 | 01C4 | DS4LP | 01C7 | DSH | 00B0 | DTIMEH | 007E |
| DTIMEL | 003E | DUMMY | 00FC | EH | 00A0 | E1P | 0026 | EIP1 | 06A6 | EIP2 | 068A | EIPEN | 0003 | EIPH | 066E |
| EOM | 0299 | ERROR | 003A | ERRSET | 02A1 | EXFC | 040F | EXT | 0003 | FAIL | 019A | FILE | 0767 | FILE1 | 076F |
| FILE2 | 0773 | FILE3 | 077C | FILEE | 0793 | F1IELP | 07B4 | FINAL | 0992 | FINAL1 | 04A3 | FS0 | 0B1B | FS1 | 0B91 |
| FS1A | 0B9A | FS3 | 0BB4 | FSCOS | 0BAA | FSCTL | 0CB6 | FSDEAD | 0B55 | FSLP | 0869 | FSOK | 0B3E | FSOKLP | 0B46 |
| FSR1 | 04BC | FSN2 | 0BE3 | FSRLY | 0BB5 | FSROTD | 0CBF | FSSTAT | 0B14 | FTIMEH | 00FF | FTIMEL | 0009 | GETRYT | 0796 |
| GETEND | 07AE | HI | 05A1 | HI1 | 05B6 | HILMT | 0003 | HIOFF | 05BE | HIOUT | 05A7 | HWRES | 0310 | IDLE | 022A |
| IDLE1 | 024E | IDLE2 | 0220 | IDLE3 | 022F | IDLE4 | 024A | IDLE5 | 0UF3 | IDLE6 | 00FE | IDLE7 | 05F5 | IDLE8 | 0250 |
| IDLE9 | 05EA | IN232 | 000A | IN422 | 0000 | INFO | 0004 | INT10 | 007C | INT20 | 0095 | INT30 | 00B4 | INT40 | 00AA |
| INTCLR | 0C35 | INTE | 0133 | INTP | 0AE4 | INTPE | 0AF6 | INTPR | 006E | INVERT | 0E69 | INVLP | 0E6F | IODEF | 00CF |
| IR | 0040 | ITIMEH | 007E | ITIMEL | 003E | JCNVRT | 0131 | LEN | 0025 | LENGTH | 0002 | LIMIT1 | 0001 | LIMIT2 | 0016 |
| LIMIT3 | 0006 | LIMIT4 | 0040 | LINE | 0024 | LINESW | 0711 | LIMET | 0C65 | LINK | 0B83 | LINKLP | 0BB9 | LNSWAP | 0718 |
| LOAD | 0370 | LOLMT | 002A | LOW1 | 0597 | LOWCHK | 0590 | LOWSP | 0CBB | LSWE | 071D | MASK1 | 00FF | MCASE | 00FE |
| MEMCLR | 0C20 | MEMLEN | 003F | MORE | 0740 | MOVE | 071E | MOVFI | 07B1 | MOVEMM | 09F7 | MOVER | 0726 | MOVERI | 07AF |
| MPOS | 073C | MUUAD | 0003 | MSBIT | 003C | MSG | 0001 | MSGL | 0003 | MTYPE | 0003 | MULT | 0BAE | MULT1 | 08B7 |
| MULT2 | 0BBB | MULTLP | 0BB1 | NABLE3 | 00FA | NEWVAL | 013F | NORMAL | 0BCE | NRTMR | 00FF | NTASK | 0421 | NUM | 0AEM |
| OFF | 070A | OFF1 | 09AB | OFF2 | 09A0 | OFFSET | 097E | OLDVAL | 0144 | ONHRD | 0544 | ONE | 04CA | ONEO | 040A |
| ONE1 | 0408 | ONE2 | 04E6 | ONEE | 04FE | OPNPRT | 0A57 | OUT232 | 0002 | OUT422 | 0000 | OVRFL | 07E7 | OVRFL1 | 07EB |
| OVRFL2 | 07ED | OVRFL3 | 07EF | OVRFL4 | 07F1 | PSH1 | 05A8 | P7L0 | 0EFA | PACK | 0EFA | PACK1 | 0E5F | PACK2 | 0E66 |
| PACKLP | 0855 | PANA | 072C | PANAST | 0734 | PARITY | 0000 | PEN | 0010 | POINT | 0740 | POINT1 | 075A | POINT2 | 075E |
| POINTL | 0756 | PORTA | 0001 | PORTB | 0002 | PORTC | 0003 | PRGRAM | 03B0 | PRUG | 0070 | PROGL | 0006 | PULSA | 0566 |
| PULSB | 0567 | PULSE | 0552 | PV | 09A7 | QUADST | 0000 | RANG1 | 0A00 | RANG2 | 0AOC | RANGA | 0A0E | RANG9 | 0810 |
| RANGE | 0812 | RANGE1 | 0820 | RANGE2 | 0A2C | RANGE3 | 0A30 | RANGE4 | 0AA6 | RANGE5 | 0A4A | RANGE6 | 0AAE | RANGEE | 0A55 |
| RANGES | 0900 | RCT1 | 0C9C | RCT2 | 0CAA | RCTEX | 0CA7 | RDATA | 0257 | RDATAA | 05CA | RDATAB | 05B9 | RDATAC | 0250 |
| RDATAD | 05E8 | RDATAE | 02B5 | RDATAF | 0CBC | RDATAG | 0C97 | RDATAH | 026C | RDATAX | 05E6 | REC | 0252 | REC1 | 0371 |
| RECV | 031A | RECVE | 0367 | REG2 | 001A | REG3 | 0003 | REGRLY | 056F | RELAY | 0502 | REQ | 02A5 | REQ1 | 0001 |
| RESET | 0010 | RESULT | 019C | REV | 05FC | REV1 | 07F6 | REVRSE | 07D3 | RFSH | 013A | RFSH1 | 002A |
| RFSH1 | 014E | RFSH3 | 0171 | RFSHL | 015B | RL1 | 052A | RL2 | 0537 | RL3 | 0531 | RL4 | 0536 | RL5 | 0530 |
| RL99 | 054E | RLY | 0471 | RLY1 | 047E | RLY1L | 047E | RL Y2 | 048B | RLYACT | 0523 | RLYBO | 0080 | RLYB1 | 0040 |
| RLYCT | 002E | RLYE | 04A7 | RLY11 | 0443 | RLYSCH | 0BF2 | RP | 0173 | RP1 | 017F | RP2 | 0185 | RP2A | 0192 |
| RPE | 0196 | RP120 | 06F1 | RPT232 | 00E6 | RRCHK | 02F7 | RRCHK1 | 02FC | RREND | 02FE | RTS | 0020 | RTS422 | 02E0 |
| RTSEND | 02E6 | RTSREQ | 0027 | RTSRES | 0017 | RXE | 0006 | RXRDY | 0002 | SAVE | 09DC | SAVE1 | 09E5 | SAVE2 | 09EA |
| SAVE3 | 09EC | SAVE4 | 09ED | SBRK | 000A | SECOND | 0025 | SEND | 0287 | SLFCAL | 00AE | SNDEND | 02CD | SPAN | 0035 |
| SRS232 | 02E4 | SRTS | 02CF | SS | 0512 | SS1 | 0510 | SSE | 051F | SSLEN | 0004 | ST | 0040 | START | 0C25 |
| STIMEH | 00FF | STIMEL | 001C | STOPCT | 004F | STOPSC | 0249 | STORE | 0UCF | STRTCT | 0UCF | SUBT | 0B9B | SUBT1 | 0BA2 |
| SUBT2 | 0BAB | SUBTV | 0890 | SUBTV1 | 0A97 | TSOMS | 0090 | TABLE | 0B56 | TABLED | 00F7 | TABLE1 | 00FB | TABLE2 | 00F9 |
| TABLEE | 0B71 | TASK | 0422 | TASKO | 0404 | TASK1 | 0402 | TASK2 | 0404 | TASK3 | 0406 | TASK4 | 040B | TASKRO | 0416 |
| TAL | 0040 | TDELAY | 0023 | TF12 | 005F | TF96 | 005E | THK1 | 0109 | THR1A | 01E6 | THR1B | 00E1 | THR1C | 01F1 |
| THR2 | 01E0 | THR2A | 01F5 | THR2B | 01F9 | TIMEH | 007F | TIMFL | 00FF | TIMERH | 0005 | TIMFRL | 0004 | TINT10 | 001C |
| TINT20 | 003F | TINT30 | 0025 | TINT40 | 0047 | TINT50 | 0057 | TINTP | 0036 | TINTXX | 0051 | TINTYY | 0036 | TMPLT | 0048 |
| TOTACT | 00F6 | TOTAL | 043F | TOTAL1 | 0450 | TOTALA | 0449 | TOTALE | 044E | TOTALX | 044B | TOTALY | 0445 | TOTASS | 00FA |
| TOTIVC | 002B | TOTLST | 0027 | TOTRUN | 00F3 | TOTSCH | 00F3 | TOTTMR | 00F7 | TSM | 0207 | TSMBUF | 0000 | TSMPTR | 0022 |
| TXE | 0004 | TXEN | 0001 | TXEND | 0212 | TXRDY | 0001 | TYPA | 03F1 | TYP1 | 0325 | TYP2 | 0342 | TYP3 | 034E |
| TYP4 | 0365 | TYP5 | 035C | TYP6 | 0362 | TYPE2 | 0281 | UART | 0004 | UARTCS | 0001 | UARTIO | 0000 | UARTST | 0C69 |
| UPDATE | 0E44 | UPLINE | 0373 | WAIT | 0213 | WAIT1 | 021A | WAIT2 | 0222 | WAIT3 | 0228 | WATCH | 04A9 | WATCH1 | 04C3 |
| WATCH2 | 04C9 | WATCHD | 002B | WATCHE | 002C | WATCHF | 0020 | WATCHX | 07F2 | XADE | 0A01 | XADN | 000F |
| XADR1 | 0A00 | XADR2 | 0A0C | XADRS | 0A01 | XADRR1 | 00F3 | XADRR2 | 00F5 | XADT2 | 0A02 | XADT3 | 0A03 | XADT4 | 0A04 |
| XADT5 | 0A05 | XADT6 | 0A06 | XADT7 | 0A07 | XADV | 0044 | XADV1 | 00E4 | XADV2 | 00F4 | XADVR1 | 00A4 | XADVR2 | 0A0F |
| XCOSFM | 031B | XCPA | 0514 | XCTS | 0206 | XDIAG | 0312 | XDIN | 0D00 | XDS1 | 0100 | XDS2 | 010E | XDS3 | 0110 |
| XDS4 | 0111 | XFAIL | 0113 | XFAIL1 | 010B | XFERCT | 0020 | XFNL | 0A0A | XIDLE | 0200 | XINTF | 0100 | XINTP | 0A09 |
| XOPEN | 0A0B | XRAM | 00B0 | XRAM1 | 0000 | XREC | 0202 | XRELAY | 0316 | XRES | 0112 | XRP1 | 0B09 | XRP2 | 010H |
| XRRCHK | 0205 | XRTS | 0203 | XSEND | 0204 | XT2 | 0102 | XT3 | 0103 | XT4 | 0104 | XT5 | 0105 | XT6 | 010B |
| XT7 | 0107 | XTHR2 | 010C | XTOT1 | 0430 | XTOT2 | 043E | XWAIT | 0201 | | | | | | |

ASSEMBLY COMPLETE,    NO ERRORS

ISIS-II ASSEMBLER SYMBOL CROSS REFERENCE, V2.1

```
AD      1565    2158#
AD1     2178    2179    2184#
AOCAL   660#
ADD16   2258    2838    2852    3033    3056#   3217    3267    3298
ADDRES  176#    1056    1214    2105    2431    2713    4020    4164    4374    4423    4670    4765
ADDX    1341#   1357    1365    2713#
ADDX1   2720    2725#
ADDX2   563     2722#
ADDXA   549#    2721
ADDXB   556     560     562#
ADDXC   552     563#
ADDXE   562     2716    2726#
ADE     3448    3449    3491#
ADEN    4351#
ADFML   3458    3889#
ADIDL   2161    2168#
ADMB1   2163    3468#
ADRP    3450    3602#
ADRP1   3606    3608#
ADRP2   3607    3611#
ADRP3   3305    3615#
ADRP4   3613#
ADRTD   3453    3833#
ADRT01  3461    3839#
ADRT02  3460    3845#
ADRT03  3459    3850#
ADRTR   3451    3637#
ADTMP   159#    3318    3751    3833
ADTMP1  161#    3323    3775    3839
ADV     3452    3454    3455    3751#
```

```
ADV0    3755#
ADV1    3462    3775#
ADV10   3754    3759#
ADV10A  3762#   3764
ADV11   3761    3764#
ADV2    3463    3780#
ADVE    3473#   3504    3617    3645    3763    3782    3847    3860    3939
ADVE1   3475#   3695
ADVEX   3471#   3756    3771    3777    3836    3842
ALARM   923#    935
ANACOS  1847    2267    2689#
ANACP   245#    391     496     690     762     3681    4369
ANACS   345#    401     432     450     460     503     693     4371    4384
ANAID   252#    2485
ANAIN   255#    2158    2168    2175    3473    3668
ANALOG  207#    828     937     946     2176    2574    2668    2835    2857    2870    2908    3094    3144    3145    3153    3168
        3180    3182    3262    3295    3317    3322    3396    3411    3492    3495    3603    3638    3669    3684    3691    3752
        3759    3850    3853    3856    3889    3922    3934    3944    3955
ANAPT   248#    2223    2575    4607
ANAST   233#    1826    2505    4625
B1200   325#    327
B9600   324#    326
BANK    2021    2025#
BANK1   2019    2023#
BANKE   2050    2055    2057    2062    2066#
BASE    3144#   3688
BASE1   3132    3153#
BASE2   3133    3163#
BASE2A  3164    3167#
BASE2B  3170    3944#
BASE3   3134    3173#
BASE3A  3174    3179#
BASE3B  3179    3182#
BASE4   3135    3186#
BASE5   3136    3190#
BASE6   3137    3194#
BASE7   3138    3198#
BASEE   3131    3181    3183    3215    3220#
BASEEA  3094#   3227
BASEEB  3096    3102#
BASEEC  3098    3113#
BASEED  3097    4352#
BASEEE  4353    4357#
BASEEF  3098#   4356
BASEEX  3178    3188    3192    3196    3200    3214    3219#
BASEEY  3101#   3119
BASEEZ  3100    3116#
BASEP   3157    3166    3167    3202#   3956
BASEP1  3210    3215#
BCDM    2011#   2028
BITMSK  1569#   1595
BLINE   2424#
BURNE   605     608#
BURNL   605#    607
BURNT   602#    1487    1488    1489    1491    1497
CASE1   1103    1106#
CASE2   1104    1119#
CASE3   1105    1107    1120    1127#
CE      1305#
CENUM   1310#   1362
CHARL   323#    326     327
CIM     1961    4257#
CIM1    4258    4261#
CIM2    4260    4262#
CIM3    4263    4266#
CIMR    4266    4271    4287#
CIMSS   1957    1960#
CINCR   4956    4957    4959#
CKSM    184#    1041    1094    1135    1187    1221    2637
CLOCK   686#
CNOINC  4958    4960#
CNVRT   399     501     692#
COM18   4251#   4259
COM916  4252#   4261
COMAN1  4179    4182    4325#
COMAND  4069    4082    4090    4094    4138    4171    4188    4321#
COMTIM  4253#   4292
CONVRT  683#
COS     2382#   2554    4794
COSBUF  195#    1551    2388    2689    4068    4114    4923    4938
COSE    2385    2392#
COSFM   1356    4914#
COSFM0  4916    4919#
COSFM1  4927    4931#
COSFM2  4928    4932    4935#
COSFM3  4917    4930    4934    4936#
COSFMA  1328    1355#
COSRES  4013#   4128
COSSET  4012#   4095
CPA     1326    2221#
CPA1    2227    2229#
CPA2    2228    2268#
CPAL    2218#   2268
CPALP   2238#   2243
CTSCHK  969     1240#
CTSCK1  1241    1243#
CTSEND  1242    1244#
DATA    578#    1626    1499    2609    3930    4034    4587    4684
DATAID  266#    580
DATE    1525#
DIG     1348    4759#
```

```
DIGA    4773   4778#
DIGDLY  251#   1709   1731   1985
DIGFS   4767   4769#
DIGIN   281#   1648   4097   4774
DIGIN1  282#   4070   4102   4776
DIGIN2  283#   4778
DIGIN3  284#   4780
DIGITL  211#   1884   1890   2222   2225   2247   2254   2255   2257   2260   2341   2343   2577   2745   2751   3202
        3212   3216   3340   3363   3365   3366   3368   3945   4288   4760   4764   4789   4834   4835   4885   4886
DIGLP   4790#  4798
DIGMSK  266#   2540   4024   4619   4674   4759
DIGMFS  4768   4774#
DIGPT   245#   2578   4616
DIGST   240#   2533   4047   4786   4964
DIR     4588   4583#
DIR0    4573   4604#
DIR1    4574   4606#
DIR1A   4605   4607#
DIR2    4575   4609#
DIR3    4658   4643#
DIR4    4577   4615#
DIR5    4578   4618#
DIR6    4579   4621#
DIR6A   4622#  4644
DIR6B   4631#  4632
DIR7    4580   4643#
DIR8    4576   4590   4655#
DIRE    4592   4662   4664#
DIRFS   4672   4674#
DIRL    4608   4614   4617   4620   4645#
DIRLA   4642   4651#
DIRLP   4585#  4663
DIRO    4675   4699#
DISSCN  4011#  4064   4130   4139   4183   4189
DIV0    2941#  3567
DIV01   2943   2950#
DIVDEN  3521   3540#  3855   3890
DIVDL   2942#  2951
DIVIDE  3525   3562#  3858   3893
DS0     663    664    665    666    869#
DS1     672    873#
DS2     673    674    880#
DS3     464    675    883#
DS3A    454#
DS4     676    897#
DS4LP   899#   905
DSH     314#
DTIMEH  444#   455
DTIMEL  445#   458
DUMMY   267#   3639   4609   4618   4621
EH      306#
EIP     189#   2087   2333   2349
EIP1    2337   2338   2345   2347#
EIP2    2335   2349#
EIPEN   2324#  2352
EIPP    1566   2333#
EOM     1125   1135#
ERROR   315#   1088
ERRSET  1045   1141#  4468   4477
EXEC    1391   1577#  1590   1645   1743   2184   2354   3476   4395
EX1     224#   1360   4922
FAIL    667    678    845#   884
FILE    1883   2174   2573#
FILE1   2573   2577#
FILE2   2224   2576   2580#
FILE3   2342   2585   2602#  4762
FILEE   2619#
FILELP  2608#  2618
FINAL   3244#  3495
FINAL3  3501   3304#
FS0     4022   4024#
FS1     4113   4120#
FS1A    4119   4127#
FS3     4023   4091   4143#
FSCOS   4114#  4125
FSCTL   4065   4096   4129   4131   4140   4173   4184   4190   4494#
FSDEAD  4073   4086#
FSLP    4085   4093#  4137
FSOK    4064#
FSOKLP  4069#  4078
FSR1    4166   4168#
FSR2    4167   4191#
FSRLY   1953   4164#
FSROTO  4120   4519#
FSSTAT  1549   4020#
FTIMEH  484#   525
FTIMEL  485#   527
GETBYT  1184   2635#
GETEND  2640   2653#
HI      2049   2058#
HI1     2053   2055#
HILMT   343#   415
HIOFF   2040   2044#
HIOUT   2054   2039#
HWRES   1313   1324#
IDLE    963    1056#
IDLE1   1058   1061#
IDLE2   1038#  1060   2128
IDLE3   1037   1040#  2127
IDLE4   637    1059#
IDLE5   631#   1061
```

| | | | | | | | | | | | | | |
|---|---|---|---|---|---|---|---|---|---|---|---|---|---|
| IDLE6 | 634 | 637# | | | | | | | | | | | |
| IDLE7 | 2124 | 2128# | | | | | | | | | | | |
| IDLE8 | 1063# | | | | | | | | | | | | |
| IDLE9 | 1063 | 2121# | | | | | | | | | | | |
| IN232 | 298# | | | | | | | | | | | | |
| IN422 | 300# | | | | | | | | | | | | |
| INFO | 225# | 1416 | 1418 | 1422 | 1465 | 1882 | 1888 | 1895 | 2221 | 2619 | 4941 | | |
| INT10 | 500 | 502# | | | | | | | | | | | |
| INT20 | 506 | 524# | | | | | | | | | | | |
| INT30 | 507# | | | | | | | | | | | | |
| INT40 | 515 | 534# | | | | | | | | | | | |
| INTCLR | 4346# | 4348 | | | | | | | | | | | |
| INTE | 516 | 537 | 544 | 723# | 784 | 811 | 817 | 830 | 854 | 870 | 880 | 894 | 931 | 952 |
| INTP | 3457 | 3922# | | | | | | | | | | | |
| INTPE | 3926 | 3928 | 3934# | | | | | | | | | | |
| INTPR | 364 | 492# | | | | | | | | | | | |
| INVERT | 4785 | 4884# | | | | | | | | | | | |
| INVLP | 4887# | 4898 | | | | | | | | | | | |
| IODEF | 355# | 433 | 461 | 513 | 535 | 4385 | | | | | | | |
| IR | 307# | 4421 | | | | | | | | | | | |
| ITIMEH | 488# | 508 | | | | | | | | | | | |
| ITIMEL | 489# | 511 | | | | | | | | | | | |
| JCNVRT | 455 | 707# | | | | | | | | | | | |
| LEN | 1412# | 1431 | | | | | | | | | | | |
| LENGTH | 223# | 1127 | 1384 | 2723 | | | | | | | | | |
| LIMIT1 | 2819# | 2836 | | | | | | | | | | | |
| LIMIT2 | 2820# | 2837 | | | | | | | | | | | |
| LIMIT3 | 2821# | 2842 | | | | | | | | | | | |
| LIMIT4 | 2822# | 2845 | | | | | | | | | | | |
| LINE | 187# | 623 | 631 | 1053 | 1210 | 2110 | 2435 | 4425 | | | | | |
| LINESW | 1338 | 2347 | 2431# | | | | | | | | | | |
| LINET | 4407# | 4428 | | | | | | | | | | | |
| LINK | 2450 | 2956# | | | | | | | | | | | |
| LINKLP | 2961# | 2965 | | | | | | | | | | | |
| LNSWAP | 2114. | 2435# | 2722 | | | | | | | | | | |
| LOAD | 1422# | 1430 | | | | | | | | | | | |
| LOLMT | 382# | 413 | | | | | | | | | | | |
| LOWI | 2044 | 2051# | | | | | | | | | | | |
| LOWCHK | 2043 | 2047# | | | | | | | | | | | |
| LOWSP | 4432 | 4436# | | | | | | | | | | | |
| LSWE | 2434 | 2459# | | | | | | | | | | | |
| MASK1 | 1568# | | | | | | | | | | | | |
| MCASE | 1075# | 1106 | | | | | | | | | | | |
| MEMCLR | 4361# | 4362 | | | | | | | | | | | |
| MEMLEN | 4348# | 4364 | | | | | | | | | | | |
| MORE | 2635 | 2641# | | | | | | | | | | | |
| MOVE | 2441# | 2446 | 4948 | 4966 | | | | | | | | | |
| MOVE1 | 2248 | 2669# | 2755 | | | | | | | | | | |
| MOVEMM | 3341 | 3364 | 3370 | 3412 | 3428# | | | | | | | | |
| MOVER | 2246 | 2263 | 2462# | 3501 | | | | | | | | | |
| MOVERI | 829 | 847 | 2668# | 3271 | 3614 | | | | | | | | |
| MPOS | 2520# | 2538 | | | | | | | | | | | |
| MQUAD | 4571# | 4660 | | | | | | | | | | | |
| MSBIT | 213# | 1892 | | | | | | | | | | | |
| MSG | 222# | 1334 | 1373 | 4914 | | | | | | | | | |
| MSGL | 1073# | | | | | | | | | | | | |
| MTYPE | 1076# | | | | | | | | | | | | |
| MULT | 2256 | 3025# | | | | | | | | | | | |
| MULT1 | 3030 | 3032# | | | | | | | | | | | |
| MULT2 | 3032 | 3034# | | | | | | | | | | | |
| MULTLP | 3027# | 3041 | | | | | | | | | | | |
| NABLE3 | 265# | | | | | | | | | | | | |
| NEWVAL | 747# | | | | | | | | | | | | |
| NORMAL | 3080# | 3087 | 3156 | 3372 | 3612 | | | | | | | | |
| NRTMR | 270# | 2083 | 2099 | | | | | | | | | | |
| NTASK | 1544 | 1588# | | | | | | | | | | | |
| NUM | 3108# | 3154 | 3165 | 3169 | 3851 | 3857 | | | | | | | |
| OFF | 1503 | 1505 | 2406# | 4323 | 4391 | 4393 | | | | | | | |
| OFF1 | 3266 | 3269# | | | | | | | | | | | |
| OFF2 | 3268 | 3270# | 3304 | 3373 | | | | | | | | | |
| OFFSET | 3261# | 3432 | 3937 | | | | | | | | | | |
| OLDVAL | 746 | 751# | | | | | | | | | | | |
| ONHRD | 1948 | 1957# | | | | | | | | | | | |
| ONE | 1630 | 1806# | | | | | | | | | | | |
| ONE0 | 1808 | 1813# | | | | | | | | | | | |
| ONE1 | 1816# | 1822 | | | | | | | | | | | |
| ONE2 | 1826# | | | | | | | | | | | | |
| ONEE | 1833 | 1839 | 1847# | | | | | | | | | | |
| OPNPRT | 3456 | 3668# | | | | | | | | | | | |
| OUT232 | 299# | | | | | | | | | | | | |
| OUT422 | 301# | | | | | | | | | | | | |
| OVRFL | 2773# | | | | | | | | | | | | |
| OVRFL1 | 2775# | 2780 | | | | | | | | | | | |
| OVRFL2 | 2773 | 2780# | | | | | | | | | | | |
| OVRFL3 | 2774 | 2783# | | | | | | | | | | | |
| OVRFL4 | 2775 | 2785# | | | | | | | | | | | |
| P5HI | 2060 | 2063# | | | | | | | | | | | |
| P7LO | 2053 | 2056# | | | | | | | | | | | |
| PACK | 4784 | 4834# | | | | | | | | | | | |
| PACK1 | 4845 | 4848# | | | | | | | | | | | |
| PACK2 | 4848 | 4853# | | | | | | | | | | | |
| PACKLP | 4840# | 4853 | | | | | | | | | | | |
| PANA | 751 | 2262 | 2482# | | | | | | | | | | |
| PANAST | 2245 | 2502# | 3494 | | | | | | | | | | |
| PARITY | 321# | 326 | 327 | | | | | | | | | | |
| PEN | 322# | 326 | 327 | | | | | | | | | | |
| POINT | 1887 | 2527# | 3642 | | | | | | | | | | |
| POINT1 | 2544 | 2546# | | | | | | | | | | | |
| POINT2 | 2545 | 2549# | | | | | | | | | | | |
| POINTL | 2544# | 2548 | | | | | | | | | | | |
| PORTA | 344# | 942 | 3224 | | | | | | | | | | |

```
PORTB    345#   3683   4375
PORTC    346#   764    938    3220   4334
PRGNAM   1304   1460#
PROG     287#   1484
PROGL    1456#  1508
PULSA    1992   1997#
PULSB    1996   1998#
PULSE    1959   1981#  4294
PV       3517#  3780   3845
QUADST   4572#  4584
RANG1    2823#
RANG7    2829#  2848   2865
RANG8    2830#  2867
RANG9    2831#  2839
RANGE    2835#  3602
RANGE1   2840   2842#
RANGE2   2850#  2855
RANGE3   2450   2852#
RANGE4   2851   2864   2867#
RANGE5   2841   2846   2870#
RANGE6   2859   2863   2876#
RANGEE   2881#
RANGES   3131#
RC11     4052   4459#
RC12     4455   4470#
RCTEX    4467#
RDATA    1082   1084#
RDATAA   1083   2097#
RDATAB   1087   2080#
RDATAC   1088#  2088
RDATAD   2104   2109   2113   2116#
RDATAE   1142   1151   1157#
RDATAF   1100   4449#
RDATAG   4456#  4466   4472   4475
RDATAH   1101#  4458
RDATAX   2115#
REC      965    1081#
REC1     1305   1308   1314   1315   1316   1317   1318   1319   1320   1325   1339   1343   1353   1359   1366   1391#
RECV     1334#  1562
RECVE    1379   1384#  1432   1509   1901   2269   4966
REG2     466#   765
REG3     153#   2750   3209   3211   3219   3261   3294   3320   3362   3369   3604   3852   3953
REGRLY   1723   1958   2018#  2346   4296
RELAY    1327   1882#
REQ      1139   1143#
REQ1     1074#  1143
RESET    309#   1032
RESULT   677    847#   913
REV      1524#
REV1     2747   2758#
REVRSE   2249   2745#
RFLDBK   4015#
RFRSH    659    660    742#
RFSH     2018   744    772    2264
RFSH1    750    759#
RFSH3    748#
RFSHL    766#   769
RL1      1933   1936#
RL2      1935   1948#
RL3      1938   1941#
RL4      1943   1946#
RL5      1949   1951#
RL94     1950   1955   1959   1964#
RLY      1564   1700#
RLY1     1705#
RLY1L    1710#  1716
RLY2     1702   1721#
RLYACT   1891   1898   1931#
RLYB0,   280#   1502   2020   4174   4185   4321   4390
RLYB1    279#   1508   2023   4392   4494
RLYCT    205#   1705   1726   1981
RLYE     1707   1743#
RLYE1    1714   1718   1740#
RLYSCH   257#   1700   1740
RP       661    804#
RP1      668    669    814#
RP2      670    820#
RP2A     825    828#
RPE      827    830#
RPT20    626    629#
RPT232   623#   1219
RRCHK    968    1258#
RRCHK1   1259   1261#
RREND    1260   1262#
RTS      308#   1202
RTS422   629    1217#
RTSEND   628    1218   1221#
RTSREQ   1202#  1206
RTSRES   1032#  1046
RXE      311#   1032   1202
RXRDY    317#
SAVE     3396#  3471
SAVE1    3398   3401#
SAVE2    3401   3404#
SAVE3    3403   3405#
SAVE4    3400   3406#
SBRK     310#
SECOND   188#   782    1773
SEND     967    1175#
SLFCAL   243#
SNDEND   1177   1181   1191#
```

| | | | | | | | | |
|---|---|---|---|---|---|---|---|---|
| SPAN | 209# | | | | | | | |
| SRS232 | 1216 | 1219# | | | | | | |
| SRTS | 966 | 1206# | | | | | | |
| SS | 1886 | 1891# | | | | | | |
| SS1 | 1898# | | | | | | | |
| SSE | 1894 | 1900# | | | | | | |
| SSLEN | 1877# | 1900 | | | | | | |
| ST | 320# | 326 | 327 | | | | | |
| START | 362 | 4355# | | | | | | |
| STIMEH | 486# | 540 | | | | | | |
| STIMEL | 487# | 542 | | | | | | |
| STOPCT | 357# | 402 | 451 | 504 | 697 | | | |
| STOPSC | 4014# | 4095 | 4128 | 4172 | | | | |
| STORE | 1113 | 1114 | 1118 | 1122 | 1131 | 1147# | | |
| STRTCT | 556# | 705 | | | | | | |
| SUBT | 2753 | 2842 | 2982 | 2991# | 3213 | 3324 | 3605 | 3954 |
| SUBT1 | 2997 | 2999# | | | | | | |
| SUBT2 | 3005 | 3007# | | | | | | |
| SUBTV | 2982# | 3269 | 3319 | 3854 | | | | |
| SUBTV1 | 2983 | 2987# | | | | | | |
| TSOMS | 1455# | | | | | | | |
| TABLE | 2898# | 3927 | | | | | | |
| TABLE0 | 262# | 2898 | 4613 | | | | | |
| TABLE1 | 263# | | | | | | | |
| TABLE2 | 264# | | | | | | | |
| TABLEE | 2901 | 2915 | 2917# | | | | | |
| TASK | 1589# | 1593 | | | | | | |
| TASK0 | 1562# | 1602 | | | | | | |
| TASK1 | 1563# | 1603 | | | | | | |
| TASK2 | 1564# | 1604 | | | | | | |
| TASK3 | 1565# | 1605 | | | | | | |
| TASK4 | 1566# | 1606 | | | | | | |
| TASKHO | 1581# | | | | | | | |
| TBL | 924# | 945 | | | | | | |
| TDELAY | 186# | 1008 | 1178 | 2121 | | | | |
| TF12 | 327# | 4436 | | | | | | |
| TF96 | 326# | 4433 | | | | | | |
| THR1 | 662 | 928# | | | | | | |
| THR1A | 434 | 937# | | | | | | |
| THR1B | 610# | 943 | | | | | | |
| THR1C | 613 | 944# | | | | | | |
| THR2 | 671 | 934# | | | | | | |
| THR2A | 436 | 946# | | | | | | |
| THR2B | 944 | 949# | | | | | | |
| TIMEH | 427 | 4350# | 4379 | | | | | |
| TIMEL | 430 | 4349# | 4382 | | | | | |
| TIMERH | 348# | 426 | 454 | 507 | 529 | 4378 | | |
| TIMERL | 347# | 400 | 429 | 457 | 510 | 692 | 4381 | |
| TINT10 | 398 | 400# | | | | | | |
| TINT20 | 404 | 425# | 439 | | | | | |
| TINT30 | 405# | | | | | | | |
| TINT40 | 426# | | | | | | | |
| TINT50 | 345 | 450# | | | | | | |
| TINTP | 365# | | | | | | | |
| TINTKX | 416 | 436# | | | | | | |
| TINTYY | 418# | 438 | | | | | | |
| TMPLT | 229# | 4604 | 4606 | 4615 | 4641 | 4664 | 4695 | 4942 4954 |
| TOTACT | 261# | 1668 | 1806 | | | | | |
| TOTAL | 1563 | 1634# | | | | | | |
| TOTAL1 | 1624 | 1648# | | | | | | |
| TOTALA | 1636 | 1642# | | | | | | |
| TOTALE | 1645# | | | | | | | |
| TOTALX | 1643# | 1812 | | | | | | |
| TOTALY | 1639# | 1673 | 1848 | | | | | |
| TOTASS | 259# | 1656 | 4633 | | | | | |
| TOTINC | 191# | 1663 | | | | | | |
| TOTLST | 190# | 1657 | | | | | | |
| TOTRUN | 260# | 2787 | 4643 | | | | | |
| TOTSCH | 258# | 1634 | 1643 | | | | | |
| TOTTMR | 206# | 1665 | 1781 | | | | | |
| TSM | 975# | 1577 | | | | | | |
| TSMBUF | 221# | 1367 | 1385 | | | | | |
| TSMPTR | 185# | 1147 | 2643 | | | | | |
| TXE | 316# | | | | | | | |
| TXEN | 312# | 1032 | 1202 | | | | | |
| TXEND | 636 | 992# | 1021 | 1038 | 1157 | 1191 | 1226 | 1244 1262 2116 |
| TXRDY | 318# | | | | | | | |
| TYP0 | 1338# | | | | | | | |
| TYP1 | 1336 | 1340# | | | | | | |
| TYP2 | 1337 | 1357# | | | | | | |
| TYP3 | 1341 | 1365# | | | | | | |
| TYP4 | 1342 | 1346 | 1354 | 1380# | | | | |
| TYP5 | 1371 | 1373# | | | | | | |
| TYP6 | 1358 | 1378# | | | | | | |
| TYPE2 | 1112 | 1114# | | | | | | |
| UART | 278# | 980 | 2085 | 2649 | 4414 | | | |
| UARTCS | 304# | 982 | 4416 | | | | | |
| UARTIO | 303# | 1011 | 1049 | 1091 | 1185 | | | |
| UARTST | 4387 | 4414# | | | | | | |
| UPDATE | 4775 | 4777 | 4779 | 4781 | 4814# | | | |
| UPLINE | 1310 | 1416# | | | | | | |
| WAIT | 964 | 1007# | | | | | | |
| WAIT1 | 1009 | 1011# | | | | | | |
| WAIT2 | 1010 | 1016# | | | | | | |
| WAIT3 | 1015 | 1018 | 1021# | | | | | |
| WATCH | 1540 | 1760# | | | | | | |
| WATCH1 | 1777 | 1779# | | | | | | |
| WATCH2 | 1763 | 1772 | 1790# | | | | | |
| WATCHO | 202# | 1760 | | | | | | |
| WATCHE | 203# | | | | | | | |
| WATCHF | 204# | | | | | | | |

```
WATCHW  1782   2787#
XADF    3444#  3615   3762
XADIDL  3448#
XADN    2153#  2160
XADR1   3461#  3828
XADR2   3460#  3829
XADR3   3459#  3846
XADRR1  3828#  3834
XADRR2  3829#  3840
XADT2   3450#
XADT3   3451#
XADT4   3452#  3745
XADT5   3453#
XADT6   3454#
XADT7   3455#
XADV    3745#  3770
XADV1   3746#  3755
XADV2   3747#  3776
XADVR1  3462#  3746
XADVR2  3463#  3747
XCOSFM  1306   1328#
XCPA    1311   1326#
XCTS    627    969#
XDIAG   1312   1325#
XDIR    4573#  4601
XDS1    672#   869
XDS2    673#
XDS3    675#
XDS4    676#
XFAIL   678#
XFAIL1  667#   804
XFEKCT  1011#  1017
XFNL    3454#  3938
XIDLE   561    963#   1019  1138  2115  2348  2636
XINTF   659#   852    949
XINTP   3457#  3781   3859
XOPEN   2180   3456#  3472
XWAM    277#   584    752   1051  1208  1492  1506  1578  1653  1724  1964  2080  2097  2641  3689  4111
        4141   4297   4356  4456  4782
XRAM1   276#
XREC    635    965#   1059  1261
XRELAY  1307   1327#
XRES    677#   823
XRP1    668#
XRP2    670#
XWRCHK  968#
XRTS    966#   1390
XSEND   967#   1217   1243
XT2     661#
XT3     662#
XT4     663#
XT5     664#
XT6     665#
XT7     666#
XTHR2   671#   930
XTOT1   1629#  1811
XTOT2   1630#  1642
XWAIT   964#   1141

CROSS REFERENCE COMPLETE
```

The embodiments of the invention in which an exclusive property or right is claimed are defined as follows:

1. A data gathering panel for permitting the rewriting of a programmable read-only memory under control of a remote station connected to said data gathering panel by a communication channel comprising:
   programmable read-only memory means for storing information to be used by said data gathering panel for controlling at least some functions performed by said data gathering panel;
   power supply means in said data gathering panel for allowing the information stored in said programmable read-only memory means to be altered; and
   control means responsive to remote transmissions from a remote station over a communication channel for interconnecting said power supply means and said programmable read-only memory means for altering said information stored in said programmable read-only memory means.

2. The data gathering panel of claim 1 wherein said control means comprises a transceiver for receiving information from and transmitting information to said communication channel.

3. The data gathering panel of claim 2 wherein said control means comprises a microcomputer connected to said transceiver for supplying information thereto to be transmitted and for receiving information therefrom to be used in the control of said programmable read-only memory means.

4. The data gathering panel of claim 3 wherein said power supply means comprises a power supply having a regulated voltage output terminal connected to said programmable read-only memory means.

5. The data gathering panel of claim 4 comprising means interconnecting said microcomputer to said programmable read-only memory means so that said regulated voltage source terminal can be used for altering said information stored in said programmable read-only memory means.

* * * * *